(12) United States Patent
Duff et al.

(10) Patent No.: US 11,087,039 B2
(45) Date of Patent: Aug. 10, 2021

(54) HEADSET APPARATUS FOR DISPLAY OF LOCATION AND DIRECTION BASED CONTENT

(71) Applicant: Middle Chart, LLC, Jacksonville, FL (US)

(72) Inventors: Jason E. Duff, Jacksonville, FL (US); Michael S. Santarone, Jacksonville, FL (US); Michael A. Wodrich, Jacksonville, FL (US); Randall Pugh, Jacksonville, FL (US)

(73) Assignee: Middle Chart, LLC, Jacksonville, FL (US)

( * ) Notice: Subject to any disclaimer, the term of this patent is extended or adjusted under 35 U.S.C. 154(b) by 0 days.

(21) Appl. No.: 16/918,115

(22) Filed: Jul. 1, 2020

(65) Prior Publication Data
US 2020/0334395 A1    Oct. 22, 2020

Related U.S. Application Data

(63) Continuation of application No. 16/504,919, filed on Jul. 8, 2019, now Pat. No. 10,740,502, which is a
(Continued)

(51) Int. Cl.
*G06F 30/13* (2020.01)
*G02B 27/00* (2006.01)
(Continued)

(52) U.S. Cl.
CPC ......... *G06F 30/13* (2020.01); *G02B 27/0093* (2013.01); *G02B 27/0172* (2013.01);
(Continued)

(58) Field of Classification Search
CPC ... G06F 30/13; G02B 27/0093; G02B 27/017; G06Q 10/06; G06T 19/006
(Continued)

(56) References Cited

U.S. PATENT DOCUMENTS 5,884,202 A    3/1999   Arjomand
5,933,479 A    8/1999   Michael et al.
(Continued)

FOREIGN PATENT DOCUMENTS

CN    102147597 A    8/2011
EP       2726817 B1   9/2018
(Continued)

OTHER PUBLICATIONS

"Wireless Indoor Localization Systems and Techniques: Survey and Comparative Study" Indonesian Journal of Electrical Engineering and Computer Science, vol. 3, No. 2, Aug 2016, pp. 392-409 (Year: 2016).
(Continued)

*Primary Examiner* — Hai Tao Sun
(74) *Attorney, Agent, or Firm* — Rogers Towers, P.A.; Joseph P. Kincart

(57) ABSTRACT

Methods and apparatus for presenting data to a user with augmented reality headgear or augmented reality glasses that has been oriented in a direction based upon unique automated generation of a vector are described. Systems for determining a direction of interest are based upon orientation of an apparatus. Data collection systems such as cameras, stereoscopic cameras, and scanner systems may be included in the augmented reality gear. In combination with a geospatial position, the direction of interest may be referenced in the provision of content via a user interface displayed in a worn augmented reality gear of the user at the site of interest. Updating of model data may be coordinated through the interface of an oriented augmented reality headgear with data collection systems.

17 Claims, 79 Drawing Sheets

Related U.S. Application Data continuation-in-part of application No. 16/503,878, filed on Jul. 5, 2019, now Pat. No. 10,776,529, which is a continuation-in-part of application No. 16/297,383, filed on Mar. 8, 2019, now Pat. No. 10,762,251, which is a continuation-in-part of application No. 16/176,002, filed on Oct. 31, 2018, now Pat. No. 10,268,782, which is a continuation-in-part of application No. 16/171,593, filed on Oct. 26, 2018, now Pat. No. 10,620,084, which is a continuation-in-part of application No. 16/165,517, filed on Oct. 19, 2018, now Pat. No. 10,733,334, which is a continuation-in-part of application No. 16/161,823, filed on Oct. 16, 2018, now Pat. No. 10,467,353, which is a continuation-in-part of application No. 15/716,133, filed on Sep. 26, 2017, now Pat. No. 10,025,887, and a continuation-in-part of application No. 15/703,310, filed on Sep. 13, 2017, said application No. 16/165,517 is a continuation-in-part of application No. 16/142,275, filed on Sep. 26, 2018, now Pat. No. 10,433,112, which is a continuation-in-part of application No. 15/887,637, filed on Feb. 2, 2018, which is a continuation-in-part of application No. 15/716,133, filed on Sep. 26, 2017, now Pat. No. 10,025,887, and a continuation-in-part of application No. 15/703,310, filed on Sep. 13, 2017, said application No. 16/503,878 is a continuation-in-part of application No. 16/249,574, filed on Jan. 16, 2019, now Pat. No. 10,831,943, which is a continuation-in-part of application No. 16/176,002, filed on Oct. 31, 2018, now Pat. No. 10,268,782.

(60) Provisional application No. 62/531,955, filed on Jul. 13, 2017, provisional application No. 62/531,975, filed on Jul. 13, 2017, provisional application No. 62/462,347, filed on Feb. 22, 2017, provisional application No. 62/712,714, filed on Jul. 31, 2018, provisional application No. 62/793,714, filed on Jan. 17, 2019.

(51) Int. Cl.
*G06Q 10/06* (2012.01)
*G06T 19/00* (2011.01)
*G02B 27/01* (2006.01)
*G06T 7/00* (2017.01)

(52) U.S. Cl.
CPC .......... *G06Q 10/06* (2013.01); *G06T 19/006* (2013.01); *G02B 27/017* (2013.01); *G06T 7/00* (2013.01); *G06T 2210/04* (2013.01)

(58) Field of Classification Search
USPC ....................................................... 345/633
See application file for complete search history.

(56) References Cited

U.S. PATENT DOCUMENTS

| | | | |
|---|---|---|---|
| 6,006,021 | A | 12/1999 | Tognazzini |
| 6,292,108 | B1 | 9/2001 | Straser et al. |
| 6,321,158 | B1 | 11/2001 | DeLorme et al. |
| 6,853,958 | B1 | 2/2005 | Turin et al. |
| 7,994,981 | B1 | 8/2011 | Farrokhi et al. |
| 8,843,350 | B2 | 9/2014 | Jacobi et al. |
| 8,996,156 | B2 | 3/2015 | Melzer-Jokisch et al. |
| 9,008,979 | B2 | 4/2015 | Miura |
| 9,064,219 | B2 | 6/2015 | Hall et al. |
| 9,342,928 | B2 | 5/2016 | Rasane et al. |
| 9,703,517 | B2 | 7/2017 | Andolina |
| 9,772,396 | B2 | 9/2017 | Liao et al. |
| 10,025,887 | B1 | 7/2018 | Santarone et al. |
| 10,054,914 | B2 | 8/2018 | Vartiainen et al. |
| 10,149,141 | B1 | 12/2018 | Stamatakis et al. |
| 10,222,301 | B2 | 3/2019 | Silva et al. |
| 2002/0095269 | A1 | 7/2002 | Natalini et al. |
| 2002/0181405 | A1 | 12/2002 | Ying |
| 2003/0110001 | A1 | 6/2003 | Chassin et al. |
| 2003/0163440 | A1 | 8/2003 | Tonack |
| 2004/0002786 | A1 | 1/2004 | Sasaki |
| 2004/0119662 | A1 | 6/2004 | Dempski |
| 2004/0122628 | A1 | 6/2004 | Laurie |
| 2005/0165576 | A1 | 7/2005 | Jesmonth |
| 2005/0208951 | A1 | 9/2005 | Annunziato et al. |
| 2005/0275525 | A1 | 12/2005 | Ahmed |
| 2006/0028345 | A1 | 2/2006 | Lee |
| 2007/0296571 | A1 | 12/2007 | Kolen |
| 2008/0319654 | A1 | 12/2008 | Shintani et al. |
| 2009/0097710 | A1 | 4/2009 | Sroka et al. |
| 2009/0189810 | A1 | 7/2009 | Murray |
| 2010/0271263 | A1 | 10/2010 | Moshfeghi |
| 2010/0296075 | A1 | 11/2010 | Hinderling et al. |
| 2011/0047516 | A1 | 2/2011 | Pavan et al. |
| 2011/0153101 | A1 | 6/2011 | Thomas et al. |
| 2012/0087212 | A1 | 4/2012 | Vartanian et al. |
| 2012/0188847 | A1 | 7/2012 | Miyamoto et al. |
| 2012/0204646 | A1 | 8/2012 | Lee et al. |
| 2012/0214507 | A1 | 8/2012 | Vartanian et al. |
| 2012/0296610 | A1 | 11/2012 | Hailemariam et al. |
| 2013/0010103 | A1 | 1/2013 | Ihara et al. |
| 2013/0073059 | A1 | 3/2013 | Brian et al. |
| 2013/0197685 | A1 | 8/2013 | Matsunaga et al. |
| 2013/0201311 | A1 | 8/2013 | Hirakawa |
| 2013/0283529 | A1 | 10/2013 | Hayes et al. |
| 2013/0288719 | A1 | 10/2013 | Alonzo |
| 2013/0297555 | A1 | 11/2013 | Fadell et al. |
| 2013/0345975 | A1 | 12/2013 | Vulcano et al. |
| 2014/0084909 | A1 | 3/2014 | Pagani |
| 2014/0107828 | A1 | 4/2014 | Zhu et al. |
| 2014/0156455 | A1 | 6/2014 | Atwood et al. |
| 2014/0188394 | A1 | 7/2014 | Febonio et al. |
| 2014/0244160 | A1 | 8/2014 | Cragun et al. |
| 2014/0266755 | A1 | 9/2014 | Arensmeier et al. |
| 2014/0274151 | A1 | 9/2014 | Pattabiraman et al. |
| 2014/0277594 | A1 | 9/2014 | Nixon et al. |
| 2014/0368373 | A1 | 12/2014 | Crain et al. |
| 2015/0005903 | A1 | 1/2015 | Worek et al. |
| 2015/0094865 | A1 | 4/2015 | Choi et al. |
| 2015/0116132 | A1 | 4/2015 | Nohra et al. |
| 2015/0121222 | A1 | 4/2015 | Lacaze et al. |
| 2015/0137967 | A1 | 5/2015 | Wedig et al. |
| 2015/0142179 | A1 | 5/2015 | Ito et al. |
| 2015/0177718 | A1 | 6/2015 | Vartiainen et al. |
| 2015/0207316 | A1 | 7/2015 | Saussele et al. |
| 2015/0227123 | A1 | 8/2015 | Laycock et al. |
| 2015/0294506 | A1 | 10/2015 | Bare et al. |
| 2015/0327010 | A1 | 11/2015 | Gottschalk et al. |
| 2015/0347854 | A1 | 12/2015 | Bare et al. |
| 2015/0356786 | A1 | 12/2015 | Bare et al. |
| 2016/0019721 | A1 | 1/2016 | Bare et al. |
| 2016/0026253 | A1 | 1/2016 | Bradski et al. |
| 2016/0026729 | A1 | 1/2016 | Gil et al. |
| 2016/0066068 | A1 | 3/2016 | Schultz et al. |
| 2016/0069675 | A1 | 3/2016 | Banda et al. |
| 2016/0084936 | A1* | 3/2016 | Smith ............... H04M 1/72457 455/456.1 |
| 2016/0091217 | A1 | 3/2016 | Verberkt et al. |
| 2016/0095188 | A1 | 3/2016 | Verberkt et al. |
| 2016/0178383 | A1 | 6/2016 | Mays et al. |
| 2016/0216879 | A1 | 7/2016 | Park et al. |
| 2016/0258760 | A1 | 9/2016 | Beaumont et al. |
| 2016/0284075 | A1 | 9/2016 | Phan et al. |
| 2016/0285416 | A1 | 9/2016 | Tiwari et al. |
| 2016/0323149 | A1 | 11/2016 | Hu et al. |
| 2016/0335731 | A1 | 11/2016 | Hall |
| 2016/0343093 | A1 | 11/2016 | Riland et al. |
| 2016/0343243 | A1 | 11/2016 | Rabb et al. |
| 2016/0379083 | A1* | 12/2016 | Sala ..................... G06T 7/75 345/633 |

(56) References Cited

U.S. PATENT DOCUMENTS

| | | |
|---|---|---|
| 2017/0055126 A1 | 2/2017 | O'Keeffe |
| 2017/0079001 A1 | 3/2017 | Lewis |
| 2017/0115022 A1 | 4/2017 | Grosshart et al. |
| 2017/0131426 A1 | 5/2017 | Sgarz et al. |
| 2017/0169683 A1 | 6/2017 | Ryder |
| 2017/0200312 A1 | 7/2017 | Smith et al. |
| 2017/0234962 A1 | 8/2017 | Yang et al. |
| 2017/0237892 A1 | 8/2017 | Sakai |
| 2017/0286568 A1 | 10/2017 | Dean et al. |
| 2017/0363504 A1 | 12/2017 | Winant et al. |
| 2018/0048693 A1 | 2/2018 | Gulbinas et al. |
| 2018/0075168 A1 | 3/2018 | Tiwari et al. |
| 2018/0101803 A1 | 4/2018 | Tiwari et al. |
| 2018/0102858 A1 | 4/2018 | Tiwari et al. |
| 2018/0113506 A1* | 4/2018 | Hall .................. G02B 27/017 |
| 2018/0130260 A1 | 5/2018 | Schmirler et al. |
| 2018/0131907 A1 | 5/2018 | Schmirler et al. |
| 2018/0159904 A1 | 6/2018 | Hu et al. |
| 2018/0239313 A1 | 8/2018 | Santarone et al. |
| 2018/0239840 A1 | 8/2018 | Santarone et al. |
| 2018/0285482 A1 | 10/2018 | Santos et al. |
| 2018/0328753 A1 | 11/2018 | Stenning et al. |
| 2018/0357823 A1 | 12/2018 | Koniki et al. |
| 2018/0374269 A1 | 12/2018 | Smith |
| 2019/0025905 A1 | 1/2019 | Godina et al. |
| 2019/0057169 A1 | 2/2019 | Santarone et al. |
| 2019/0096232 A1 | 3/2019 | Wedig et al. |
| 2019/0228370 A1 | 7/2019 | Lien |
| 2019/0294834 A1 | 9/2019 | Mountz |
| 2019/0355177 A1 | 11/2019 | Manickam et al. |

FOREIGN PATENT DOCUMENTS

| | | |
|---|---|---|
| GB | 2498177 A | 7/2013 |
| WO | 2008124713 A2 | 10/2008 |
| WO | 2011019810 A1 | 2/2011 |
| WO | 2014204753 A1 | 12/2014 |
| WO | 2016130571 A1 | 8/2016 |
| WO | 2016192916 A1 | 12/2016 |
| WO | 2017149526 A2 | 9/2017 |
| WO | 2017223008 A1 | 12/2017 |

OTHER PUBLICATIONS

Carmelo Scuro et al., IoT for Structural Health Monitoring, Dec. 2018, IEEE Instrumentation & Measurement Magazine, pp. 4-14.

Dong et ai, "Evaluation of the Reliability of RSSI for Indoor localization", 2012, pp. 6. downloaded from the internet https://ieeexplore.ieee.org/documentl6402492 (Year: 2012).

Hu. Wi-Fi Based Indoor Positioning System Using Smartphones. Nov. 2013. [retrieved on Apr. 23, 2018]. Retrieved from the Internet: (91 pages total).

International Search Report and Written Opinion dated May 14, 2018 issued in connection with corresponding International Application No. PCT/US2018/019154 (10 pages total).

International Search Report and Written Opinion dated May 7, 2018 issued in connection with corresponding [International Application No. PCT/US2018/019185 (7 pages total).

Khemapech et al., Bridge Structural Monitoring and Warning System Aplication in Thailand—Experiences Learned, 2017, TRON Forum ISBN 978-4-89362-330-0, pp. 1-8.

Kyle, "Property Management" Dearborn Real Estate, 2000—Business & Economics, pp. 40-41.

Wang et al. A wireless structural health monitoring system with multithreaded sensing devices: design and validation. ∩ In: Structure and Infrastructure Engineering. Feb. 16, 2007 (Feb. 16, 2007) Retrieved on Jul. 21, 2019 (Jul. 21, 2019) from entire document.

Wang et al. Performance Evaluation of Automatically Generated BIM from Laser Scanner Data for Sustainability Analyses. 2015. [retrieved on Apr. 23, 2018]. Retrieved from the Internet: . (8 pages total).

Yang et ai, "Wi Fi-Based Indoor Positioning", 2015, pp. 150-157 downloaded from the internet I EEE.com databases. (Year: 2015).

\* cited by examiner

```
┌─────────────────────────────────────────────────────────────────────┐
│  SPECIFY DEPLOYMENT ASPECTS FOR A COMMERCIAL STRUCTURE IN A VIRTUAL MODEL │
│                                                                 401 │
└─────────────────────────────────────────────────────────────────────┘
                                    │
┌─────────────────────────────────────────────────────────────────────┐
│   DESIGN A COMMERCIAL STRUCTURE FOR DEPLOYMENT ON A REAL ESTATE PARCEL │
│                     WITH PHYSICAL GEOLOCATION                       │
│                                                                 402 │
└─────────────────────────────────────────────────────────────────────┘
                                    │
┌─────────────────────────────────────────────────────────────────────┐
│   MODEL PERFORMANCE ASPECTS OF ONE OR MORE MACHINES CAPABLE OF       │
│      PREFORMING A PROCESS WITHIN THE COMMERCIAL STRUCTURE       403 │
└─────────────────────────────────────────────────────────────────────┘
                                    │
┌─────────────────────────────────────────────────────────────────────┐
│    MODEL THROUGHPUT OF ONE OR MORE PROCESSING STEPS TO BE COMPLETED  │
│                     WITHIN THE COMMERCIAL STRUCTURE                  │
│                                                                 404 │
└─────────────────────────────────────────────────────────────────────┘
                                    │
┌─────────────────────────────────────────────────────────────────────┐
│       RECORD AS BUILT ASPECTS OF THE STRUCTURE AS DIGITAL RECORDS    │
│                                                                 405 │
└─────────────────────────────────────────────────────────────────────┘
                                    │
┌─────────────────────────────────────────────────────────────────────┐
│         IDENTIFY THE COMMERCIAL STRUCTURE VIA A PHYSICAL LOCATION    │
│                                                                 406 │
└─────────────────────────────────────────────────────────────────────┘
                                    │
┌─────────────────────────────────────────────────────────────────────┐
│    POSITION WITHIN THE COMMERCIAL STRUCTURE VIA POSITIONING IDENTIFIERS │
│               INCORPORATED INTO THE COMMERCIAL STRUCTURE             │
│                                                                 407 │
└─────────────────────────────────────────────────────────────────────┘
                                    │
┌─────────────────────────────────────────────────────────────────────┐
│     ACCESS THE VIRTUAL MODEL OF AN ASPECT OF THE AS BUILT COMMERCIAL │
│   STRUCTURE BASED UPON THE POSITION WITHIN THE STRUCTURE AND A DIRECTION, │
│                      HEIGHT AND ANGLE OF VIEW                        │
│                                                                 408 │
└─────────────────────────────────────────────────────────────────────┘
                                    │
┌─────────────────────────────────────────────────────────────────────┐
│           PERFORM AN UPDATE TO THE AS BUILT COMMERCIAL STRUCTURE     │
│                                                                 409 │
└─────────────────────────────────────────────────────────────────────┘
                                    │
┌─────────────────────────────────────────────────────────────────────┐
│    RECORD AND REPRESENT THE UPDATE IN THE VIRTUAL COMMERCIAL MODEL   │
│                                                                 410 │
└─────────────────────────────────────────────────────────────────────┘
```

FIG. 4A

```
┌─────────────────────────────────────────────────────────────────────┐
│  POSITIONING MACHINE CAPABLE OF PERFORMING A PROCESS IN A COMMERCIAL│
│                          STRUCTURE                              421 │
└─────────────────────────────────────────────────────────────────────┘
                                   │
┌─────────────────────────────────────────────────────────────────────┐
│        ASSOCIATING A UNIQUE IDENTIFIER WITH THE MACHINE         422 │
└─────────────────────────────────────────────────────────────────────┘
                                   │
┌─────────────────────────────────────────────────────────────────────┐
│  INTERFACING WITH A MODEL SYSTEM TO ADD THE UNIQUE ID FOR THE MACHINE│
│                         TO THE MODEL                            423 │
└─────────────────────────────────────────────────────────────────────┘
                                   │
┌─────────────────────────────────────────────────────────────────────┐
│          REGISTERING THE MACHINE AS INSTALLED INTO THE MODEL        │
│                                                                 424 │
└─────────────────────────────────────────────────────────────────────┘
                                   │
┌─────────────────────────────────────────────────────────────────────┐
│  ACTIVATE AN OPERATIONAL MONITOR TO RECORD ONE OR MORE CONDITIONS OF│
│                  THE MACHINE WHILE OPERATIONAL                  425 │
└─────────────────────────────────────────────────────────────────────┘
                                   │
┌─────────────────────────────────────────────────────────────────────┐
│    TRANSFERRING OPERATIONAL DATA FROM THE MONITOR TO THE AVM MODEL  │
│                                                                 426 │
└─────────────────────────────────────────────────────────────────────┘
                                   │
┌─────────────────────────────────────────────────────────────────────┐
│    GENERATING AN IMPROVEMENT POTENTIAL BASED ON RECORDATION OF THE  │
│                         OPERATIONAL DATA                            │
│                                                                 427 │
└─────────────────────────────────────────────────────────────────────┘
                                   │
┌─────────────────────────────────────────────────────────────────────┐
│  QUERYING THE OPERATIONAL DATA FOR WARRANTY INFORMATION ON THE MACHINE│
│                                                                 428 │
└─────────────────────────────────────────────────────────────────────┘
                                   │
┌─────────────────────────────────────────────────────────────────────┐
│    ORDERING A SERVICE PART AND SCHEDULING A SERVICING VISIT BY THE  │
│           COMMERCIAL STRUCTURE MODELLING CONTROLLER                 │
│                                                                 429 │
└─────────────────────────────────────────────────────────────────────┘
```

FIG. 4C

```
┌─────────────────────────────────────────────────────────────────────────┐
│  GENERATE AN AVM MODEL OF A PROCESSING FACILITY WITH MACHINERY, EQUIPMENT│
│                              AND LAYOUT                                  │
│                                                                      801 │
└─────────────────────────────────────────────────────────────────────────┘
                                    │
┌─────────────────────────────────────────────────────────────────────────┐
│  RECEIVE INTO THE AVM ONE OR BOTH OF SENSOR DATA AND USER INPUT DATA     │
│  INDICATIVE OF ONE OR MORE OF PRODUCTION, YIELDS, CONSUMMABLES, UTILITY  │
│  COSTS, MAINTENANCE AND REPLACEMENT COSTS                                │
│                                                                      802 │
└─────────────────────────────────────────────────────────────────────────┘
                                    │
┌─────────────────────────────────────────────────────────────────────────┐
│     AUTOMATE DATA CONNECTION BETWEEN DEPLOYED FACILITY AND THE AVM MODEL │
│                                                                      803 │
└─────────────────────────────────────────────────────────────────────────┘
                                    │
┌─────────────────────────────────────────────────────────────────────────┐
│              ACCESS HISTORICAL OF SAME AND/OR OTHER AVM MODELS           │
│                                                                      804 │
└─────────────────────────────────────────────────────────────────────────┘
                                    │
┌─────────────────────────────────────────────────────────────────────────┐
│  INTEGRATE RELEVANT INDICES, INCLUDING ONE OR MORE OF: GEOGRAPHIC        │
│  LOCATION, LABOR ORGANIZATION, MARKET CONDITIONS, LABOR COSTS, PHYSICAL  │
│  CONDITIONS, PROPERTY STATUS, ETC                                        │
│                                                                      805 │
└─────────────────────────────────────────────────────────────────────────┘
                                    │
┌─────────────────────────────────────────────────────────────────────────┐
│                         BUILD AND DEPLOY COST                            │
│                                                                      806 │
└─────────────────────────────────────────────────────────────────────────┘
                                    │
┌─────────────────────────────────────────────────────────────────────────┐
│                      UTILITY AND CONSUMABLES COST                        │
│                                                                      807 │
└─────────────────────────────────────────────────────────────────────────┘
                                    │
┌─────────────────────────────────────────────────────────────────────────┐
│  PREDICTED AND ACTUAL QUANTIFICATIONS: ENERGY CONSUMPTION, PROCESS       │
│  THROUGHPUT, YIELD, QUALITY, RESOURCE REQUIREMENTS                       │
│                                                                      808 │
└─────────────────────────────────────────────────────────────────────────┘
```

FIG. 8

FIG. 11A
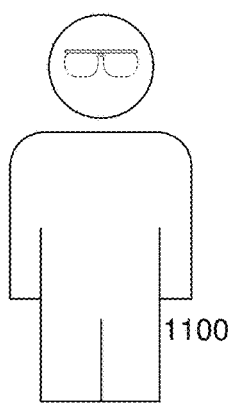
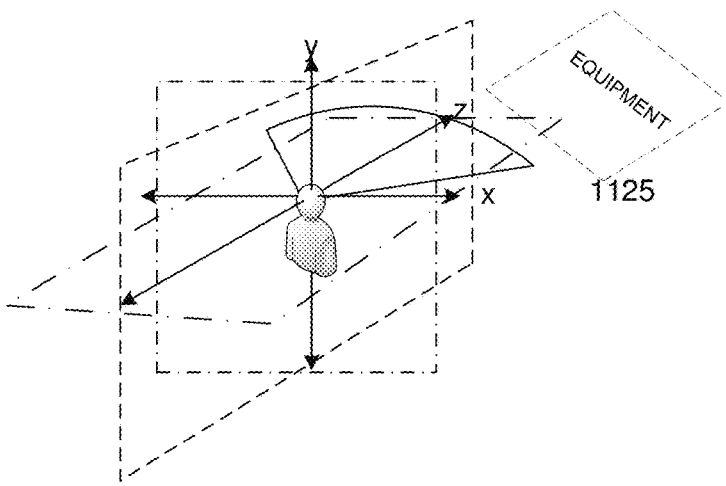
FIG. 11B
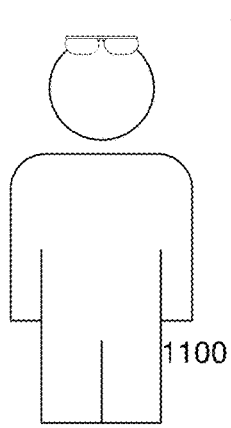
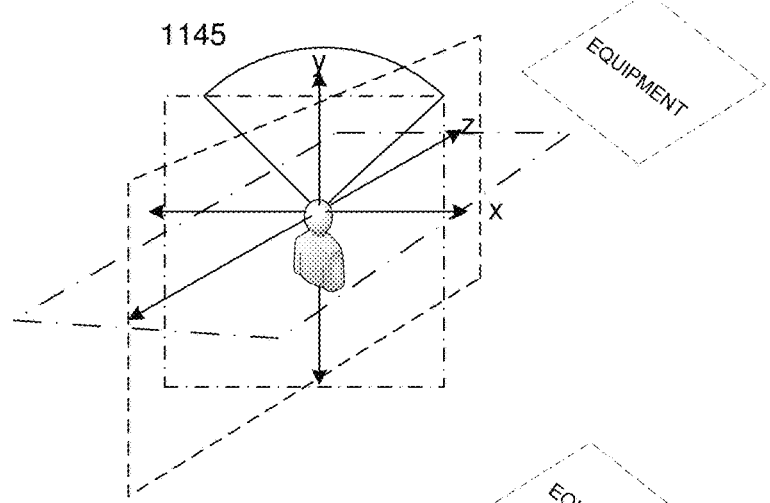
FIG. 11C
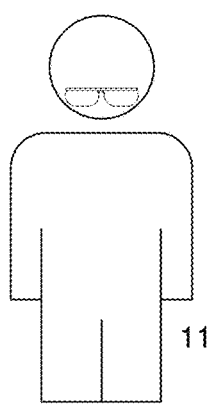
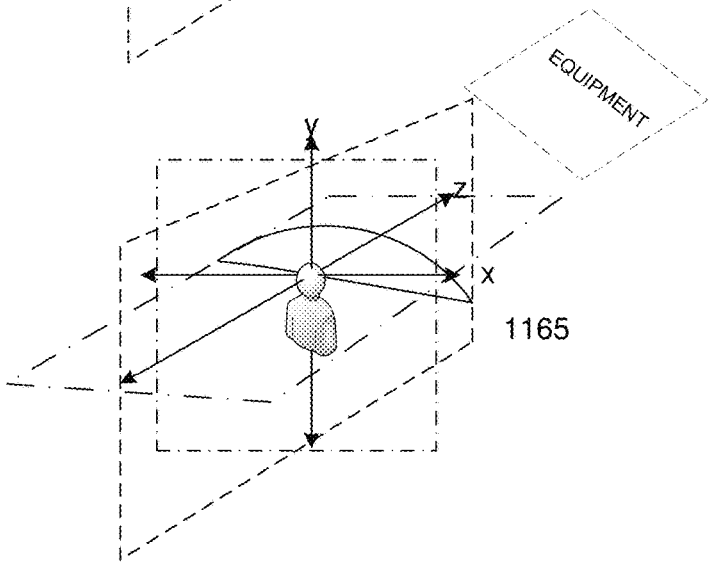

```
┌─────────────────────────────────────────────────────┐
│  SYMPTOMATIC MALFUNCTION DATA WILL BE DIAGNOSED     │
│         TO DETERMINE CAUSE OF MALFUNCTION           │
│  1612                                               │
└─────────────────────────────────────────────────────┘
                           │
┌─────────────────────────────────────────────────────┐
│   TECHNICAL MAINTENANCE DATA, RECORDS, AND          │
│ INSTRUCTIONAL WALKTHROUGH DATA WILL BE RELAYED      │
│                  TO SMART DEVICE                    │
│  1613                                               │
└─────────────────────────────────────────────────────┘
                           │
┌─────────────────────────────────────────────────────┐
│  RESULTS OF PURPOSE FOR A PRESENCE AT A LOCATION    │
│   ARE RECORDED AND ADDED AS EXPERIENTIAL DATA TO    │
│                      THE AVM                        │
│                                                     │
│  1614                                               │
└─────────────────────────────────────────────────────┘
```

FIG. 16A

```
┌─────────────────────────────────────────────────────────┐
│ INTRODUCING A VIBRATION PATTERN INTO A COMPONENT OF     │
│                    THE STRUCTURE                         │
│  1711                                                    │
└─────────────────────────────────────────────────────────┘
                              │
┌─────────────────────────────────────────────────────────┐
│ COMPARING THE VIBRATION PATTERN INTRODUCED WITH A       │
│    PATTERN OF VIBRATION DETECTED BY THE MEMS            │
│  1712                                                    │
└─────────────────────────────────────────────────────────┘
                              │
┌─────────────────────────────────────────────────────────┐
│      TRACKING A SERIES OF TRANSITIONS OF MEMS           │
│              ACCELEROMETER READINGS                      │
│  1713                                                    │
└─────────────────────────────────────────────────────────┘
                              │
┌─────────────────────────────────────────────────────────┐
│ CORRELATING STRUCTURAL INTEGRITY WITH A PATTERN OF      │
│    VIBRATION MEASURED BY THE MEMS ACCELEROMETER         │
│  1714                                                    │
└─────────────────────────────────────────────────────────┘
                              │
┌─────────────────────────────────────────────────────────┐
│ CORRELATING STRUCTURAL STATE OF USE WITH A PATTERN      │
│ OF VIBRATION MEASURED BY THE MEMS ACCELEROMETER         │
│  1715                                                    │
└─────────────────────────────────────────────────────────┘
                              │
┌─────────────────────────────────────────────────────────┐
│   SETTING A THRESHOLD RANGE OF VALUES FOR A SENSOR      │
│  1716                                                    │
└─────────────────────────────────────────────────────────┘
                              │
┌─────────────────────────────────────────────────────────┐
│    EXECUTING AN ALERT ROUTINE BASED UPON A SENSOR       │
│      GENERATING EXCEEDING THE THRESHOLD RANGE           │
│  1717                                                    │
└─────────────────────────────────────────────────────────┘
```

FIG. 17B

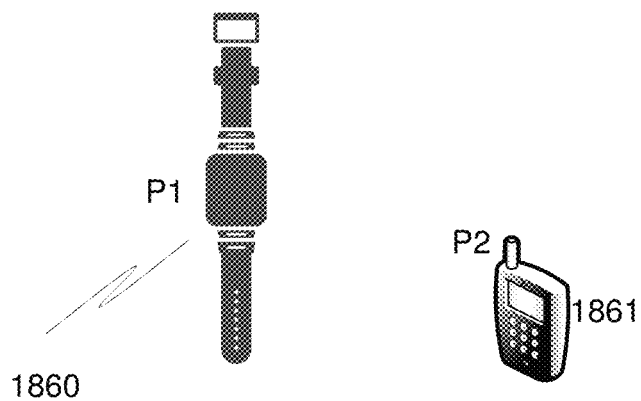
FIG. 18C
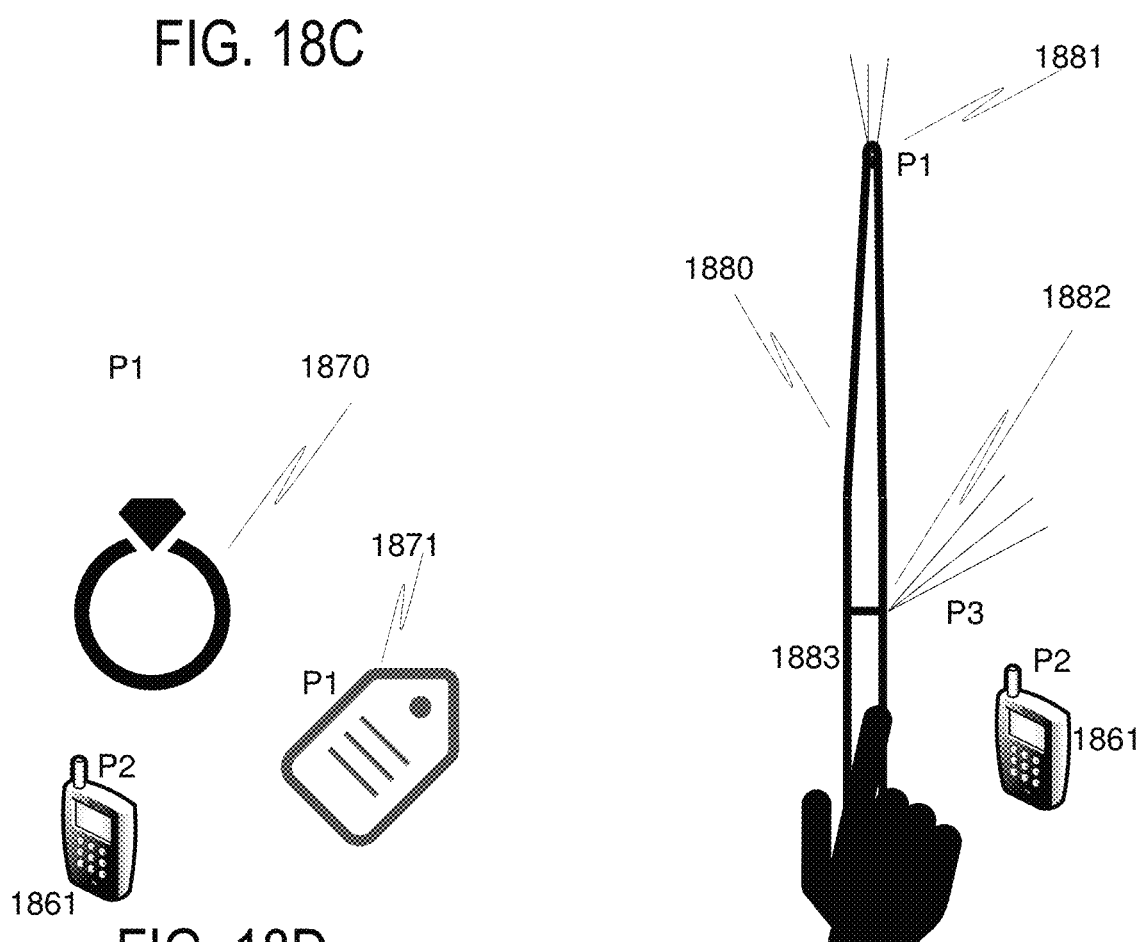
FIG. 18D
FIG. 18E

```
┌─────────────────────────────────────────────────────────────┐
│   INTRODUCING A VIBRATION PATTERN INTO A COMPONENT OF       │
│                      THE STRUCTURE                          │
│  2015                                                       │
└─────────────────────────────────────────────────────────────┘
                              │
┌─────────────────────────────────────────────────────────────┐
│   COMPARING THE VIBRATION PATTERN INTRODUCED WITH A         │
│     PATTERN OF VIBRATION DETECTED BY THE MEMS               │
│  2016                                                       │
└─────────────────────────────────────────────────────────────┘
                              │
┌─────────────────────────────────────────────────────────────┐
│      TRACKING A SERIES OF TRANSITIONS OF MEMS               │
│              ACCELEROMETER READINGS                         │
│  2017                                                       │
└─────────────────────────────────────────────────────────────┘
                              │
┌─────────────────────────────────────────────────────────────┐
│   CORRELATING STRUCTURAL INTEGRITY WITH A PATTERN OF        │
│     VIBRATION MEASURED BY THE MEMS ACCELEROMETER            │
│  2018                                                       │
└─────────────────────────────────────────────────────────────┘
                              │
┌─────────────────────────────────────────────────────────────┐
│   CORRELATING STRUCTURAL CONDITION WITH A PATTERN OF        │
│     VIBRATION MEASURED BY THE MEMS ACCELEROMETER            │
│  2019                                                       │
└─────────────────────────────────────────────────────────────┘
                              │
┌─────────────────────────────────────────────────────────────┐
│ SETTING A THRESHOLD RANGE OF VALUES FOR A SENSOR AND        │
│    EXECUTING METHOD STEPS BASED UPON A SENSOR               │
│    GENERATING EXCEEDING THE THRESHOLD RANGE                 │
│  2020                                                       │
└─────────────────────────────────────────────────────────────┘
```

FIG. 20A

```
┌─────────────────────────────────────────────────────────────────────────────┐
│  CALCULATE A LOCATION OF A FIRST POSITION TRANSCEIVER SUPPORTED BY AN AGENT │
│          BASED UPON WIRELESS COMMUNICATION WITH A REFERENCE POSITION        │
│  2032                              TRANSCEIVER                              │
└─────────────────────────────────────────────────────────────────────────────┘
                                       │
┌─────────────────────────────────────────────────────────────────────────────┐
│  CALCULATE A LOCATION OF A SECOND POSITION TRANSCEIVER ALSO SUPPORTED BY    │
│   THE AGENT BASED UPON WIRELESS COMMUNICATION WITH A REFERENCE POSITION     │
│  2033                              TRANSCEIVER                              │
└─────────────────────────────────────────────────────────────────────────────┘
                                       │
┌─────────────────────────────────────────────────────────────────────────────┐
│  GENERATE A VECTOR BASED UPON THE LOCATION OF THE FIRST POSITION TRANSCEIVER│
│  2034          AND THE POSITION OF THE SECOND POSITION TRANSCEIVER          │
└─────────────────────────────────────────────────────────────────────────────┘
                                       │
┌─────────────────────────────────────────────────────────────────────────────┐
│                    QUERY A DATABASE BASED UPON THE VECTOR                   │
│  2035                                                                       │
└─────────────────────────────────────────────────────────────────────────────┘
                                       │
┌─────────────────────────────────────────────────────────────────────────────┐
│   GENERATE A USER INTERFACE BASED UPON A RESPONSE TO THE QUERY BASED UPON   │
│                                   THE VECTOR                                │
│  2036                                                                       │
└─────────────────────────────────────────────────────────────────────────────┘
                                       │
┌─────────────────────────────────────────────────────────────────────────────┐
│       DISPLAY THE USER INTERFACE ON A SMART DEVICE ASSOCIATED WITH THE      │
│                                     AGENT                                   │
│  2037                                                                       │
└─────────────────────────────────────────────────────────────────────────────┘
```

FIG. 20C

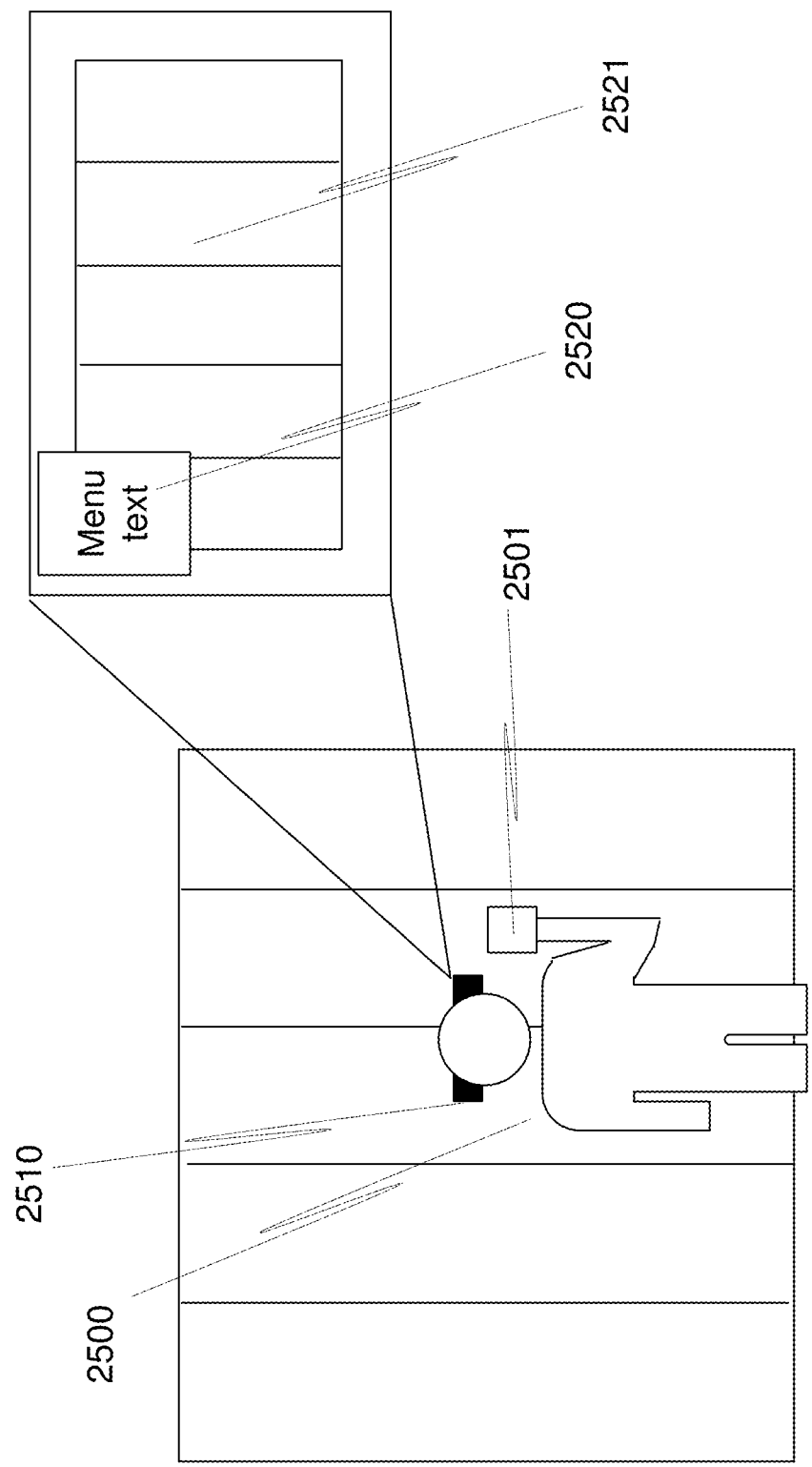

HEADSET APPARATUS FOR DISPLAY OF LOCATION AND DIRECTION BASED CONTENT

CROSS REFERENCE TO RELATED APPLICATIONS

The present application claims priority to Non Provisional patent application Ser. No. 16/504,919, filed Jul. 8, 2019 and entitled METHOD AND APPARATUS FOR POSITION BASED QUERY WITH AUGMENTED REALITY HEADGEAR as a Continuation Application, which in turn claims priority to Non Provisional patent application Ser. No. 15/703,310, filed Sep. 13, 2017 and entitled BUILDING MODEL WITH VIRTUAL CAPTURE OF AS BUILT FEATURES AND OBJECTIVE PERFORMANCE TRACKING as a Continuation in Part Application: and to Non Provisional patent application Ser. No. 15/716,133, filed Sep. 26, 2017 and entitled BUILDING MODEL WITH VIRTUAL CAPTURE OF AS BUILT FEATURES AND OBJECTIVE PERFORMANCE TRACKING as a Continuation in Part Application: and to Provisional Patent Application Ser. No. 62/462,347, filed Feb. 22, 2017 and entitled VIRTUAL DESIGN, MODELING AND OPERATIONAL MONITORING SYSTEM: and to Provisional Patent Application Ser. No. 62/531,955, filed Jul. 13, 2017 and entitled BUILDING MODELING WITH VIRTUAL CAPTURE OF AS BUILT FEATURES; and to Provisional Patent Application Ser. No. 62/531,975 filed Jul. 13, 2017 and entitled BUILDING MAINTENANCE AND UPDATES WITH VIRTUAL CAPTURE OF AS BUILT FEATURES as a continuation in part application; the contents of each of which are relied upon and incorporated herein by reference.

FIELD OF THE INVENTION

The present invention relates to methods and apparatus for determining a direction of interest based upon orientation of headgear. A geospatial position and a direction of interest are referenced to provide content via a user interface in a headgear device. Content in the user interface is based upon the position and direction of interest and may include one or more of: instruction for travel; creation of virtual models including virtual design and virtual operation of a facility; capturing details of a physical build; and performance of a structure modeled.

BACKGROUND OF THE INVENTION

Virtual reality (VR) headgear have been known and used for multiple purposes. However, the use of VR headgear has not been a widely adopted as once predicted. One issue with VR headgear, is that although they can be entertaining and immerse you in a favorite movie or gaming app, Practical use for such headgear has been limited. One reason for restrained utilization of VR headgear is that it is onerous to provide relevant content to such headgear, and user's often just use a tablet or smart phone as a smart device or choice.

In addition, traditional methods of using automated design tools, such as AutoDesk™, have been focused on the generation of a design plan for use in construction of a facility, such as a processing plant. An automated design tool may be advantageous in the specifying of building aspects, materials and placement of features. Aspects may include building features, such as walls, ingress/egress, utilities and even equipment. However, usefulness of the design plan is also limited absent a direction of interest from any given point.

Similarly, while traditional methods of using automated design tools, such as AutoDesk™ have greatly increased the capabilities of virtual models of facilities, very little has been done to quantify a deployed performance of design features, such as equipment layout, capacity, throughout consumables walls, ingress/egress, windows, ceiling designs, textures, building materials, placement of structural beams, utilities, machinery location, machinery type, machinery capacity equipment. Accurate recreation of such design features in the field requires an indication of both location and direction.

More sophisticated design systems include "virtual reality" models. Virtual reality models may include two dimensional and/or three dimensional views from one or more user selected Vantage Points within the model of the structure. Virtual reality models also require a designation of a Vantage Pont and a direction.

SUMMARY OF THE INVENTION

Accordingly, the present invention combines methods and apparatus for displaying content to a user (sometimes referred to herein as an "Agent") via an AV Headgear based upon a geospatial location and direction of orientation of the AV Headgear. In some embodiments, transceivers fixedly attached to AV Headgear are used to determine a location of the AV Headgear. Content may automatically be displayed upon the AV Headgear based upon the AV Headgear's location and direction of orientation as well as a purpose associated with an Agent wearing the AV Headgear.

For example, if the Agent is a technician who is on site to service an equipment item, the AV Headgear may first ascertain a current position of the Agent and provide step by step directions and visual representation of the Agent's location and a direction the Agent is facing. When the HR headgear ascertains that the Agent is in a location proximate to the equipment item, may transition to display of a direction of the equipment relative to a direction the Agent is facing. Upon the Agent facing a correct direction and in a correct position, the AV Headgear may transition to display content including one or more of: a description of the equipment item; service actions to be performed: maintenance records; video training or other related content. The Agent is not required to enter complex queries, since a controller is able to display content automatically based upon a position of the AV Headgear and a direction the headgear is facing. In some embodiments, a position and direction of headgear orientation may also be used to determine content to be displayed upon a smart device carried by the Agent.

In another aspect, the AV Headgear may also be used to generate data descriptive of a location and direction of the headgear. The data descriptive of a location may include image data, laser scan data, Agent annotations (which may be conveyed via voice) audio data and the like.

According to the present invention, a first Transceiver location and a second Transceiver location are generated based upon wireless communications and a directional vector is formed based upon the first Transceiver location and a second Transceiver location. A direction of interest is generated based upon the vector. Content may be provided based upon the location and direction of interest.

The present invention additionally provides for automated apparatus for improved modeling of construction, Deployment and updating of a Structure. The improved modeling is based upon generation of As Built and Experiential Data captured with one or both of Smart Devices and Sensors located in or proximate to the Structure. In some examples, a data capture device such as an infrared stereoscopic camera system, may be attached to a wearable AV Headgear. The stereoscopic camera system may be used for one or both of: capturing imagery of the Structure and determining a distance of the user to a tangible object. In still further examples, a laser three-dimensional scanning system may be affixed to the AV Headgear to capture data such as topography related to the imagery collected. The automated apparatus is also operative to model compliance with one or more performance levels for the Structure related to processing of a Product or for habitation. Still other examples of some embodiments include an Agent supported device pointing towards or touching an item of interest.

In another aspect of the present invention, a virtual model of a Structure extends beyond a design stage of the Structure into an "As Built" stage of a physical embodiment of the Structure and a Deployment stage of the Structure. Generation and analysis of Experiential Data captures conditions realized by the Structure during a Deployment stage of the Structure.

In general, As Built and Experiential Data generated according to the present invention include one or more of: image data; three-dimensional topography; stereoscopic imagery; stereoscopic measurements; vibration patterns; electrical measurements; water consumption; solid state; electrical; and electromechanical devices (or combination thereof); data generation capturing conditions experienced by a Structure. In addition, an Agent may enter data, such as for example, data descriptive of an action taken by a service technician into an Augmented Virtual Model (AVM). As Built and Experiential Data may be aggregated for a single Structure or multiple Structures. Likewise, a Structure may include a single Structure or multiple Structures.

As Built Data is collected that quantifies details of how a specific physical Structure was actually constructed. According to the present invention, a Structure is designed and modeled in a 3D virtual setting. As Built Data is combined with a design model in a virtual setting to generate an AVM. As Built Data may reflect one or more of: fabrication of the Structure; repair; maintenance; upgrades; improvements; and work order execution associated with the Structure. In preferred embodiments, As Built Data is displayed to a user via an AV Headgear, which may also be worn by the user in the Structure itself. In some embodiments, when worn by a user, the Headgear may also be used to access and display data with minimal user interaction required. The AV Headgear may also further study the Structure and gather updated data quantifying or qualifying aspects of the Structure. Some embodiments may also provide real-time display of the results of the study.

In addition, Experiential Data may be generated and entered into the AVM of the Structure. Experiential Data may include data indicative of a factor that may be tracked and/or measured in relation to the Structure. Experiential Data is typically generated by Sensors in or proximate to the Structure and may include, by way of non-limiting example, one or more of: vibration Sensors (such as piezo-electro devices); accelerometers; force transducers; temperature sensing devices; amp meters, ohmmeters, switches, motion detectors; light wavelength capture (such as infrared temperature profile devices), water flow meters; air flow meters; and the like. Three-dimensional laser scanning systems may be employed to capture topography of surfaces. Stereoscopic camera systems may be used to gather and/or improve three-dimensional capture of data and distance measurements. AV Headgear worn by a user may be used for alignment of the data to an oriented direction with a result presented to a user following incorporation into an AVM. In some embodiments, presentation to a user may be in real-time or near-real-time, depending on the level of processing of the data involved.

Some examples of Experiential Data may include: details of operation of equipment or machinery in the Structure; vibration measurements; electrical current draws; machine run times, machine run rates, machine run parameters; interior and/or exterior temperatures; opening and closings of doors and windows; weight loads; preventive maintenance; cleaning cycles; air circulation; mold contents; thermal profiles and the like. A variety of Sensors and technologies may be used to capture empirical data during construction of the Structure and during Deployment of the Structure. By way of additional example, it may be determined that water consumption in a particular Structure, or a particular class of structures, will be analyzed to determine if it is prudent to make modifications to the Structure or class of Structures. The automated apparatus of the present invention will include As Built Data for features of a Structure that is accessed while modeling proposed modifications and upgrades. Relevant As Built Features may include features for which relevancy may seem obvious, such as, for example, one or more of: utility requirements, electrical, disposal, air handling equipment, filtering; plumbing; and efficiency.

In addition, other As Built Features, for which relevancy may not seem obvious, but which unstructured queries draw a correlation may also be included.

Location of appliances, equipment, machines and utilities relative to other appliances, equipment, machines and utilities may also be deemed relevant by unstructured query analysis. An unstructured query of captured data quantifying actual electrical, gas, chemical, atmosphere, and water usage may determine that certain configurations better meet an objective than others. For example, it may later be determined that a particular Structure design is more likely to have a consistent internal temperature, lighting, ambient particulate or other trends than others.

As discussed more fully below, captured data may include empirical quantifications of a number of times a piece of machinery or equipment cycles on and off, vibrations within a Structure, temperature within a Structure, doors opening and closing, quantity of products processed, hours of occupancy of the Structure and other variable values. Captured data may also be used to generate a determination of how a Structure is being used, such as residential, short-term residential, manufacturing, production cycles, quality, yield, rates, volumes, etc. As discussed more fully below, empirical Sensor data associated with how particular humans and/or automatons behave within a Structure may also be correlated with Structure Performance based upon who occupies a particular Structure, when they occupy the Structure, and for how long.

In another aspect, an automated apparatus may combine a design model of a Structure with precise additions based upon data capture of features actually built into the Structure. This allows for service calls that may include one or more of: repairs, upgrades, modifications and additions (hereinafter generally referred to as "Service Call"), to access data indicating an AVM combined with precise features included in a building represented by As Built Data, as well as Experiential Data and technical support for the features, maintenance logs and schedules, "how to" documentation and video support, virtual connection to specialists and experts, and a time line of original As Built details and subsequent modifications. Modifications may include repairs, updates, and/or additions to a Structure. Additionally, emergency responders may access the AVM while responding to an emergency.

The improved methods taught herein provide for the performance of repairs, maintenance and upgrades via access to the AVM that incorporates "As Built" data with Geolocation and direction. AVM representations of a Structure including "As Built Imagery" accurately indicate locations and types of features and also provide images or other captured data. Exemplary data may include As Built locations of structural components (beams, headers, doorways, windows, rafters etc.); HVAC, electrical, plumbing, machinery, equipment, etc. Virtual repair may include "how to" instructions and video, technical publications, visual models comprised of aggregated data of similar repair orders, and the like. An onsite technician or other Agent may verify a correct location of an equipment item based upon wireless orienteering apparatus and techniques.

An AVM may additionally include virtual operation of equipment and use of modeled Structure based upon aggregated data from one or more As Built structures. Upon conclusion of a repair, maintenance, upgrade or addition, additional information quantifying time, place, nature of procedure, parts installed, equipment, new component locations, etc. may be captured and incorporated into a virtual model.

Some embodiments of the present invention include capturing data of procedures conducted during preventive maintenance and/or a Service Call and inclusion of relevant data from the Service Call into an AVM. Precise data capture during a Service Call or during construction may include actual locations of building features such as, electrical wiring and components, plumbing, joists, headers, beams and other structural components, as well as other Sensor measurements. Data capture may be ongoing over time as the building is used and modified or updated during the life of a Structure (sometimes referred to herein as the "Operational" or "Deployed" stage of the Structure).

An Operational Stage may include, for example: occupation and use of a Property, as well as subsequent modifications, repairs and Structure improvements. The Property may include one or more modeled structures, such as: a factory, structure, fabrication facility, server farm, power generator facility, an outbuilding, and facilities included in a Property. Smart Devices with unique methods of determining a location and direction of data capture may be utilized to gather data during construction of a Structure and during Deployment of a Structure during an Operational Stage.

In general, a Smart Device controller or other data aggregator may provide ongoing collection of As Built and Deployed data that is captured during construction and Deployment of a Structure. The collected data is further correlated with design data and used to track Performance of features included in a design of a structure and/or features included within the confines of a Property parcel ("Property"). Data may be captured by a wide variety of sensors as described herein including cameras, stereoscopic cameras, laser scanning systems worn by a user in headgear, and other Sensors of various types that generate data translatable into a digital format.

In another aspect, collected data may be used to predict Performance of a Property based upon features built into a Structure and conditions experienced by the Property. As Built Data may include modifications to a Property that are made during a construction phase, and/or during a Deployment phase, and a Property life cycle. Similarly, as Deployed data may include details quantifying one or more of: machine operators, production quantity, yield, quality level, usage, maintenance, repairs and improvements performed on the Property.

In still another aspect of the present invention, predictive analytics may be performed to predict a life of various components included in the Property. Maintenance procedures and replacement of consumables or other parts may also be budgeted and scheduled based upon a correlation of a) design data; b) As Built Data; c) as used data; and d) Experiential Data. In addition, contemplated improvements may be modeled according to an expected return on investment ("ROI"). An expected ROI may be calculated according to one or more of: an objective level of measurements, an amount of a fungible item, such as kilowatt, gallon, currency, volume, or other quantity expended during the life of Deployment; and satisfaction of users and Performance.

Predictive analytics may include monitoring use of equipment and machinery. The monitoring may include data collection that is stored in a controller and analyzed, such as, via artificial intelligence routines and/or unstructured queries. In some embodiments, data gathered during monitoring may be transmitted to a centralized location and aggregated with other similar type buildings, building support equipment (e.g., HVAC, plumbing, electric) and appliances. Analytic profiles may be generated. Predicted Performance and failures may be generated and used to plan a remedial action, such as schedule Service Calls before a physical failure occurs. Profiles may include degrees of usage, consumables, electric current draws, vibration, noise, image capture and the like.

Still another aspect includes generation of VR user interfaces accessing the AVM based upon a) design data; b) As Built Data; c) as used data; d) improvement data; and/or e) Experiential Data. A VR user interface may be accessed as part of one or more of: a maintenance routine; to support a change order for the Property; and to contemplate improvements in a Property. As Built, As Deployed, and/or Experiential Data may include data quantifying repairs and updates to the Property.

In some embodiments, a) design data; b) As Built Data; c) Experiential Data; and d) Lead Actions and Lag Benefit measurements, as they relate to multiple Properties may be aggregated and accessed to support one or more Properties. Access to aggregated data may include execution of artificial intelligence (AI) routines. AI routines may include, by way of non-limiting example; structured algorithms and unstructured queries operative to predict Performance metrics; and maintenance needs. AI routines may access both initial designs and data aggregated during build and Deployment stages of the Property.

AR display systems may be used to display a variety of data pertaining to a Property and/or Structure, and in some embodiments include design data, As Built Data, Experiential Data, and As Deployed Data. In some examples, such AR display systems may be deployed in the field at locations with the facility which has been modeled. The AR display system may be oriented in space by collection of geospatial information by one or more types of systems include WiFi, GPS, cellular, magnetic field monitoring as well as triangulation based on near field communication systems as well as other means. An oriented AV Headgear used on site may provide clear presentation of model data and also may improve the ability to update datasets by collection of new imagery by camera and scanning systems attached to the Headgear.

One general aspect includes a method of collecting site specific geospatially oriented data, the method including the steps of: supporting a receiver capable of receiving logical communications with a AV Headgear; wearing the AV Headgear and perceiving textual information in a display of the AV Headgear; maintaining the AV Headgear at a set position relative to a ground plane, wirelessly receiving a first data set from a first set of multiple reference transmitters into the receiver with the receiver located at a first geospatial position; determining, with a geolocating device upon the AV Headgear, coordinates of the first geospatial position based upon the first data set; and generating a direction of interest relative to the first geospatial position based upon the first data set received wirelessly from the first set of multiple reference transmitters into the receiver. In some embodiments a direction of interest is ascertained based upon movement of the receiver to a second geospatial position. In some embodiments, an AV Headgear may include multiple transceivers spaced apart by a sufficient distance to generate a first geospatial position and a second geospatial position without movement of the Headgear.

Implementations may include one or more of the following features. The method may further include the step of selecting a virtual model of a structure based upon one of the first geospatial position and the second geospatial position, accessing a first virtual position within the virtual model. The method may also include aspects by projecting along a second vector including a direction congruent with the direction of interest, where a length of a second vector is based upon a distance in direction of interest to a first physical item. A first physical item may be, for example, one or more of a machine or an architectural structure or an architectural feature. Implementations may also include a method where a user specifies a distance based upon a drop-down menu of features intersecting a second vector. The method may also include portraying a virtual model from a perspective of a first virtual position in the AV Headgear.

In some examples, there may be methods where a three-dimensional scanner, such as a LIDAR scanner, is attached upon the AV Headgear. In some examples, the method may further include wearing a device attached to a wrist or hand such as a watch or ring respectively. The wearable device being worn includes components with geolocation function. The method may include examples where the wearable device further includes near field communication devices.

The details of one or more examples of the invention are set forth in the accompanying drawings and the description below. The accompanying drawings that are incorporated in and constitute a part of this specification illustrate several examples of the invention and, together with the description, serve to explain the principles of the invention: other features, objects, and advantages of the invention will be apparent from the description, drawings, and claims herein.

DESCRIPTION OF THE DRAWINGS

The accompanying drawings, that are incorporated in and constitute a part of this specification, illustrate several embodiments of the invention and, together with the description, serve to explain the principles of the invention:

FIGS. 4A, 4B, and 4C illustrate exemplary method flow diagrams with steps relating to processes of the present invention.

FIG. 8 illustrates method steps that may be implemented according to some aspects of the present invention.

FIGS. 11A-C illustrates vertical changes in an AVM viewable area according to some aspects of the present invention.

FIGS. 16 and 16A illustrate method steps that may be executed in practicing some embodiments of the present invention.

FIGS. 17A-B illustrates method steps that may be implemented in some embodiments of the present disclosure.

FIG. 18C-18E illustrate devices that may include a Transceiver.

FIGS. 20 and 20A-20C illustrate method steps that may be executed in practicing some embodiments of the present invention.

FIG. 25B illustrates an oriented Headgear in a use mode.

DETAILED DESCRIPTION

Figure 1A:
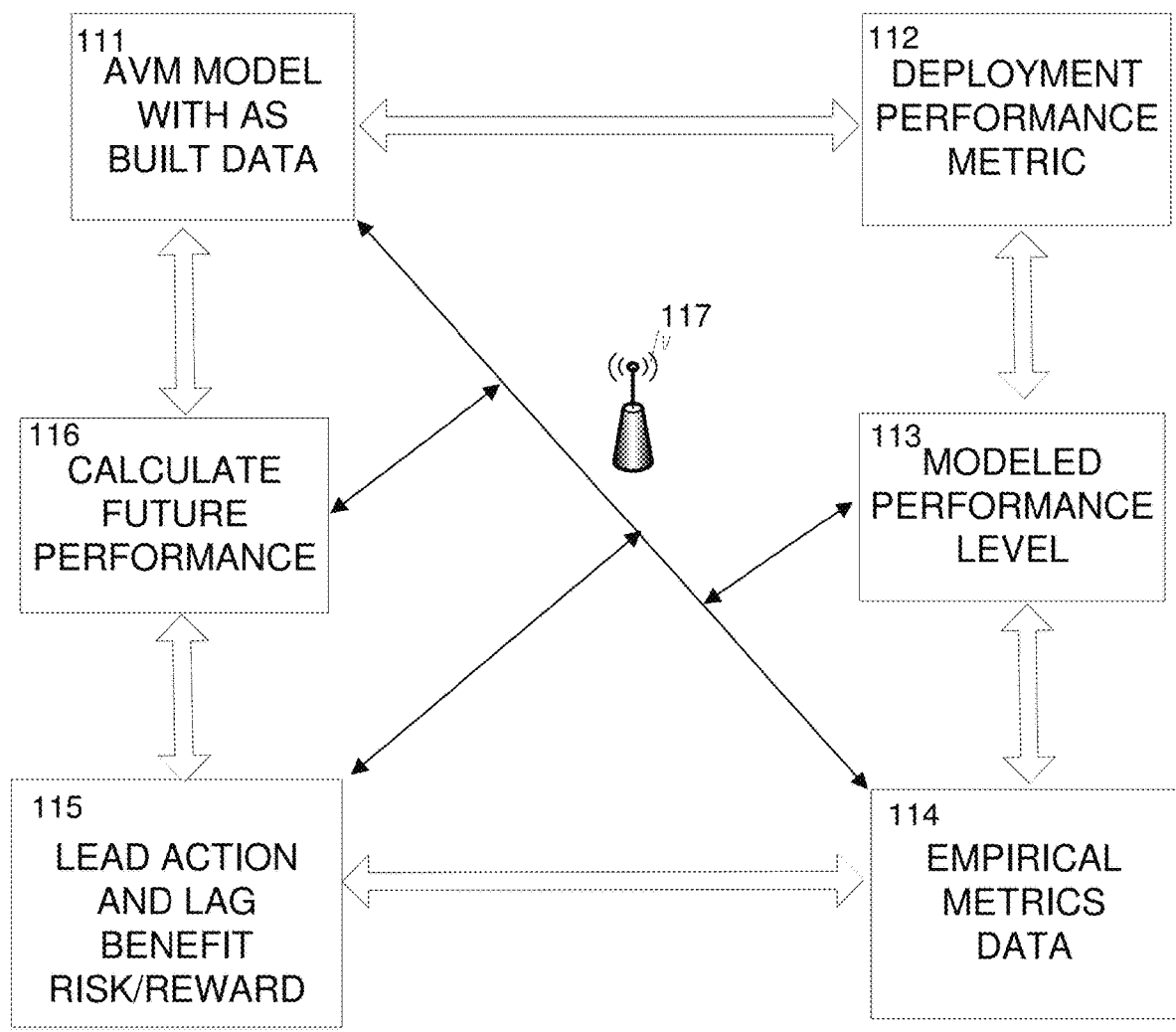
FIG. 1A illustrates a block diagram of inter-relating functions included in automated systems according to the present invention.

The present invention relates to methods and apparatus for orienteering and generation of content to be displayed utilizing Augmented Reality Headgear. Orienteering includes wirelessly determining a position and direction of interest relative to the position. The present invention provides automated apparatus and methods for generating improved Augmented Virtual Models (sometimes referred to herein as an "AVM") of a Structure; including design data, As Built.

In the following sections, detailed descriptions of examples and methods of the invention will be given. The description of both preferred and alternative examples though thorough are exemplary only, and it is understood to those skilled in the art that variations, modifications and alterations may be apparent. It is therefore to be understood that the examples do not limit the broadness of the aspects of the underlying invention as defined by the claims.

The Augmented Virtual Model of the property may include a conceptual model and progress through one or more of: a) a design stage; b) a build stage; c) a Deployment stage; d) a service stage; e) a modification stage; and f) a dispensing stage. As discussed more fully herein, an AVM according to the present invention include original design data matched to As Built data captured via highly accurate geolocation, direction and elevation determination. As Built data is matched with a time and date of data acquisition and presented in two dimensional (2D) and three dimensional (3D) visual representations of the property. The augmented models additionally include data relating to features specified in a property design and data collected during building, Deployment, maintenance and modifications to the property. In some embodiments, a fourth dimension of time may also be included.

An Augmented Virtual Model includes a three or four dimensional model in a virtual environment that exists parallel to physical embodiments modeled in the Augmented Virtual Model. Details of one or more physical structures and other features within a real estate parcel are generated and quantified and represented in the Augmented Virtual Model. The Augmented Virtual Model exists in parallel to a physical structure in that the AVM includes virtual representations of physical structures and additionally receives and aggregates data relevant to the structures over time. The aggregation of data may be one or more of: a) according to an episode (i.e. onsite inspection, repair, improvement etc.); b) periodic; and c) in real time (without built in delay).

The experience of the physical structure is duplicated in the virtual Augmented Virtual Model. The Augmented Virtual Model may commence via an electronic model generated via traditional CAD software or other design type software. In addition, the AVM may be based upon values for variables, including one or more of: usage of a structure; usage of components within the structure; environmental factors encountered during a build stage or Deployment stage; and metrics related to Performance of the structure. The metrics may be determined, for example, via measurements performed by Sensors located in and proximate to structures located on the property.

In another aspect, an Augmented Virtual Model may be accessed in relation to modeling achievement of a stated Performance Level. Accurate capture of As Built Features and aggregated data of similar buildings, equipment types, machinery and usage profiles assist in one or more of: predicting Performance Level, Yield, Quality, Volume of Production, selecting appropriate technicians to deploy to a service call; providing correct consumables and replacement parts, scheduling a preventative maintenance; scheduling building, equipment and/or machinery upgrades; matching a building, equipment and machinery combination of a particular type of Deployment; providing on site guidance during the Service Call; providing documentation relevant to the building, equipment and machinery; providing access to remote experts that guide onsite technicians.

In some embodiments, a technical library specific to a particular property and location within the property may be maintained for each property and made accessible to an onsite technician and/or remote expert. The library may include, but is not limited to: structure, equipment/machinery manuals; repair bulletins, and repair/maintenance. Appropriate how to videos may also be made available based upon an AVM with As Built and Experiential Data.

In another aspect, a parts ordering function may be included in the Augmented Virtual Model. Augmented parts ordering may allow a technician to view an ordered part and view a virtual demonstration of the part in use and procedures for replacing the part.

Aspects of the Augmented Virtual Model may be presented via a user interface that may display on a tablet or other flat screen, or in some embodiments be presented in a virtual reality environment, such as via a virtual reality headset.

The present invention additionally provides for an Augmented Virtual Model to forecast Future Performance of a property based upon the values of variables included in data aggregated during the design, build and Deployment of the property sometimes referred to herein as: a) Design Features; b) As Built data; and c) as Deployed data.

The improved modeling system incorporates "As Built" data into the improved design model. Subsequently, an onsite or remote technician may access the As Built data to facilitate. The As Built data is generated and/or captured via highly accurate geolocation, direction and elevation determination. Based upon the geolocation, direction and elevation determination, As Built data is incorporated into a design model at a precise location within the AVM. In some embodiments, a time and date of data acquisition may be associated with updates to aspects of the improved AVM such that a chronology of changes exists within the AVM.

Original design aspects and updated design aspects may be presented in two dimensional (2D) and three dimensional (3D) visual representations of the property. The present invention provides for systematic updates to As Built data during a Deployment of the property. Updated data may verify and/or correct previously included data and also be used to memorialize modifications made during a Service Call or modification to a property.

Some exemplary embodiments may include updates to an AVM that include, one or more of: quantifying a make and model of equipment and machinery on site; time and date notation of change in location specific data; Model accessed and/or updated according to XYZ and distance data; XY data may include high level location designation within the street address via triangulation (i.e. such as a street address) and highly specific position designation (i.e. particular room and wall); combination of two types of position data; GPS, Differential GPS; references used during triangulation; aggregate data across multiple structures for reference; designs that perform well; designs that fail; popularity of various aspects; access to and/or generation of, multiple Augmented Virtual Models; original and modified model versions; index according to date/time stamp; index according to feature; index according to popularity; index according to cost; index according to User specific query; plumbing; electrical; HVAC; chemical, raw material, structural; access areas (i.e. crawl spaces, attics); periodic data and position capture with camera/Sensor attached to a fixed position; and during one or more of: repair/maintenance/updates.

Accordingly, actual "As Built" imagery and location data is incorporated into the design model to accurately indicate a location and type of feature included in a structure, and provide "pictures" or other captured data. Exemplary data may include As Built locations of structural components (beams, headers, doorways, windows, rafters etc.); HVAC, electrical, plumbing, machinery, equipment, etc. A virtual reality model may additionally include virtual operation of machinery and equipment and use of a Processing Facility based upon aggregated data from the structure, as well as annotations and technical specifications relating to features included in the As Built model of a Processing Facility identified by time, date, geolocation and direction.

In some embodiments, an initial digital model may be generated according to known practices in the industry. However, unlike previously known practices, the present invention associates an initial digital model with a unique identifier that is logically linked to a geolocation and one or both of date and time designation, and provides updates to the original model based upon data captured at the geolocation during a recorded timeframe. In this manner, a Virtual Reality Simulation is generated that logically links a digital model to a specific geographic location and actual As Built data at the specific geographic location. The updated model may be virtually accessed from multiple locations such as a field office, onsite, a technical expert, a financial institution, or other interested party.

In some preferred embodiments, the geographic location will be provided with accurately placed location reference points. The location reference points may be accessed during activities involved in a Service Call on the property, such as a repair or upgrade to a structure or other structures included within a property parcel surrounding the structure. Accuracy of the reference points may or may not be associated with location relevance beyond the property, however they do maintain accuracy within the property.

Preferred embodiments may also include reference points accurately placed within a structure Processing Facility located on the property. As further discussed below, the reference points may include, by way of non-limiting example, a wireless transmission data transmitter operative to transmit an identifier and location data; a visual identifier, such as a hash code, bar code, color code or the like; an infrared transmitter; a reflective surface, such as a mirror; or other means capable of providing a reference point to be utilized in a triangulation process that calculates a precise location within the structure or other structure.

Highly accurate location position may be determined via automated apparatus and multiple levels of increasingly accurate location determination. A first level may include use of a GPS device providing a reading to first identify a property. A second level may use position transmitters located within, or proximate to, the property to execute triangulation processes in view of on-site location references. A GPS location may additionally be associated with a high level general description of a property, such as, one or more of: an address, a unit number, a lot number, a taxmap number, a county designation, Platte number or other designator. On-site location references may include one or more of: near field radio communication beacons at known X-Y position reference points; line of sight with physical reference markers; coded via ID such as Bar Code, Hash tag, and alphanumeric or other identifier. In some embodiments, triangulation may calculate a position within a boundary created by the reference points to within millimeter range. In some embodiments, Differential GPS may be used to accurately determine a location of a Smart Device with a sub centimeter accuracy.

In addition to a position determination, such as latitude and longitude, or other Cartesian Coordinate (which may sometimes be indicated as an "X and Y" coordinate) or GPS coordinate, the present invention provides for a direction (sometimes referred to herein as a "Z" direction and elevation) of a feature for which As Built data is captured and imported into the AVM.

According to the present invention, a direction dimension may be based upon a movement of a device. For example, a device with a controller and an accelerometer, such as mobile Smart Device, may include a user display that allows a direction to be indicated by movement of the device from a determined location acting as a base position towards an As Built feature in an extended position. In some implementations, the Smart Device may first determine a first position based upon triangulation with the reference points and a second position (extended position) also based upon triangulation with the reference points. The process of determination of a position based upon triangulation with the reference points may be accomplished, for example via executable software interacting with the controller in the Smart Device, such as, for example via running an app on the Smart Device.

In combination with, or in place of directional movement of a device utilized to quantify a direction of interest to a user, some embodiments may include an electronic and/or magnetic directional indicator that may be aligned by a user in a direction of interest. Alignment may include, for example, pointing a specified side of a device, or pointing an arrow or other symbol displayed upon a user interface on the device towards a direction of interest.

In a similar fashion, triangulation may be utilized to determine a relative elevation of the Smart Device as compared to a reference elevation of the reference points.

It should be noted that although a Smart Device is generally operated by a human user, some embodiments of the present invention include a controller, accelerometer, data storage medium, Image Capture Device, such as a Charge Coupled Device ("CCD") capture device and/or an infrared capture device being available in a handheld or unmanned vehicle.

An unmanned vehicle may include for example, an unmanned aerial vehicle ("UAV") or ground level unit, such as a unit with wheels or tracks for mobility and a radio control unit for communication.

In some embodiments, multiple unmanned vehicles may capture data in a synchronized fashion to add depth to the image capture and/or a three dimensional and 4 dimensional (over time) aspect to the captured data. In some implementations, UAV position will be contained within a perimeter and the perimeter will have multiple reference points to help each UAV (or other unmanned vehicle) determine a position in relation to static features of a building within which it is operating and also in relation to other unmanned vehicles. Still other aspects include unmanned vehicles that may not only capture data but also function to perform a task, such as paint a wall, drill a hole, cut along a defined path, or other function. As stated throughout this disclosure, the captured data may be incorporated into the virtual model of a Processing Facility.

In another aspect, captured data may be compared to a library of stored data using image recognition software to ascertain and/or affirm a specific location, elevation and direction of an image capture location and proper alignment with the virtual model. Still other aspects may include the use of a compass incorporated into a Smart Device.

In still other implementations, a line of sight from a Smart Device, whether user operated or deployed in an unmanned vehicle, may be used to align the Smart Device with physical reference markers and thereby determine an XY position as well as a Z position. Electronic altitude measurement may also be used in place of, or to supplement, a known altitude of a nearby reference point. This may be particularly useful in the case of availability of only a single reference point.

Reference points may be coded via identifiers, such as a UUID (Universally Unique Identifier), or other identification vehicle. Visual identifiers may include a bar code, hash tag, Alphanumeric or other symbol. Three dimensional markers may also be utilized.

By way of non-limiting example, on site data capture may include designation of an XYZ reference position and one or more of: image capture; infra-red capture; Temperature; Humidity; Airflow; Pressure/tension; Electromagnetic reading; Radiation reading; Sound readings (i.e. level of noise, sound pattern to ascertain equipment running and/or state of disrepair), and other vibration or Sensor readings (such as an accelerometer or transducer).

In some embodiments, vibration data may be used to profile use of the building and/or equipment and machinery associated with the building. For example, vibration detection may be used to determine a machine operation, including automated determination between proper operation of a piece of equipment and/or machinery and faulty operation of the equipment and/or machinery. Accelerometers may first quantify facility operations and production speed and/or capacity during operations. Accelerometers may also detect less than optimal performance of equipment and/or machinery. In some embodiments. AI may be used to analyze and predict proper operation and/or equipment/machinery failure based upon input factors, including vibration patterns captured. Vibrations may include a "signature" based upon machine type and location within a structure human related activity, such as, by way of non-limiting example: machine and foot traffic, physical activities, machine operations, machine failure, raised voices, alarms and alerts, loud music, running, dancing and the like, as well as a number of machines and/or people in the building and a calculated weight and mobility of the people.

Vibration readings may also be used to quantify operation of machinery and equipment associated with the building, such as HVAC, circulators and water pumps. Vibration data may be analyzed to generate profiles for properly running equipment and equipment that may be faulty and/or failing. The improved virtual model of the present invention embodied as an AVM may be updated, either periodically or on one off occasions, such as during a service call or update call.

In some embodiments, a fourth dimension in addition to an XYZ dimension will include date and time and allow for an historical view of a life of a structure to be presented in the virtual model. Accordingly, in some embodiments, onsite cameras and/or Sensors may be deployed and data may be gathered from the on-site cameras and Sensors either periodically or upon command. Data gathered may be incorporated into the improved virtual model.

In still another aspect, the AVM may aggregate data across multiple properties and buildings. The aggregated data may include conditions experienced by various buildings and mined or otherwise analyzed, such as via artificial intelligence and unstructured queries. Accordingly, the AVM may quantify reasons relating to one or more of: how to reposition machines, route workflow or otherwise improve, designs that work well; designs that fail; popular aspects; generate multiple Virtual Models with various quantified features; original and modified model versions and almost any combination thereof.

Although data may be gathered in various disparate and/or related ways, an aggregate of data may be quickly and readily accessed via the creation of indexes. Accordingly, indexes may be according to one or more of: date/time stamp; feature; popularity; cost; User specific query; Plumbing; Electrical; HVAC; Structural aspects; Access areas; Periodic data and position capture with camera/Sensor attached to a fixed position; during construction; during modification; during Deployment; HVAC; machinery; traffic flows during use of structure; audible measurements for noise levels; and almost any other aspect of captured data.

In another aspect, an Augmented Virtual Model may receive data descriptive of generally static information, such as, one or more of: product specifications, building material specifications, product manuals, and maintenance documentation.

Generally static information may be utilized within the Augmented Virtual Model to calculate Performance of various aspects of a property. Dynamic data that is captured during one of: a) design data; b) build data; and c) deployed data, may be used to analyze actual Performance of a property and also used to update an Augmented Virtual Model and increase the accuracy of additional predictions generated by the Augmented Virtual Model. Maintenance records and supporting documentation may also be archived and accessed via the AVM. A variety of Sensors may monitor conditions associated with one or both of the structure and the parcel. The Sensors and generated data may be used to extrapolate Performance expectations of various components included in the Augmented Virtual Model. Sensor data may also be aggregated with Sensor data from multiple Augmented Virtual Model models from multiple structures and/or properties and analyzed in order to track and/or predict Performance of a structure or model going forward.

Glossary

"Agent" as used herein refers to a person or automation capable of supporting a Smart Device at a geospatial location relative to a Ground Plane.

"Ambient Data" as used herein refers to data and data streams captured in an environment proximate to a Vantage Point and/or an equipment item that are not audio data or video data. Examples of Ambient Data include, but are not limited to Sensor perception of: temperature, humidity, particulate, chemical presence, gas presence, light, electromagnetic radiation, electrical power, moisture and mineral presence.

"Analog Sensor" and "Digital Sensor" as used herein include a Sensor operative to quantify a state in the physical world in an analog representation.

"As Built" as used herein refers to details of a physical structure associated with a specific location within the physical structure or parcel and empirical data captured in relation to the specific location.

"As Built Features" as used herein refers to a feature in a virtual model or AVM that is based at least in part upon empirical data captured at or proximate to a correlating physical location of the feature. Examples of As Built Features include placement of structural components such as a wall, doorway, window, plumbing, electrical utility, machinery and/or improvements to a parcel, such as a well, septic, electric or water utility line, easement, berm, pond, wet land, retaining wall, driveway, right of way and the like.

"As Built Imagery" (Image Data) as used herein shall mean image data generated based upon a physical aspect.

"Augmented Virtual Model" (sometimes referred to herein as "AVM"): as used herein is a digital representation of a real property parcel including one or more three dimensional representations of physical structures suitable for use and As Built data captured descriptive of the real property parcel. An Augmented Virtual Model includes As Built Features of the structure and may include improvements and features contained within a Processing Facility.

"AV Headgear" as used herein shall mean an apparatus wearable on a person's head and including a display viewable by the person while wearing the apparatus.

"Property" as used herein shall mean one or more real estate parcels suitable to be modeled in an AVM."

"Directional Indicator" as used herein shall mean a quantification of a direction generated via one or both of: analogue and digital indications.

"Directional Image Data" as used herein refers to image data captured from a Vantage Point with reference to a direction. Image data may include video data.

"Directional Audio" as used herein refers to audio data captured from a Vantage Point within or proximate to a property and from a direction.

"Deployment" as used herein shall mean the placement of one or more of: a facility machinery and an equipment item into operation.

"Deployment Performance" as used herein shall mean one or both of: objective and subjective quantification of how one or more of: facility, machinery and an equipment item operated, which may be depicted in an AVM.

"Design Feature" as used herein, shall mean a value for a variable descriptive of a specific portion of a property. A Design Feature may include, for example, a size and shape of a structural element or other aspect, such as a doorway, window or beam; a material to be used, an electrical service, a plumbing aspect, a data service, placement of electrical and data outlets; a distance, a length, a number of steps; an incline; or other discernable value for a variable associated with a structure or property feature.

"Digital Sensor" as used herein includes a Sensor operative to quantify a state in the physical world in a digital representation.

"Experiential Data" as used herein shall mean data captured on or proximate to a subject Processing Facility descriptive of a condition realized by the Processing Facility. Experiential data is generated by one or more of: digital and/or analog sensors, transducers, image capture devices, microphones, accelerometers, compasses and the like.

"Experiential Sensor Reading" as used herein shall mean a value of a sensor output generated within or proximate to a subject Processing Facility descriptive of a condition realized by the Processing Facility. An Experiential Sensor Reading may be generated by one or more of: digital and/or analog sensors, transducers, image capture devices, microphones, accelerometers, compasses and the like.

"Ground Plane" as used herein refers to horizontal plane from which a direction of interest may be projected.

"Image Capture Device" or "Scanner" as used herein refers to apparatus for capturing digital or analog image data, an Image capture device may be one or both of: a two dimensional camera (sometimes referred to as "2D") or a three dimensional camera (sometimes referred to as "3D"). In some examples an Image Capture Device includes a charged coupled device ("CCD") camera.

"Lag Benefit" as used herein shall mean a benefit derived from, or in relation to a Lead Action.

"Lead Actions" as used herein shall mean an action performed on, in, or in relation to a property to facilitate attachment of a Performance Level.

"Performance" as used herein may include a metric of an action or quantity. Examples of Performance may include metrics of: number of processes completed, energy efficiency; length of service; cost of operation; quantity of goods processed or manufacture; quality of goods processed or manufacture; yield; and human resources required.

"Performance Level" as used herein shall mean one or both of a quantity of actions executed and a quality of actions.

"Processing Facility" as used herein shall mean a structure "Quality Level" capable of receiving in a processing material and/or a consumable and outputting a product.

"Ray" as used herein refers to a straight line including a starting point and extending indefinitely in a direction.

"Sensor" as used herein refers to one or more of a solid state, electro-mechanical, and mechanical device capable of transducing a physical condition or property into an analogue or digital representation and/or metric.

"Smart Device" as used herein includes an electronic device including, or in logical communication with, a processor and digital storage and capable of executing logical commands.

"Total Resources" as used herein shall mean an aggregate of one or more types of resources expended over a time period.

"Transceive" as used herein refers to an act of transmitting and receiving data.

"Transceiver" as used herein refers to an electronic device capable of one or both of transmitting and receiving data.

"Vantage Point" as used herein refers to a specified location which may be an actual location within a physical facility or a virtual representation of the actual location within a physical facility.

"Vector" as used herein refers to a magnitude and a direction as may be represented and/or modeled by a directed line segment with a length that represents the magnitude and an orientation in space that represents the direction.

"Virtual Processing Facility" ("VPS"): as used herein shall mean a digital representation of a physical structure suitable for use. The Virtual Processing Facility may include Design Features and As Built Features. The Virtual Processing Facility may be included as part of an AVM.

Referring now to FIG. 1A a block diagram illustrates various aspects of the present invention and interactions between the respective aspects. The present invention includes an Augmented Virtual Model 111 of a Processing Facility that includes As Built Features. The generation and inclusion of As Built Features, based upon location and direction specific data capture, is discussed more fully below. Data may be transmitted and received via one or both of digital and analog communications, such as via a wireless communication medium 117.

According to the present invention, one or more Deployment Performance Metrics 112 are entered into automated apparatus in logical communication with the AVM 111. The Deployment Performance Metric 112 may essentially include a purpose to be achieved during Deployment of a modeled Processing Facility. By way of non-limiting example, a Deployment Performance Level may include one or more of: a production or quantity; quality; yield; scalability; a level of energy efficiency; a level of water consumption; mean time between failure for equipment included in the Processing Facility; mean time between failure for machinery installed in the structure; a threshold period of time between repairs on the Processing Facility; a threshold period of time between upgrades of the Processing Facility; a target market value for a property; a target lease or rental value for a property; a cost of financing for a property; Total Cost of ownership of a property; Total Cost of Deployment of a property or other quantifiable aspect.

In some embodiments, Deployment Performance Metrics may be related to a fungible item, such as a measurement of energy (KWH of electricity, gallon of fuel oil, cubic foot of gas, etc.); man hours of work; trade medium (i.e. currency, bitcoin, stock, security, option etc.); parts of manufactures volume of material processed or other quantity. Relating multiple disparate Deployment Performance Metrics to a fungible item allows disparate Performance Metrics to be compared for relative value.

Modeled Performance Levels 113 may also be entered into the automated apparatus in logical communication with the AVM 111. The Modeled Performance Levels 113 may include an appropriate level of Performance of an aspect of the structure in the AVM affected by the Deployment Performance Metric 112. For example, a Performance Level 113 for energy efficiency for a structure modeled may include a threshold of KW hours of electricity consumed by the structure on a monthly basis. Similarly, a target market value or lease value may be a threshold pecuniary amount. In some embodiments, a pecuniary amount may be according to a period of time, such as monthly, or a term of years.

Empirical Metrics Data 114 may be generated and entered into the automated apparatus on an ongoing basis. The Empirical Metrics Data 114 will relate to one or more of the Deployment Performance Metrics and may be used to determine compliance with a Deployment Performance Level and/or a Performance Levels. Empirical Metrics Data 114 may include, by way of non-limiting example, one or more of: a unit of energy; an unit of water; a number of service calls; a cost of maintenance; a cost of upgrades; equipment details, design details, machinery details, identification of human resources deployed; identification of organizations deployed; number of human resources; demographics of human resources (i.e. age, gender, occupations, employment status, economic status, requiring assistance with basic living necessities; and the like); percentage of time structure is occupied; purpose of occupancy (i.e. primary residence, secondary residence, short term rental, long term lease, etc.); Sensor readings (as discussed more fully below); man hours required for structure repair/maintenance/upgrades; total currency (or other fungible pecuniary amount) expended on behalf of a structure or property.

In addition to Empirical Metrics Data 114, Lead Actions and expected Lag Benefits 115 that may cause an effect on one or both of a Deployment Performance Level 112 and a Performance Level 113, may be entered into the automated apparatus. A Lead Action may include an action expected to raise, maintain or lower an Empirical Metrics Data 114. For example, an action to install water efficient plumbing fixtures may be scheduled in order to improve water consumption metrics. Similar actions may relate to electrically efficient devices, or automatic electric switches being installed; preventive maintenance being performed; structure automation devices being installed and the like. Other Lead Actions may include limiting a demographic of occupants of a structure to a certain demographic, such as senior citizens. An expected benefit may be measured in Lag Benefit measurements, such as those described as Empirical Metrics Data 114, or less tangible benefits, such as occupant satisfaction.

The automated apparatus may also be operative to calculate Future Performance 116 based upon one or more of: AVM Model with As Built Data 111; Deployment Performance Metrics 112; Modeled Performance Levels 113 and Empirical Metrics Data 114. Future Performance may be calculated in terms of an appropriate unit of measure for the aspect for which Performance is calculated, such as, for example: an energy unit; man hours; mean time between failures and dollar or other currency amount.

Calculation of Future Performance 116 may be particularly useful to calculate Total Resources calculated to be required to support a particular structure, group of structures, properties and/or group of properties over a term of years ("Total Resources Calculated"). Total Resources Calculated may therefore be related to calculations of Future Performance 116 and include, for example, one or more of: energy units; water units; man hours; equipment; machinery and dollars (or other currency or fungible item). In some embodiments, calculations of Future Performance may include a Total Cost of Ownership for a term of years. For example, a Total Cost of Ownership for a property may include a purchase amount and amounts required for maintenance, repair and upgrades from day one of Deployment through twenty years of Deployment (a shorter or longer term of years may also be calculated).

Accordingly, some embodiments may include a calculation of Total Resources required that includes a purchase price of a property with a Processing Facility, that incorporates a total cost associated with the property over a specified term of years. The total cost will be based upon the AVM with As Built Data 111; Deployment Performance Metrics 112; Modeled Performance Levels 113 and Empirical Metrics Data 114.

Moreover, Total Resources required may be aggregated across multiple properties and. Structures. Aggregation of properties may be organized into property pools to mitigate risk of anomalies in the Calculation of Future Performance. Of course, the benefits of property ownership and/or management may also be pooled and compared to the Total Resources required. In various embodiments, different aspects of calculated Future Performance 116 may be aggregated and allocated to disparate parties. For example, first aggregation may relate to man hours of technician time for structure repair and maintenance and the fulfillment of obligations related to the aggregation may be allocated to a first party. A second aggregation may relate to machinery Performance and obligations allocated to a second party. A third aggregation may relate to equipment Performance and obligations allocated to a third party. Other aggregations may similarly be allocated to various parties. In some embodiments, financial obligations incorporating one or both of acquisition cost and ongoing Deployment costs may be allocated and financed as a single loan. Other embodiments include a calculated Future Performance cost being incorporated into a purchase price.

An important aspect of the present invention includes definition and execution of Lead Actions based upon one or more of: the AVM Model with As Built Data 111; Deployment Performance Metrics 112; Modeled Performance Levels 113; Empirical Metrics Data 114 and Calculations of Future Performance 116.

Figure 1B:
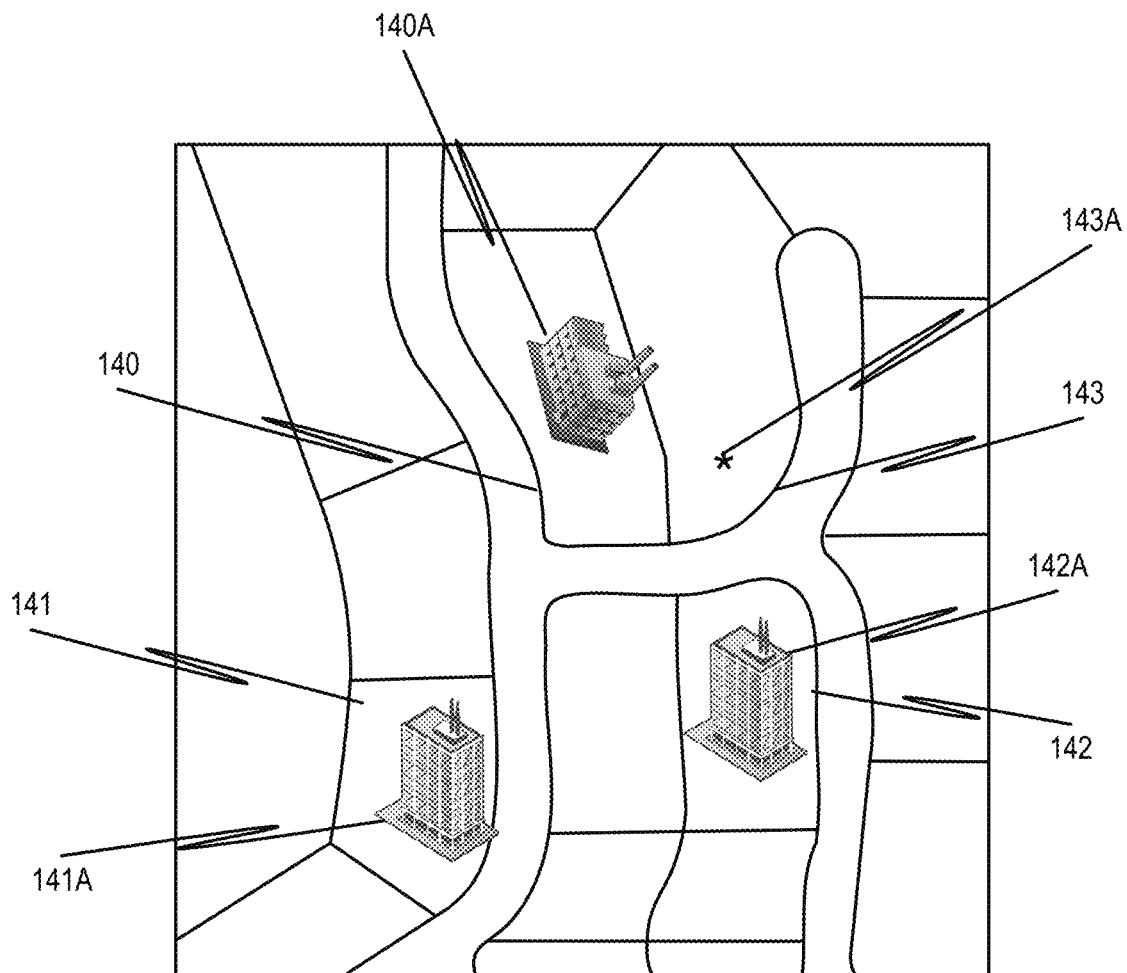
FIG. 1B illustrates geolocation aspects that may be used to identify a property and corresponding data and predictions.

Referring now to FIG. 1B, an AVM is generally associated with a property that includes real estate parcels 140-143. According to some embodiments, one or more of: monitoring; service call; an improvement, a repair, maintenance and an upgrade are performed on the property. The property is identified according to an automated determination of a location and a particular position, elevation and direction are further determined automatically within the property. Smart Devices may be used to access data records stored in an AVM according to a unique identifier of a physical location of the real estate parcels 140-143.

As illustrated, a map of real estate parcels 140-143 is shown with icons 140A-142A indicating parcels 140-142 that have virtual structures 140A-142A included in a virtual model associated with the parcels. Other parcels 143 have an indicator 143A indicating that a virtual model is in process of completion.

In some methods utilized by the present invention, data in an AVM may be accessed via increasingly more accurate determinations. A first level of geospatial location determinations may be based upon the real estate parcels 140-143 themselves and a second geospatial determination may be made according to Reference Position Transceivers (discussed more fully below) included within the boundaries of the real estate parcels 140-143. Still more accurate location position may be calculated according to one or both of a direction determination and an accelerometer or other location determination technology. Accordingly, it is within the scope of the present invention to access a record of a design model for a specific wall portion within a structure based upon identification of a particular parcel of real estate parcels 140-143 and a location within a structure situated within the real estate parcels 140-143 and height and direction. Likewise, the present invention provides for accessing As Built data and the ability to submit As Built data for a specific portion of a structure based upon an accurate position and direction determination.

For example, in some embodiments, a first level of location identification may include a property 141-143 identified based upon a first wireless communication modality, such as a GPS communication. A second level of location identification may include a structure 141A-143A identified via one or more of GPS; UWB; WiFi; sonic communications; and Bluetooth communications. A third level of location identification may include an Agent position within a structure (or property) based upon logical communications via one or more of: UWB; WiFi; sonic communications; and Bluetooth communications. A fourth level of location identification may include a determination of a distance from a surface proximate to an Agent, the distance based upon infrared and/or sonic transceiving.

In some implementations of the present invention, a property unique identifier may be assigned by the AVM and adhere to a standard for universally unique identifiers (UUID), other unique identifiers may be adopted from, or be based upon, an acknowledged standard or value. For example, in some embodiments, a unique identifier may be based upon Cartesian Coordinates, such as global positioning system (GPS) coordinates. Other embodiments may identify a property according to one or both of: a street address and a tax map number assigned by a county government of other authority.

In some embodiments, an AVM may also be associated with a larger group of properties, such as a manufacturing plant, research and development, assembly, a complex, or other defined arrangement.

As illustrated, in some preferred embodiments, an electronic record correlating with a specific property may be identified and then accessed based upon coordinates generated by a GPS device, or other electronic location device. The GPS device may determine a location and correlate the determined location with an AVM record listing model data, As Built data, improvement data, Performance data, maintenance data, cost of operation data, return on investment data and the like.

Figure 1C:
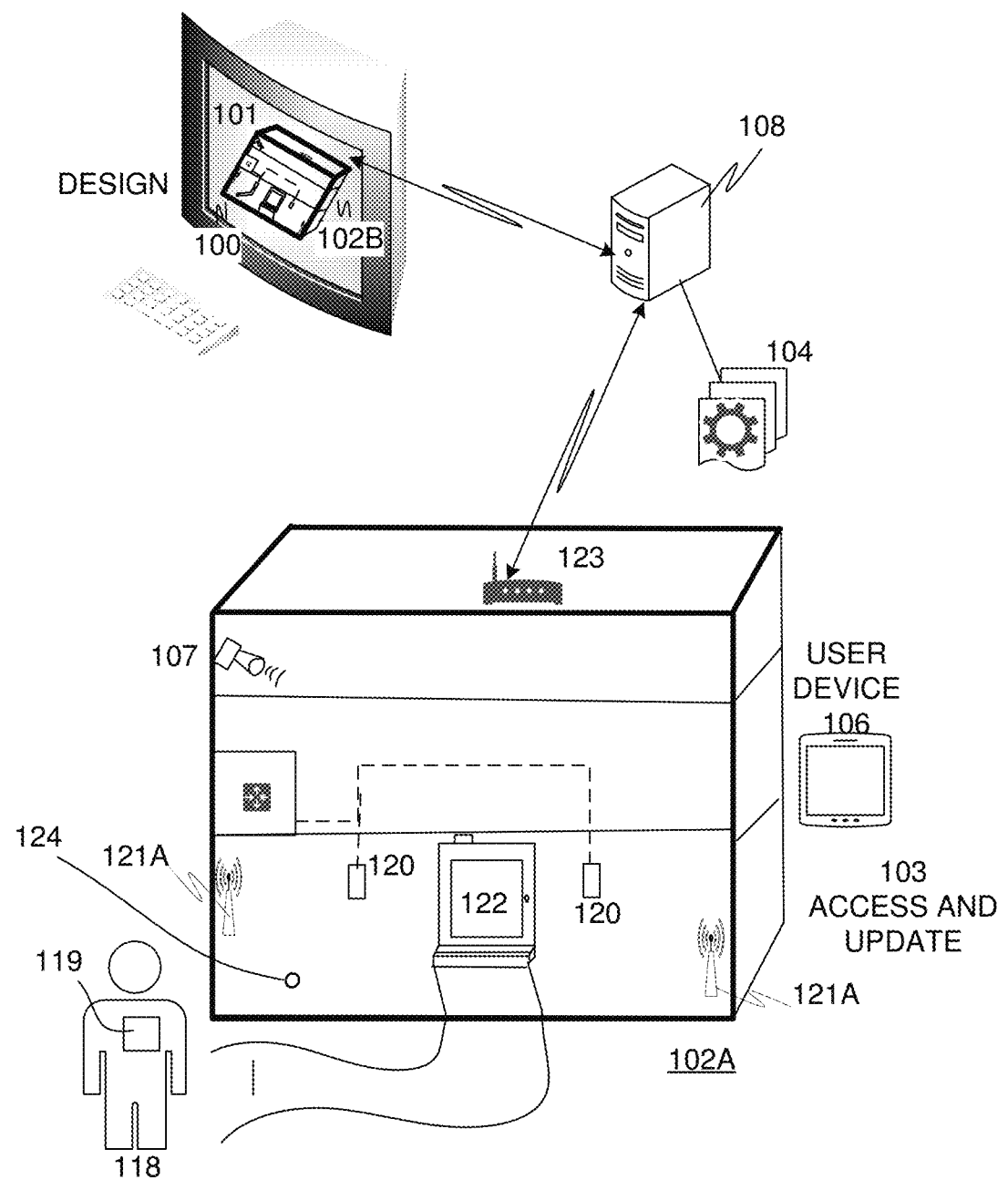
FIG. 1C illustrates a block diagram of ongoing data capture via Smart Devices and Sensors and support for predictive modeling based upon the smart data capture.

Referring now to FIG. 1C, a relational view of an Augmented Virtual Model 100 with a Virtual Processing Facility 102B is illustrated, as well as a physical structure 102A. The Augmented Virtual Model 100 includes a virtual model stored in digital form with a design aspect that allows for a physical structure 102A suitable for use to be designed and modeled in a virtual environment. The design aspect may reference Performance data of features to be included in a Virtual Processing Facility 102B and also reference variables quantifying an intended use of the Virtual Processing Facility 102B. The Virtual Structure 102B and the Augmented Virtual Model 100 may reside in a virtual setting via appropriate automated apparatus 108. The automated apparatus 108 will typically include one or more computer servers and automated processors as described more fully below and may be accessible via known networking protocols.

The Physical Structure 102A may include transceivers 120 or other type of sensor or transmitter or receivers that monitor an area of ingress and egress 122, such as a doorway, elevator and/or loading dock. Reference point transceivers 121A may be used as wireless references of a geospatial position. A wireless communication device 123 may also link logical infrastructure within the structure 102A with a digital communications network.

In correlation with the design aspect, the present invention includes an As Built Model 101 that generates a Virtual Structure 102A in the context of the Augmented Virtual Model 100. The As Built Model 101 includes virtual details based upon As Built data captured on or proximate to a physical site of a related physical structure 102A. The As Built data may be captured, for example, during construction or modification of a physical structure 102A.

The As Built Model 101 may include detailed data including image captures via one or more image capture devices 107 and physical measurements of features included in the physical structure 102A. The physical measurements may be during a build phase of the physical structure; or subsequent to the build phase of the physical structure. In some embodiments, original As Built measurements may be supplemented with additional data structure data associated with repairs or improvements are made to the physical structure. Details of recordable build aspects are placed as digital data on a recordable medium 104 included in the automated apparatus 108.

The digital data included on a recordable medium 104 may therefore include, for example, one or more of: physical measurements capturing Experiential Data; image data (i.e. digital photos captured with a CCD device); laser scans; infra-red scans and other measurement mediums. One or more records on the recordable medium 104 of an As Built structure may be incorporated into the Augmented Virtual Model 100 thereby maintaining the parallel nature of the Augmented Virtual Model 100 with the physical structure 102A.

In some embodiments, As Built data on a recordable medium 104 may be generated and/or captured via an image capture device 107.

As the physical structure is deployed for use, subsequent measurements that generate and/or capture Experiential Data may be made and incorporated into the Augmented Virtual Model 100. In addition, a user may access and update 103 the Augmented Virtual Model 100 to ascertain features of the physical structure 102A that have been virtually incorporated into the Augmented Virtual Model 100. In some examples, a tablet, handheld network access device (such as, for example a mobile phone) or other device with automated location service may be used to determine a general location of a physical structure 102A. For example, a smart phone with global positioning system (GPS) capabilities may be used to determine a physical address of a physical structure, such as 123 Main Street. Stored records containing data relating to 123 Main Street may be accessed via the Internet or other distributed network.

In addition to the use of GPS to determine a location of a User Device, the present invention provides for a real estate parcel with a physical structure 102A that includes more radio frequency (or other mechanism) location identifiers 121A. Location identifiers 121A may include, for example, radio transmitters at a defined location that may be used to accurately identify via triangulation, a position of a user device 106, such as a: tablet, smart phone or virtual reality device. The position may be determined via triangulation, single strength, time delay determination or other process. In some embodiments, triangulation may determine a location of a user device within millimeters of accuracy.

Other location identifiers may include, by way of non-limiting example, RFID chips, a visual markings (i.e. a hash tags or barcode), pins or other accurately placed indicators. Placement of the location identifiers may be included in the AVM and referenced as the location of the physical user device is determined. As described above, specific location identifiers may be referenced in the context of GPS coordinates or other more general location identifiers.

Based upon the calculated location of the user device 106, details of the physical structure 102A may be incorporated into the Virtual Structure 102B and presented to a user via a graphical user interface (GUI) on the user device 106.

For example, a user may approach a physical structure and activate an app on a mobile user device 106. The app may cause the user device 106 to activate a GPS circuit included in the user device and determine a general location of the user device 106, such as a street address designation. The general location will allow a correct AVM 100 to be accessed via a distributed network, such as the Internet. Once accessed, the app may additionally search for one or more location identifiers 121A of a type and in a location recorded in the AVM. An AVM may indicate that one or more RFID chips are accessible in a kitchen, a living room and each bedroom of a structure. The user may activate appropriate Sensors to read the RFID chips and determine their location. In another aspect, an Augmented Virtual Model 100 may indicate that location identifiers 121A are placed at two or more corners (or other placement) of a physical structure 102A and each of the location identifiers 121A may include a transmitter with a defined location and at a defined height. The user device 106, or other type of controller, may then triangulate with the location identifiers 121A to calculate a precise location and height within the physical structure.

Similarly, a direction may be calculated via a prescribed movement of the user device 106 during execution of code that will record a change in position relative to the location identifiers 121A. For example, a user smart device, such as a smart phone or user device 106 may be directed towards a wall or other structure portion and upon execution of executable code, the smart device may be moved in a generally tangential direction towards the wall. The change in direction of the user device 106 relative to the location identifiers 121A may be used to calculate a direction. Based upon a recorded position within the structure 102A and the calculated direction, a data record may be accessed in the Augmented Virtual Model 100 and a specific portion of the Augmented Virtual Model 100 and/or the Virtual Structure 102B may be presented on the user device 106. In other embodiments, a direction may be made, or verified via a mechanism internal to the smart device, such as a compass or accelerometer.

In still another aspect of the present invention, in some embodiments, transmissions from one or more location identifiers 121A may be controlled via one or more of: encryption; encoding; password protection; private/public key synchronization or other signal access restriction. Control of access to location identifiers 121A may be useful in multiple respects, for example, a location identifier may additionally function to provide access to data, a distributed network and/or the Internet.

The Virtual Structure 102B may include one or both of: historical data and most current data relating to aspects viewable or proximate to the user device 106 while the user device is at the calculated location in the physical structure 102A. In this way, the parallel virtual world of the Augmented Virtual Model 100 and the Virtual Structure 102B may present data from the virtual world that emulates aspects in the physical world, and may be useful to the user accessing the user device 106, while the user device is at a particular physical location. As discussed within this document, data presented via the Augmented Virtual Model 100 may include one or more of: design data, As Built data, Experiential Data, Performance data relating to machinery and/or features of the Augmented Virtual Model 100 or physical structure; maintenance data, and annotations.

Annotations may include, for example, a user's or designer's note recorded at a previous time, a service bulletin, maintenance log, operation instructions or a personal note to a subsequent user, such as a virtual "John Smith was here" such guest log indicating who had frequented the location. Annotations may include one or both of text and image data. For example, an annotation may include an image of the location captured at a given time and date. The image may be of a personal nature, i.e. the living room while the Smith's owned the structure, or a professional nature, i.e. the living room after being painted by XYZ Contractor on a recorded date. In some embodiments, annotations may be used to indicate completion of a work order. Recordation of completion of a work order may in turn trigger a payment mechanism for paying an entity contracted to complete the work order. In another aspect, annotations may relate to an AVM or a Virtual Structure as a whole, or to a particular aspect that is proximate to a location of the user device within the Virtual Structure.

In some embodiments, details of a proposed use of a structure and parcel may be input into a design module and used to specify or recommend features to be included in an Augmented Virtual Model 100.

According to the present invention, features of a Structure and parcel are generated within a digital design model and then tracked as the features are implemented in a build process and further tracked in Performance of the structure as it is placed into use. To the extent available, Performance is tracked in the context of variables relating to use. Variables may include, for example: a use of the structure, such as manufacturing and/or processing; a number of resources accessing in a structure; demographics of the human resources; number of months per year the structure is deployed for use; which months of the year a structure is deployed for use; which hours of the day the structure is occupied and other relevant information.

As Experiential Sensor Readings are generated, they may be memorialized to generate Experiential Data associated with a physical structure 102A. The Experiential Data is collected and analyzed via structured queries and may also be analyzed with Artificial Intelligence processes such as unstructured queries to derive value. In some embodiments, Experiential Data may also be associated with a human and/or an animal interacting with the structure 102A. Whereas former process plants were generally designed and built to mitigate against variability in a human 118 and between disparate humans 118. The present invention allows for human variability to be monitored via sensors within device 119 and the structure to be modified to optimally inter-relate with the values for variables attributable to a human 118 that will inhabit or otherwise interact with the structure 102A. Human (and/or animal) may be quantified with sensors within device 119 installed on or proximate to the Human 118. Alternatively, sensors 124 located in, or proximate to, a structure 102A may be used to monitor human variability. Biosensors may be used to provide empirical data of humans 118 interacting with a structure may be analyzed using structured or unstructured queries to device relationships between structure performance and human biometrics. Accordingly, sensors may be used to quantify interaction between a human 118 and an As Built structure 102A according to physiological and behavioral data, social interactions, and environmental factors within the structure, actions undertaken, movements, and almost any quantifiable aspect.

As Built Features and biometrics may be further utilized to control various structure automation devices. Structure automation devices may include, by way of non-limiting example one or more of: automated locks or other security devices; thermostats, lighting, heating, chemical processing, cutting, molding, laser shaping, 3D printing, assembly, cleaning, packaging and the like. Accordingly, a structure with recorded As Built design features and vibration sensors may track activities in a structure and determine that a first occupant associated with a first vibration pattern of walking is in the structure. Recorded vibration patterns may indicate that person one is walking down a hallway and automatically turn on appropriated lighting and adjust one or more of: temperature, sound and security. Security may include locking doors for which person one is not programmed to access. For example, a first pattern of vibration may be used to automatically ascertain that a person is traversing an area of a structure for which a high level of security is required or an area that is designated for limited access due to safety concerns. As Built data has been collected. Other structure automation may be similarly deployed according to As Built data, occupant profiles, biometric data, time of day, or other combination of available sensor readings.

Figure 1D:
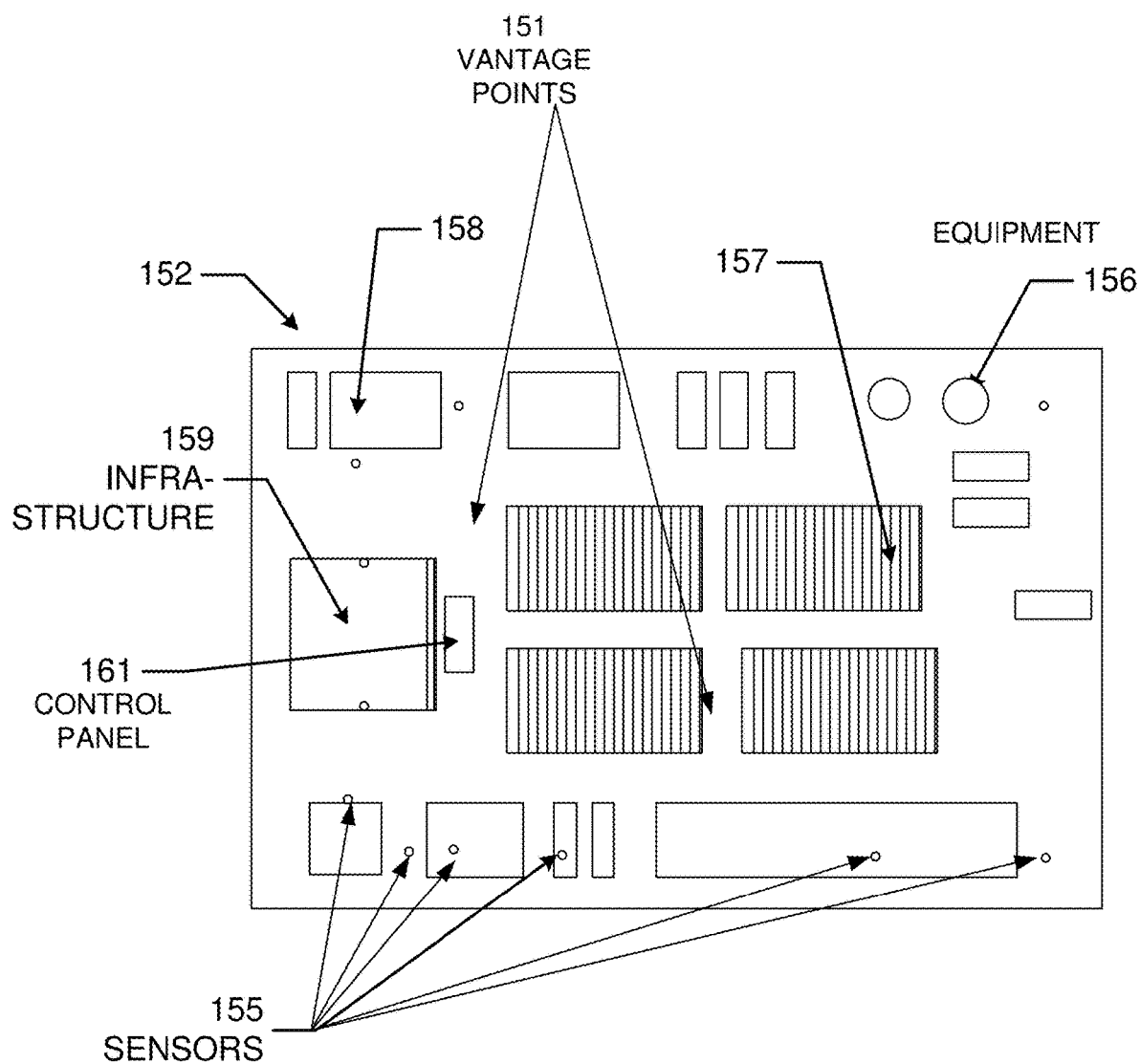
FIG. 1D illustrates an exemplary Facility layout with various equipment delineated in a top-down representation according to some embodiments of the present invention.

Referring now to FIG. 1D, according to the present invention a virtual model 100 is generated that correlates with a physical facility 102A and includes virtual representations of As Built features and Experiential Data. As discussed more fully herein, the virtual model may include an AVM with As Built data, such as image data and measurements, included within the model. In addition, sensor data may be collected over time and incorporated into the AVM. The AVM may include virtual representations of one or more of: sensors 155; equipment 156-158; controls 161; infrastructure 159, such as HVAC, utilities, such as electric and water, gas lines, data lines, etc. and vantage points 151.

In some implementations, a virtual reality headset may be worn by a user to provide an immersive experience from a vantage point 151 such that the user will experience a virtual representation of what it would be like to be located at the vantage point 151 within the facility 152 at a specified point in time. The virtual representation may include a combination of Design Features, As Built Data and Experiential Data. A virtual representation may therefore include a virtual representation of image data via the visual light spectrum, image data via infrared light spectrum, noise and vibration reenactment. Although some specific types of exemplary sensor data have been described, the descriptions are not meant to be limiting unless specifically claimed as a limitation and it is within the scope of this invention to include a virtual representation based upon other types of captured sensor data may also be included in the AVM virtual reality representation.

Figure 1E:
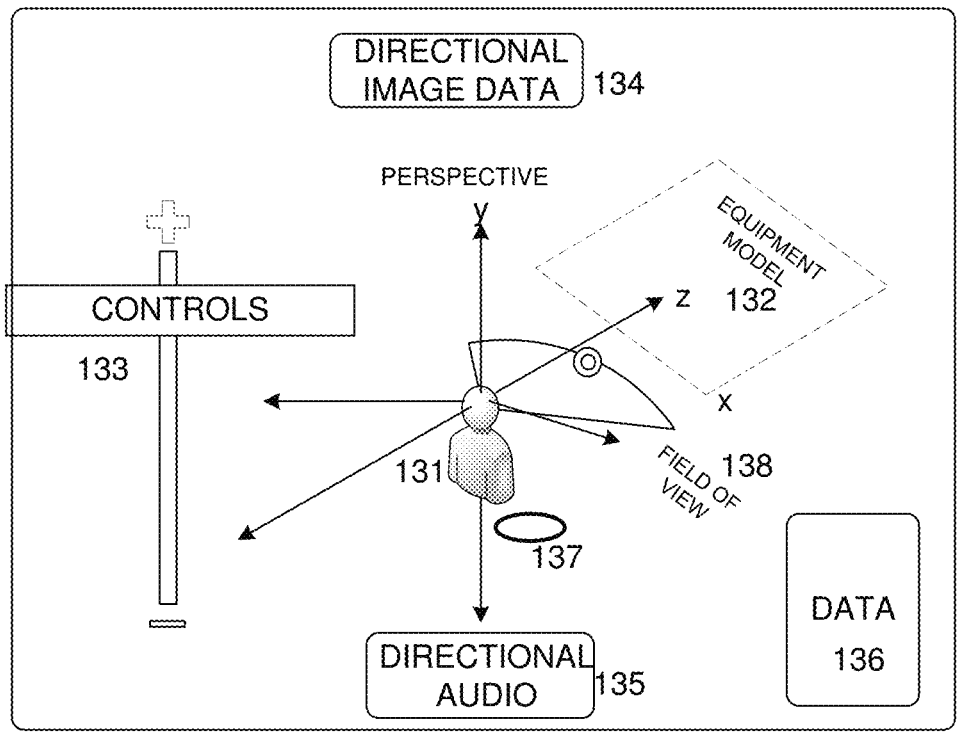
FIG. 1E illustrates a diagram of a user and directional image data.

Referring now to FIG. 1E, a user 131 is illustrated situated within an AVM 111. The user 131 will be virtually located at a Vantage Point 137 and may receive data 136, including, but not limited to one or more of: image data 134, audio data 135 and Ambient Data 136. The user 131 may also be provided with controls 133. Controls 133 may include, for example, zoom, volume, scroll of data fields and selection of data fields. Controls may be operated based upon an item of Equipment 132 within a Field of View 138 of the User 131 located at a vantage point 137 and viewing a selected direction (Z axis). The user is presented with Image Data from within the AVM 111 that includes As Built data and virtual design data.

Additional examples may include sensor arrays, audio capture arrays and camera arrays with multiple data collection angles that may be complete 360 degree camera arrays or directional arrays, for example, in some examples, a sensor array (including image capture sensors) may include at least 120 degrees of data capture, additional examples include a sensor array with at least 180 degrees of image capture; and still other examples include a sensor array with at least 270 degrees of image capture. In various examples, data capture may include sensors arranged to capture image data in directions that are planar or oblique in relation to one another.

Figure 2:
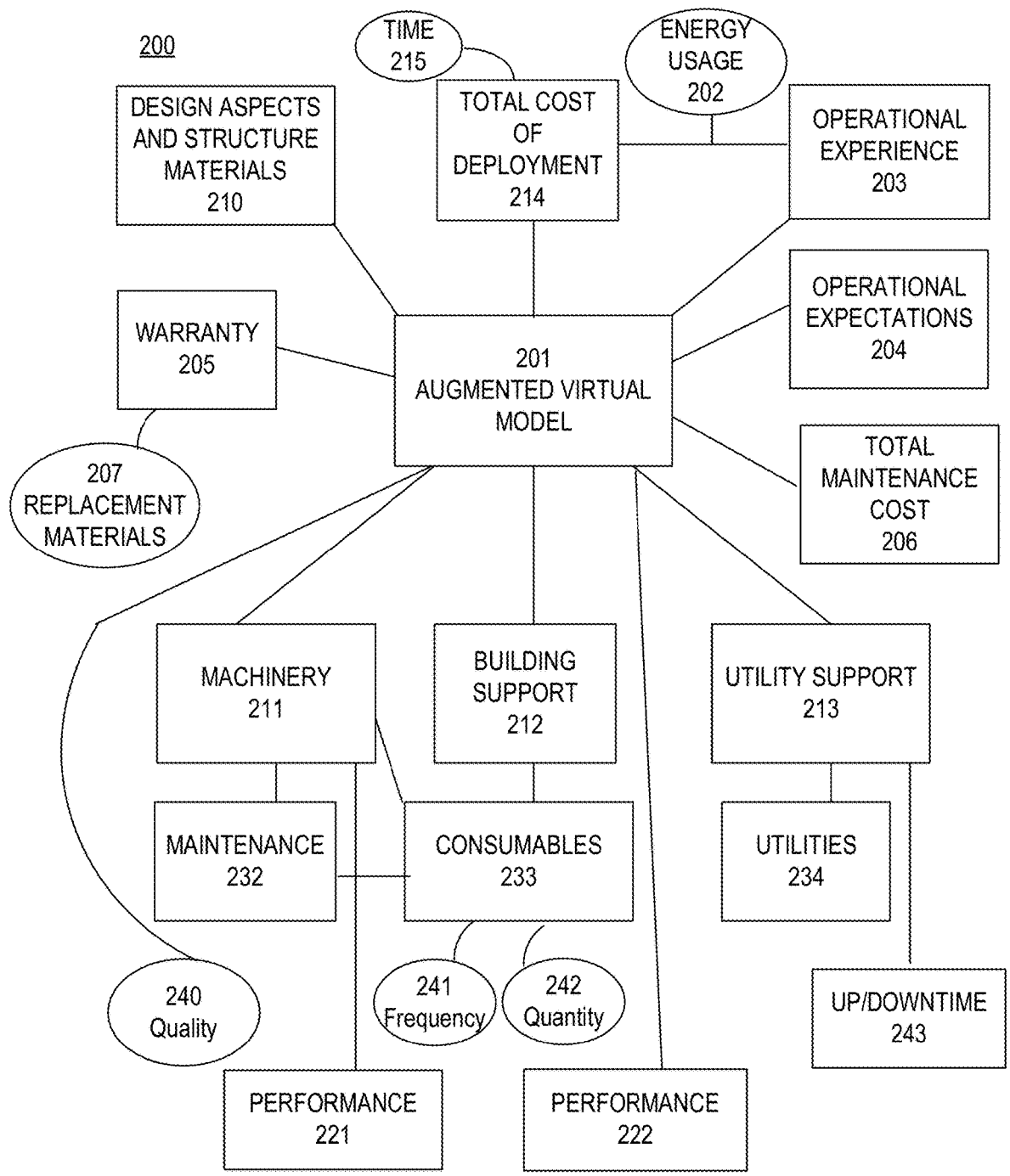
FIG. 2 illustrates a block diagram of an Augmented Virtual Modeling system.

Referring now to FIG. 2, a functional block illustrates various components of some implementations of the present invention. According to the present invention automated apparatus included in the AVM 201 are used to generate a model of a Virtual Structure ("VPS") and may also incorporate a model and associated real estate parcel ("VPS"). One or more pieces of equipment that will be deployed in the property may be included into the augmented virtual model 201, equipment may include, for example: machinery 211; building support items 212, and utilities support 213. The AVM 201 may model operational levels 204 during deployment of a facility and associated machinery and equipment included in the AVM 201. Machinery 211 may include, for example, manufacturing tools, robots or other automation, transport tools, chemical processing machine, physical processing machine, assembly machine, heat processing machine, cooling machine, deposition device, etching device, welding apparatus, cutting apparatus, forming tool, drilling tool, shaping tool, transport machine, structure automation, air purification or filter systems, noise containment device and the like. Utility support equipment may include cabling, dish antennas, Wi-Fi, water softener, water filter, power, chemical supply, gas supply, compressed air supply and the like, as well as uptime and downtime associated with a facility utility and uptime and down time 243 of one or more aspects of the facility.

The AVM 201 calculates a predicted Performance of the AVM and generates Operational Levels 204 based upon the Performance 222, wherein "Performance" may include one or more of: total cost of deployment 214; operational experience 203 which may include one or both of: objective empirical measurements and satisfaction of operator's use an As Built physical model based upon the AVM; operational expectations 204, total maintenance cost 206, and residual value of an As Built following a term of years of occupation and use of an As Built Facility based upon the AVM. Performance 221 may also be associated with a specific item of machinery 211.

In another aspect, actual Operational Experience 203 may be monitored, quantified and recorded by the AVM 201. Data quantifying the Operational Experience 203 may be collected, by way of non-limiting example, from one or more of: Sensors incorporated into an As Built structure; maintenance records; utility records indicating an amount of energy 202 (electricity, gas, heating oil) consumed; water usage; periodic measurements of an As Built structure, such as an infra-red scan of climate containment, air flow through air handlers, water flow, water quality and the like; user surveys and maintenance and replacement records.

In still another aspect, a warranty 205 covering one or both of parts and labor associated with an As Built structure may be tracked, including replacement materials 207. The warranty 205 may apply to an actual structure, or one or more of machinery 211; building support 212 item; and utility support item 213.

The AVM 201 may take into account a proposed usage of a Deployment of a Structure based upon values for Deployment variables, and specify aspects of one or more of: Machine s 211; building support 212; and utility support 213 based upon one or both of a proposed usage and values for Deployment variables. Proposed usage may include, for example, how many human resources will occupy a Structure, demographics of the resources that will occupy the Structure; percentage of time that the Structure will be occupied, whether the Structure is a primary residence, whether the Structure is a leased property and typical duration of leases entered into, environmental conditions experienced by the Structure, such as exposure to ocean salt, Winter conditions, desert conditions, high winds, heavy rain, high humidity, or other weather conditions.

In another aspect, Deployment may relate to biometrics or other data associated with specific occupants of a structure. Accordingly, in some embodiments, sensors may monitor biologically related variables of occupants and/or proposed occupants. The biometric measurements may be used to determine one or both of Lead Actions and Lag Metrics. Lead actions may include one or more of: use of specific building materials, selection of design aspects; Deployment of structure equipment; Deployment of machinery; terms of a lease; length of a lease: terms of a maintenance contract; and structure automation controls.

According to the present invention, design aspects and structure materials 210 may also be based upon the proposed usage and values for Deployment variables. For example, a thicker exterior wall with higher insulation value may be based upon a structure's location in an adverse environment. Accordingly, various demographic considerations and proposed usage of a structure may be used as input in specifying almost any aspect of a Structure.

Total Cost of Deployment (TCD)

In still another consideration, a monetary value for one or more of: a Total Cost of Deployment ("TCD"). Total maintenance cost ("TMC") and a desired return on investment ("ROI") for a property may be used as input for one or more design aspects included in an Augmented Virtual Model System 200. Total Cost of Ownership, Total Maintenance Cost and ROI may be used to determine optimal values of variables 202-205, 210-213 specified in an Augmented Virtual Model System 200 and incorporated into an As Built structure, and other improvements to a real estate parcel.

A Total Cost of Deployment 214 may change based upon a time period 215 used to assess the Total Cost of Deployment 214. A ROI may include one or more of: a rental value that may produce a revenue stream, a resale value, a cost of operation, real estate taxes based upon structure specifications and almost any other factor that relates to one or both of a cost and value.

Desirable efficiency and Performance may be calculated according to one or more of: established metrics, measurement protocols and past experience. The AVM 201 and associated technology and software may be used to support a determination of a TCD. In another aspect, a TCD may be based upon an assembly of multiple individual metrics, procedures to assess metrics, procedures to adjust and optimize metrics and procedures to apply best results from benchmark operations. In the course of managing Total Cost of Ownership, in some examples, initial steps may include design aspects that model an optimal design based upon Total Cost of Ownership metrics and also model designed algorithms used to assess Total Cost of Ownership metrics.

In the following examples, various aspects of Total Cost of Deployment 214, Total Maintenance Costs, and associated metrics, are considered in the context of calculating a target Total Cost of Deployment 214. Accordingly, the AVM may be used to TCD optimization.

A designed Structure is ultimately built at a site on a real estate parcel. A build process may be specified and provide metrics that may be used in a process designed by an AVM 201 and also used as a physical build proceeds. In some examples, time factors associated with a physical build may be important, and in some examples time factors associated with a physical build may be estimated, measured and acted upon as they are generated in a physical build process. Examples of time factors may include, one or more of: a time to develop and approve site plans; a time to prepare the site and locate community provided utilities or site provided utilities; a time to lay foundations; a time to build structure; a time to finish structure; a time to install internal utilities and facilities related aspects; a time to install, debug, qualify and release equipment; times to start production runs and to certify compliance of production are all examples of times that can be measured by various techniques and sensing equipment on a Structure's site. Various time factors for a build are valuable and may become increasingly valuable as a physical build proceeds since the monetary investment in the project builds before revenue flows and monetary investments have clearly defined cost of capital aspects that scale with the time value of money.

Various build steps may include material flows of various types. Material flow aspects may be tracked and controlled for cost and efficiency. Various materials may lower a build materials cost, but raise time factors to complete the build. Logical variations may be calculated and assessed in an AVM 201 and optimal build steps may be generated and/or selected based upon a significance placed upon various benefits and consequences of a given variable value. Physical build measurements and/or sensing on physical build projects may also be used as input in an assessment of economic trade-offs.

The equipment deployed may incur a majority of a build cost depending upon user defined target values. The AVM may model and present alternatives including one or more of: cost versus efficiency, quality 240, time to build, life expectancy, market valuation over time. A cost to build may be correlated with cost to deploy and eventual resale. An overall model of a Total Cost of Deployment 214 may include any or all such aspects and may also include external. In some examples, the nature of equipment trade-offs may be static and estimations may be made from previous results. In some other examples, changes in technology, strategic changes in sourcing, times of acquisition and the like may play into models of Total Cost of Deployment 214.

In some examples, an initial efficiency of design which incurs large costs at early stages of a project may have a dominant impact on Total Cost of Deployment 214 when time factors are weighted to real costs. In other examples, the ability of a Structure to be flexible over time and to be changed in such flexible manners, where such changes are efficiently designed may dominate even if the initial cost aspects may be less efficient due to the need to design in flexibility. As a Structure is built, and as it is operated the nature of changing customer needs may create dynamic aspects to estimations of Total Cost of Deployment 214. Therefore, in some examples, estimates on the expected dynamic nature of demands on a Structure may be modeled against the cost aspects of flexibility to model expectations of Total Cost of Deployment 214 given a level of change.

In some examples, factors that may be less dependent on extrinsic factors, such as product demand and the like may still be important metrics in Total Cost of Deployment 214. Included in the As Built factors may be calculations such as HVAC temperature load, in which personnel and seasonal weather implications may be important. AVM models may include a user interface to receive value useful in the AVM models. In addition, electronic monitoring, via Sensors that may determine energy consumption, includes for example: electricity, fuel oil, natural gas, propane and the like may be useful for estimation and measurement.

Temperatures may be monitored by thermocouples, semiconductor junction based devices or other such direct measurement techniques. In other examples, temperature and heat flows may be estimated based on photon based measurement, such as surveying the Structure with infra-red imaging or the like.

Utility load may be monitored on a Structure wide basis and/or at point of use monitoring equipment located at hubs or individual pieces of equipment itself. Flow meters may be inline, or external to pipes wires or conduits. Gases and liquid flows may be measured with physical flow measurements or sound based measurement. In other examples, electricity may be monitored as direct current measurements or inferred inductive current measurement.

In some examples, the nature and design of standard usage patterns of a Structure and an associated environment may have relevance to Total Cost of Ownership. For example, usage that includes a larger number of ingress and egress will expose an HVAC system to increased load and usage that includes a significant number of waking hours with inhabitants in the building may incur increased usage of one or more of: machinery 211; building support devices 212; and utilities 234.

The nature and measurement aspects of vibration in the Structure may also be modeled and designed as the Structure is built. There may be numerous means to measure vibrations from capacitive and resistive based measurements to optical based measurements that measure a subtle change in distance scale as a means of detecting vibration. Vibration may result from a Structure being located proximate to a roadway, train, subway, airport, tidal flow or other significant source of relatively consistent vibration. Vibration may also be more periodic, such as earthquake activity. In still another aspect, vibration may result from human traffic within the property. The use of vibration monitoring Sensors may indicate various activities that take place within the structure and facilitate more accurate modeling of a life expectancy of various aspects of the structure as well as machines located within the structure.

Noise levels are another type of vibrational measurement which is focused on transmission through the atmosphere of the Structure. In some cases, noise may emanate from one location after moving through solid structure from its true source at another location. Thus, measurement of ambient sound with directional microphones or other microphonic sensing types may be used to elucidate the nature and location of noise emanations. In some cases, other study of the noise emanations may lead to establishment of vibrational measurement of different sources of noise. Floors, ceilings, doorways, countertops, windows and other aspects of a Structure may be monitored in order to quantify and extrapolate noise levels. Noise and vibrational measurement devices may be global and monitor a region of a Structure, or they may be inherently incorporated into or upon individual equipment of the Structure.

In some examples, models of a Structure (including original models and As Built models) may include routings of pipes, wires, conduits and other features of a Structure and the installed equipment that have structure. Together with models of the building structure and the equipment placed in the building the various routed structures may be married in a detailed AVM 201.

In another aspect, an AVM 201 may include conflicts between the physical structures may be detected and avoided in the design stage at far improved cost aspects. In some examples, a designer may virtually ascertain a nature of the conflict and alter a design in virtual space to optimize operational aspects. Additionally, in some embodiments, an As Built model may be generated during and after a Structure is built for various purposes. In some examples, a technician may inspect a Structure for conformance of the build to the designed model. In other examples, as an As Built Structure is altered to deal with needed changes, changes will be captured and included in the As Built AVM 201.

In another aspect of the present invention, the AVM 201 may be used to generate a virtual reality model of a property, including one or more structures that may be displayed via a user interface that includes an immersion of the user into a virtual setting. Immersion may be accomplished, for example, via use of a virtual reality headset with visual input other than a display screen is limited. In some embodiments, a virtual setting may be generated based upon a location of the user. For example, GPS coordinates may indicate a property and a user may wear a headset that immerses the user in a virtual reality setting. The virtual reality setting may display one or more virtual models of structures that may be potentially constructed on the property.

Embodiments may include models generated, standard modeling software such as BIM 360™ field which may support the display of a Structure design in a very complete level of detail. Modeling of a Structure in its location or proposed location, or in multiple proposed locations, may be useful from a Total Cost of Ownership perspective, especially from an evaluation of the nature of a site layout including real estate property parcel options and the like.

In some examples, a virtual display observed in the field at the site of an As Built or proposed build may allow for design changes and design evaluations to be viewed in a space before build is completed. For example, a structure may be completed to the extent that walls, floors and ceilings are in place. A user may utilize a virtual display to understand the layout difference for different designs and the designs may be iterated from designs with the least flexibility to more flexible yet more complex designs.

In some examples, the design systems may include various types of features such as building structure, walls, ducts, utilities, pipes, lighting, and electrical equipment. The design systems are augmented with As Built Data and Experiential Data.

The design and modeling systems may be utilized to simulate and project cost spending profiles and budgeting aspects. The modeling systems may therefore be useful during the course of an audit, particularly when comparing actual versus projected spending profiles. The comparison of various spend sequencing may be used to optimize financing costs, maintenance, refurbishing and sequencing. The AVM 201 may be useful to provide early estimates, and for cost tracking versus projections which may be visualized as displays across a virtual display of the building, facilities and equipment.

Energy/Utilities Cost: There may be numerous examples of tradeoffs in sources of electric energy to a Structure. For example, a site may be designed with various utility supplies for power, with tailored power management systems to balance the capacitance and impedance of the effective load to minimize electricity cost. In addition, various alternative forms of electric energy may be assessed and designed. Solar, geothermal and Wind generated electric power may make economic sense under certain conditions and may have time of day and seasonal relevance. The design of flexible support facilities for the installation of initial energy generation capacity with provision for the addition of additional capacity may be assessed. In some instances, backup power generation may be designed to ensure that a Structure may run at some level for a certain period of time. In some cases, this may allow for continued production, in other examples, backup power may give a Structure the time to idle and shut down capacity in a safer and less damaging manner.

In some examples, an energy source for heating, cooling, humidification and dehumidification equipment may be modeled and managed. In some examples, a source of energy used may be one or more of electric, natural gas, propane, fuel oil or natural gas. Emergency backup may also be modeled and managed. Various choices between electric sources. Solar and fuel based energy consumption may be modeled and controlled based on upon market forecasts. Estimates may be periodically adjusted according to world and/or market events.

Enhanced inspection, and guidance capabilities enabled via ongoing electronic Sensor measurements may facilitate one or more of: maintenance, expansion and optimization of Structure features, operation property equipment and maintenance models. Ongoing monitoring via Sensor data collection also increases knowledge of machines and operations, or other useful capacities towards knowing the state of the Structure.

Decisions related to maintenance of equipment and facilities may be important decisions that modeling and operational management systems support. The various cost elements that may go into modeling may include, for example, one or more variables related to consumables, such as: a cost of consumables; frequency of replacement 241, quantity of consumables 242, life of replaced parts, nature of failures of different part types; manpower associated with planned and unplanned maintenance and expected and actual life of equipment Inside of a functional Structure, augmented reality functions viewable in an AVM 201 including an AVM may be used to guide operators, surveyors, repair workers, or other individuals, through the Structure. As one non-limiting example, a tablet, mobile device, or other small device with a screen, imaging, and other sensing capabilities may be used in an augmented reality fashion towards this function.

As described above, facing a mobile device towards an area in a Structure and movement of the mobile device in a particular pattern may be used to ascertain a specific area of the Structure for which AVM 201 data should be accessed. A combination of one or more of: image, location, orientation, and other Sensors may also be used to identify to the mobile device, which wall segment, building aspect, machinery or equipment the device is identifying. A location of mobile device, a height and an angle of view may also be utilized to determine aspects of the structure for which a virtual model is being requested.

In some embodiments, a user may be presented with various layers of data, including, for example, one or more of: structural aspects of the Structure, plumbing, electrical, data runs, material specifications or other documentation, including but not limited to: basic identifying information, installation information, service records, safety manuals, process records, expected service schedule, among many other possibilities.

A plurality of information may be thus easily accessible inside the Structure, and may be used for a variety of functions, including finding a specific machine to then diagnose and service a problem, regular inspection of equipment, guided tours of the Structure, or many other functions. This information may be conveyed to the individual in a plurality of possible formats, such as lists that show up on the screen, clickable icons that show up next to the equipment in a Virtual Reality ("VR") camera feed, or many other possibilities. These functions may also be accessible in a hands-free VR format with a VR headset, or other such device.

As the user is inside a Structure, the user may receive a plurality of information, instructions, etc. while the user is proximate to the various aspects of the structures. For example, the user machines themselves, seeing them work, hearing the sounds they make, etc. to better inspect or service, among other possible functions, the Structure's equipment. With VR systems, similar travel, guidance, or inspection capabilities for a functional Structure may be achieved completely remotely from the Structure itself. Additionally, with VR systems, these capabilities may occur prior, during, or after the construction and deployment of a Structure.

A VR system may constitute a headset or lens system with stereoscopic viewing capabilities, a sound conveying means, such as headphones, and various forms of user input, such as a handheld controller or foot pedals as non-limiting examples. Various forms of imaging, surveying, or modeling technology may be used to generate virtual models of a functional Structure. As a non-limiting example, exploring such a model with a VR system may be used to examine layout, functioning, or other parameters of a Structure before its construction. As an alternative non-limiting example, exploring a model possibly generated by sensing technology in real time, or over a period of time prior to viewing with a VR system, may allow for inspection or demonstration capabilities in a location entirely remotely from the actual Structure itself. This may include both imagery and sounds captured within the Structure.

Collection of data may additionally include actual service life experienced and performance of equipment used in an AVM which thereby enables enhanced modeling of a life expectancy of equipment included in an Augmented Virtual Model 100 and an As Built structure. Various Sensors may gather relevant data related to one or more of: use of machinery and equipment, performance of machinery items of equipment and an ambient environment inside or proximate to machinery and equipment. In addition, an unstructured query relating to the functioning or life expectancy of equipment may be generated by a processor to access and interpret data, thereby deriving relevant input to a decision maker based upon analysis of the data.

Various examples of data to be acquired, relating to life expectancy of equipment, may include, but is not limited to, hours of operation, conditions of operation (whether and how long the equipment may be running under capacity, at rated capacity, or over capacity), or many environmental conditions for operation; environmental conditions may include the ambient temperature (or the difference in ambient temperature from an ideal or other measured value), ambient humidity (or the difference in ambient humidity from an ideal or other measured value), ambient air particulate content (or a comparison of the current air particulate level to a filter change schedule), presence or concentration of ambient gasses (if relevant) such as carbon dioxide, or other gas, a number of times of ingress or egress into the Structure which may change ambient conditions or other trackable data.

Identification of Equipment

Identification capabilities may be facilitated or improved for one or more of: structural aspects, machinery, equipment and utility support within the Structure. This identification may take many forms through various means of query and communication, and may be facilitated through various hardware and/or software means.

Non-limiting examples may include image based identification; a device with some imaging means, including but not limited to a mobile device camera, tablet device camera, computer camera, security camera, or AR headset camera may image the equipment to be identified. Image recognition software may be used to identify the visualized equipment by its identifying features. Machine learning may be used to train systems using this software to identify specific features of the equipment in question. Other types of visual identifiers including but not limited to QR codes, may be used to visually identify equipment.

An additional non-limiting example may include location based identification; a device with some location means, including but not limited to GPS, internal dead-reckoning, or other means, may be used to determine a location within a Structure. Identifying information for equipment at or near the measured location may be accessed for assessment, based on its proximity to the location based signal.

An additional non-limiting example may also include direction based identification; with a fixed location, or in tandem with a location means, a device may have capabilities to deduce orientation based information of the device. This orientation information may be used to deduce a direction that the device is pointing in. This direction based information may be used to indicate that the device is pointing to a specific piece of equipment that may be identified.

An additional non-limiting example may also include As Built sensor and sensor generated experiential data based identification; identifying information for various equipment may be stored and accessed within a database storing this information. This information may be accessed by various means by a user with certain qualification to that information.

An additional non-limiting example may include tag-based identification; identifying information for various equipment may be accessed through proximity to many non-limiting examples of tagging capabilities, such as magnetic tags, bar code tags, or others. These tags may contain the information in question, or may reference the location of pertinent information to the owner, in order to convey this information to the owner.

An additional non-limiting example, data aggregation may include sensors generating data that is associated with an IoT (Internet of Things) based identification. Various IoT devices (or Sensors) may include a digital storage, processor and transmitter for storing and conveying identifying information. Upon request, an IoT device may relay identifying information of itself to a human with a communicating device, or to its neighbors. It may also possibly convey information received from and/or sent to other internet connected devices as well.

Data aggregated and stored for reference in calculation of Cost of Upkeep considered in a TOC and may include data related to some or all of:
Documented items covered;
Long term warranty for Structure/building ownership;
Items included in purchase price;
financed amounts;
Tax implications;
Capital value;
Ability to expand Structure and/or structural features such as baths or kitchens;
Lateral dimensions;
Vertical dimensions;
Building support systems;
Utilities;
Electric;
Water;
Discharge;
Aggregate Data;
Same Structure;
Multiple similar facilities;
Disparate Structure types;
Same geographic area;
Disparate geographic areas;
Locating Machine s and Equipment;
GPS (may be used in combination with other location technologies;
Near field communication with reference point emitter in Structure;
Wi-Fi;
RFID;
Reflector tags;
"Visual" recognition identifiers, i.e. hash, barcode; and
Directional—accelerometers in combination with visual recognition identifiers.

As per the above listing, functionality may therefore include modeled and tracked Performance of a Structure and equipment contained within the Structure, including consumables 233 used and timing of receipt and processing of consumables; modeled and actual maintenance 232, including quality of maintenance performed; equipment Performance including yields; Consumables 233 tracking may include a frequency of replacement and quantity of replaced consumables; Utilities 234 tracking may include projected and actually units of energy consumed.

3D Scanning & Model Development

In one aspect of the present invention data related to the position and identity of substantial elements of a Structure are first designed and then recorded in their actual placement and installation. This may include locations of building features, such as beams, walls, electrical junctions, plumbing and etc. as the structure is designed and constructed. As part of the Structure model, laser scanning may be performed on site at various disparate times during construction. An initial scan may provide general information relating to the location of the structure in relationship to elements on the property such as roadways, utilizes such as electricity, water, gas and sewer to identify non-limiting examples.

Additional events for scanning may occur during the construction process in order to capture accurate, three-dimensional (3D) "as-built" point cloud information. Point cloud may include an array of points determined from image capture and/or laser scanning or other data collection technique of As Built features. In some examples, captured data may be converted into a 3D model, and saved within a cloud-based data platform.

In some examples other methods of capturing spatially accurate information may include the use of drones and optical scanning techniques which may include high resolution imagery obtained from multiple viewpoints. Scanning may be performed with light based methods such as a CCD camera. Other methods may include infrared, ultraviolet, acoustic, and magnetic and electric field mapping techniques may be utilized.

Structure related information may include physical features generally associated with an exterior of a structure such as geo-location, elevation, surrounding trees and large landscaping features, underground utility locations (such as power, water, sewer, sprinkler system, and many other possible underground utility features), paving, and pool or patio areas. Structure related information may also include features generally related to a structure such as underground plumbing locations, stud locations, electrical conduit and wiring, vertical plumbing piping, and HVAC systems or other duct work. The acquisition of the data may allow the model system to accurately locate these interior and exterior features. Acquisition of As Built data during different points of the construction completion allows measurements to be taken prior to aspects involved in a measurement process being concealed by concrete, drywall or other various building materials.

Data is acquired that is descriptive of actual physical features as the features are built and converted into a 3D model which may be referred to as the "As Built" model. The As Built model will include "key components" of the structure and be provided with a level of artificial intelligence that fully describes the key component. In some embodiments, the As Built model may be compared to a design model. In some implementations "intelligent parameters" are associated with key components within the 3D model. For example, key components and associated information may further be associated with intelligent parameters. Intelligent parameters for the key components may include the manufacturer, model number, features, options, operational parameters, whether or not an option is installed (and if so, its features and dimensions), any hardware associated with the key component (and its manufacturer and serial number), an owner's manual and service contract information, as non-limiting examples. Intelligent parameters associated with a functional key component such as, HVAC Equipment, may include the manufacturer, model number, capacity, efficiency rating, serial number, warranty start date, motor size, SEER rating, an owner's manual associated with the equipment, and service contract information.

Key components of the structure may have an identification device such as a two or three dimensional graphical code (such as a QR code label) a Radio Frequency Identification Chip (RFID) attached that is accessible to a user, such as a structure owner, structure builder or service technician. When scanned with an apparatus capable of reading the code, a user interface on a display of various types, such as a tablet, may use the associated identification, such as a QR code, to provide direct access to related information. In some examples, the display may show textual or tabular representations of related data.

In other examples, graphical data such as images, drawings, and the like may be displayed. In still further examples, both graphical and textual displays may be associated with the code.

Although a QR code may provide an example, other identification technologies such as radio frequency ID, Internet of things (IoT) communication protocols with associated stored information, and other devices that can receive a signal and respond with stored information may be used. As well, numerous other types of graphical codes in addition to QR code may be read by a device and provide a connection between a key component, machinery, location and other identified aspect and associated data. In some examples, an image based code may be displayed using paints or pigments which are not visible to the human eye, such as in a non-limiting example ultraviolet pigments. In some other examples, a paint or pigment may not be visible until it is made to emit visible light by irradiating it with a particular band of electromagnetic radiation, such as, for example, ultraviolet light.

In some examples, key components may include doors, windows, masonry, roofing materials, insulation, HVAC equipment and machinery.

An automated Design and Monitoring ("RDM") system may support dynamic updating of tracked aspects. For example, as a structure owner acquires new or additional key components, such as machinery, HVAC, plumbing additions, key components may be added into the As Built model and the key components may be tracked as a part of the model. Other aspects may be dynamically updated such as when additions are made to the building structure or rebuilding of internal structure is made as non-limiting examples.

Since the As Built model includes information in a database and dynamic model functionality exists that commences as a building structure is being constructed, the model may assume new support aspects to the construction process itself. For example, a benefit from the definition and utilization of many components within a Structure utilizing the system herein includes the ability to pre-cut and/or pre-fabricate studs and framing, roofing cuts, masonry, under-slab plumbing, HVAC ductwork, electrical, and other such components. The dimensions of these various components may be dynamically updated based on an original model that may be compared to actual fabricated structure as realized on a building site. In some examples a structure builder may use a display interface associated with the system and model to display a comparison of an original set of building plans to a current structure at a point in time which may allow the builder to authorize any structural changes or variances to design and thereafter allow the description of following components to be dynamically adjusted as appropriate. The system may be of further utility to support various inspections that may occur during a building project which may associate detected variances with design expert review and approval. An inspector may be able to utilize the system as allowed on site or operate a window into the system from a remote location such as his office.

As the system is utilized during construction, orders for customized components may be placed. These customized components may be labeled and delivered to site, in an appropriate sequence, for assembly by carpenters. This may contribute to a minimization of waste at the worksite, as well as provide a work product that is entirely consistent with a pre-determined model which may have approved changes that are tracked. The result may improve the quality of the work product, and make it easier to generate the measured point-cloud 3D model.

Performance Tracking

In another aspect, the AVM system can autonomously and/or interactively obtain, store and process data that is provided to it by components of the Structure as the structure is built, installed or additions are made to the structure. The generation, modeling, capture, use, and retention of data relating to Performances in specific equipment or in some cases aspects relating to the design of a facility, may be monitored by the system.

In some examples, Operational Performance may be assessed by processing sampled data with algorithms of various kinds. Feedback of the status of operation and of the structure as a whole or in part, as assessed by algorithmic analysis may be made to a structure owner or a structure builder. In addition, a variety of data points gathered via appropriate Sensors, visual and sound data may be recorded and stored and correlated to 3D models of the facility. Experiential Sensor readings may include, by way of non-limiting example: temperature, power usage, utilities used, consumables, product throughput, equipment settings, and equipment Performance measurement, visual and audible data. Techniques to record data points may involve the use of one or more of: electronic Sensors, electro-mechanical Sensors, CCD capture devices, automated inspection equipment, video camera arrays and audio microphones and arrays of audio microphones for the capture and processing of data that may be used to generate visualizations of actual conditions, either on site or at a remote location. In addition, data may be collected, retained, analyzed, and referenced to project facility Performance.

In some examples, data may also be combined with manufacturer equipment specifications and historical data to model expectations related to actual operation of the structure and property aspects.

Virtual Maintenance Support

A 3D model of structure, such as a structure, which may be integrated with information related to the key components and laser scanned location information, may be made available to the structure owner/structure builder through a computer, an iPad or tablet, or smart device. The resulting system may be useful to support virtual maintenance support.

The three dimensional model may support enhancement to the two dimensional views that are typical of paper based drawings. Although three dimensional renderings are within the scope of information delivered in paper format, a three dimensional electronic model may render dynamic views from a three dimensional perspective. In some examples, the viewing may performed with viewing apparatus that allows for a virtual reality viewing.

In some examples, a viewing apparatus, such as a tablet or a virtual reality headset, may include orienting features that allow a user such as a structure owner, structure builder, inspector, engineer, designer or the like to view aspects of a model based upon a location, a direction, a height and an angle of view. A current view may be supplemented with various other information relating to features presented in the view. In some examples, the interface may be accessible through a virtual reality headset, computer, or mobile device (such as an iPad, tablet, or phone), as non-limiting examples. Utilizing a device equipped with an accelerometer, such as a virtual reality headset or mobile device, as non-limiting examples, a viewable section of the model may be displayed through the viewing medium (whether on a screen, or through a viewing lens), where the viewer's perspective changes as the accelerometer equipped device moves, allowing them to change their view of the model. The viewer's Vantage Point may also be adjusted, through a certain user input method, or by physical movement of the user, as non-limiting examples.

The presented view may be supplemented with "hidden information", which may include for example, depictions of features that were scanned before walls were installed including pipes, conduits, ductwork and the like. Locations of beams, headers, studs and building structure may be depicted. In some examples, depiction in a view may include a superposition of an engineering drawing with a designed location, in other examples images of an actual structure may be superimposed upon the image based upon As Built scans or other recordations.

In a dynamic sense, display may be used to support viewing of hypothetical conditions such as rerouted utilities, and rebuild walls and other such structure. In some examples, graphical or text based data may be superimposed over an image and be used to indicate specifications, Performance aspects, or other information not related to location, shape and size of features in the image.

As presented above, an image may allow for a user to "see through walls" as the augmented reality viewing device simulates a section of a model associated with a space displayed via the virtual reality viewing device. The viewer's perspective may change as an accelerometer in the virtual reality viewing device moves. A user may also change a view of the AVM, to include different layers of data available in the AVM. The viewer's Vantage Point may also be adjusted by moving about a physical space that is represented by the model. To achieve this, it may be possible to incorporate positioning hardware directly into a building represented by the virtual model. The positioning hardware may interface with an augmented reality device for positioning data to accurately determine the viewing device's orientation and location with millimeter precision. The positioning hardware may include, for example a radio transmitter associated with a reference position and height. Altitude is differentiated from height unless specifically referenced since the relative height is typically more important.

Accordingly, a user may access the AVM on site and hold up a smart device, such as an iPad or other tablet, and use the smart device to generate a view inside a wall in front of which the smart device is positioned, based upon the AVM and the location, height and direction of the smart device position.

In some examples, through the use of an augmented reality device, it may also be possible to view data, such as user manuals, etc. of associated devices in the view of a user, simply by looking at them in the viewing interface. In other examples, there may be interactive means to select what information is presented on the view.

Various electronic based devices implementing of the present invention may also be viewed in a virtual reality environment without accelerometer such as a laptop or personal computer. A viewable section of a model may be displayed on a Graphical User Interface (GUI) and the viewer's Vantage Point may be adjusted, through a user input device.

The ability to track machinery and other components of a system and store the components associated information, such as, for example user manuals and product specifications and part numbers, may allow for much more efficient use and maintenance of the components included within a structure. As well, the system model may also maintain structure owner manuals and warranties and eliminate the need for storage and tracking of hard copy manuals.

In a non-limiting example, if a structure owner/structure builder desires information related to an machinery, it may be found by positioning a device with a location determining device within it in proximity to the machinery and accessing the parallel model in the Virtual Structure such as by clicking on the machinery in the Virtual Structure model or by scanning the Code label attached to machinery. In some examples, an internet of things equipped machine may have the ability to pair with a user's viewing screen and allow the system model to look up and display various information. Thus, the user may have access to various intelligent parameters associated with that machinery such as service records, a manual, service contract information, warranty information, consumables recommended for use such as detergents, installation related information, power hooked up and the like.

In some examples, an AVM system may include interfaces of various kinds to components of the system. Sensors and other operational parameter detection apparatus may provide a routine feedback of information to the model system. Therefore, by processing the data-stream with various algorithms autonomous characterization of operating condition may be made. Therefore, the AVM system may provide a user with alerts when anomalies in system Performance are recognized. In some examples, standard structure maintenance requirements may be sensed or tracked based on usage and/or time and either notification or in some cases scheduling of a service call may be made. In some examples, the alert may be sent via text, email, or both. The structure user may, accordingly, log back into the Virtual Structure to indicate completion of a maintenance task; or as appropriate a vendor of such service or maintenance may indicate a nature and completion of work performed.

By detecting operational status, a Virtual Structure may take additional autonomous steps to support optimal operation of a system. A Virtual Structure may take steps to order and facilitate shipping of anticipated parts needed for a scheduled maintenance ahead of a scheduled date for a maintenance event (for example, shipping a filter ahead of time so the filter arrives prior to the date it is scheduled to be changed). In another example, a Virtual Structure may recall notes from an Original Equipment Manufacturer (OEM) that could be communicated to a user through the Virtual Structure. In still further examples, a Virtual Structure may support a user involved in a real estate transaction by quantifying service records and Performance of a real property.

In still another aspect the AVM may establish a standard maintenance and warranty program based on manufacturers published data and the ability to advise structure owners of upcoming needs and/or requirements. In other examples, the model system may facilitate allowing for structure builders, rental companies, or maintenance companies to consolidate information for volume discounts on parts or maintenance items. The model system may also facilitate minimizing unnecessary time expenditure for structure builders hoping to minimize needless service calls for warranty issues, and allowing structure builders and rental companies attempting to sell a structure or a rental to demonstrate that care has been taken to maintain a structure.

Benefits derived from monitoring and tracking maintenance with a Virtual Structure may include positively reassuring and educating lenders and/or lien holders that their investment is being properly cared for. In addition, insurance companies may use access to a Virtual Structure to provide factual support that their risk is properly managed. In some examples, a data record in a Virtual Structure model system and how an owner has cared for their facility may be used by insurance companies or lenders to ensure that good care is being taken. Maintenance records demonstrating defined criteria may allow insurance companies to offer a structure owner policy discount, such as, for example, installation of an alarm system. Additionally, access to a Virtual Structure may allow municipalities and utilities to use the info for accurate metering of utility usage without having to manually check; and peaks in utility demand may be more accurately anticipated.

In some examples, Virtual Structure may also be used to assist with structure improvement projects of various types. In some examples, the structure improvement projects may include support for building larger additions and modifications, implementing landscaping projects. Smaller projects may also be assisted, including in a non-limiting example such a project as hanging a picture, which may be made safer and easier with the 3D "as-built" point cloud information. Hidden water piping, electrical conduits, wiring, and the like may be located, or virtually "uncovered", based on the model database.

Optimization of Facilities

During construction of a structure corresponding to a Virtual Structure, discrete features of the As Built structure may be identified via an identification device such as an IoT device or a QR code label. The ID device may be integrated to the feature or added during the build scope. Performance monitors may also be simultaneously installed to allow monitoring of Key Performance Indicators (KPIs) for selected features. In an example, an HVAC system may be added to a facility during construction and a simultaneously a Performance monitor may be added to the HVAC system. The Performance monitor may be used to monitor various KPIs for an HVAC system. These KPIs may include outdoor air temperature, discharge air temperature, discharge air volume, electrical current, and the like. Similar monitoring capabilities may be installed to all machinery and utilities systems in a facility. The combination of these numerous system monitors may allow for a fuller picture of the efficiency of operations of various systems.

Use of the Virtual Structure, which may include data values contributed from communication of data from the various monitoring systems, may allow owners to receive periodic reports, such as in a non-limiting sense monthly emails which may show their current total energy consumption as well as a breakdown of what key components are contributing to the current total energy consumption.

The systems presented herein may be used by owners and facility managers to make decisions that may improve the cost effectiveness of the system. An additional service for Owners may allow the structure owner to tap into energy saving options as their structure ages. As an example, if a more efficient HVAC system comes on the market, which may include perhaps a new technology node, the user may receive a "Savings Alert". Such an alert may provide an estimated energy savings of the recommended modification along with an estimate of the cost of the new system. These estimates may be used to generate a report to the owner of an estimated associated return-on-investment or estimated payback period should the structure owner elect to replace their HVAC system.

In some examples, an AVM of a Virtual Structure may set a threshold value for the required ROI above which they may be interested in receiving such an alert with that ROI is achieved. This information will be based on data derived from actual operating conditions and actual historical usage as well as current industry information. Predictive maintenance and energy savings to key systems via Smart Structure Total Cost of Ownership ("TCO") branded Sensors.

Aggregating Data from Multiple Residences

With the ability to collect and utilize relevant structure information with the model system, the aggregation of data and efficiency experience from numerous systems may allow for analysis of optimization schemes for various devices, machinery and other structure components that includes real installed location experience. Analysis from the aggregated data may be used to provide feedback to equipment manufacturers, building materials fabricators and such suppliers.

In some examples, business models may include providing anonymous and aggregated data to original equipment manufacturers as a service model to give the OEMS an ability to utilize more data to monitor and improve their products. In some examples, OEM advertising may be afforded access through the model system. Manufacturers may have an additional side benefit motivating the use of this data related to improving their equipment cost effectives and reliability in order to minimize warranty cost. Such optimized Performance may also provide benefits to both structure owners and builders to support their ability to track actual warranty information, power cost, and overall Performance of a structure.

Methods and Apparatus

Figure 3A:
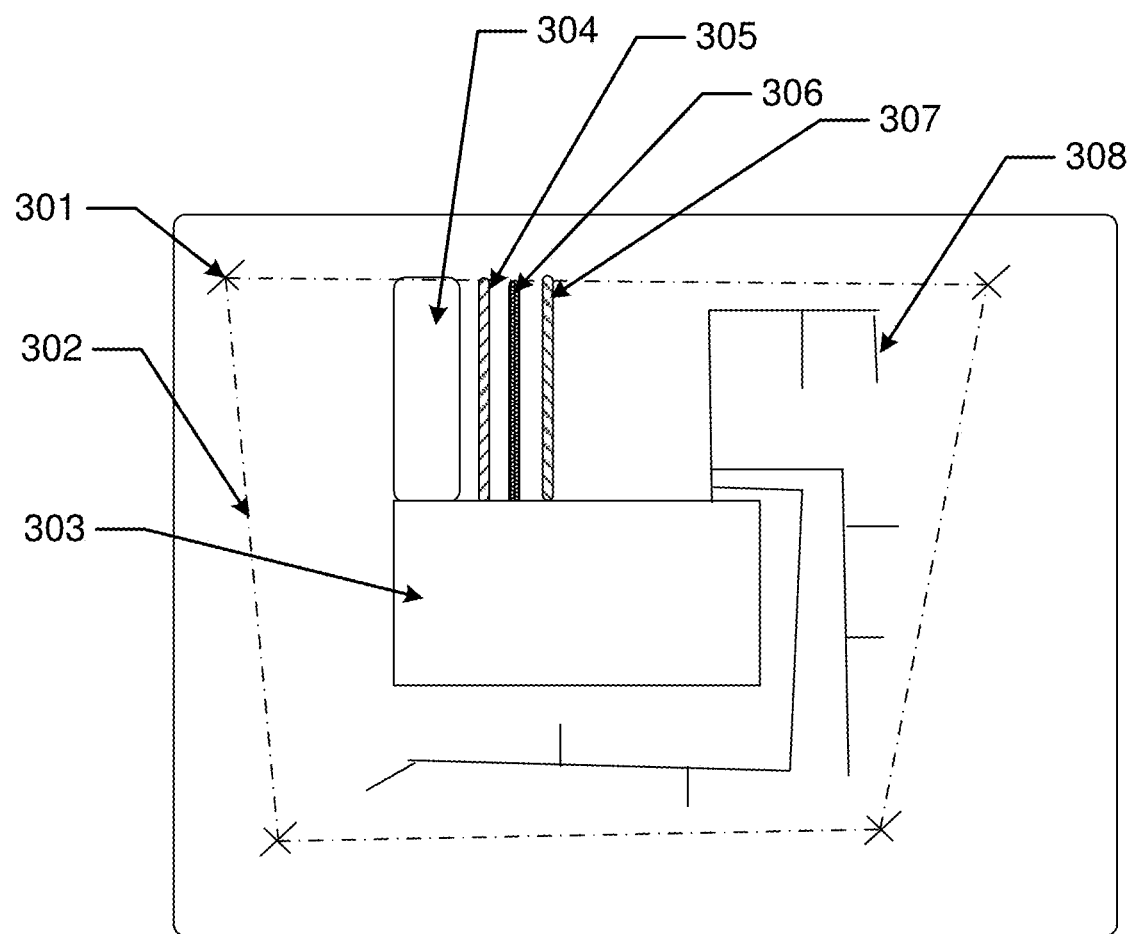
FIGS. 3A-3F, are illustrations of exemplary aspects of collecting and displaying data of a Processing Facility generated during construction of the Processing Facility.

Referring to FIGS. 3A-3F, an illustration of the collection of data by scanning a facility during its construction is provided. In FIG. 3A, a depiction of a site for building a facility structure is illustrated. The depiction may represent an image that may be seen from above the site. Indications of property boundaries such as corners 301 and property borders 302 are represented and may be determined based on site scanning with property markings from site surveys or may be entered based on global coordinates for the property lines. An excavated location 303 may be marked out. Roadways, parking and/or loading areas 304 may be located. Buried utilities such as buried telephone 305, buried electric 306, buried water and sewer 307 are located in the model as illustrated. In some examples, such other site service as a buried sprinkler system 308 may also be located.

Figure 3B:
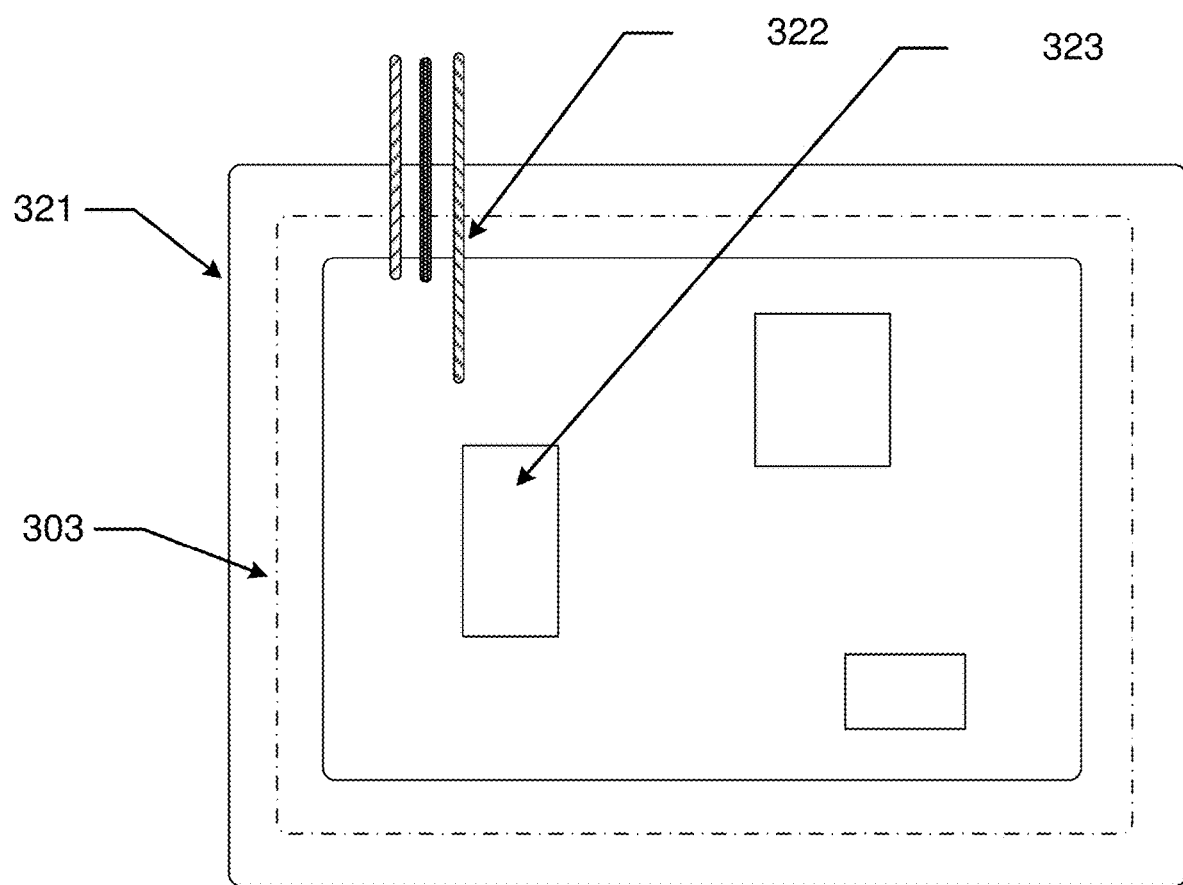

Referring to FIG. 3B the excavated location 303 may be scanned or imaged to determine the location of foundation elements. In some non-limiting examples, a foundational footing 321 along with buried utilities 322 is illustrated. The buried utilities may include such utilities as electric lines, water supply whether from a utility or a well on location, sewer or septic system lines, telecommunications lines such as telephone, cable and internet. Other footing elements 323 may be located at structural requiring locations as they are built. In some examples a scanning system may provide the locational orientation relative to site orientation markings. In other examples, aerial imagery such as may be obtained with a drone may be used to convert features to accurate location imagery.

Figure 3C:
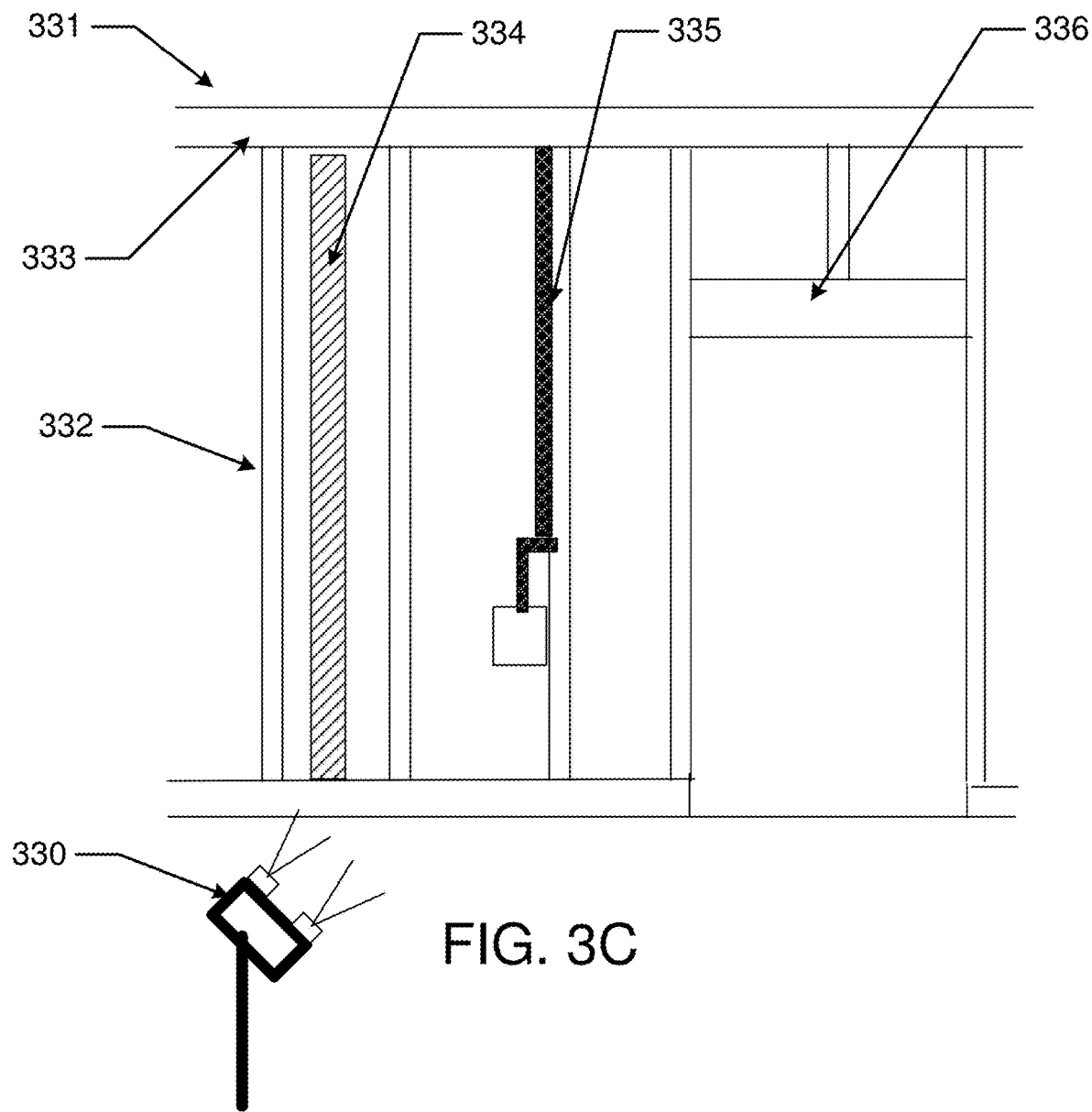

Referring to FIG. 3C a wall 331 of the Structure in the process of build is illustrated. The structure may be scanned by a scanning element 330. In some examples, a laser three dimensional scanner may be used. The wall may have supporting features like top plates 333, headers 336, studs 332, as well as internal items such as pipes 334, electrical conduits and wires 335. There may be numerous other types of features within walls that may be scanned as they occur such as air ducts, data cables, video cables, telephone cables, and the like.

Figure 3D:
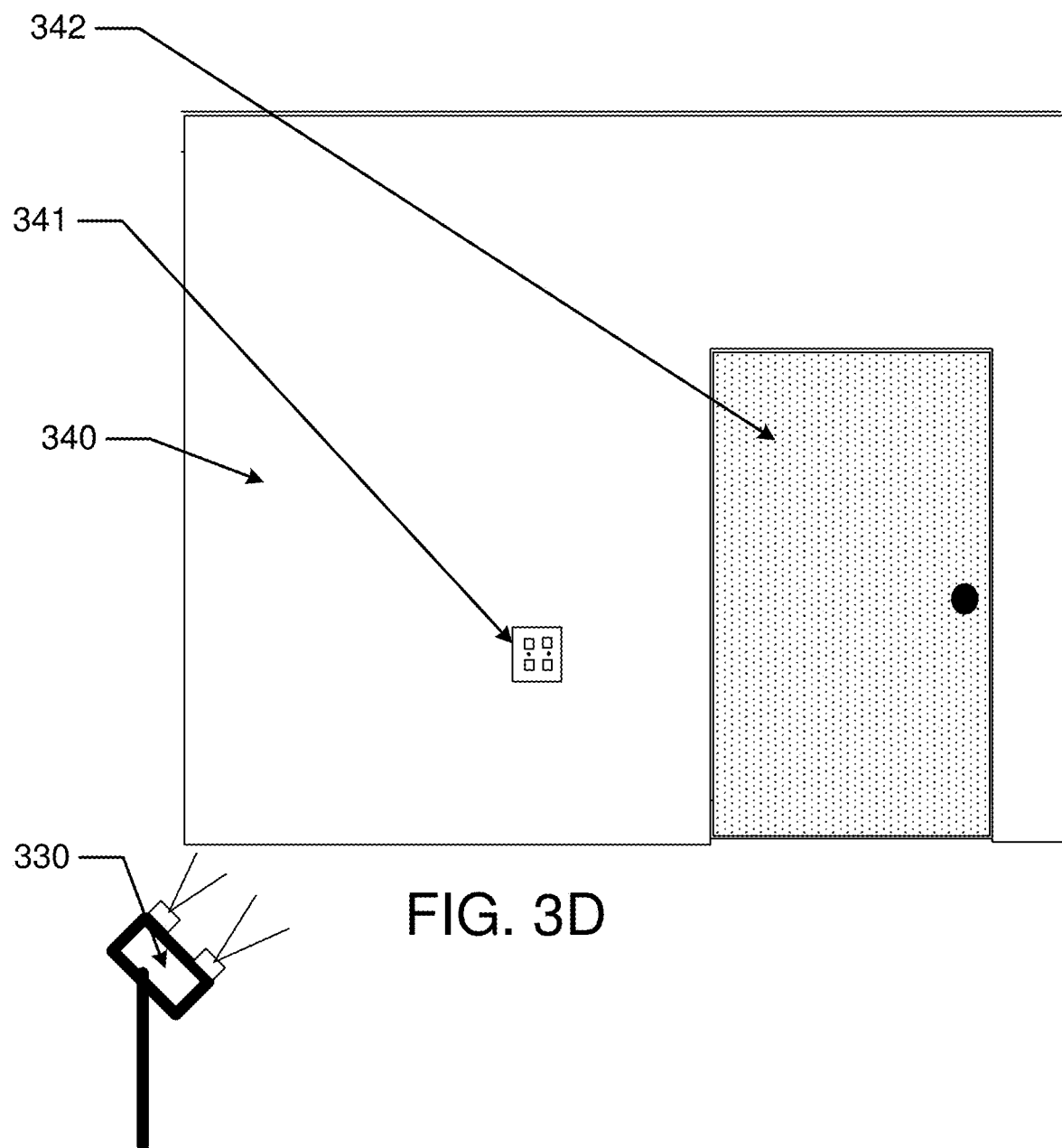

Referring to FIG. 3D the wall may be completed with structure components behind wall facing 340 may no longer be visible. Electrical outlets 341 and door structures 342 may be scanned by a scanning element 330.

Figure 3E:
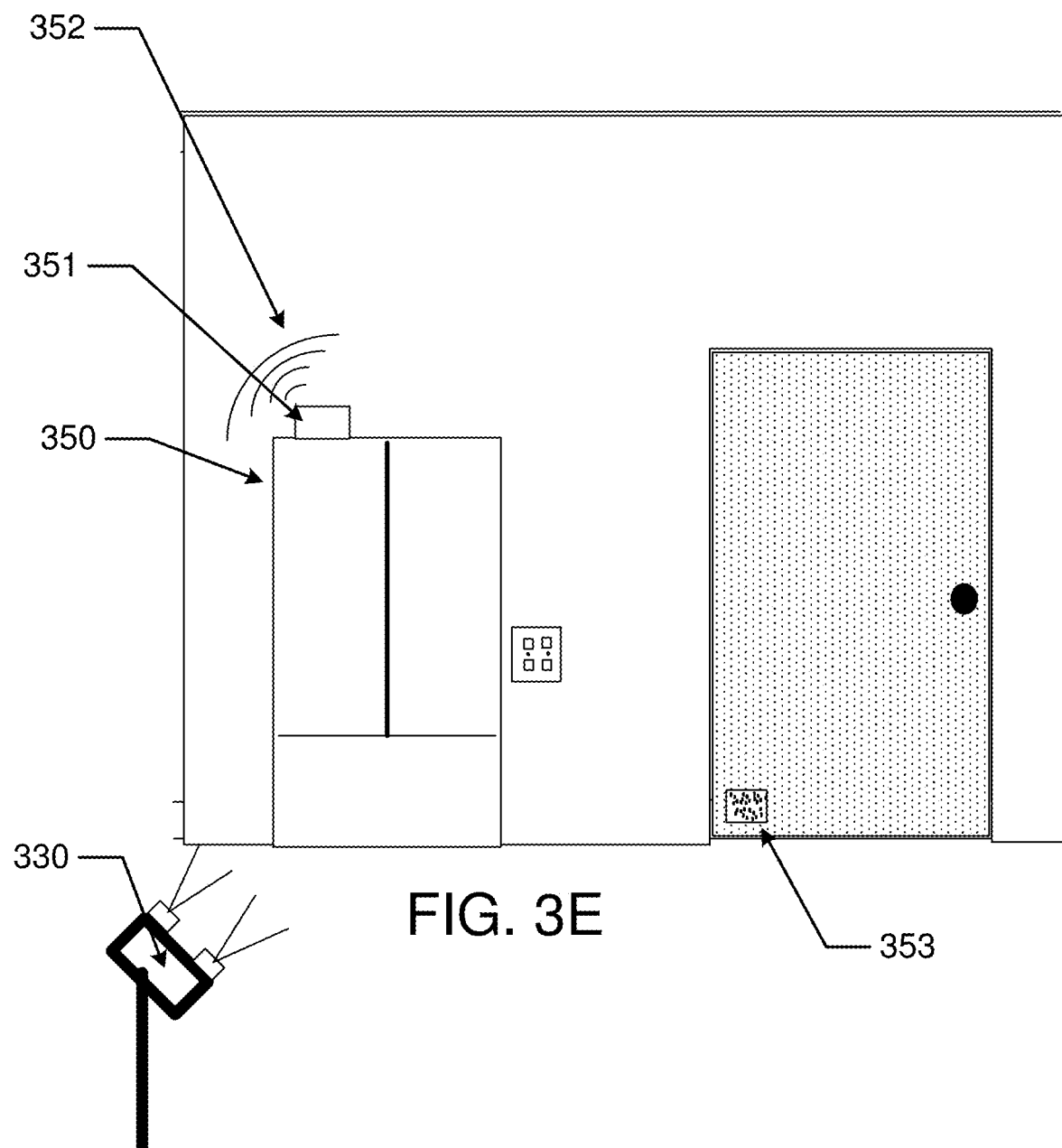

Referring to FIG. 3E internal components such as machinery may be installed. As a non-limiting example, a machine 350 may be installed and the resulting three dimensional profiles may be scanned by a scanning element 330. In some examples, an operational monitor 351 may be attached to the machinery. In some examples, an operational monitor may be part of the machinery. The operational monitor may have the ability to communicate 352 data to various receivers that may be connected to the model system of the residence. In some examples, key structural components, such as doors, may have identifying devices such as a QR label 353. The label may be visible or painted into the structure with non-visible paint. The identifying devices may provide information related to the device itself and warrantees of the device as non-limiting examples.

Figure 3F:
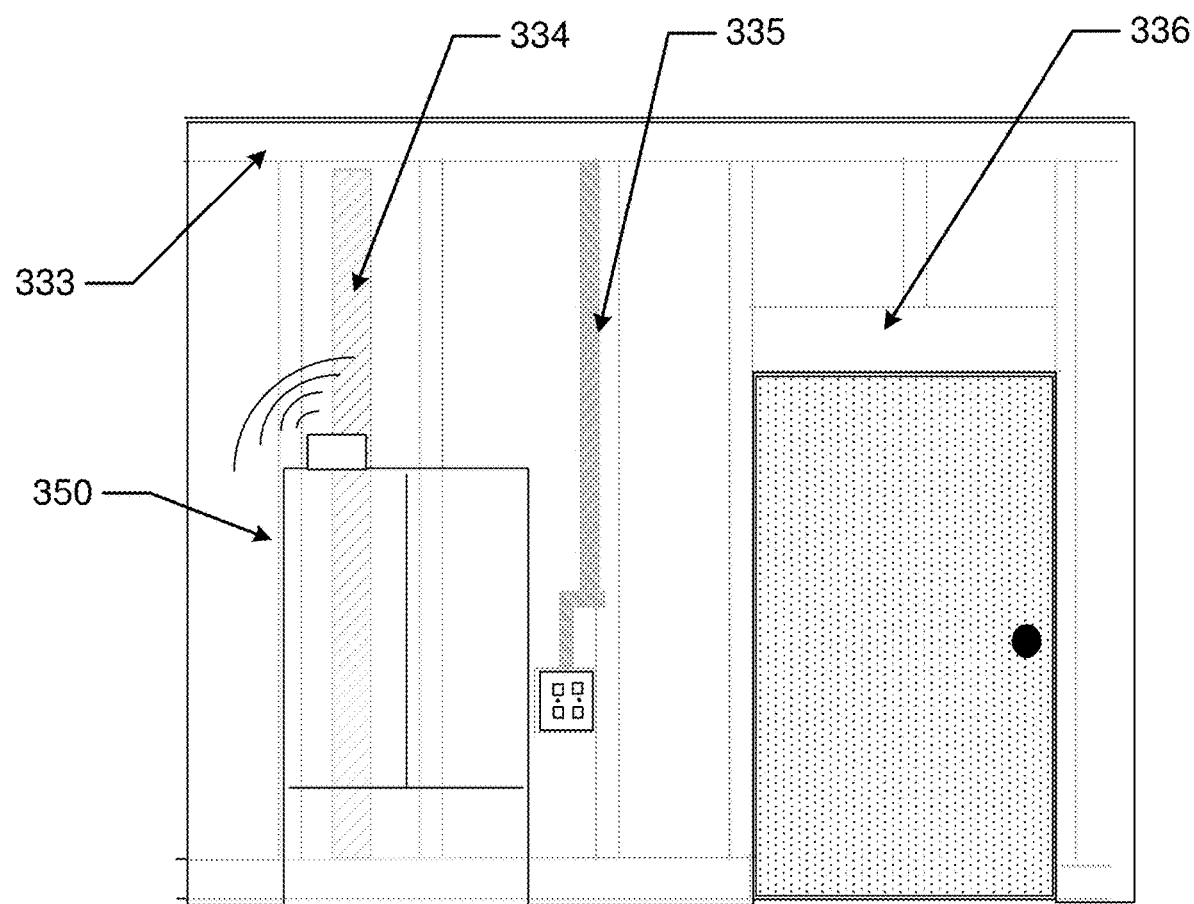

The model may include the various structure elements hidden and visible and may be used to create output to a display system of a user. Referring to FIG. 3F an example display is illustrated. The various non-visible layers may be shown by rendering the covering layers with a transparency. Thus, the display shows the machine profile 350 as well as the internal features that may be concealed like pipes 334, electrical conduits with wires 335, and headers 336 as examples.

Figure 3G:
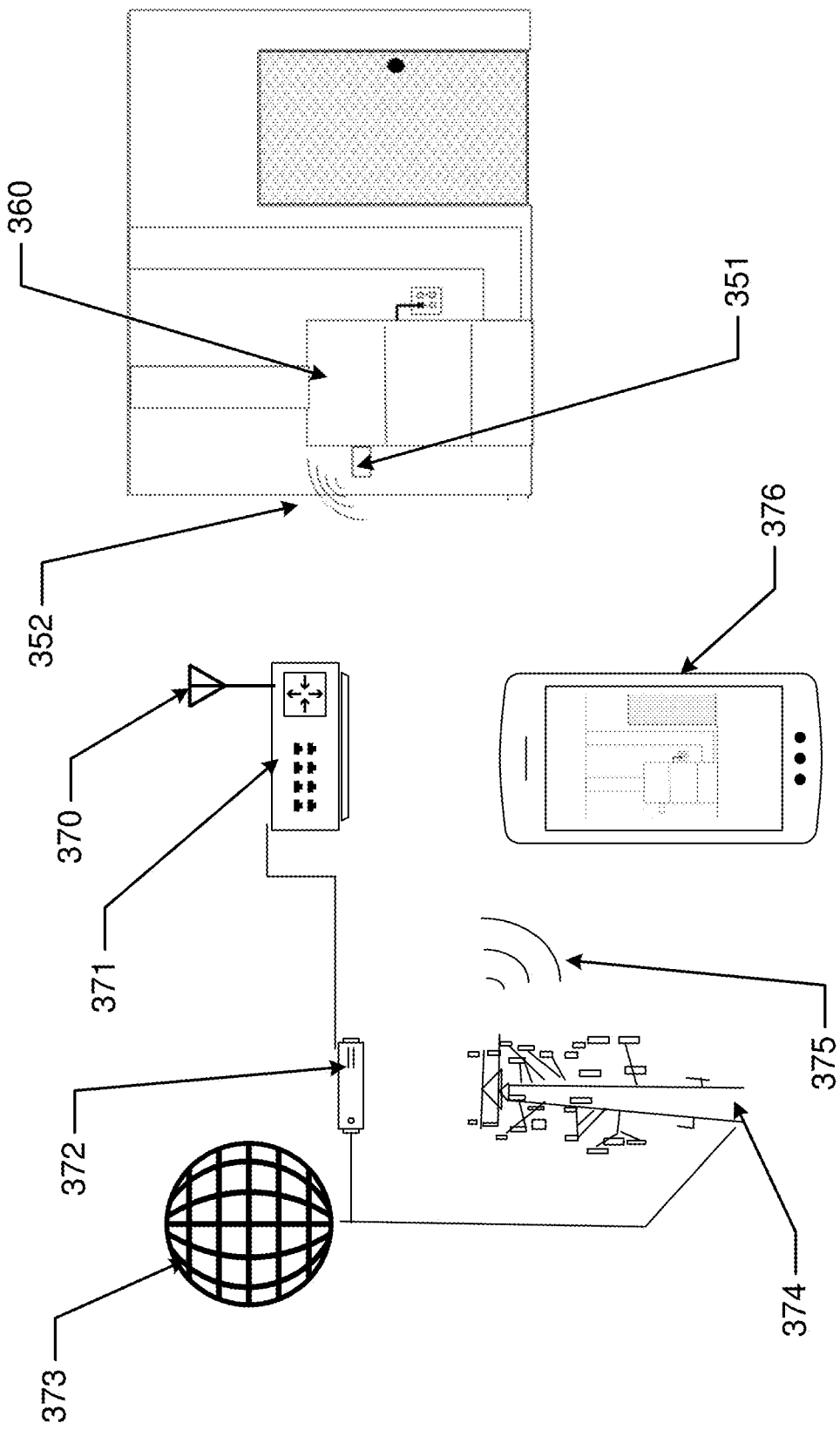
FIG. 3G illustrates an exemplary key component of the model system, with a Performance monitor providing data via a communication system to the model system.

Referring to FIG. 3G, an illustration of feedback of the model system is illustrated. A wall that has been scanned with an HVAC unit 360 may include a Performance Monitor 351 which may communication various information wirelessly 352. The communication may be received at an antenna 370 of a router 371 within the facility. The facility may be interconnected through the internet 372 to a web located server 373 which processes the communication. The web located server 373 also can include the various model data about the facility and it can provide composite displays that can summarize the structure as well as the operational Performance of the HVAC unit 360. It may aggregate the various data into textual and graphic reports. In some examples it may communicate these reports back through internet connections. In other examples, wireless Smart Device communications may be sent to cellular towers 374 which may transmit 375 to a Smart Device 376 of a user associated with the facility.

Figure 3H:
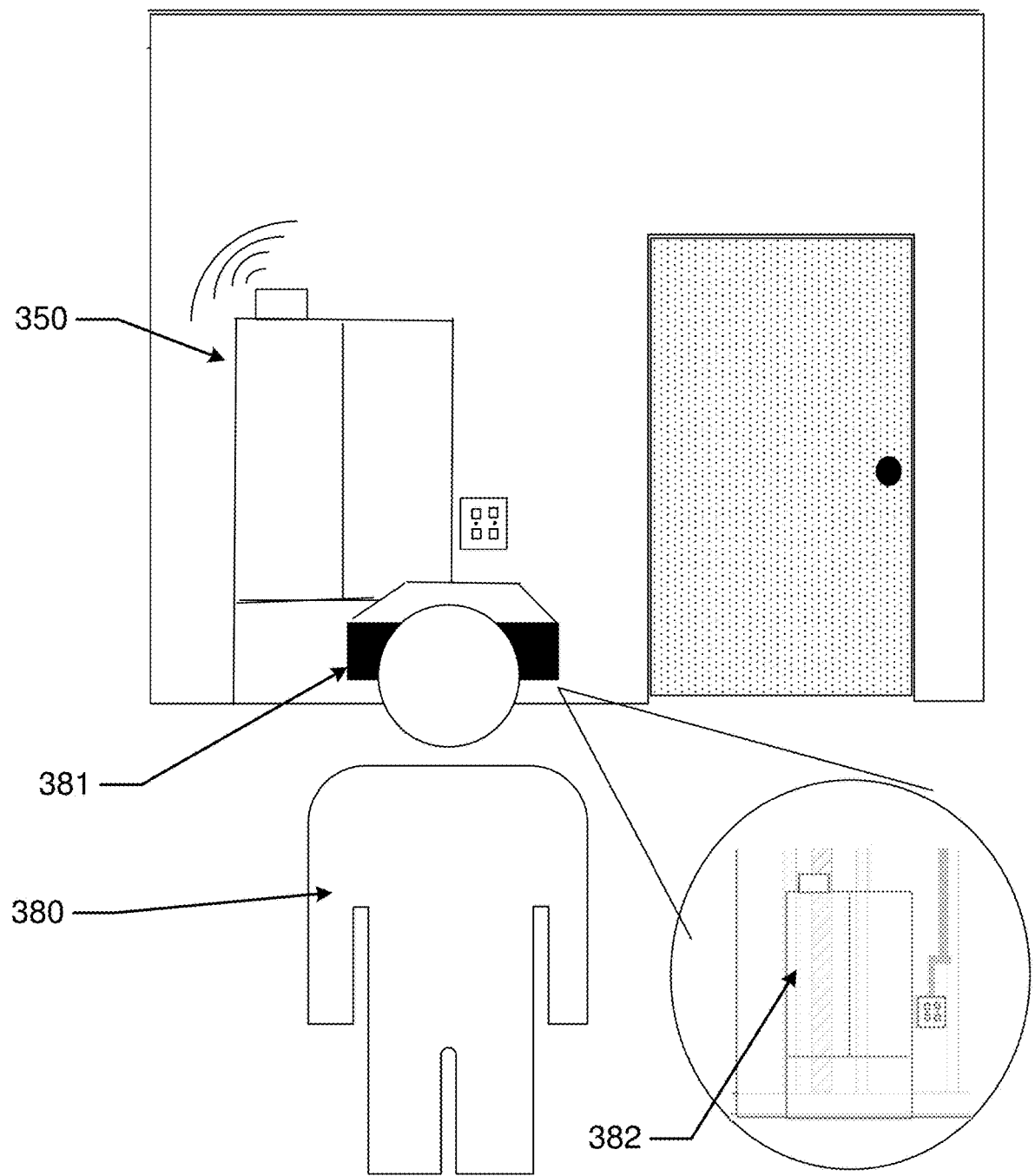
FIG. 3H illustrates an exemplary virtual reality display in according to the present invention.

Referring to FIG. 3H an illustration of a virtual reality display in concert with the present invention is illustrated. A machinery 350 of the facility may communicate information to the model server. A user 380 may receive may an integrated communication from the server. The resulting communication may be provided to a virtual reality headset 381. The virtual reality headset may provide a display 382 to the user that provides a three-dimensional view of the physical data as well as simulated imagery that may allow views through objects to hidden elements behind the object. As well, a heads up type display of information about an object may be superimposed.

Referring now to FIG. 4A, method steps that may be implemented in some embodiments of the present invention are illustrated. At method step 401, Deployment aspects may be specified for a Structure and incorporated into a virtual model, such as an AVM discussed above. Deployment aspects may include for example, a purpose for an As Built structure that is built based of the AVM. The purpose may include, by way of non-limiting example, one or more of: manufacturing, processing, data processing, health care, research, assembly, shipping and receiving, prototyping and the like.

Deployment aspects may also include a level of use, such continual, shift schedule or periodic. A climate in which the structure will be placed may also be considered in the Deployment aspects. Climate may include one or more of: four seasons; primarily winter; tropical, desert; exposed to salt air; and other environmental factors At method step 402, a virtual model, such as an AVM is digitally created according to the Deployment aspects of the model. The AVM may include improvements to a real estate parcel and a structure that will be placed on the real estate parcel, as well as where a structure may be located upon the parcel.

At method step 403, Performance aspects of machinery that may be included in the AVM may be digitally modeled and may include a level of use of the machinery and an expected satisfaction of the machinery as deployed according to the Deployment aspects. Maintenance expectations, including a number of repair calls and a preventive maintenance schedule may also be modeled and associated costs.

At method step 404, Performance aspects of equipment that may be included in the AVM may be digitally modeled and may include a level of use of the equipment and an expected satisfaction of the machinery as deployed according to the Deployment aspects. Maintenance expectations, including a number of repair calls and a preventive maintenance schedule may also be modeled and associated costs.

At method step 405, As Built aspects of a structure are recorded as discussed herein, preferably recordation of As Built aspects begins as construction begins and continues throughout the existence of the structure.

At method step 406, the physical structure may be identified via a location. A physical location may include, for example, Cartesian Coordinates, such as Latitude and Longitude coordinates, GPS coordinates, or other verifiable set of location parameters. In addition, more exact location specifications may include survey designations.

At method step 407, a position within or proximate to the Structure may be determined via positioning identifiers. The position within or proximate to the Structure may be determined.

At method step 408, an AVM may be identified and accessed via the physical location. Once an appropriate AVM is accessed, a particular portion of the AVM may be presented via a GUI based upon the position within the Structure (or proximate to the Structure) and a direction, height and angle of view. The position may be determined relative to location identifiers. Height may be determined via electronic devices, such as a smart device, or via triangulation referencing the location identifiers (locations identifiers are discussed more fully above and below).

At method step 409 an update may be made to a physical Structure and at method step 410, the update to the physical structure may be recorded and reflected in the AVM.

Figure 4B:
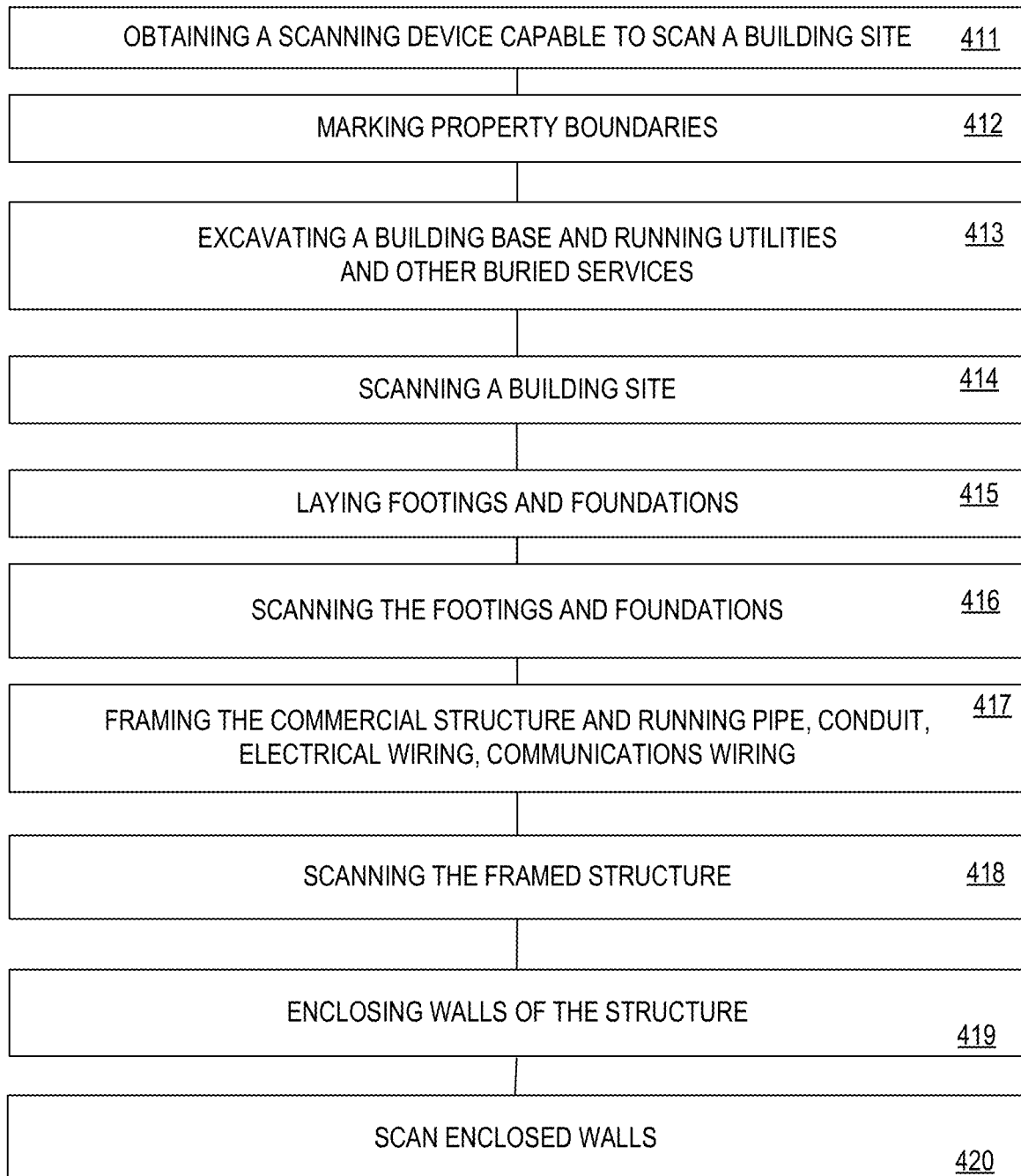

Referring to FIG. 4B, a method flow diagram for monitoring and maintenance is illustrated. At 411 a user may obtain a scanning device or devices that may scan a building site. At 412, the user or a service of the user may mark property boundaries of the site. At 413, work on the site may continue with the excavation of a building base and the laying down of utilities and other buried services. At 414, the scanning device is used to scan the location of the various aspects of the building site. At 415, work may continue with the laying of footings and foundations and other such foundational building activities. At 416, scanning of the footings and foundations may be accomplished. At 417, a structure may be framed and features such as pipe conduit, electrical wiring communications wiring and the like may be added. At 418, the building site may again be scanned to locate the various elements. The framing of the residence may commence along with running of pipe, wiring, conduits, ducts and various other items that are located within wall structures. Before coverings are placed on walls, the framed structure may be scanned at 418. Thereafter, the framed structure may be enclosed with walls 419. Thereafter, the walls may be scanned with the scanning device at step 420.

Referring to FIG. 4C a method flow diagram for structure monitoring and maintenance is illustrated. In this flow diagram, a Structure may already be built and may have various data layers already located in the model system. At 421, machinery may be added to the Structure. At 422, an ID tag, or a QR tag, or and RFID tag or an internet of things device may be associated with the machinery and may be programmed into the model system. At 423, the model system may be interfaced to the machinery ID and into the Structure model. At 424, a scanning step may be used to input three dimensional structure data at the installed location into the model system. At 425, an operational monitor function of the device may be added or activated. At 426, operational data may be transferred from the operational monitor to the server with the Structure model.

At 427, algorithms running on a server of the model system may determine an operational improvement opportunity based on calculations performed on the data from the operational monitor. At 428 a user may query the operational data of the machinery for information on its warranty. At 429, the model system may initiate an order for a service part and may schedule a service visit to make a repair based upon analysis of the operational data. The various steps outlined in the processing flow may be performed in different orders. In some examples additional steps may be performed. In some examples, some steps may not be performed.

In some embodiments, the present invention includes a method of tracking attainment of a stated Performance Level relating to a Structure, including: a) determining a geographic position of a Structure via a global positioning system device in a smart device proximate to the Structure; b) identifying a digital model of the Structure based upon the geographic position of the Structure, the digital model comprising virtual representation of structural components included in the Structure; c) referencing multiple positioning reference devices within the Structure; d) measuring a distance to at least three of the multiple positioning reference devices from a point of measurement; e) calculating a position within the Structure, the calculation based upon a relative distance of the at least three positioning reference devices to the point of measurement and a triangulation calculation; f) calculating an elevation of the point of measurement; g) measuring a first state within the Structure with a sensor; h) specifying a location of the first state within the Structure via reference to the position of the point of measurement and the elevation of the point of measurement; i) recording a first time designation for the step of measuring a first state within the Structure with a sensor; and i) correlating the first state within the Structure and the first time designation attainment of the stated Performance Level.

The geographic position may be calculated with a GPS reading from within the Structure. Measuring a distance to the at least three of the positioning reference devices may include, one or more of: relative signal strength received from wireless transmissions emanating from the at least three positioning reference devices; time of arrival of radio signals of wireless transmissions emanating from the at least three positioning reference devices measuring a distance to the at least three positioning reference devices comprises time difference of arrival of radio signals of wireless transmissions emanating from the at least three reference positioning devices.

The above steps may be repeated for at least a second state and a second time designation, and in preferred embodiments multiple more states and time designations.

A state may include, for example, one or more of: a vibration measured with an accelerometer; a temperature of at least a portion of the structure; an electrical current measurement to equipment installed in the Structure, a number of cycles of operation of equipment installed in the Structure; a number of cycles of operation of an machinery installed in the Structure; an electrical current measurement to an machinery installed in the Structure; a vibration associated with movement of an occupant of the Structure.

A vibration pattern may be associated with a specific occupant and tracking the movement of the specific occupant through the structure may be based upon measured vibration patterns. Similarly, a vibration pattern may be associated with a particular activity of a specific occupant and the activity of the specific occupant may be tracked within the structure based upon measured vibration patterns.

A Performance Level may include one or more of: operating the Structure for a term of years within a threshold use of energy; operating the Structure for a term of years within a threshold number of repairs; and operating the Structure for a term of years within a threshold budgetary cost.

Figure 5:
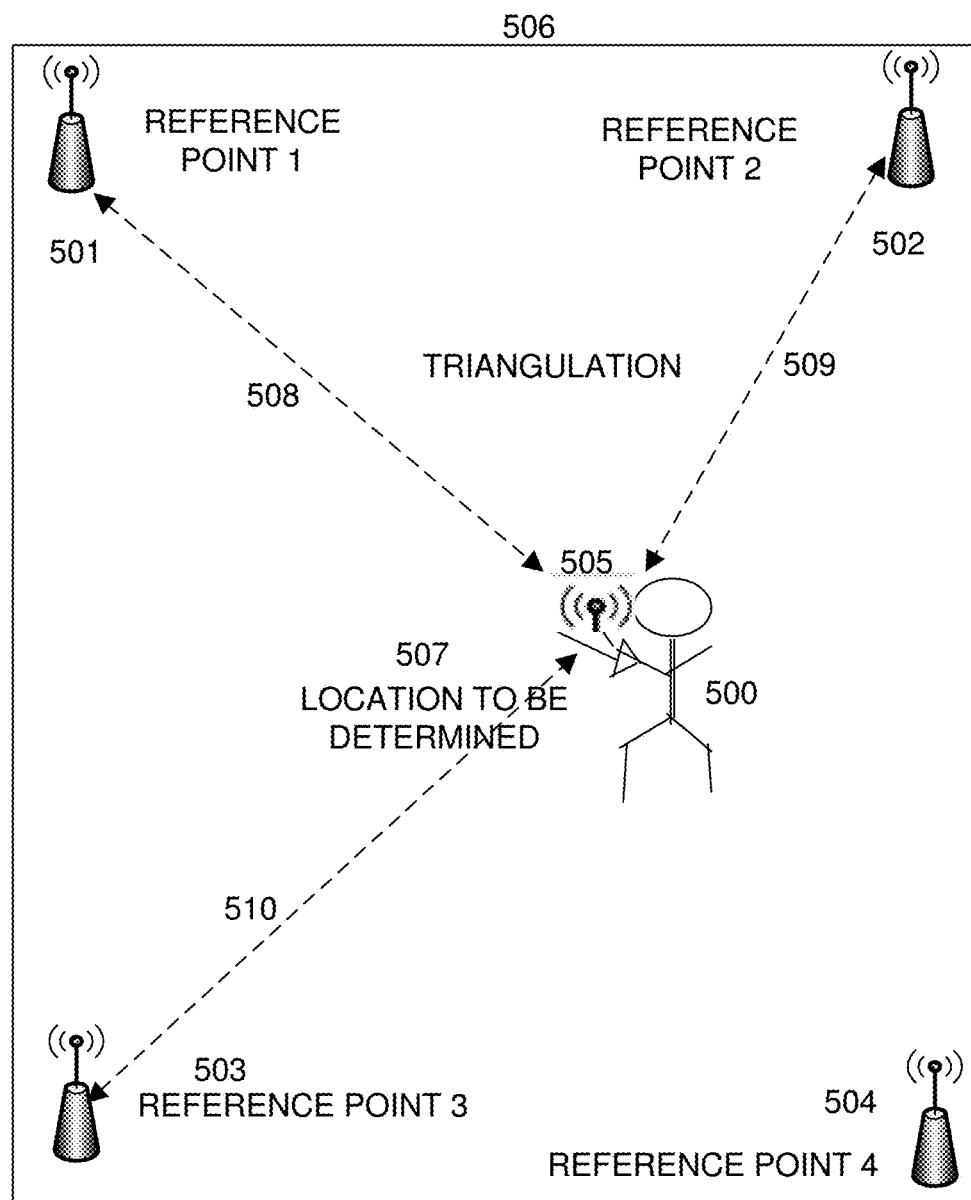
FIGS. 5-5A illustrate location and positioning transceivers used for location determination.

FIG. 5 illustrates Reference Point Transceivers 501-504 that may be deployed in a defined area 506, such as a Structure to determine a location 507 of an Agent 500 within or proximate to the defined area 505. Reference Point Transceivers 501-504 may be fixed in a certain location Transceive in a manner suitable for triangulation determination a position of an Agent. Transceiving may be via wireless transmission to one or more Transceivers 505 supported by the Agent 500.

By way of non-limiting example, Transceivers 505 supported by the Agent 500 may be included in, or be in logical communication with a smart device, such as a smart phone, tablet or other Agent supportable device, such as a headgear, ring, watch, wand, pointer with Transceivers 505 able to Transceive with the Reference Point Transceivers 501-504. The Reference Point Transceivers 501-504 may include devices, such as, for example, a radio transmitter, radio receiver, a light generator, or an image recognizable device. A radio transmitter may include a router or other WiFi, Bluetooth or other communication device for entering into logical communication with a controller. In some embodiments, Reference Point Transceivers 501-504 may include a WiFi router that additionally provides access to a distributed network, such as the Internet. Cartesian Coordinates, X, Y, Z coordinates, vector values, a GPS position, or other data that may be utilized for one or more of: locating one or both of an Agent 500; indicating a direction of interest; and identify a Structure or defined area 506.

A precise location may be determined via triangulation based upon a measured distance from three or more Reference Point Transceivers 501-504. For example, a radio transmission or light signal may be measured and compared from the three reference position identifiers 501-503. Other embodiments may include a device recognizable via image analysis and a camera or other Image Capture Device, such as a CCD device, may capture an image of three or more Reference Point Transceivers 501-504. Image analysis may recognize the identification of each of three or more of the Reference Point Transceivers 501-504 and a size ratio of the respective image captured Reference Point Transceivers 501-504 may be utilized to calculate a precise position. Similarly, a height designation may be made via triangulation using the position identifiers as reference to a known height or a reference height.

Figure 5A:
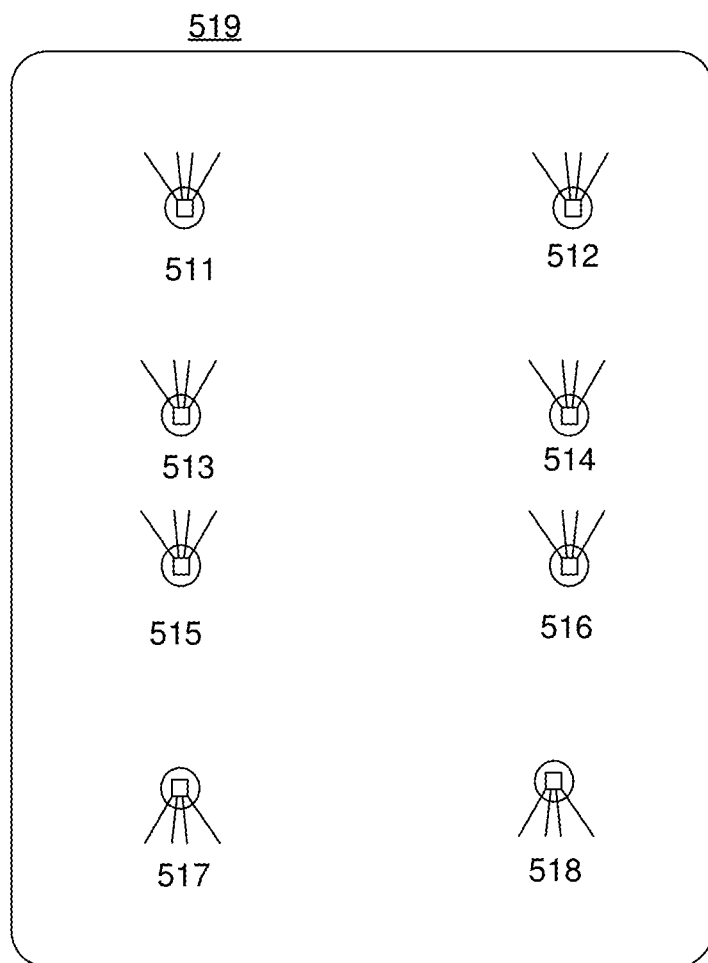

Referring now to FIG. 5A, according to the present invention, an Agent 500 may support one or more Transceivers 506 that include one or both of: a Multi-modality Transceiver 511 and transceivers of a same modality 512; Transceivers of different modalities 513 and a transmitter of a single modality 514; a transmitter of multiple modalities 515; a receiver of a single modality 516 and a receiver or multiple modalities 517. Similarly, a Reference Point Transceiver 501-504 may include multiple Transceivers, transmitters and receivers 511-518. The multiple Transceivers, transmitters and receivers 511-518 may include one or both of: transmitters and receivers of a same modality; and transmitters and receivers of different modalities. FIG. 5A illustrates a generic Transceiver 519 that may be a Reference Point Transceiver 501-504, or an Agent supported Transceiver 505. Both of which may include one or more of: a Multi-modality Transceiver 511 and transceivers of a same modality 512; Transceivers of different modalities 513 and a transmitter of a single modality 514; a transmitter of multiple modalities 515; a receiver of a single modality 516 and a receiver or multiple modalities 517.

A modality, as used in conjunction with a Transceiver, transmitter and/or receiver refers to one or both of a bandwidth of wireless communication and a protocol associated with a bandwidth. By way of non-limiting example, a modality, as used in relation to a Transceiver, transmitter and/or receiver may include: WiFi; WiFi RTT; Bluetooth; UWB; Ultrasonic, sonic, infrared; or other logical communication medium.

Referring now again to FIG. 5, according to the present invention, triangulation essentially includes determining an intersection of three distances 508-510, each distance 508-510 calculated from a reference point 501-504 to an Agent supported device 505. The present invention allows for a first distance 508, to be determined based upon a wireless communication in a first modality; and a second distance 509 and a third distance 510 determined based upon a wireless communication in a same or different modality as the first modality. For example, a first distance 508 may be determined based upon a wireless communication using WiFi; a second distance 509 may be determined based upon a wireless communication using Bluetooth; and a third communication may be determined based upon a wireless communication using ultrasonic communication (other combinations of same and/or different communication modalities are also within the scope of the present invention).

Figure 6:
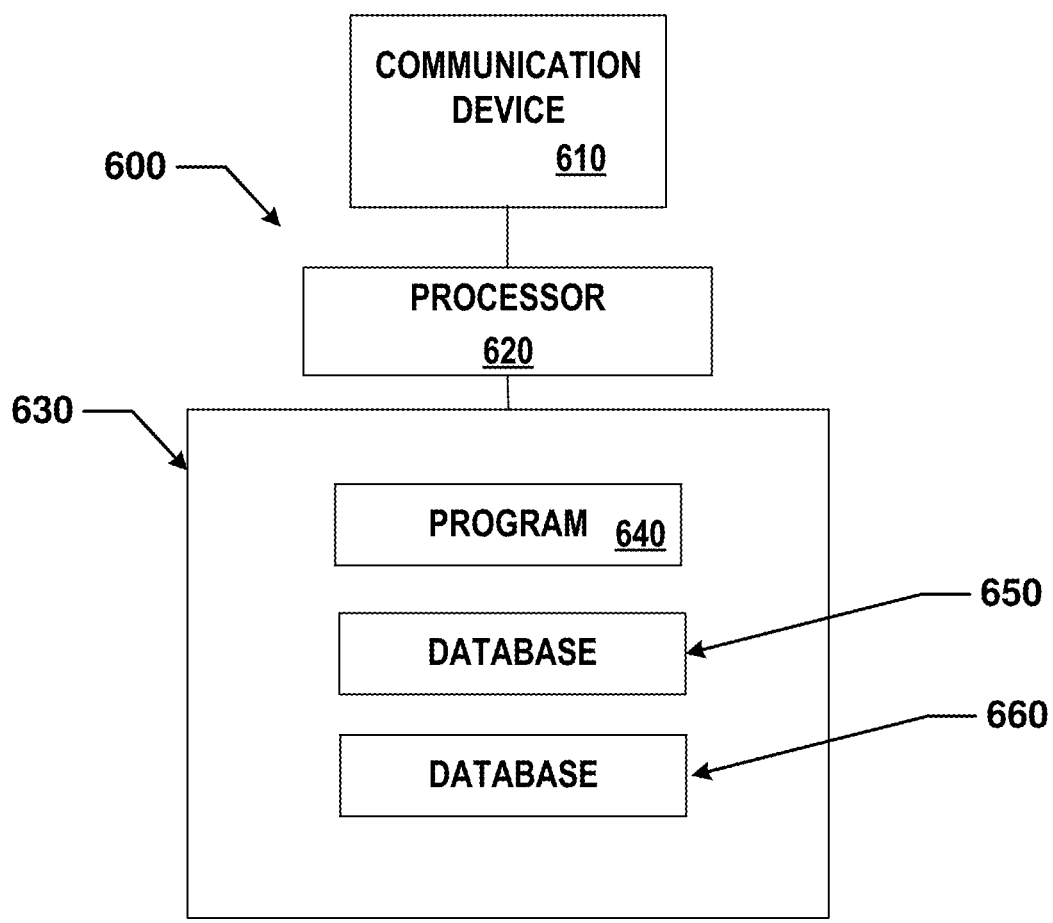
FIG. 6 illustrates apparatus that may be used to implement aspects of the present invention including executable software.

Referring now to FIG. 6 an automated controller is illustrated that may be used to implement various aspects of the present invention, in various embodiments, and for various aspects of the present invention, controller 600 may be included in one or more of: a wireless tablet or handheld device, a server, a rack mounted processor unit. The controller may be included in one or more of the apparatus described above, such as a Server, and a Network Access Device. The controller 600 includes a processor unit 620, such as one or more semiconductor based processors, coupled to a communication device 610 configured to communicate via a communication network (not shown in FIG. 6). The communication device 610 may be used to communicate, for example, with one or more online devices, such as a personal computer, laptop, or a handheld device.

The processor 620 is also in communication with a storage device 630. The storage device 630 may comprise any appropriate information storage device, including combinations of magnetic storage devices (e.g., magnetic tape and hard disk drives), optical storage devices, and/or semiconductor memory devices such as Random Access Memory (RAM) devices and Read Only Memory (ROM) devices.

The storage device 630 can store a software program 640 with executable logic for controlling the processor 620. The processor 620 performs instructions of the software program 640, and thereby operates in accordance with the present invention. The processor 620 may also cause the communication device 610 to transmit information, including, in some instances, control commands to operate apparatus to implement the processes described above. The storage device 630 can additionally store related data in a database 650 and database 660, as needed.

Figure 7:
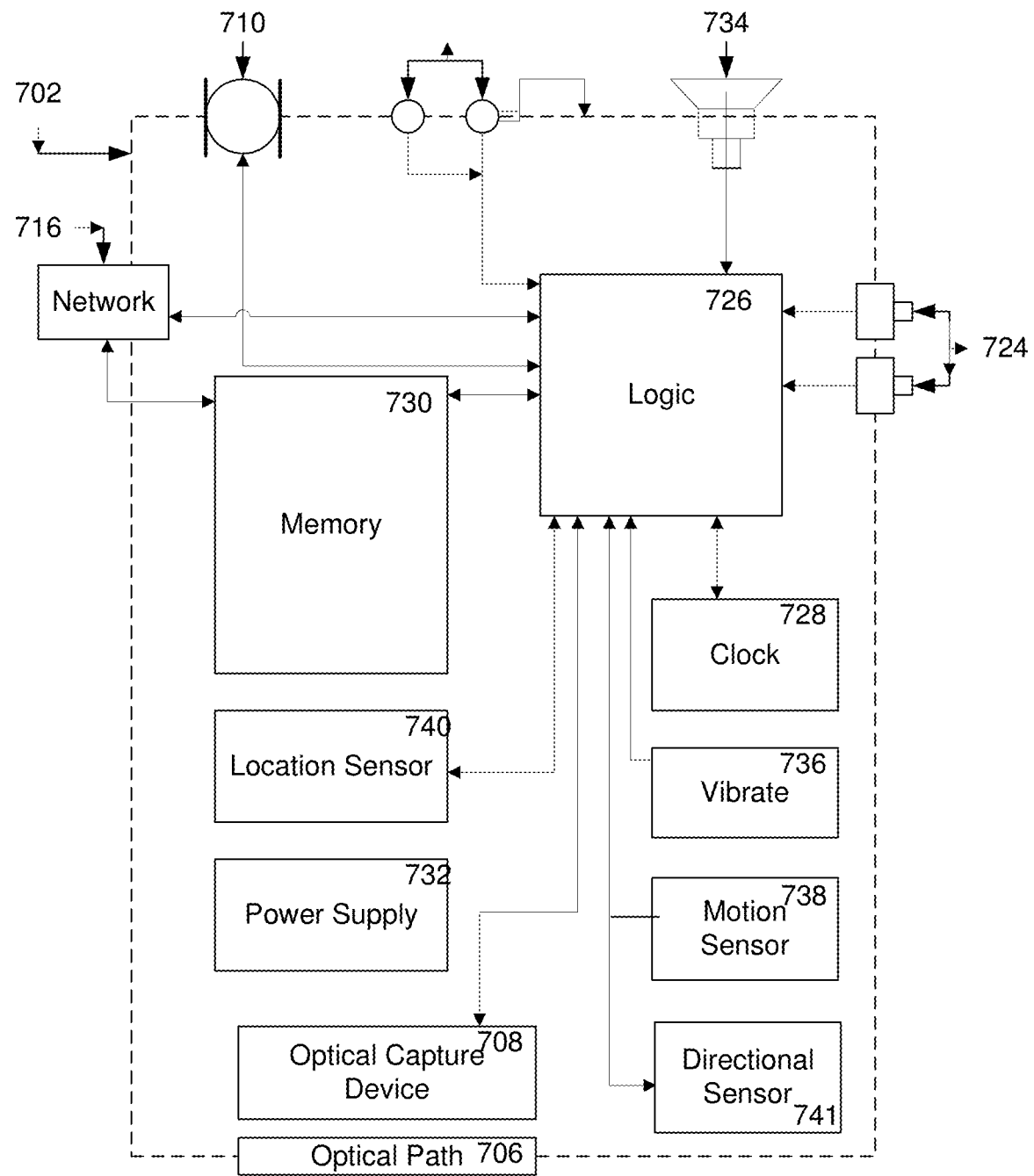
FIG. 7 illustrates an exemplary mobile smart device that may be used to implement aspects of the present invention including executable software.

Referring now to FIG. 7, a block diagram of an exemplary mobile device 702. The mobile device 702 comprises an optical capture device 708 to capture an image and convert it to machine-compatible data, and an optical path 706, typically a lens, an aperture or an image conduit to convey the image from the rendered document to the optical capture device 708. The optical capture device 708 may incorporate a Charge-Coupled Device (CCD), a Complementary Metal Oxide Semiconductor (CMOS) imaging device, or an optical Sensor 724 of another type.

A microphone 710 and associated circuitry may convert the sound of the environment, including spoken words, into machine-compatible signals. Input facilities may exist in the form of buttons, scroll wheels, or other tactile Sensors such as touch-pads. In some embodiments, input facilities may include a touchscreen display.

Visual feedback to the user is possible through a visual display, touchscreen display, or indicator lights. Audible feedback 734 may come from a loudspeaker or other audio transducer. Tactile feedback may come from a vibrate module 736.

A motion Sensor 738 and associated circuitry convert the motion of the mobile device 702 into machine-compatible signals. The motion Sensor 738 may comprise an accelerometer that may be used to sense measurable physical acceleration, orientation, vibration, and other movements. In some embodiments, motion Sensor 738 may include a gyroscope or other device to sense different motions.

A location Sensor 740 and associated circuitry may be used to determine the location of the device. The location Sensor 740 may detect Global Position System (GPS) radio signals from satellites or may also use assisted GPS where the mobile device may use a cellular network to decrease the time necessary to determine location. In some embodiments, the location Sensor 740 may use radio waves to determine the distance from known radio sources such as cellular towers to determine the location of the mobile device 702. In some embodiments these radio signals may be used in addition to GPS.

The mobile device 702 comprises logic 726 to interact with the various other components, possibly processing the received signals into different formats and/or interpretations. Logic 726 may be operable to read and write data and program instructions stored in associated storage or memory 730 such as RAM, ROM, flash, or other suitable memory. It may read a time signal from the clock unit 728. In some embodiments, the mobile device 702 may have an on-board power supply 732. In other embodiments, the mobile device 702 may be powered from a tethered connection to another device, such as a Universal Serial Bus (USB) connection.

The mobile device 702 also includes a network interface 716 to communicate data to a network and/or an associated computing device. Network interface 716 may provide two-way data communication. For example, network interface 716 may operate according to the internet protocol. As another example, network interface 716 may be a local area network (LAN) card allowing a data communication connection to a compatible LAN. As another example, network interface 716 may be a cellular antenna and associated circuitry which may allow the mobile device to communicate over standard wireless data communication networks. In some implementations, network interface 716 may include a Universal Serial Bus (USB) to supply power or transmit data. In some embodiments other wireless links may also be implemented.

As an example of one use of mobile device 702, a reader may scan some coded information from a location marker in a facility with the mobile device 702. The coded information may include for example a hash code, bar code, RFID or other data storage device. In some embodiments, the scan may include a bit-mapped image via the optical capture device 708. Logic 726 causes the bit-mapped image to be stored in memory 730 with an associated time-stamp read from the clock unit 728. Logic 726 may also perform optical character recognition (OCR) or other post-scan processing on the bit-mapped image to convert it to text. Logic 726 may optionally extract a signature from the image, for example by performing a convolution-like process to locate repeating occurrences of characters, symbols or objects, and determine the distance or number of other characters, symbols, or objects between these repeated elements. The reader may then upload the bit-mapped image (or text or other signature, if post-scan processing has been performed by logic 726) to an associated computer via network interface 716.

As an example of another use of mobile device 702, a reader may capture some text from an article as an audio file by using microphone 710 as an acoustic capture port. Logic 726 causes audio file to be stored in memory 730. Logic 726 may also perform voice recognition or other post-scan processing on the audio file to convert it to text. As above, the reader may then upload the audio file (or text produced by post-scan processing performed by logic 726) to an associated computer via network interface 716.

A directional sensor 741 may also be incorporated into the mobile device 702. The directional device may be a compass and be based upon a magnetic reading, or based upon network settings.

In the following sections, detailed descriptions of examples and methods of the invention will be given. The description of both preferred and alternative examples though through are exemplary only, and it is understood that to those skilled in the art that variations, modifications and alterations may be apparent. It is therefore to be understood that the examples do not limit the broadness of the aspects of the underlying invention as defined by the claims.

Referring now to FIG. 8, exemplary steps that may be performed in some aspects of the present invention are illustrated. At step 801, a processor may generate an AVM model of a Structure. The AVM model may be based upon a physical layout of the Structure and include a layout of each item of machinery, equipment as well as facility features. At step 802, the AVM may receive data indicative of one or more performance metrics. Data may include data generated via a sensor and/or input by a user. In some examples, data may include performance metrics, utility cost, maintenance cost and replacement cost.

At step 803, a data connection between a deployed facility and an AVM may be automated to generate and transmit data to the model on an automated basis without human intervention or artificial delay. All or some data may be stored in a storage. At step 804, the AVM may access received and/or historical data from the same or other AVM models. At step 805. Artificial Intelligence routines or other logic may integrate relevant indices, including one or more of: geographic location, labor organization, market conditions, labor costs, physical conditions, property status or data descriptive of other variables.

At step 806, an AVM may generate a value for build and deployment cost, and at step 807 the AVM may include utility and consumables cost. At step 808 an AVM may generate one or more of: predicted and actual quantifications from the structure; energy consumption and process throughput.

Figure 9A:
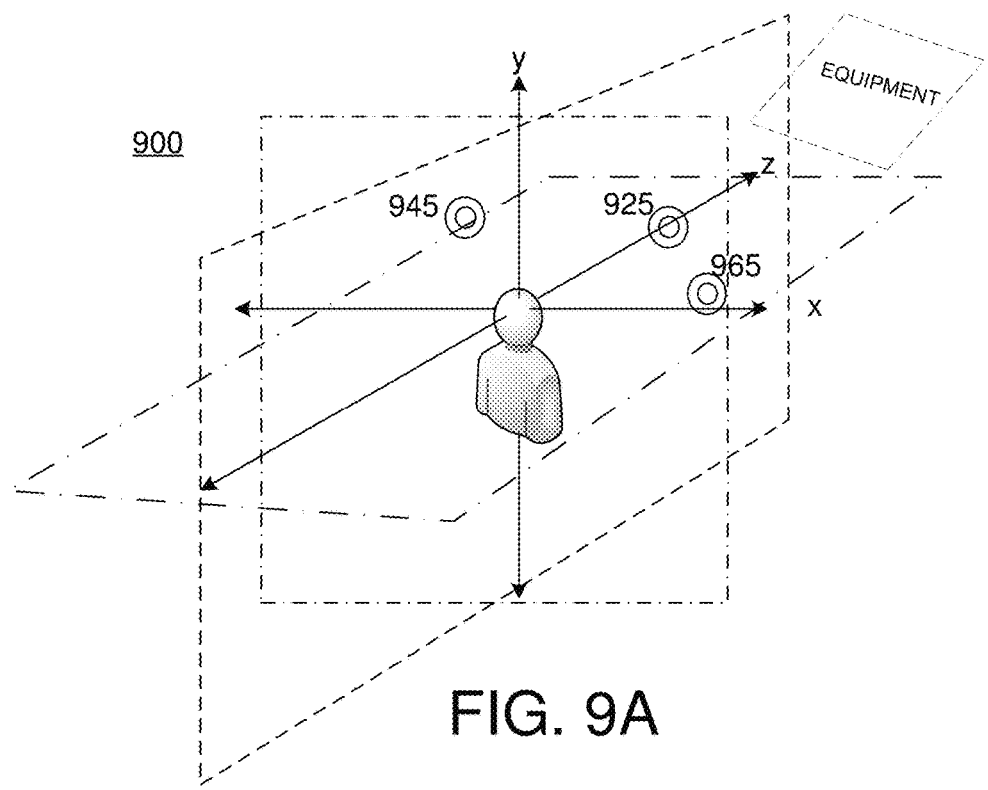
FIGS. 9A-D illustrates views of an AVM via a wearable eye display according to some aspects of the present invention.
Figure 9B:
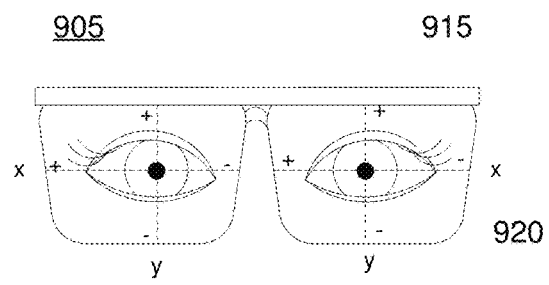
Figure 9C:
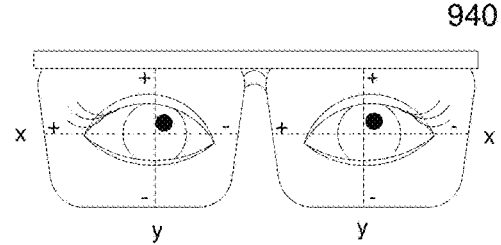
Figure 9D:
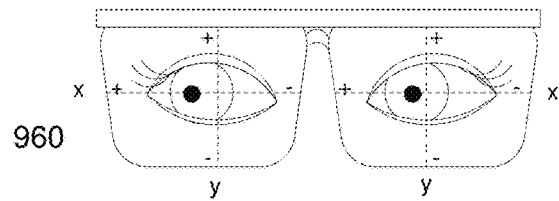

Referring now to FIG. 9A, an exemplary perspective graph 900 comprising three separate perspective points 925, 945, 965 is illustrated. In some aspects, as illustrated in FIG. 9B, a wearable display 905 may be configured to detect eye movement of the wearer 915, which may be calibrated. For example, such as illustrated in FIG. 9B, a neutral, forward-looking eye position 920 may be established as the center point of the axes 910 (0, 0), which may establish a view along the positive z-axis. As a further illustrative example in FIG. 9C, once calibrated, a shift in eye position 940 to look up and left may change a view from the vantage point and be transmitted to the AVM to access another portion of the AVM. As an illustrative example, as shown in FIG. 9D, a user may look right, and the eye position 960 may shift along the positive x-axis.

In some aspects, the wearable display 905 may comprise a set of goggles or glasses, wherein the goggles or glasses may comprise one or more lenses. For example, a single wrapped lens may allow a user to experience panoramic views. Alternately, dual lenses may provide different image data, wherein the combined images may allow the user to have stereoscopic perception of the performance event. In still further embodiments, the wearable display 905 may comprise a helmet, which may allow for more detailed immersion. For example, a helmet may allow for temperature control, audio isolation, broader perspectives, or combinations thereof.

Figure 10A:
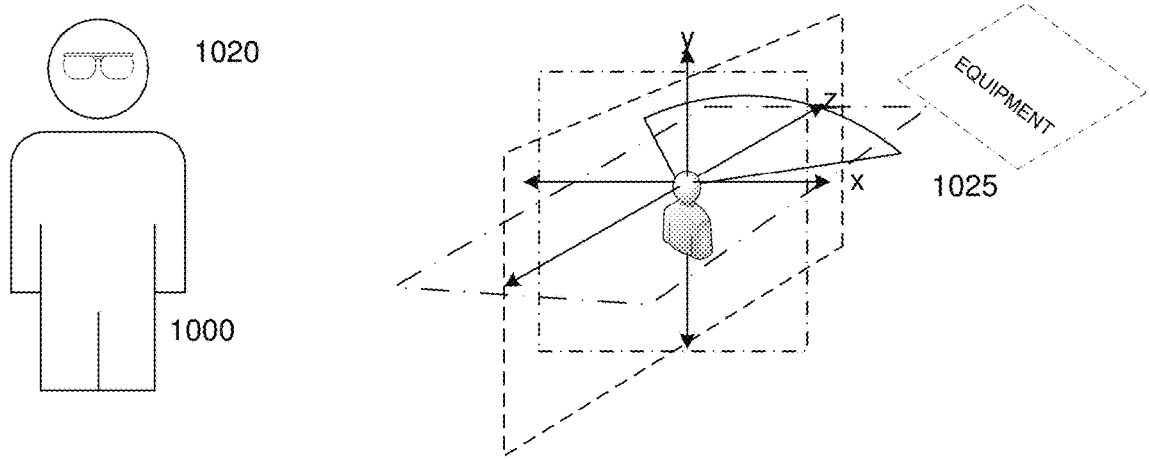
FIGS. 10A-C illustrates viewing areas of an AVM according to some aspects of the present invention.
Figure 10B:
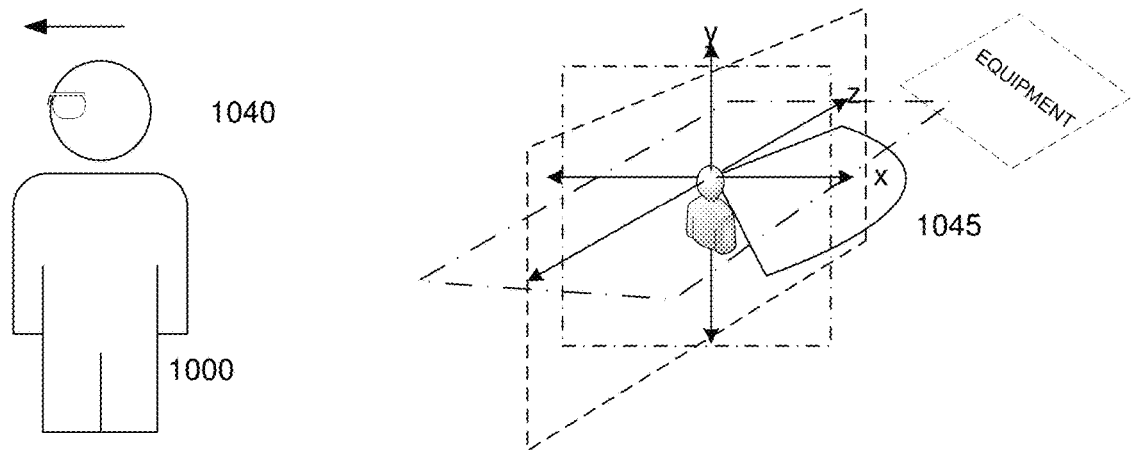
Figure 10C:
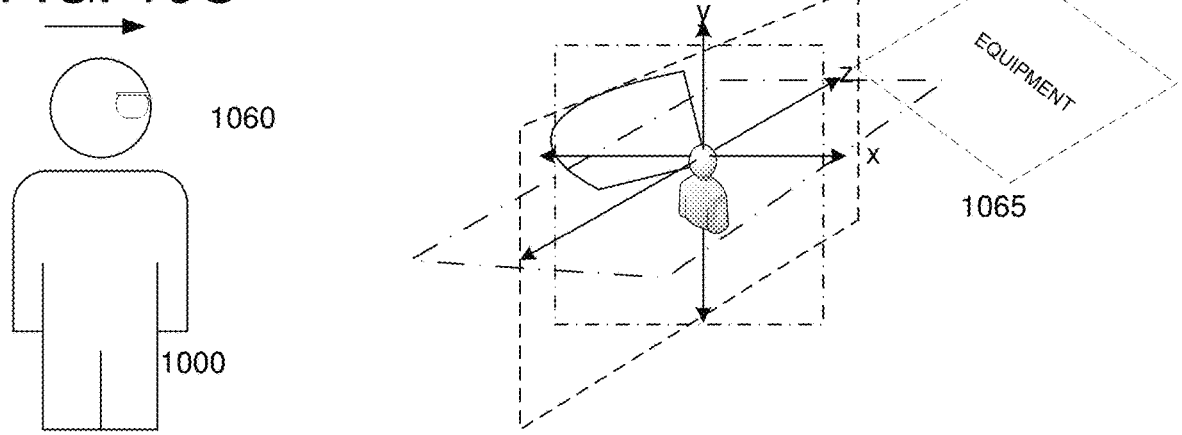

Referring now to FIGS. 10A-10C, exemplary horizontal changes in viewing areas are illustrated. In some embodiments, the wearable display may comprise an accelerometer configured to detect head movement. Similarly, to the eye position detection, the accelerometer may be calibrated to the natural head movements of a user 1000. In some embodiments, the calibration may allow the user to tailor the range to the desired viewing area. For example, a user may be able to move their head 110° comfortably, and the calibration may allow the user to view the entire 180° relative the natural 110° movement.

As illustrated in FIG. 10A, a neutral head position 1020 of the wearable display may allow the user 1000 to view a forward-looking perspective 1025. As illustrated in FIG. 10B, a right head position 1040 of the wearable display may allow the user 1000 to view a rightward-looking perspective 1045. As illustrated in FIG. 10C, a left head position 1060 of the wearable display may allow the user 1000 to view a leftward-looking perspective 1065.

Referring now to FIGS. 11A-11C, exemplary vertical changes in viewing areas are illustrated. Similarly, to FIGS. 10A-10C, in some embodiments, the wearable display may be configured to detect vertical motions. In some aspects, a user may look up to shift the viewing area to a range in the positive y axis grids, and user may look down to shift the viewing area to a range in the negative y axis grids. In some embodiments, the wearable display may be configured to detect both horizontal and vertical head motion, wherein the user may be able to have almost a 270° viewing range.

As illustrated in FIG. 11A, a neutral head position 1120 of the wearable display may allow the user 1100 to view a forward-looking perspective 1125. As illustrated in FIG. 11B, an up head position 1140 of the wearable display may allow the user 1100 to view an upward-looking perspective 1145. As illustrated in FIG. 11C, a down head position 1160 of the wearable display may allow the user 1100 to view a downward-looking perspective 1165.

In still further embodiments, the wearable display may be able to detect 360° of horizontal movement, wherein the user may completely turn around and change the neutral viewing range by 180°. In some aspects, the wearable display may be configured to detect whether the user may be sitting or standing, which may shift the perspective and viewing area. In some implementations, a user may be allowed to activate or deactivate the motion detection levels, based on preference and need. For example, a user may want to shift between sitting and standing throughout the experience without a shift in perspective. In some implementations, the wearable display may further comprise speakers, wherein audio data may be directed to the user.

In some embodiments, the wearable display may allow for immersion level control, wherein a user may adjust the level of light and transparency of the wearable display and/or frames. In some aspects, the lenses of the wearable display may comprise an electrically active layer, wherein the level of energy may control the opacity. For example, the electrically active layer may comprise liquid crystal, wherein the energy level may control the alignment of the liquid crystal. Where a user may prefer a fully immersive viewing experience, the lenses may be blacked out, wherein the user may see the video with minimal external visibility. Where a user may still prefer to have awareness or interactions beyond the video, the lenses and/or frames may allow for some light to penetrate or may allow for some transparency of the video.

Additional examples may include Sensor arrays, audio capture arrays and camera arrays with multiple data collection angles that may be complete 360 degree camera arrays or directional arrays, for example, in some examples, a Sensor array (including image capture Sensors) may include at least 120 degrees of data capture, additional examples include a Sensor array with at least 180 degrees of image capture; and still other examples include a Sensor array with at least 270 degrees of image capture. In various examples, data capture may include Sensors arranged to capture image data in directions that are planar or oblique in relation to one another.

Figure 12:
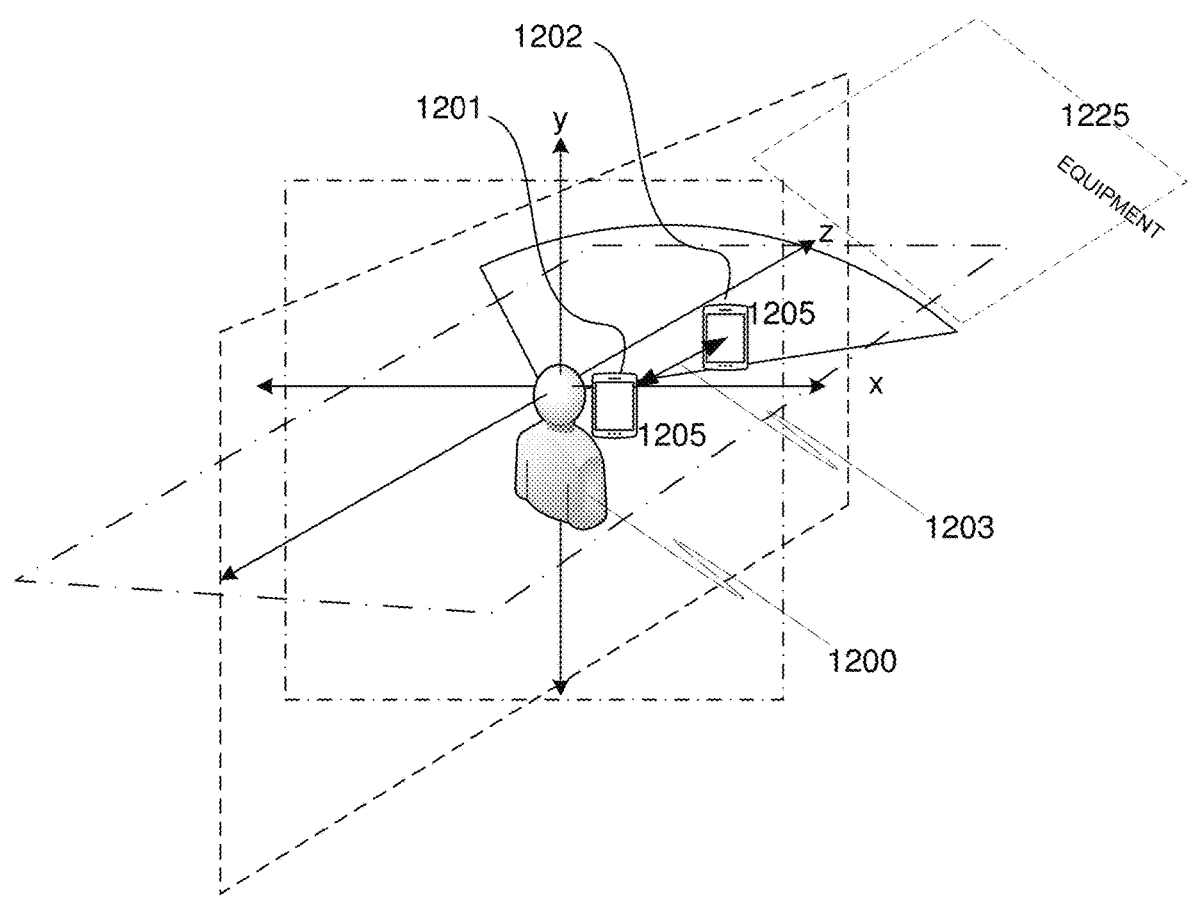
FIG. 12 illustrates designation of a direction according to some aspects of the present invention.

Referring now to FIG. 12, methods and devices for determining a direction that may be referenced for one or both of data capture and AVM presentation of a particular portion of the virtual representation of the modeled structure. A User 1200 may position a Smart Device 1205 in a first position 1201 proximate to a portion of a structure for which a representation in the AVM the User 1200 wishes to retrieve and display. The first position 1201 of the Smart Device 1205 may be determined (as discussed herein via GPS and/or triangulation) and recorded. The User 1200 may then relocate the Smart Device 1205 to a second position 1202 in a general direction of the portion of a structure (illustrated as the Z direction) for which a representation in the AVM the User 1200 wishes to retrieve and display. In this manner, the AVM system (not shown in FIG. 12) and/or the Smart Device 1205 may generate one or both of a ray and a vector towards the portion of a structure for which a representation in the AVM the User 1200 wishes to retrieve and display.

In some embodiments, the vector may have a length determined by the AVM that is based upon a length of a next Feature in the AVM located in the direction of the generated vector. The vector will represent a distance 1203 from the second position 1202 to an item 1225 along the Z axis defined by a line between the first position 1201 and the second position 1202. A ray will include a starting point and a direction.

As illustrated, the change in the Z direction is associated with a zero change in the X and Y directions. The process may also include a second position 1205 that has a value other than zero in the X and/or Y directions.

In other embodiments, a User 1200 may deploy a laser, accelerometer, sound generator or other device to determine a distance from the Smart Device 1205 to the feature, such as a piece of equipment. Such unique methods of determining a location and direction of data capture may be utilized to gather data during construction of modeled buildings or other structures and during Deployment of the structures during the Operational Stage. An additional non-limiting example may include direction based identification; with a fixed location, or in tandem with a location means, a device may have capabilities to deduce orientation based information of the device. This orientation information may be used to deduce a direction that the device is pointing in. This direction based information may be used to indicate that the device is pointing to a specific piece of equipment 1225 that may be identified in the AVM.

In still other embodiments, a device with a controller and an accelerometer, such as mobile Smart Device 1205, may include a user display that allows a direction to be indicated by movement of the device from a determined location acting as a base position towards an As Built feature in an extended position. In some implementations, the Smart Device determines a first position 1201 based upon triangulation with the reference points. The process of determination of a position based upon triangulation with the reference points may be accomplished, for example via executable software interacting with the controller in the Smart Device, such as, for example by running an app on the Smart Devices 1205.

In combination with, or in place of directional movement of a Smart Device 1205 in order to quantify a direction of interest to a user, some embodiments may include an electronic and/or magnetic directional indicator that may be aligned by a user in a direction of interest. Alignment may include, for example, pointing a specified side of a device, or pointing an arrow or other symbol displayed upon a user interface on the device towards a direction of interest.

In a similar fashion, triangulation may be utilized to determine a relative elevation of the Smart Device as compared to a reference elevation of the reference points.

Other techniques for position determination, such as a fingerprint technique that utilizes a relative strength of a radio signal within a structure to determine a geospatial position. are also within the scope of the present invention.

It should be noted that although a Smart Device is generally operated by a human user, some embodiments of the present invention include a controller, accelerometer, and data storage medium, Image Capture Device, such as a Charge Coupled Device ("CCD") capture device and/or an infrared capture device being available in a handheld or unmanned vehicle.

An unmanned vehicle may include for example, an unmanned aerial vehicle ("UAV") or ground level unit, such as a unit with wheels or tracks for mobility and a radio control unit for communication.

In some embodiments, multiple unmanned vehicles may capture data in a synchronized fashion to add depth to the image capture and/or a three dimensional and 4 dimensional (over time) aspect to the captured data. In some implementations, UAV position will be contained within a perimeter and the perimeter will have multiple reference points to help each UAV (or other unmanned vehicle) determine a position in relation to static features of a building within which it is operating and also in relation to other unmanned vehicles. Still other aspects include unmanned vehicles that may not only capture data but also function to perform a task, such as paint a wall, drill a hole, cut along a defined path, or other function. As stated throughout this disclosure, the captured data may be incorporated into an AVM.

In still other embodiments, captured data may be compared to a library of stored data using recognition software to ascertain and/or affirm a specific location, elevation and direction of an image capture location and proper alignment with the virtual model. Still other aspects may include the use of a compass incorporated into a Smart Device.

By way of non-limiting example, functions of the methods and apparatus presented herein may include one or more of the following factors that may be modeled and/or tracked over a defined period of time, such as, for example, an expected life of a build (such as, 10 years or 20 years).

Figure 13:
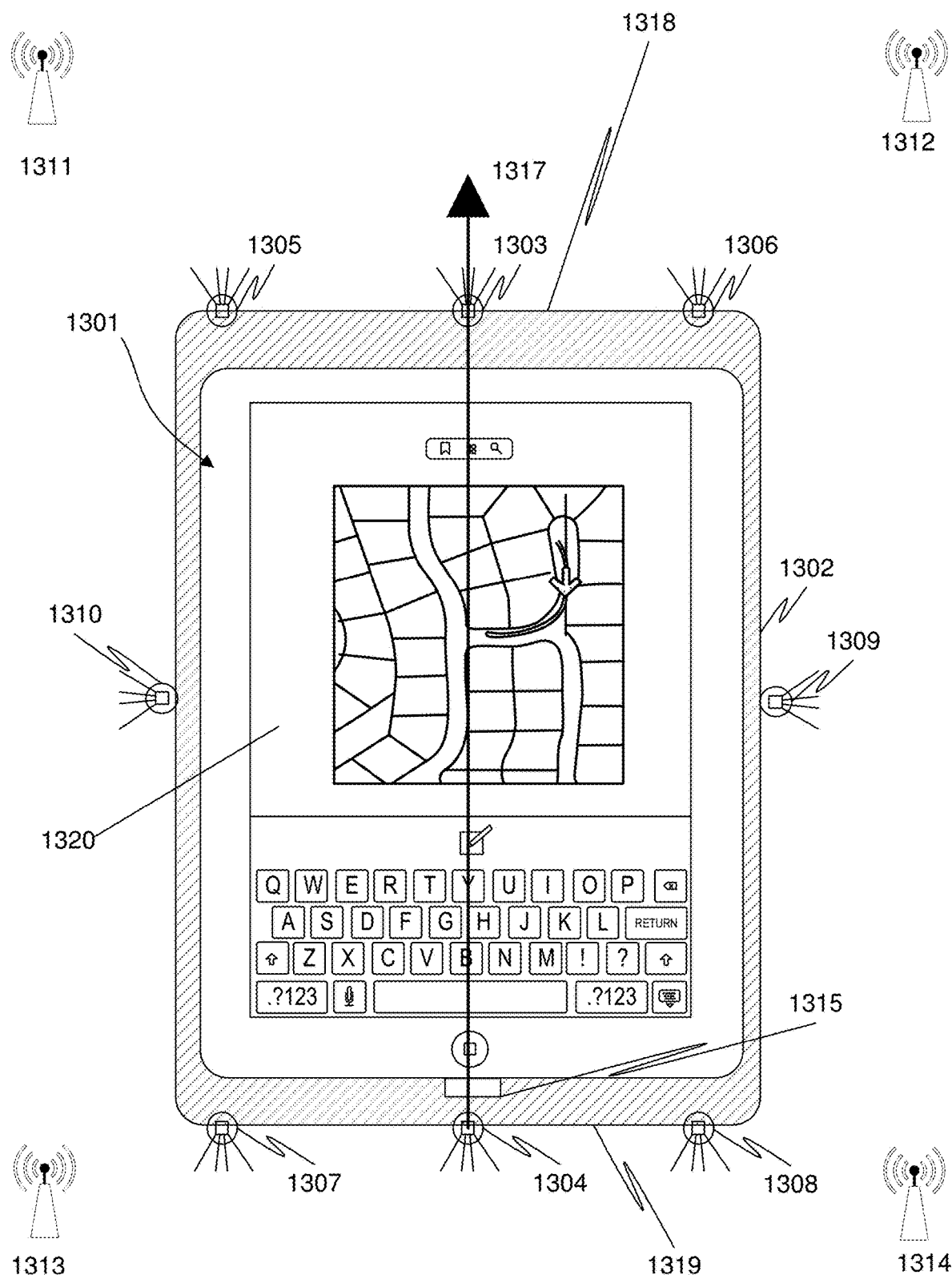
FIGS. 13, 13A-13D illustrate a device and vectors according to various embodiments of the present invention.

Referring now to FIG. 13, additional apparatus and methods for determining a geospatial location and determination of a direction of interest may include one or both of an enhanced smart device and a smart device in logical communication with wireless position devices 1303-1310. The importance of geospatial location and determination of a direction of interest is discussed in considerable detail above. As illustrated, a smart device 1301 may be in logical communication with one or more wireless position devices 1303-1310 strategically located in relation to the physical dimensions of the smart device. For example, the smart device 1301 may include a smart phone or tablet device with a user interface surface 1320 that is generally planar. The user interface surface 1320 will include a forward edge 1318 and a trailing edge 1319.

In some preferred embodiments, the smart device will be fixedly attached to a smart receptacle 1302. The smart receptacle 1302 may include an appearance of a passive case, such as the type typically used to protect the smart device 1301 from a damaging impact. However, according to the present invention, the smart receptacle 1302 will include digital and/or analog logical components, such as wireless position devices 1303-1310. The wireless position devices 1303-1310 include circuitry capable of receiving wireless transmissions from multiple wireless positional reference transceivers 1311-1314. The wireless transmissions will include one or both of analog and digital data suitable for calculating a distance from each respective reference point 1311-1314.

In some embodiments, the smart receptacle 1302 will include a connector 1315 for creating an electrical path for carrying one or both of electrical power and logic signals between the smart device 1301 and the smart receptacle 1302. For example, the connector 1315 may include a mini-usb connector or a lightening connector. Additional embodiments may include an inductive coil arrangement for transferring power.

Embodiments may also include wireless transmitters and receivers to provide logical communication between the wireless position devices 1303-1310 and the smart device 1301. Logical communication may be accomplished, for example, via one or more of: Bluetooth, ANT, and infrared mediums.

Reference transceivers 1311-1314 provide wireless transmissions of data that may be received by wireless position devices 1303-1310. The wireless transmissions are utilized to generate a position of the respective wireless position devices 1303-1310 in relation to the According to the present invention, reference transceivers 1311-1314 providing the wireless transmissions to the wireless position devices 1303-1310 are associated with one or more of: a position in a virtual model; a geographic position; a geospatial position in a defined area, such as Structure; and a geospatial position within a defined area (such as, for example a property).

According to the present invention, a smart device may be placed into a case, such as a smart receptacle 1302 that includes two or more wireless position devices 1303-1310. The wireless position devices 1303-1310 may include, for example, one or both of: a receiver and a transmitter, in logical communication with an antenna configured to communicate with reference transceivers 1311-1314. Communications relevant to location determination may include, for example, one or more of: timing signals; SIM information; received signal strength; GPS data; raw radio measurements; Cell-ID; round trip time of a signal; phase; and angle of received/transmitted signal; time of arrival of a signal; a time difference of arrival; and other data useful in determining a location.

The wireless position devices 1303-1310 may be located strategically in the case 1302 to provide intuitive direction to a user holding the case 1302, and also to provide a most accurate determination of direction. Accordingly, a forward wireless position device 1303 may be placed at a top of a smart device case and a reward wireless position device 1304 may be placed at a bottom of a smart device case 1302. Some embodiments each of four corners of a case may include a wireless position device 1305, 1306, 1307, 1308. Still other embodiments may include a wireless position device 1309 and 1310 on each lateral side.

The present invention provides for determination of a location of two or more wireless positioning devices 1303-1310 and generation of one or more directional vectors 1317 and/or rays based upon the relative position of the wireless positioning devices 1303-1310. For the sake of convenience in this specification, discussion of a vector that does not include specific limitations as to a length of the vector and is primarily concerned with a direction, a ray of unlimited length may also be utilized. In some embodiments, multiple directional vectors 1317 are generated and a direction of one or more edges, such as a forward edge, is determined based upon the multiple directional vectors 1317.

According to the present invention a geospatial location relative to one or more known reference points is generated. The geospatial location in space may be referred to as having an XY position indicating a planar designation (e.g. a position on a flat floor), and a Z position (e.g. a level within a structure, such as a second floor) may be generated based upon indicators of distance from reference points. Indicators of distance may include a comparison of timing signals received from wireless references. A geospatial location may be generated relative to the reference points.

In some embodiments, a geospatial location with reference to a larger geographic area is associated with the reference points, however, in many embodiments, the controller will generate a geospatial location relative to the reference point(s) and it is not relevant where the position is located in relation to a greater geospatial area.

In some embodiments, a position of a smart device may be ascertained via one or more of: triangulation; trilateration; and multilateration (MLT) techniques.

A geospatial location based upon triangulation may be generated based upon a controller receiving a measurement of angles between the position and known points at either end of a fixed baseline. A point of a geospatial location may be determined based upon generation of a triangle with one known side and two known angles.

A geospatial location based upon trilateration may be generated based upon a controller receiving wireless indicators of distance and geometry of geometric shapes, such as circles, spheres, triangles and the like.

A geospatial location based upon multilateration may be generated based controller receiving measurement of a difference in distance to two reference positions, each reference position being associated with a known location. Wireless signals may be available at one or more of: periodically, within determined timespans and continually. The determination of the difference in distance between two reference positions provides multiple potential locations at the determined distance. A controller may be used to generate a plot of potential locations. In some embodiments, the potential determinations generally form a curve. Specific embodiments will generate a hyperbolic curve.

The controller may be programmed to execute code to locate an exact position along a generated curve, which is used to generate a geospatial location. The multilateration thereby receives as input multiple measurements of distance to reference points, wherein a second measurement taken to a second set of stations (which may include one station of a first set of stations) is used to generate a second curve. A point of intersection of the first curve and the second curve is used to indicate a specific location.

In combination with, or in place of directional movement of a Smart Device 1301 in order to quantify a direction of interest to a user, some embodiments may include an electronic and/or magnetic directional indicator that may be aligned by a user in a direction of interest. Alignment may include, for example, pointing a specified side of a device, or pointing an arrow or other symbol displayed upon a user interface on the device towards a direction of interest.

In a similar fashion, triangulation may be utilized to determine a relative elevation of the Smart Device as compared to a reference elevation of the reference points.

It should be noted that although a Smart Device is generally operated by a human user, some embodiments of the present invention include a controller, accelerometer, and data storage medium, Image Capture Device, such as a Charge Coupled Device ("CCD") capture device and/or an infrared capture device being available in a handheld or unmanned vehicle.

An unmanned vehicle may include for example, an unmanned aerial vehicle ("UAV") or an unmanned ground vehicle ("UGV"), such as a unit with wheels or tracks for mobility. A radio control unit may be used to transmit control signals to a UAV and/or a UGV. A radio control unit may also receive wireless communications from the unmanned vehicle.

In some embodiments, multiple unmanned vehicles may capture data in a synchronized fashion to add depth to the image capture and/or a three dimensional and 4 dimensional (over time) aspect to the captured data. In some implementations, a UAV position will be contained within a perimeter and the perimeter will have multiple reference points to help each UAV (or other unmanned vehicle) determine a position in relation to static features of a building within which it is operating and also in relation to other unmanned vehicles. Still other aspects include unmanned vehicles that may not only capture data but also function to perform a task, such as paint a wall, drill a hole, cut along a defined path, or other function. As stated throughout this disclosure, the captured data may be incorporated into an AVM.

In still other embodiments, captured data may be compared to a library of stored data using recognition software to ascertain and/or affirm a specific location, elevation and direction of an image capture location and proper alignment with the virtual model. Still other aspects may include the use of a compass incorporated into a Smart Device.

By way of non-limiting example, functions of the methods and apparatus presented herein may include one or more of the following factors that may be modeled and/or tracked over a defined period of time, such as, for example, an expected life of a build (such as, 10 years or 20 years).

Figure 13A:
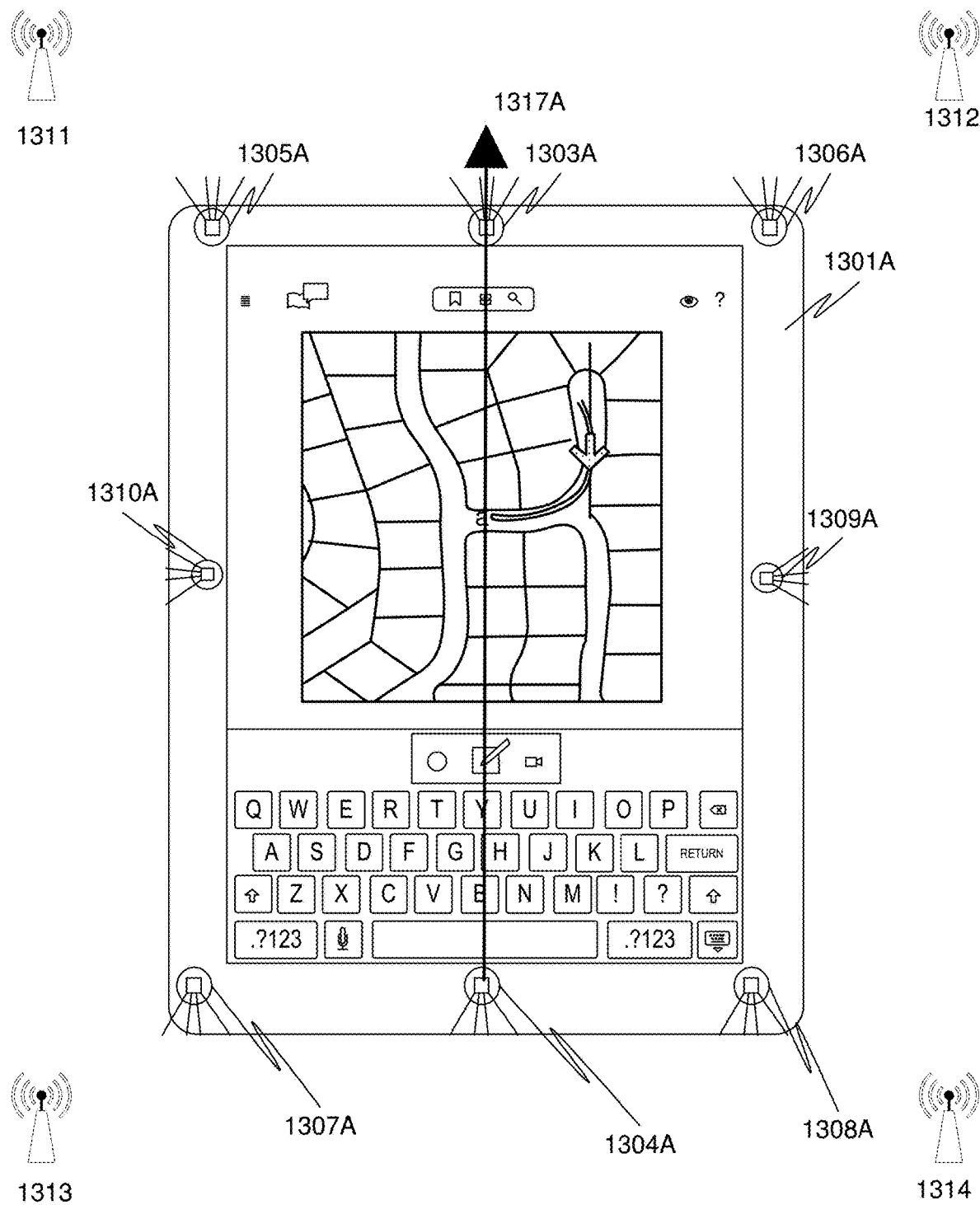

Referring now to FIG. 13A, in some embodiments, wireless position devices 1303A-1310A may be incorporated into a smart device 1301A and not require a smart receptacle to house wireless position devices 1303-1310. Wireless position devices 1303A-1310A that are incorporated into a smart device, such as a smart phone or smart tablet, will include internal power and logic connections and therefore not require wireless communication between the controller in the smart device 1301A and the Wireless position devices 1303A-1310A.

A person of ordinary skill in the arts will understand that a smart device 1301A with integrated wireless position devices 1303-1310 and a smart device 1301 with wireless position devices 1303-1310 in a smart receptacle 1302 may provide a directional indication, such as a directional vector 1317-1317A, without needing to move the smart device from a first position to a second position since a directional vector may be determined from a relative position of a first wireless position devices 1303-1310 and a second wireless positional device wireless position devices 1303-1310.

In exemplary embodiments, as described herein, the distances may be triangulated based on measurements of WiFi strength at two points. WiFi signal propagates outward as a wave, ideally according to an inverse square law. Ultimately, the crucial feature of the present invention relies on measuring relative distances at two points. In light of the speed of WiFi waves and real-time computations involved in orienteering, these computations need to be as computationally simple as possible. Thus, depending upon the specific application and means for taking the measurements, various coordinate systems may be desirable. In particular, if the smart device moves only in a planar direction while the elevation is constant, or only at an angle relative to the ground, the computation will be simpler.

Accordingly, an exemplary coordinate system is a polar coordinate system. One example of a three-dimensional polar coordinate system is a spherical coordinate system. A spherical coordinate system typically comprises three coordinates: a radial coordinate, a polar angle, and an azimuthal angle (r, θ, and φ, respectively, though a person of ordinary skill in the art will understand that θ and φ are occasionally swapped).

By way of non-limiting example, suppose Point 1 is considered the origin for a spherical coordinate system (i.e., the point (0, 0, 0)). Each WiFi emitter e1, e2, e3 can be described as points (r1, θ1, φ1), (r2, θ2, φ2), and (r3, θ3, φ3), respectively. Each of the ri's (1≤i≤3) represent the distance between the WiFi emitter and the WiFi receiver on the smart device.

It is understood that in some embodiments, an azimuth may include an angle, such as a horizontal angle determined in an arcuate manner from a reference plane or other base direction line, such as an angle formed between a reference point or reference direction; and line (ray or vector) such as a ray or vector generated from or continuing to; a smart device, or a positional sensor in logical communication with a smart device or other controller. In preferred embodiments the ray or vector may be generally directed from a reference point transceiver towards, and/or intersect one or more of: an item of interest; a point of interest; an architectural aspect (such as a wall, beam, header, corner, arch, doorway, window, etc.); an installed component that may act as a reference in an AVM (such as for example, an electrical outlet, a light fixture, a plumbing fixture, an architectural aspect), an item of equipment, an appliance, a multimedia device, etc.); another reference point transceiver or other identifiable destination. Embodiments include a position of the transceiver being determined via use of a polar coordinate system. The polar coordinate system may include a spherical coordinate system Accordingly, in some embodiments, spherical coordinate system may include reference point transceiver that is capable of determining an angle of departure of a location signal and a transceiver that is capable of determining an angle or arrival of the location signal; one or both of which may be used to facilitate determination of an applicable azimuth.

According to various embodiments of the present invention, one or both of an angle of departure and an angle of arrival may therefore be registered by a transceiver that is transmitting and/or receiving wireless signals (e.g. radio frequency, sonic frequency, or light frequency).

In some embodiments, orienteering occurs in a multi-story building, in which transceivers, (including for example one or more of: WiFi transceivers, UWB transceivers, Bluetooth transceivers, infrared transceivers and ultrasonic transceivers) may be located above and/or below the technician. In these embodiments, a cylindrical coordinate system may be more appropriate. A cylindrical coordinate system typically comprises three coordinates: a radial coordinate, an angular coordinate, and an elevation (r, 0, and z, respectively). A cylindrical coordinate system may be desirable where, for example, all WiFi emitters have the same elevation.

Figure 13B:
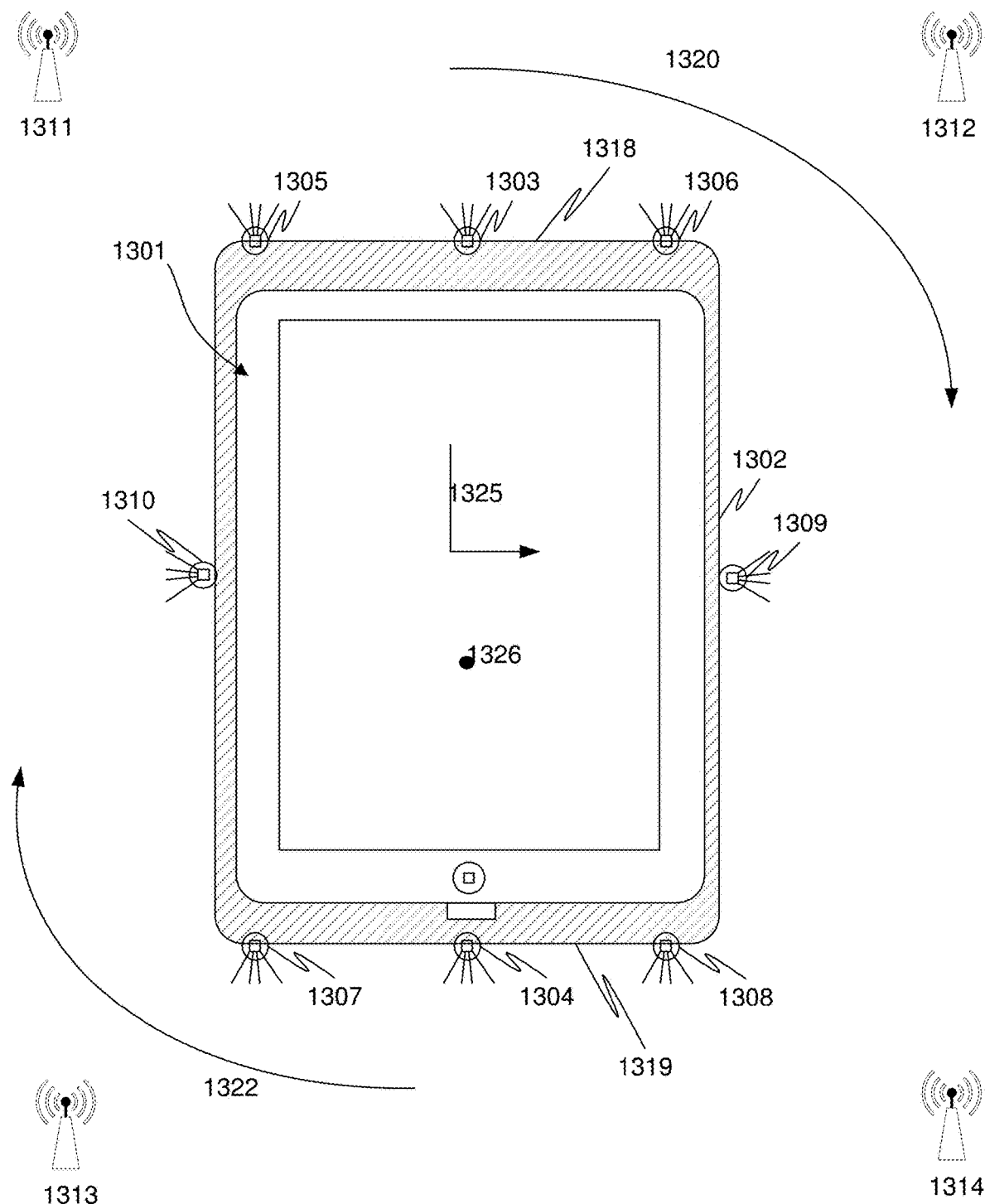

Referring now to FIG. 13B, in some embodiments, one or both of a smart device 1301 and a smart receptacle 1302 may be rotated in a manner (such as, for example in a clockwise or counterclockwise movement 1320, 1322 relative to a display screen) that repositions one or more wireless position devices 1303-1310 from a first position to a second position. A vector 1326 may be generated at an angle that is perpendicular 1325 or some other designated angle in relation to the smart device 1301. In some embodiments, an angle in relation to the smart device is perpendicular 1325 and thereby viewable via a forward looking camera on the smart device.

A user may position the smart device 1301 such that an object in a direction of interest is within in the camera view. The smart device may then be moved to reposition one or more of the wireless position devices 1303-1310 from a first position to a second position and thereby capture the direction of interest via a generation of a vector in the direction of interest.

Figure 13C:
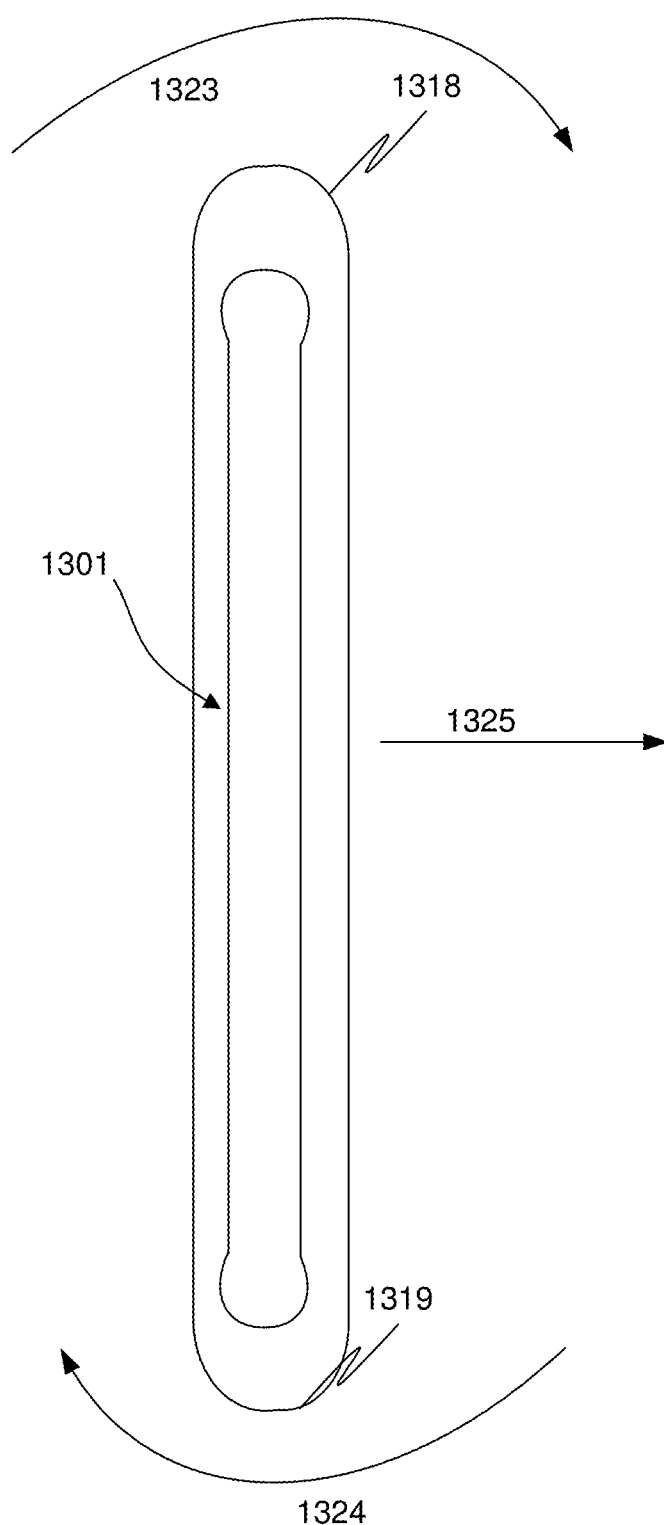

Referring now to FIG. 13C, as illustrated, a vector 1325 indicative of a direction of interest 1325 may be based upon a rocking motion 1323-1324 of the smart device 1301, such as a movement of an upper edge 1318 in a forward arcuate movement 1323. The lower edge 1319 may also be moved in a complementary arcuate movement 1324 or remain stationary. The movement of one or both the upper edge 1318-1319 also results in movement of one or more wireless position devices 1303-1310. The movement of the wireless position devices 1303-1310 will be a sufficient distance to register to geospatial positions based upon wireless transmissions. A required distance will be contingent upon a type of wireless transmission referenced to calculate the movement. For example, an infrared beam may require less distance than a WiFi signal, and a WiFi transmission may require less distance than a cell tower transmission which in turn may require less distance than a GPS signal.

Figure 13D:
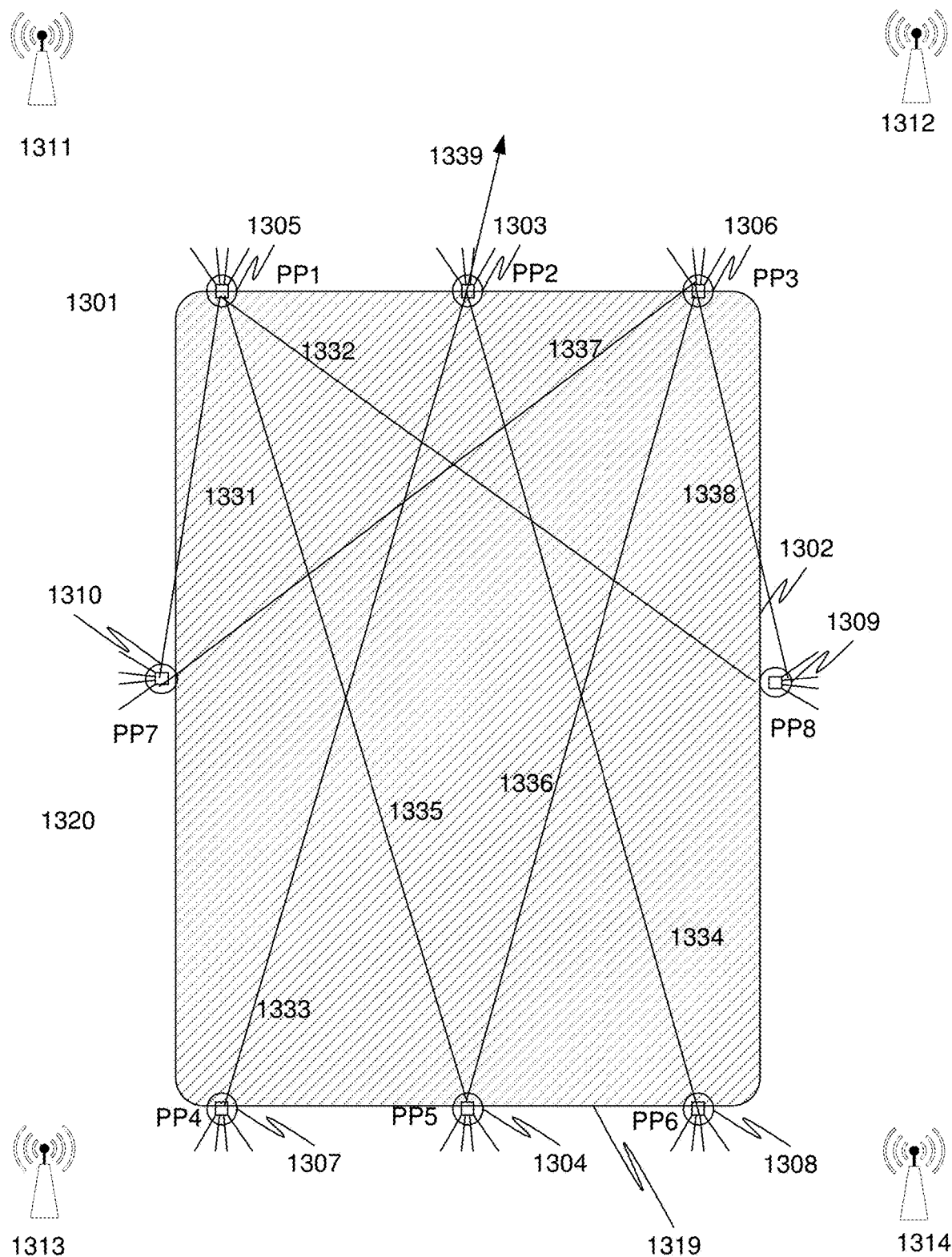

Referring to FIG. 13D, line segments 1331-1338 are illustrated that intersect various generated position points (PP1-PP8) for Transceivers 1303-1310. Position points PP1-PP8 may be generated according to the methods and apparatus presented herein, including a mathematical average, median, mean or other calculation of multiple positions determined via triangulation techniques. In addition, a vector 1339 or ray may be generated based upon one or more of the lines 1331-1338. In some embodiments, position points may be recorded in high numbers based upon thousands of logical communications per second and a virtual representation of the position points PP1-PP8 may be generated based upon the recorded position points PP1-PP8. Some embodiments may also include a cloud point type representation a device that comprises the Transceivers used to record position point PP1-PP8, wherein the cloud point representation is based upon the multiple positions calculated.

Figure 14:
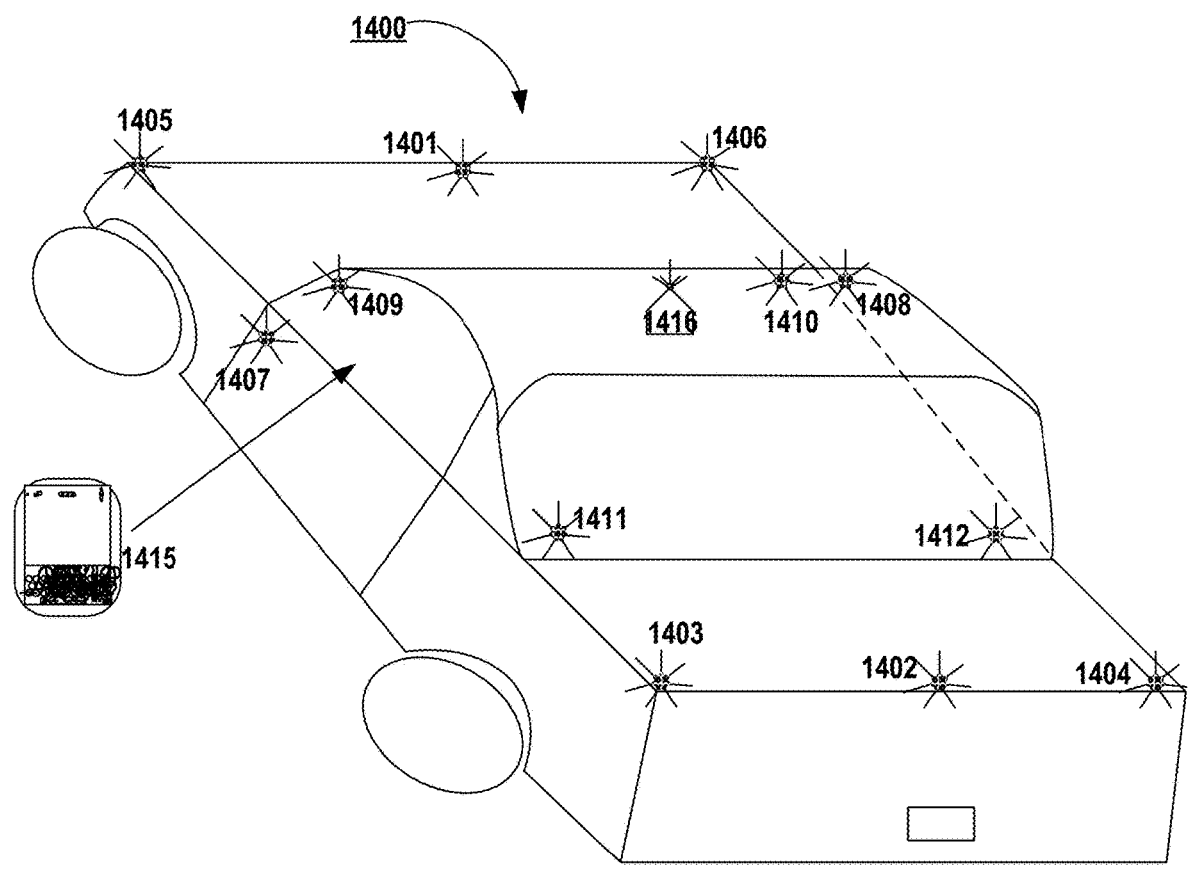
FIG. 14 illustrates a vehicle acting as platform 1400 for supporting wireless position devices.

Referring now to FIG. 14, in still other embodiments, a smart device 1415 may be logically associated with a larger platform 1400 for supporting wireless position devices 1401-1412. The larger platform 1400 may include a vehicle, such as an automobile, a truck, a ship, an aircraft, a motorcycle or other motorized vehicle. As illustrated the platform 1400 includes an automobile. The platform 1400 may include almost any combination of two or more wireless position devices 1401-1412 that may provide respective positional data sufficient to generate a directional vector. Accordingly, by way of non-limiting example, a front and center wireless position device 1401 may be paired with a rear center wireless position device 1402; each corner of the vehicle may include a wireless position device 1403-1406; interior corners may include a respective wireless position device 1409-1412; and exterior locations, such as on rear view mirrors may contain wireless position devices 1407-1408.

Utilizing multiple on board wireless position devices 1401-1412, it is possible to ascertain a direction that a vehicle is pointing without movement of the vehicle. This is useful since unlike traditional methods utilized by navigational systems that relied on a first geographic location of the vehicle and a second geographic position of the vehicle, which in turn required motion, the present invention provides for directional orientation without movement of the vehicle.

In another aspect, a controller may be included in a smart device paired to the vehicle and/or a transmitter 1416 may transmit data received from the multiple wireless position devices 1401-1412 to a remote processor which may determine a directional orientation. The remote processor and/or a smart device may also transmit the directional orientation back to a display viewable by an operator of the vehicle.

Figure 15A:
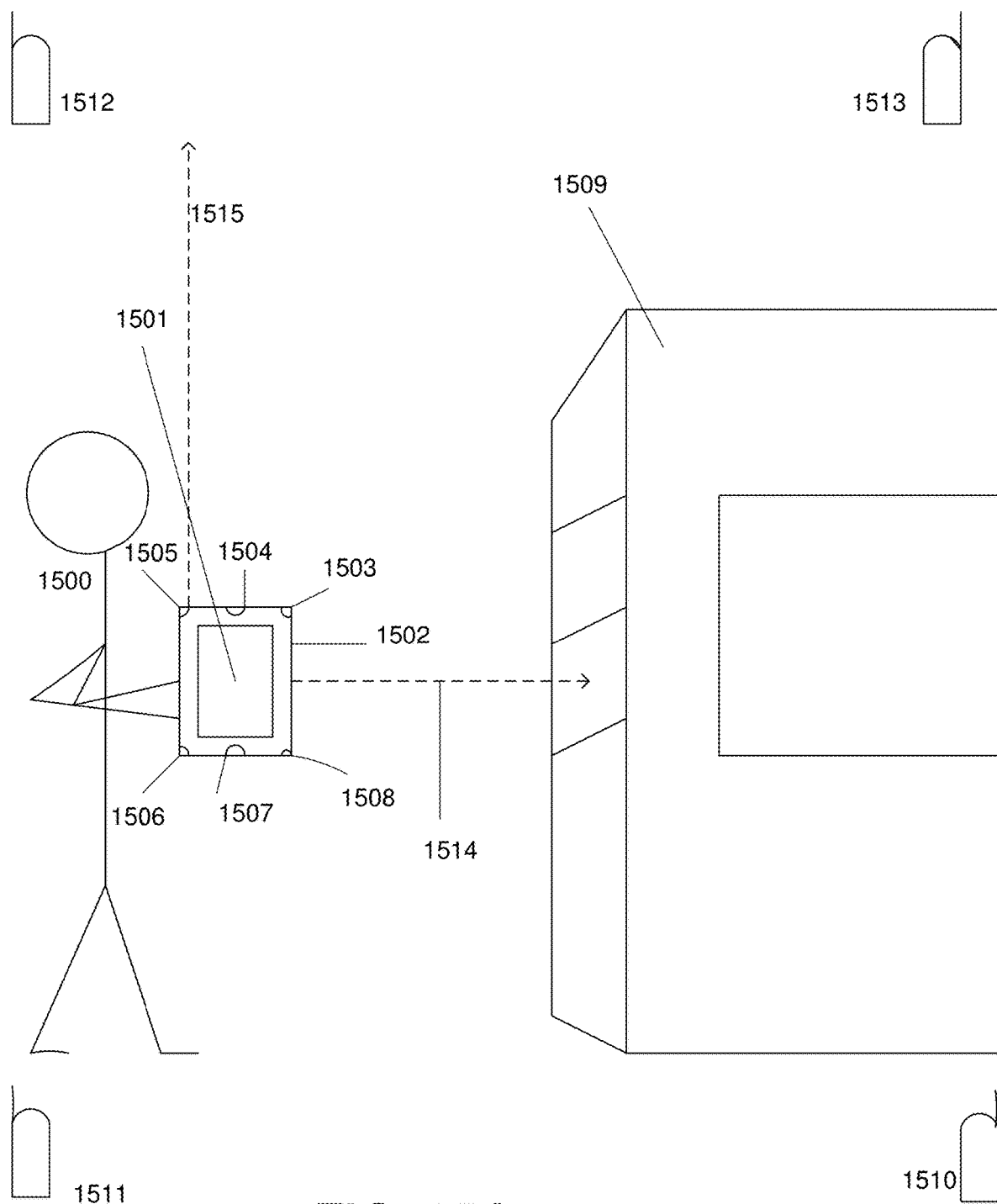
FIGS. 15A-15C illustrate movement of a smart device to generate a vector.
Figure 15B:
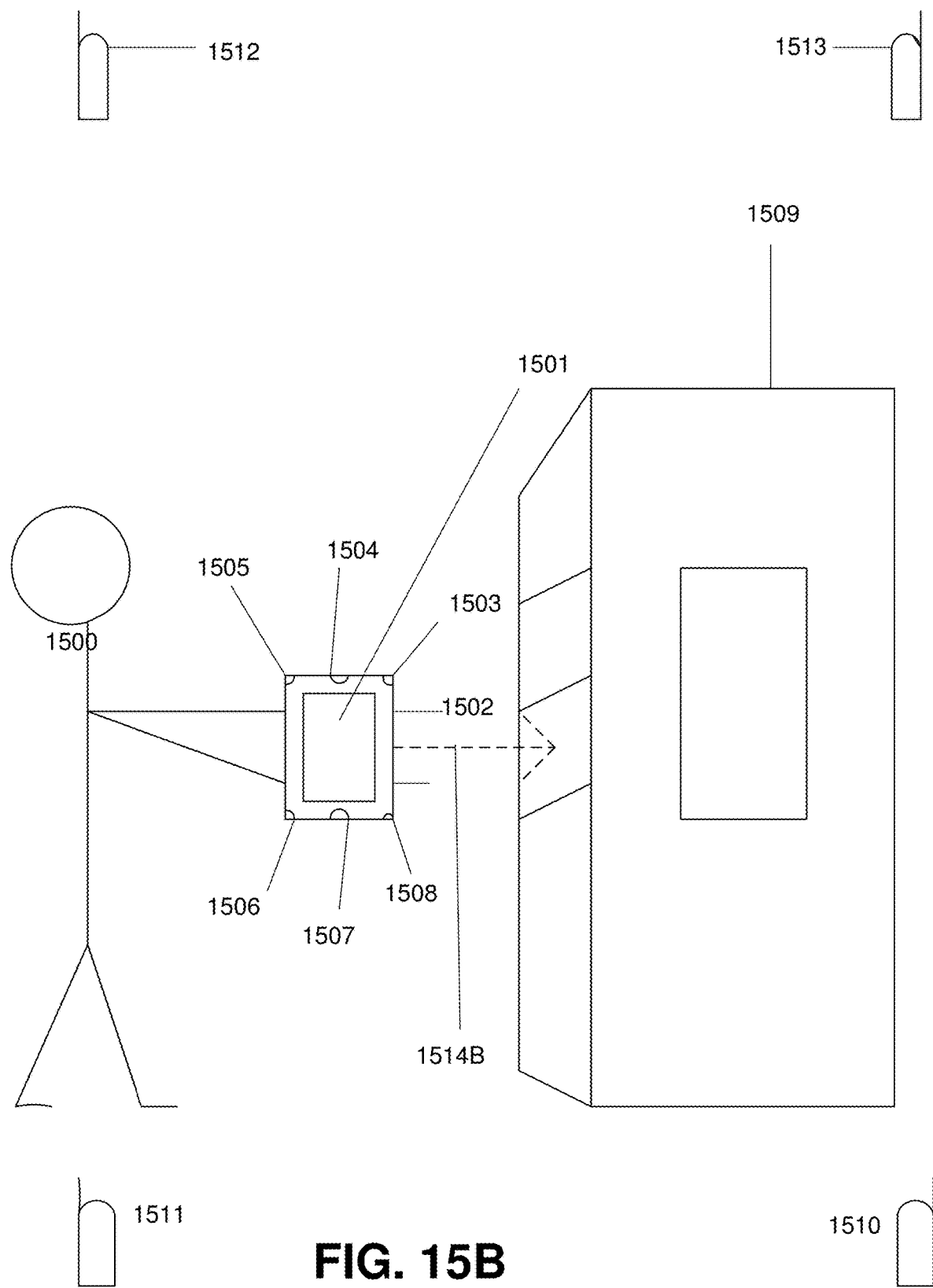
Figure 15C:
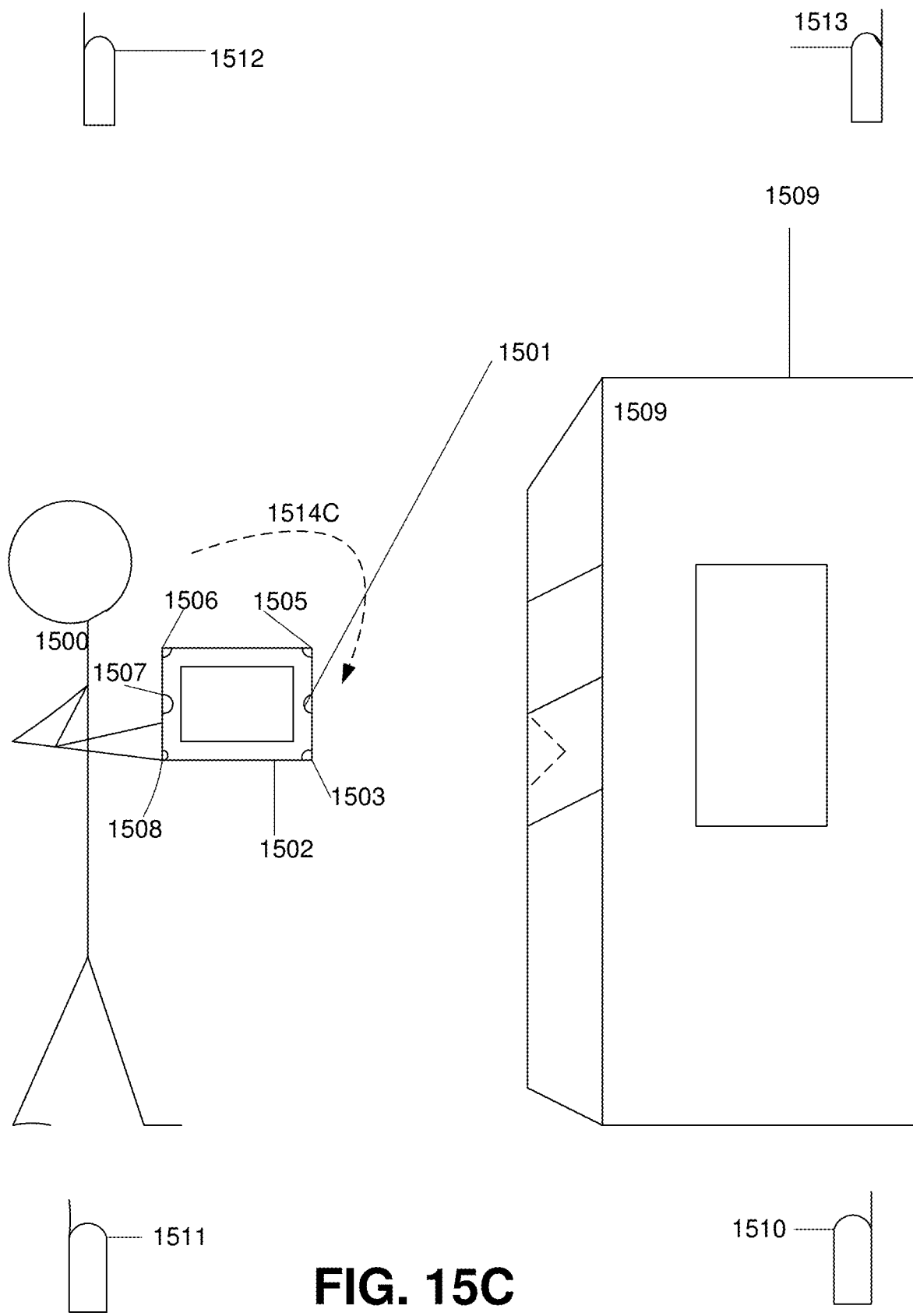

Referring now to FIGS. 15A-15C, a support 1500 for a smart device 1501 is illustrated. The support remains stationary in relation to a ground plane. One or more position devices 1503-1508 are shown located within, on or proximate to the smart device 1501. In FIG. 15A, generally linear movement 1514-1515 from a first position to a second position is illustrated. In FIG. 15B the extended position 1514B along the general movement is illustrated. In some embodiments, a cessation of movement in a general direction is determined via an accelerometer included in or operated by the smart device 1501. In exemplary embodiments 15A-15C a user (shown here as the support 1500) may activate a user interactive device, 1502 such as a button on a touch screen, or a switch to indicate one or both of the first position and the second position.

The wireless position devices 1503-1508 enter into logical communication with multiple wireless positional reference transceivers 1510-1513.

In some embodiments, a direction of interest will include an item of interest 1509, such as an apparatus or other piece of equipment. A direction of interest 1514 may include a vector with a direction pointing towards the item of interest 1509. The vector length will be sufficient to reach the item of interest 1509.

In some embodiments, a vector indicating a direction of interest 1514 may be used to reference an AVM and the SVM may provide a selection mechanism, such as a drop down menu that includes potential items of interest 1509 along the vector direction. A selection of an item of interest may then be used to determine a length of the vector 1514.

Referring now to FIG. 15C, a movement of a smart device 1501 may be arcuate in nature 1514C so long as arcuate movement 1514C results in sufficient distance of movement of one or more position devices 1503, 1505-1508.

Figure 16:
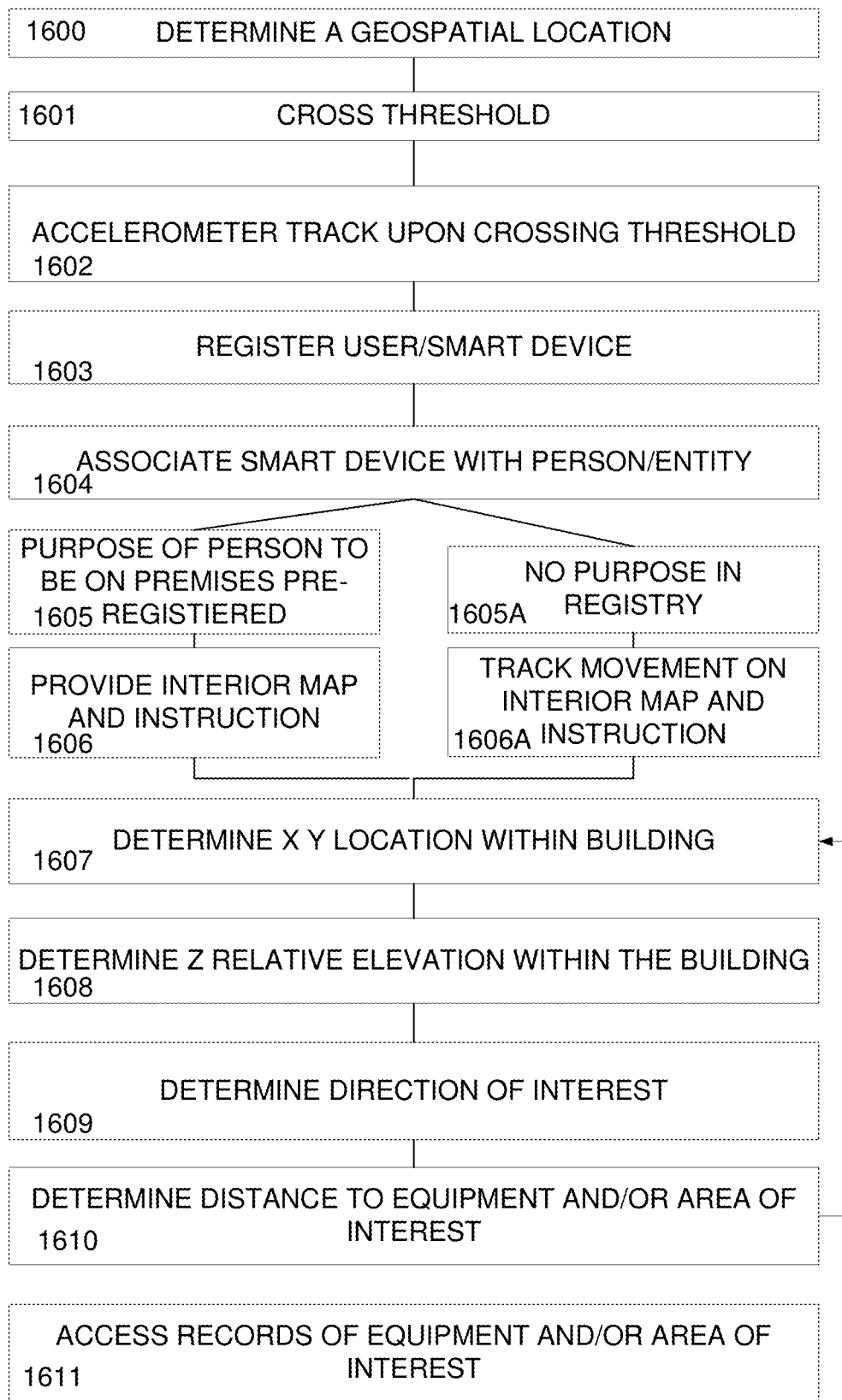

Referring now to FIG. 16, method steps that may be implemented in some embodiments of the present invention are illustrated. At method step 1600, geospatial location services are used to determine geospatial location such as a location of the structure with a position and direction of interest. Geospatial services may be used to determine a user's location relative to the structure and directions thereto. The methods used may include, by way of non-limiting example, one or more of: satellite-based global positioning systems (GPS), cell tower triangulation, radio signal triangulation, Wi-Fi signal location services, infrared transmitters and the like.

Geospatial location services will be cross-referenced with database registry of as built virtually modeled facilities and may be used in conjunction with a network of registered service technicians to route the nearest available service technician to the structure experiencing equipment malfunction. Service technician may register with the system to accept geospatial location tracking services by the system.

At method step 1601, the service technician's entry into the structure will be registered. Registration of entry into the structure may be achieved through multiple methods, which may include, by way of non-limiting example, on or more of: WiFi gateway detection, infrared detection, magnetic door locking systems, Bluetooth services, and the like. Upon entry into the structure requesting the service call, system will register the service technician's entry into the structure.

At method step 1602, a support unit for a smart device, such as service technician or an unmanned vehicle may be tacked via a change in triangulation values and/or an accelerometer and a position and direction within the structure is tracked. The methods used may be, by means of non-limiting example, one or more of: use of data gleaned from accelerometers located on or in possession of service technicians, Wi-Fi services, radio frequency (RF) triangulation, Bluetooth technology, infrared detection, RFID badges, and the like.

At method step 1603, a smart device will be registered as entering within structure. Following the smart device entry into structure.

At method step 1604, a smart device may be associated with one or both of a person and an entity.

At method step 1605, the smart device is pre-registered by the system with detailed instructions regarding a reason for the device to be at a particular location. The reason may be, for example, one or more of: a service call placed from structure to system detailing current equipment malfunction, service calls from structure detailing non-specific malfunctions and symptomatic data indicating equipment malfunction, a service call placed by self-assessing equipment utilizing internet of things (IoT) and machine learning functionality to ascertain malfunctions and predictive analytics to anticipate malfunctions, and the like. The system may integrate data reports into the AVM and relay as much to the smart device in the field.

Alternatively, at method step 1605A, the smart device may arrive at the structure without prior knowledge of a purpose. Upon entry into the structure and registration of the smart device as described in method steps 1601 through 1604, system will relay data gleaned from the AVM, operational data uploaded to the system through IoT processes, and other experiential data reported to the system and thereby relayed to the smart device on site. Methods for relation of such data to the onsite smart device may include, by means of non-limiting example, referential data based on proprietary orienteering processes to determine smart device location within structure, which location will be cross-referenced with AVM data. At method step 1606A movement may be tracked on an interior map with instruction.

At method step 1606, a position within or proximate to the structure may be determined via positioning identifiers. The position within or proximate to the structure is determined and detailed instructions directing smart device to the source of a malfunction is relayed by the system to the smart device directly or by means of smart device application. The methods used may be, by means of non-limiting example, one or more of: augmented reality overlays displayed on heads-up displays or other wearable technologies, augmented reality overlays displayed on smart devices, direct instructional vectoring provided to the smart device by the system over Wi-Fi internet connection or LTE signal, virtual reality walkthrough instructions provided to smart device on site or prior to arrival at the structure, updated map/schematic displays detailing the structure and directing the smart device to the source of the subject malfunction by means of vectoring and orienteering processes.

At method step 1607, a smart device's location within the structure along an XY axis will be tracked and recorded by the system by means of fixed or adaptive orienteering apparatus within the structure. Such orienteering apparatus may include, by means of non-limiting example, on or more of: Wi-Fi triangulation, infrared position detection, radio frequency (RF) detection, RF ID tracking, onboard accelerometers located on the smart device or carried smart devices, and the like.

At method step 1608, the smart device's location within the structure along the Z axis will be determined. The methods used may be, by means of non-limiting example, one or more of: onboard magnetometers, onboard barometers, onboard accelerometers, and the like, used in conjunction with in-structure XY axis position processes described in method step 0167 above, along with data detailed in the AVM of the structure.

At method step 1609, the smart device's direction of interest will be determined. Method steps 1601 through 1608 work in conjunction to track and direct the smart device to the source of the malfunction; once at the source of the malfunction, smart device will be oriented to the direction of interest. The system will determine the smart device's direction of interest using, by means of non-limiting example, on or more of the following methods: infrared pointers, laser direction finding devices, onboard camera(s), RF ID trackers, RFD finders, barcode scanners, hex/hash code scanners, Wi-Fi triangulation, and the like.

At method step 1610, the smart device's distance to the subject malfunction will be determined. The methods used may be, by means of non-limiting example, one or more of the following: infrared pointers, laser pointing devices, Wi-Fi triangulation, RF ID sensors, RFD, depth perception sensors contained within onboard cameras, onboard magnetometers, Bluetooth technology, ANT sensors, directionally enabled smart device cases, and the like.

At method step 1611, records of equipment and/or area of interest will be accessed and relayed to smart device. The smart device's position, direction of interest, and distance to the equipment/area of interest as determined by method steps 1601 through 1610 will be cross-referenced with the AVM and experiential data to call up pertinent data on the malfunctioning equipment/area of interest. Data regarding the service call will be added to the AVM and experiential data displayed to the on-site smart device. The methods used may be, by means of non-limiting example, one or more of: IoT data relayed by machine learning-enabled equipment, structure-relayed symptomatic data, and the like.

Proceeding to FIG. 16A, at method step 1612, symptomatic malfunction data will be diagnosed to determine cause of malfunction. The methods used may be, by means of non-limiting example, one or more of: IoT experiential data gathered and collated from multiple sources across multiple facilities similar to the presented symptomatic data, internet-gathered data analyzed by various machine learning technologies, algorithmic analytics of symptomatic data to determine causal indications, and smart device expertise.

At method step 1613, technical maintenance data, records, and instructional walkthrough data will be relayed to smart device. System will collate data from method step 1612 above and relay as much to smart device. The methods used may be, by means of non-limiting example, one or more of: augmented reality overlays as displayed by heads-up displays and other wearable technologies, augmented reality overlays as displayed on smart devices, virtual reality walkthroughs as shown by wearable technologies or smart devices, direct instruction or remote control, .pdf user manuals and other written instructional material, video walkthrough instructions displayed on smart devices, and the like.

At method step 1614, results of purpose for a presence at a location are recorded and added as experiential data to the AVM. The methods used may be, by means of non-limiting example, on or more of: equipment self-reporting through IoT and machine learning technologies, smart device entered data, experiential data gathered from emplaced sensors and other recording devices within the structure itself, and the like.

Figure 17A:
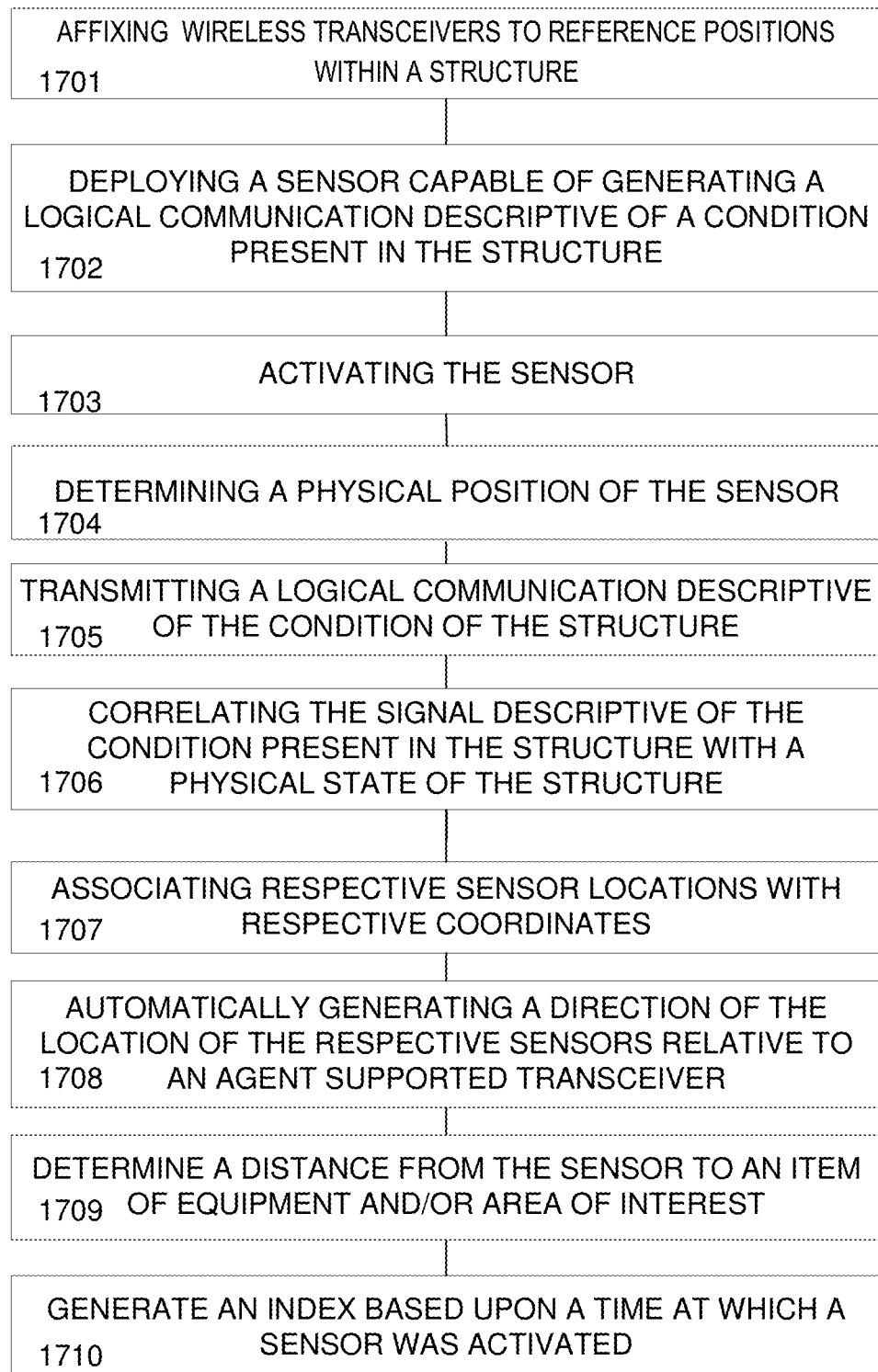

Referring now to FIG. 17A, methods steps that may be executed in some embodiments of the present invention are presented. At step 1701, as discussed in detail herein, Transceivers may be affixed to reference positions within or proximate to a structure. In some preferred embodiment's Transceivers are positioned at the perimeter of the structure or within a defined area of a property and are capable of wireless communication of logical data within the structure and/or defined area.

At step 1702, a sensor is deployed to a position within, or proximate to, the structure and/or defined area in a manner conducive for the sensor to operate and generate a logical communication including digital data descriptive of a condition that is one or both of: within the structure and/or defined area, or proximate to the structure and/or defined area. The sensor will also generate a digital signal descriptive of the condition monitored by the sensor.

At step 1703, the sensor is activated to an operational state and generates the digital data descriptive of a condition and transmits the digital data descriptive of a condition in the form of a logical communication. In some embodiments, the sensor will transmit the data via a wireless transmission. In other embodiments, the sensor may transmit the data via an electrical or optical connector. Sensors may also be incorporated into, or in logical communication with a sensor cluster platform capably of operating multiple sensors simultaneously.

At step 1704, a physical position of the sensor is determined. The physical position may include a location within the structure and/or defined area. The physical position may be based upon one or more of: a physical connection to an item of known location (such as a sensor cluster or an electrical outlet); and wireless communication of the sensor with two or more of the wireless transceivers at the reference positions. As discussed herein, the physical position may include an X coordinate and a Y coordinate on an X, Y plane and an elevation based upon a Z coordinate relative to a ground plane or other designated plane of origin.

At step 1705 a digital signal is transmitted descriptive of the condition of the structure. The condition of the structure may be based upon Vital Conditions of the structure assessed via the sensor readings. At 1706 a physical state of the building at the physical position of the sensor, or an area of the structure within range of the sensor, may be correlated with the digital signal descriptive of a condition of the structure.

At step 1707, the sensor locations and/or areas of the structure within range of the sensor for which the sensor may take a reading, are associated with location coordinates, such as X, Y and Z coordinates.

A step 1708, in another aspect, a direction of the sensor in relation to an Agent supported position Transceiver home may be determined via the processes described herein. At step 1709 a distance of the sensor to an item of equipment or an area of interest may be determined. The distance may be determined via methods, such as calculation within a virtual model, infrared reflection, sonic transmissions, LIDAR, echo, User entry or other method.

At step 1710, an index may be activated based upon a time at which a sensor was activated. In some preferred embodiments, the index includes entries from a timing device (such as a clock) and also includes a chronological sequence of sensor readings and time of reading. The index may also be used to synchronize multiple sensor readings, such as synchronization to the clock and thereby capture a holistic picture of a structure during a given time period.

The logical communication may include wireless communications via an industrial scientific and medical (ISM) band wavelength which may include wavelengths between 6.765 MHz and 246 GHz. WiFi is one protocol that may be implemented for wireless communication, as is Bluetooth, ANT, infrared or other protocol. Other wavelength bandwidths may include sonic wavelengths and infrared wavelengths.

Referring now to FIG. 17B, method steps for some deployments of accelerometers and/or other sensors are presented. At step 1711 a vibration is introduced into a component of the structure. The vibration may be introduced via a calibrated vibration producing device, or via an occurrence within or proximate to the sensor. By way of non-limiting example, a vibration inducing device may generate a vibration pattern that may be tracked through at least a portion of a structure. Nonlimiting examples of an occurrence may include, one or more of: starting and/or running of a machine; movement of an Agent within the structure; and operation of a vehicle outside of a structure.

At step 1712 the vibration pattern introduced may be compared with a pattern of vibration detected by a sensor, such as a MEMS. At step 1713 a series of MEMS or other sensor readings may be tracked and at step 1714 the pattern of vibrations measured by the MEMS accelerometers may be correlated with structural integrity, wherein structural integrity may include an assessment of whether a structure is suitable for a particular use (such as occupation as a residence, commercial use or ability to bear a particular load.

At step 1715, structural damage may be correlated with a pattern of vibration measured. At step 1716, a threshold range of values measured by a sensor may be set and at step 1717 an alert routine may be executed in the event that the threshold range is exceeded or upon an analysis that detects a particular signal indicating a condition in the structure.

Figure 18A:
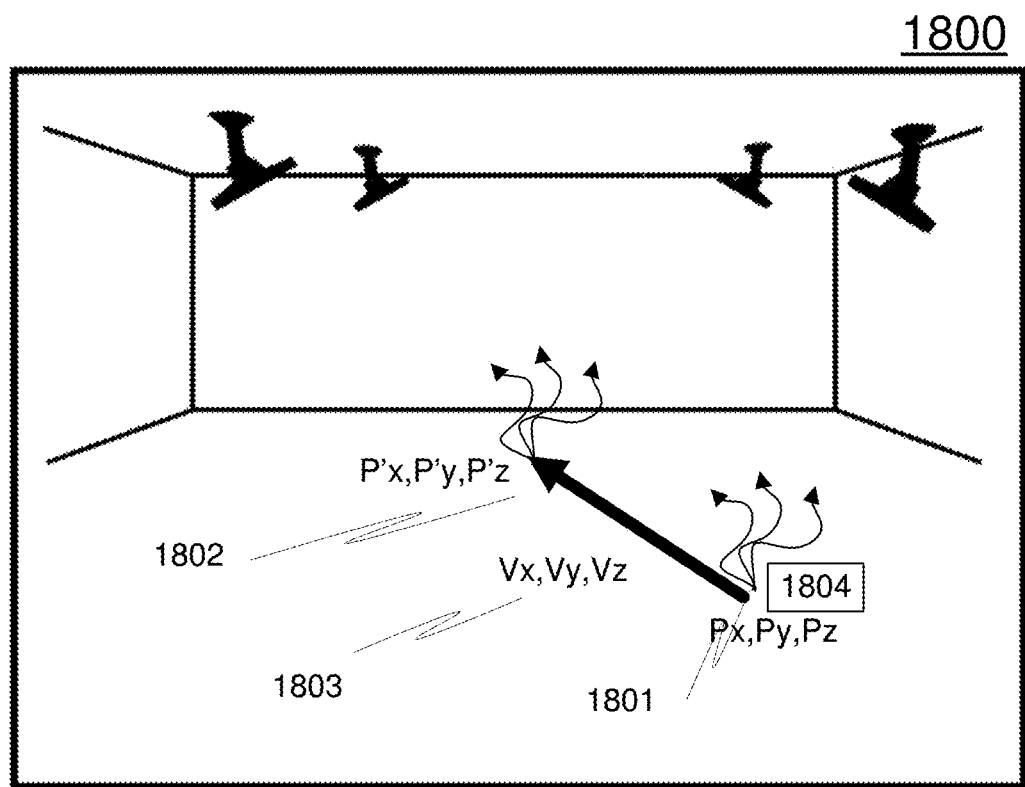
FIG. 18A-18B illustrates a defined are with Transceivers.

Referring now to FIG. 18A, illustrates exemplary structures that may be used to correlate sensor readings and generate an alert based upon values of conditions measured in a structure. The table may include Building Vital. Sensor Readings 1801 and include unique identifiers of particular sensors 1802; a location of each sensor 1803; a time and date stamp of a sensor reading 1804; a value of the reading 1805 and an alert status 1806, such as one of: Normal, High, Low or almost any other status indicator.

Another exemplary table may include Building Ratings Based Upon Vital Readings 1807. The Building Ratings table may include a property identification 1808, such as a taxmap number or other identifier; an identification of sensors deployed 1809, and aggregate status of the property as a whole 1810; a deployment impact 1811 that indicates whether sensor readings correlate with acceptable readings for a specified deployment; and an overall property Rating 1812 which may be a result of conditional logic applied to sensor readings of the sensors deployed.

Localization and Direction Orientation

In some exemplary embodiments of the present invention, one or both of radio frequency and sound wave transmission may be used to determine a location of a smart device an Agent indicated direction of interest, such as point to an element of interest. In some examples, this localization and direction determination may be classified as six degrees of freedom of orientation. Referring to FIG. 18A, an illustration of the six degrees of freedom are illustrated. In FIG. 18A, a set of sensing and/or transmitting devices within a defined area 1800 are illustrated at a first point 1801, and at a second point 1802. The positional coordinates of the first point 1801 may be represented in a Cartesian Coordinate system as $P_x$, $P_y$, and $P_z$. Accordingly, the second point 1802 may be represented in a Cartesian Coordinate system $P'_x$, $P'_y$ and $P'_z$. A direction from the first point 1801 to the second point 1802 may be represented by a vector 1803 as $V_x$, $V_y$ and $V_z$. In representing the orientation and direction of an element of interest there may be a number of possible position references that may be associated with the element.

In some examples, a controller determining a position may default to either a first point 1801 or a second point 1802 (additional points may also be calculated and used according to the methods presented in this disclosure) or a mathematical combination of the first point, second point (and any additional points) locations. A vector 1803 may be generated and a direction of the vector may be used as an Agent defined direction of interest.

A hierarchy of the first point 1801 to the second point 1802 may be specified to generate a starting point of the vector (e.g. first point 1801) and an intersecting point (e.g. second point 1802), a magnitude may be generated based upon a model of a position of the Agent. A generated direction may be inverted by swapping the hierarchy of the first point 1801 and the second point 1802.

One or more of radio frequency and sound frequency transmissions, emissions, reflections, absorption and detections may be used as input into a controller for determining a location of the first point 1801 and the second point 1802 and generation of a direction of interest.

Figure 18B:
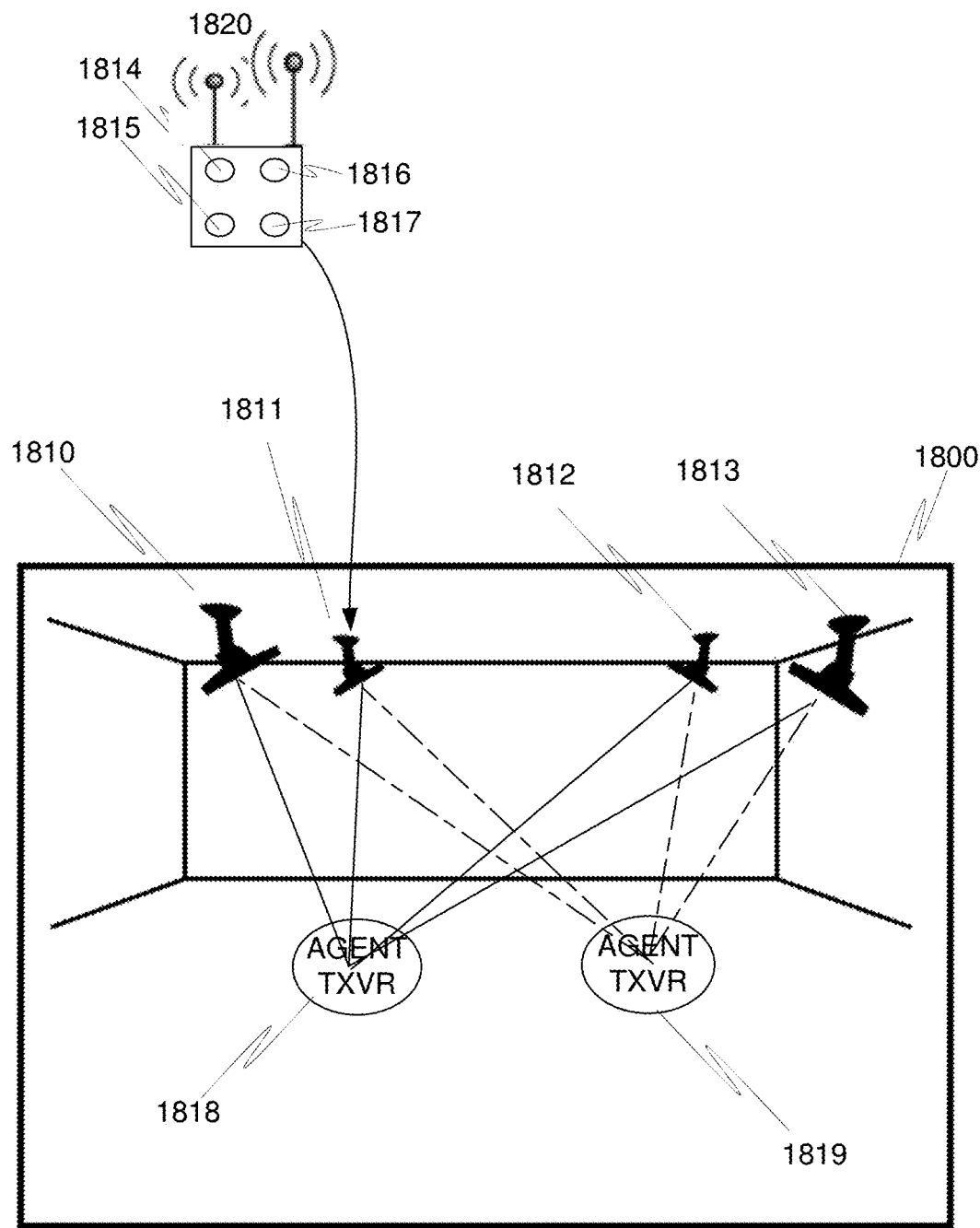

Referring now to FIG. 18B, a defined area 1800 may be equipped with fixed reference point transceivers 1810-1813, each transceiver capable of one or both of transmitting and receiving one or both of radiofrequency encoded data and soundwave encoded data. Numerous frequency bandwidths are within the scope of the invention, including radio waves that are sometimes referred to as Ultra Wide Band (UWB) technology which focusses radio wave emissions of low power consumption to achieve high bandwidth connections, WiFi bandwidths, including WiFi RTT and frequencies compliant with 802.11 specifications, ultrasonic bandwidths, infrared bandwidths and Bluetooth bandwidths, including Bluetooth 5.1.

In some embodiments, each transceiver 1810-1813 may in turn include multiple transmitters and/or receivers 1814-1817. The multiple transmitters and receivers 1814-1817 may operate on a same or different frequencies. Different frequencies may be within a same bandwidth, such as for example UWB bandwidth, or the different frequencies may be across different bandwidths, such as, for example an UWB and a WiFi bandwidth. In some embodiments a single transceiver 1810-1813 may thereby operate on multiple different frequencies. In other embodiments, different transceivers 1810-1813 may operate on a same or different frequencies. The multiple transceivers 1810-1813 may be operative to implement simultaneous or sequenced transmitting and receiving.

In some embodiments, some or all of the multiple transmitters and receivers 1814-1817 may be incorporated into a transceiver device. The multiple transmitters and receivers 1814-1817 may also include antenna with a same or different physical characteristics. For example, different antenna may be tuned to a same or different frequencies. In some embodiments, tens, hundreds or more antenna may be incorporated into a device in order to enable redundant communications and improve quality of a wireless communication.

Wireless communication may be accomplished for example via bandwidths associated with one or more of: Bluetooth; UWB; WiFi (including RTT Wi-Fi); Ultrasonic; and infrared communications. Transceivers used in transceiving may include directional and/or omni-directional antennas 1820. Antennae 1820 may be tuned similarly or tuned differently. Transceiving may be accomplished simultaneously, in timed sequence and/or based upon occurrence of an even. For example, a sensor may transceive on a predetermined timed schedule and also transceive following the occurrence of an event, such as a sensor reding that exceeds a threshold.

As illustrated in FIG. 18B, at least three Reference Point Transceivers 1810-1813 are mounted in different reference locations within or proximate to the defined area 1800. Preferably each Reference Point Transceivers 1810-1813 has a relatively clear line of sight to an Agent Transceiver 1818-1819 supported by an Agent (not shown in FIG. 18B) and the line of sight is conducive to successful wireless communications.

In some examples, mounting (either permanent or temporary) will include fixedly attaching a Reference Point Transceiver 1810-1813 to a position and may be made to one or more of: a ceiling within the defined area; a wall mount; a stand mount; a pole; or integrated into or otherwise connected to an electrical receptacle. In some examples, a reference transceiver 1810-1813 may be mounted at a calibrated location within the defined area 1800 and act as a coordinate reference location.

The Reference Point Transceivers 1810-1813 may be placed in logical communication with a controller (such as via a distributed communications system, wireless or hardwired), the controller may cyclically receive logical communication from one or more transceivers supported by an Agent located within the defined area 1800 while simultaneously monitoring the reference location. A Reference Point Transceiver 1810-1813 may be useful for calibrating various aspects of wireless communication between a Reference Point Transceiver 1810-1813 and an Agent supported Transceiver 1818-1819, aspects may include, for example variables in communication relating to one or more of: environmental condition such as humidity, temperature and the like; as well as a variation in transceiver power levels, noise levels, amplification aspects and the like.

There may be numerous sources and causes of noise in a radiofrequency environment and/or a sound frequency environment (such as ultrasonic) that may come into play when using a Reference Point Transceivers 1810-1813 and an Agent supported Transceiver 1818-1819 that operate in one or more of: WiFi bandwidth; Bluetooth bandwidth; ultra-wide band; ultrasonic or similar technology. For example, in an indoor environment walls, structures, furniture, occupants, HVAC settings; particulate in the air (such as smoke or steam) human traffic; machinery movement; and the like may create a complex and dynamic environment where radiofrequency logical communications reflect and are absorbed. Reflections, particularly multiple reflections, may cause spurious logical communications where the time for the logical communication transmission may be inappropriately long.

Accordingly, in some embodiments, a controller may benefit from receiving many data from multiple closely sequenced logical communications included in transmissions/receptions between Reference Point Transceivers and Transceivers supported by an Agent. Examples of multiple logical communications include less than ten samples to billions of samples per second. A large number of logical communications may be averaged or otherwise mathematically processed to determine a localization. Mathematical processing may include less consideration (e.g. weight, or removal) of logical communications outside of an otherwise closely associated data set. Other mathematical processing may include a mean, an average and a median of data included in the logical communications.

Systems with Transceiver counts of as few as six and sampling frequencies in the hundreds of billions of samples per second have been demonstrated to localize Transceiver locations with sub-millimeter accuracy. High sampling rates may require specialized data acquisition capabilities including advanced filtering systems, ultrafast digital to analog converters and the like. Fundamentally, the more samples that are collected per unit of time a more accurate a position determination may be.

A wireless positioning system (such as, WiFi, UWB, Ultrasonic and Bluetooth) with high positioning accuracy may be used for determination of a direction of interest using transceivers sized to be unobtrusive in a defined area 1800 and/or to be able to be supported by a human Agent or an automation Agent capable of traversing the defined area 1800.

Referring now to FIGS. 18C-18E, an example of Agent supported Transceivers 1818-1819 may include a combination of an Agent's smart phone 1861 and an ancillary position determining device 1860-1861, 1871-1872, 1881-1882 linked to the smart phone 1861. An ancillary position determining device 1860-1861, 1871-1872, 1881-1882 may provide one location position, such as for example, a first location position (P1), and the smart phone 1861 may provide another location position, such as for example a second location position (P2). A vector may be generated based upon P1 and P2. For example, a generated vector may intersect P1 and P2, or the vector may be in a calculated direction, such as an angle, with reference to one or both of P1 and P2.

Linking between a smart device, such as a smart phone 1861, and an ancillary position determining device 1860-1861, 1871-1872, 1881-1882 may be accomplished, for example via a hardwire connection, such as a lightening port or USB, mini USB type connector, Bluetooth, ANT, near field communications and the like. A smart wrist watch 1860 that may be worn on an Agent's arm, a wand 1883 may be held in an Agent's hand, similarly, a ring '1870 may be worn on a finger and a tag 1871 may be incorporated into a badge, a button, an adhesive backed patch, a clip or a wide variety of attachment mechanisms. Each ancillary position determining device 1860-1861, 1871-1872, 1881-1882 may include one or more Transceivers capable of communicating with a Reference Point Transceiver to generate logical communications from which a position may be calculated.

The Agent's smart phone 1861 and an ancillary position determining device 1860-1861, 1871-1872, 1881-1882, may each have one or more Transceivers and may be used with the methods and apparatus described herein to determine a first point and a second point. The first point and the second point may be used for generating a vector indicating a direction of interest (as discussed above). Other combinations of devices may be used, such as those illustrated in FIG. 18D where a smart ring 1870 and a smart tag 1871 may be used to determine the multiple position location samples.

Referring to FIG. 18E in some embodiments, a single an ancillary position determining device 1860-1861, 1871-1872, 1881-1882 may be able to employ multiple transceivers on its body. For example, a wand 1880 may include a tip Transceiver 1881 and a base Transceiver 1882. A wand 1880 may be used in conjunction with a smart device, such as a smart phone 1861, where the phone 1861 is in a first position in close proximity to an Agent (such as in a pocket or holster worn by the Agent). The wand 1880 may be extended out from a handle portion of the wand The devices shown as examples may allow a single hand to be used to indicate position and direction. Various other devices that may include transceiver capability may be used in similar manners. A user may have one hand occupied holding a tool or sensor or may be otherwise occupied and can still indicate a desired direction of focus. In the example of a wand 1880, the user may press a button, switch, or engage other activation mechanism, such as a capacitive discharge device on the wand to indicate that the orientation of the wand is at a desired input condition.

Transceiver devices may be operative to employ various methods to improve accuracy of location determination, including but not limited to: varying a frequency of transmission and reception of logical communications; varying a pulse pattern transmission and reception of logical communications, and varying intensity of emissions used in transmitting a logical communication.

In some embodiments of the present invention, Agent supported Transceivers 1860-1861, 1871-1872, 1881-1882 may communicate bursts of logical communications that include timing information. A delay of logical communications between the transmitter and the receiver may be converted to a distance measurement and a combination of a number of such logical communications may be used to triangulate the position. In some examples, the smart phone 1861 and an ancillary position determining device 1860-1861, 1871-1872, 1881-1882 may transmit the timing logical communications which the mounted transceivers receive and process for a distance determination. In other examples, an ancillary position determining device 1860-1861, 1871-1872, 1881-1882 and smart phone 1861 may receive logical communications and determine timing delays and associated distances. Results of distance determinations may be communicated to controller, such as processing devices located at a smart device. A suitable controller may be located at one or more of the Transceivers or at a location remote to the Transceivers and connected by a communication network.

There may be many physical properties that may be used to make localization measurements/determinations. In an example of another type of sensing system an Infrared based sensor and camera system may be used to determine localization and orientation.

Figure 19A:
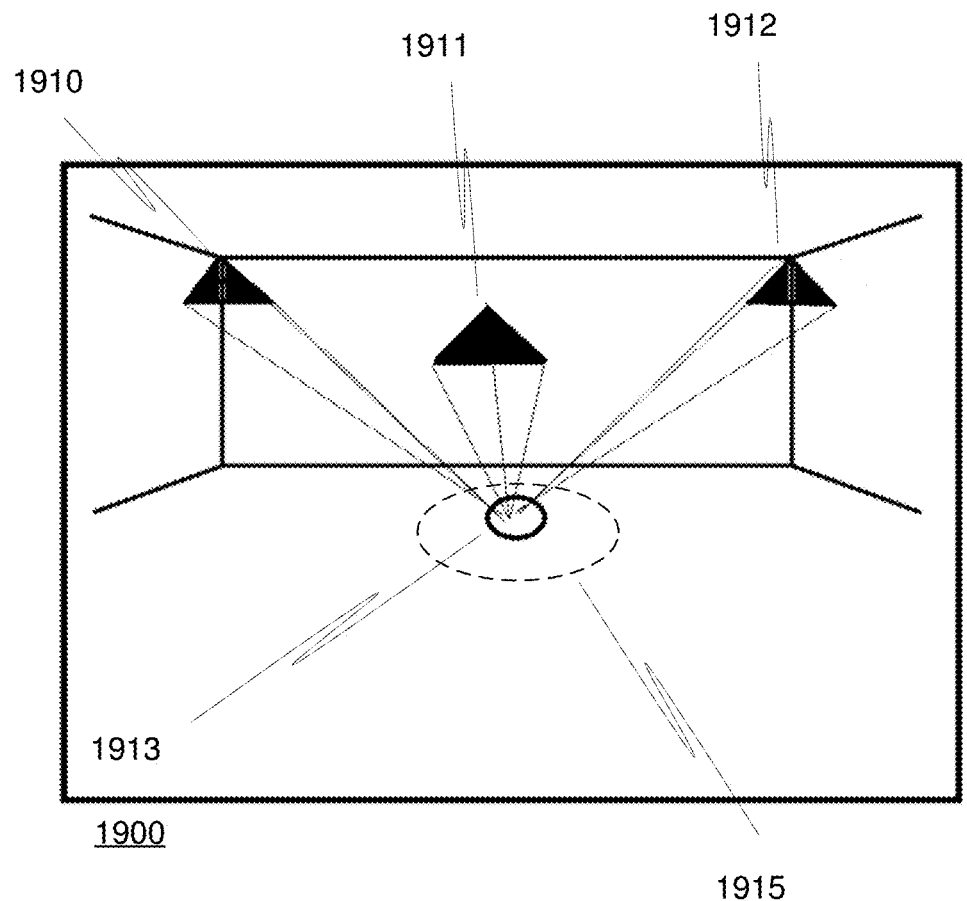
FIG. 19A illustrates wireless communication, including directional Transceivers.

Referring to FIG. 19A, in some embodiments, one or several wireless communications modalities may be operational during a same time period. For example, one or more of UWB; Bluetooth; WiFi; ultrasonic and infrared transmitters may be included in a system in a defined area 1900. The system may include three Reference Point Transceivers 1910-1912 that are positioned to transmit to a portion 1940 of the defined area 1900. Some Reference Point Transceivers operate without movement of the Reference Point Transceivers 1910-1912. Additional embodiments may include one or more of the Reference Point Transceivers 1910-1912 sweeping the defined area 1900, or otherwise changing a field of view associated with the respective Reference Point Transceivers 1910-1912. For systems that include Reference Point Transceivers 1910-1912 that change a field of view, a timing sequence may be generated and used to correlate with a logical communication such that the logical communication is associated with both the Reference Point Transceivers 1910-1912 and a particular field of view.

Some particular embodiments will include Reference Point Transceivers 1910-1912 that include one or more infrared cameras, each camera will have a defined field of view. Other directional transceivers may operate similarly.

A Transceiver may be located at position 1915 and wirelessly communicate with a multitude of the Reference Point Transceivers 1910-1912. As mentioned in reference to FIGS. 19A-19C a user may wear one or more Transceivers that include transmitters 1913, such as infrared emitting LEDs, laser or lights that emanate logical communications; WiFi, UWB; Bluetooth and/or Ultrasonic Transceivers. One or more of the Reference Point Transceivers 1910-1912 receive logical communications transmitted via an Agent supported Transceiver 1913. The infrared transmitters 1913 may change intensity, cycle on and off, and/or vary in patterns to enable logical communication, such as information that allows for the extraction of location information. In some examples, Transceivers 1913 that include infrared transmitters have calibrated maximum intensities, and the logical communication levels received may be used to determine additional confirming information related to location. Various smart devices and/or position determining devices described herein may include or be equipped with an infrared emission element that may serve as a Transceiver supported by an Agent 1913 and used to indicate position and direction orientation.

In some examples, the aspects of FIG. 19A may represent a virtual viewing environment that a user, such as an architect or engineer may be immersed in with a viewing apparatus, such as a Virtual Reality headset. The user may utilize localization and direction orientation aspects of the camera systems to drive the content of a virtual display view plane and a virtual location within a virtual model being displayed. In some examples, a user may be located at a building site configured with a camera system such as illustrated in FIG. 19A while an architect may be located in a separate room configured with a similar camera system as illustrated in FIG. 19A. In some of these examples, the architect may observe the view perspective of the user in the real-world location. In some other examples, the architect may occupy a virtual location and observe, through camera output of the real-world location, both the real-world location, the user in the real-world location and a display of the virtual model.

Figure 19B:
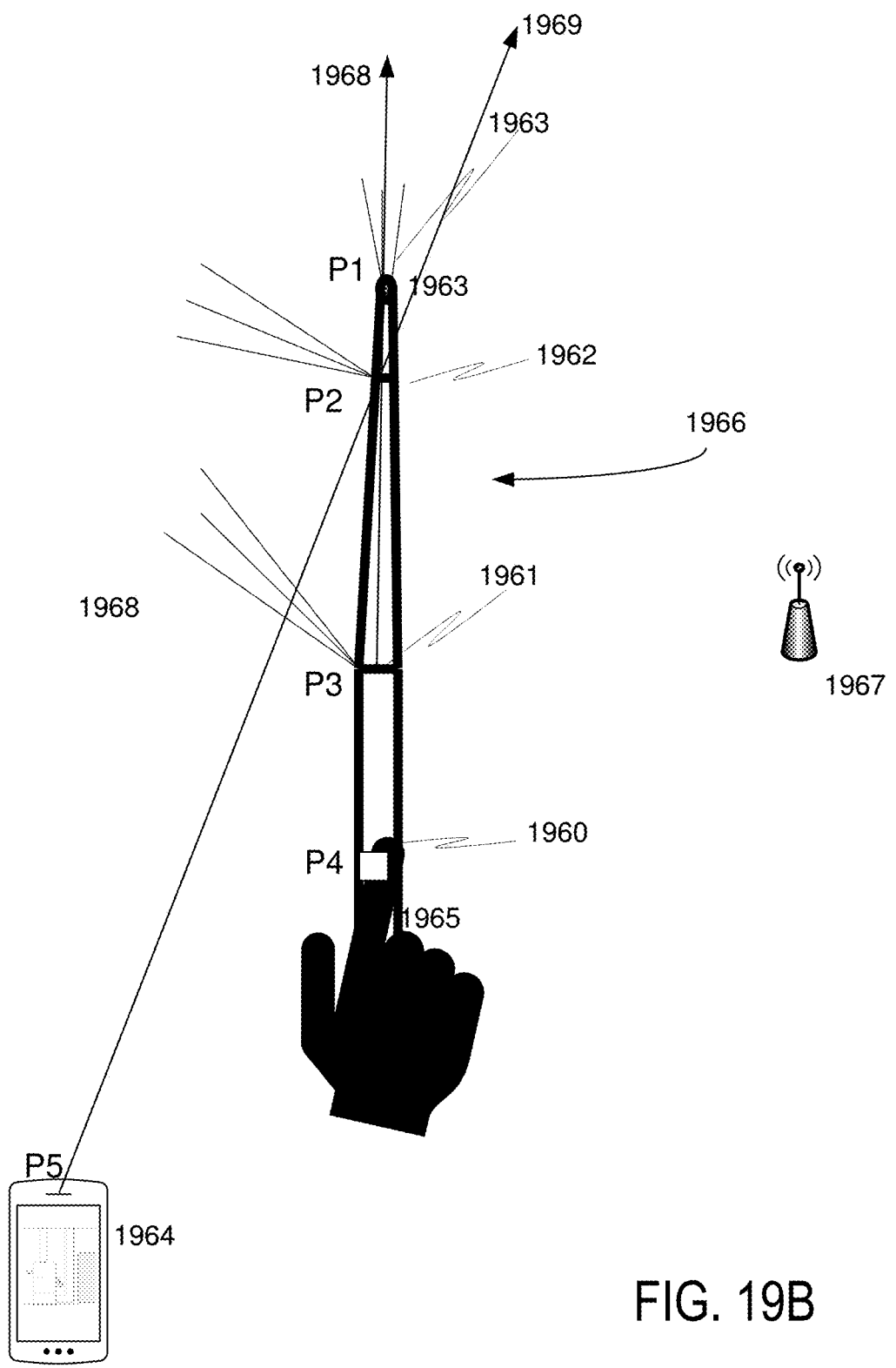
FIG. 19B illustrates an apparatus with Transceivers and generation of a vector.

Referring to FIG. 19B, in some specific embodiments, ancillary position determining devices may include an extension apparatus 1966 supported by an Agent. The extension apparatus 1966 may include, for example a pointer 1960. The pointer 1966 may include a fixed length of rigid or semi-rigid material, or a telescopic combination of multiple lengths of rigid and/or semi-rigid materials. The pointer

1966 may be configured with areas of one or more wireless transceivers 1961-1963 at various distances from a first point 1963 of the pointer 1960. A location of the first point 1963 may essentially be the tip, or other convenient area.

A second area containing one or more transceivers 1961 and 1962 may be used as indicators that will be detected by directional apparatus, such as an infrared camera. A user may direct a pointer 1960 in a direction of interest and engage an activation mechanism, such as a switch, or engage in a motion to indicate the time to obtain the position and direction orientation. For example, an agent may activate a switch 1965 to activate a Transceiver 1960-1963 and partake in logical communication with a Reference Point Transceiver 1967. In some embodiments, the logical communication may be manifested as a pattern of light. A controller may be supplied with the pattern of light transmitted as well as Reference Position information and generate a direction of interest.

According to the methods of the present invention, position points P1-P4 may be generated based upon the logical communications between the Reference Point Transceiver 1967 and the Transceivers supported by an Agent 1960-1964. A vector 1968 may be generated based upon the position points P1-P4. In addition, a smart device 1964 may also communicate with the Reference Point Transceiver 1967 and a position point P5 associated with the smart device 1964 may be generated.

In some embodiments, a vector 1969 may be generated based upon the position point P5 of the smart device 1964 and a position point P1-P4 generated based upon logical communications with Transceivers 1960-1963 located on or within the ancillary position determining device 1966.

Figure 19C:
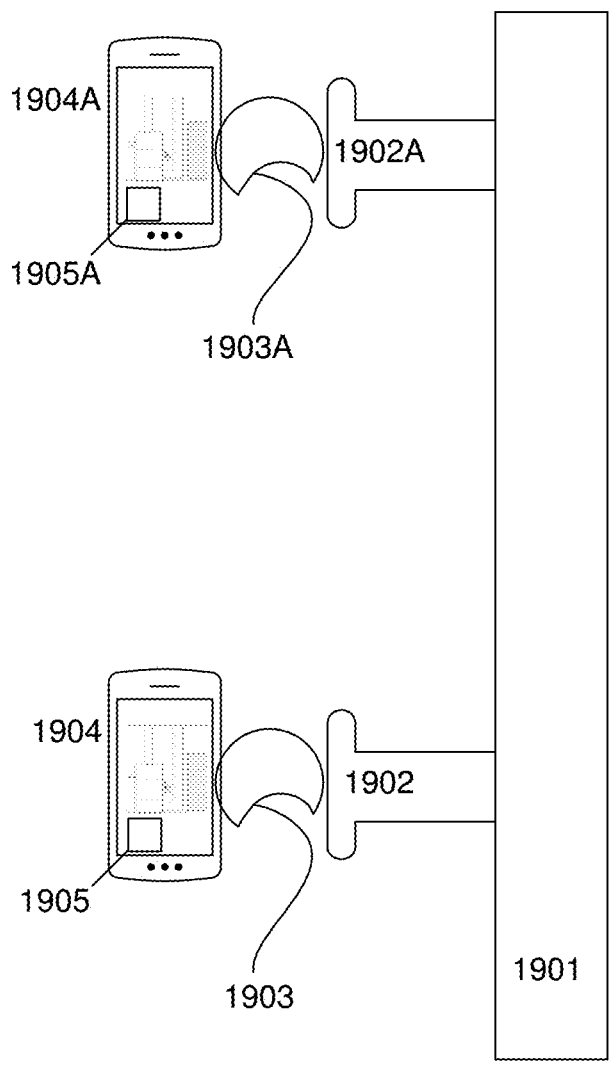
FIG. 19C illustrates an exemplary apparatus for attaching an exemplary accelerometer to a component of a Structure.

Referring now to FIG. 19C as discussed further herein, a sensor that includes a microelectromechanical system (MEMS) accelerometer may be used to track vibration patterns.

In some embodiments, a MEMS accelerometer 1905 may be included within a smart device, such as a tablet or a smart phone 1904. Other embodiments include a sensor independent of a smart device. Still other embodiments include a sensor packaged with a controller for executing software specific to the sensor, such as the Fluke™ 3561 FC Vibration Sensor. A structural component 1901 of a structure for which conditions will be monitored with sensors may include a vibration integrator 1902 with an attachment fixture 1903 that establishes vibrational integrity between an accelerometer 1905 in a smart phone 1904 and the structural component 1901. The vibration integrator 1902 may be matched via its shape and material to accurately convey vibrations present in the structural component to the accelerometer 1905 in the smart device 1904. In some embodiments a vibration integrator may include a damper or filter to exclude certain frequencies that may be considered noise to some applications. A damper may be directional such that only vibration frequencies in a particular direction are excluded.

It is understood that an accelerometer 1905 does not need to be incorporated into a smart phone and may be directly fixed to an attachment fixture 1903 or fixed to a vibration integrator 1902 or fixed to a structural component 1901.

Vibrations present in the structural component may be indicative of a state of functioning of equipment included in the structure (not shown in FIG. 19C). For example, a first pattern of vibrations, which may include frequency and/or amplitude and variations in one or both of frequency and amplitude may indicate a proper functioning of a piece of equipment. Patterns of equipment installed in a setting in a structure may be recorded under proper operating conditions to set up an initial proper state of functioning. Patterns derived from a subsequent sensor reading, such as an accelerometer 1905 reading may indicate a variation from the initial pattern of sufficient magnitude to indicate a malfunction or wear present in the equipment.

In some embodiments, a user, such as a service technician, may install an accelerometer into the attachment fixture for the specific purpose of taking an accelerometer reading. A smart phone 1904 may run an app that records a time and place and vibration pattern received. The vibration pattern may be compared with a known set of vibration patterns and a condition of the structured may be ascertained from the comparison. The time date and vibration pattern may be transmitted to a server and aggregated with other sensor readings.

In another aspect, in some embodiments, a second accelerometer 1905A may be used to introduce a vibration pattern into the structural component 1901. The second device may include a second attachment fixture 1903A that establishes vibrational integrity between the second accelerometer 1905A in a second smart phone 1904A and a second vibration integrator 1902A. The vibration pattern introduced may include a known frequency and amplitude. In some embodiments, the vibration pattern will include a sequence of frequencies and amplitudes, wherein different frequencies and amplitudes will be effective in diagnosing or otherwise indicating an underlying causation for a pattern of vibration. The second accelerometer 1905A and the first accelerometer 1905 may be synchronized via executable software such that the first accelerometer will detect the vibrations introduced by the second accelerometer 1905A. Any discrepancies between what was introduced by the first accelerometer 1905A and the first accelerometer 1905 may be indicative of a state of the structure.

For example, introduction of a frequency pattern into a beam that is sound may transmit well through the beam and be detected with minimal variations from the frequency pattern that was introduced. However, a beam that is cracked or has rot within it may not convey the frequency pattern to the first accelerometer or convey the frequency pattern with significant distortion and/or diminutions in amplitude.

A history of sensor readings associated with a particular structure and/or group of structures may be stored and referenced to assist in interpreting a cause for a particular vibration pattern.

Vibration sensors may be installed and recorded in as built data, or added to a structure in a retrofit. Some commercial sensors (such as the Fluke 3561 FC Vibration Sensor) may be associated with vendor supplied software for ease of retrofit implementation.

According to the present invention, accelerometers or other vibration sensors are deployed in specific locations and tracked in a structure according to the respective sensor location. In addition, a relative position of a particular sensor position is tracked relative to other sensors (vibration sensors or sensors for monitoring different modalities of ambient conditions). The present system includes an AVM that may store and make available to a user and/or to AI applications which structural components are in vibrational communication with a particular sensor. Various sensors include underlying piezoelectric, accelerometers of other technologies.

Embodiments also include a sensor programmed to reside in a lower power states and to periodically "wake itself up" (enter a higher powered state) to take a reading and transmit the reading. Sensor readings may be correlated with different types of wear, damage, failure or proper operation of components included in a structure. The AVM tracks location and may rank a likelihood of a component responsible for a particular vibration pattern detected by a sensor. The ranking may be based upon proximity, mediums available for communicating the vibration pattern (such as a beam traversing a significant portion of a structure but which provides excellent mechanical communication for the vibration).

Some embodiments also associate a sensor reading of vibration with a type of motion likely to cause such a reading. For example, some readings may include a linear component and a rotational component (such as operation of a washing machine during certain cycles). Patterns of normal and abnormal operation may be recorded and deciphered via programmable software on a controller.

In another aspect, a pattern of sensor data that denotes spikes of linear data may be associated with a human being walking. Overtime, a controller may track sensor reading patterns and associate a particular pattern with the walk of a particular person.

It is also within the scope of the invention to track and analyze a set of data associated with a primary signal and additional sets of data (secondary, tertiary etc.) tracking harmonics of the primary signal. The AVM may also track sets of data associated with simultaneous, and/or closely timed readings received from multiple sensors and associate an amplitude, sequence, delay or other attribute of the data sets relative to each other to provide input as to a location of a source of the vibration. Additionally, vibration sensors may include axis within the sensor. For example, two axis and three axis sensors may have a direction of each axis included in the AVM and used in analysis of a vibration pattern.

The present invention also provides simple and fast procedures for the provision of directions of a User or a sensor to a source of vibration based upon analysis of readings of one or more sensors via the X. Y and Z location determination and directional ray or vector generation methods described herein.

Disparate types of sensor may also provide disparate data types that are useful in combination to determine a source of sensor readings. For example, a vibration sensor reading indicating erratic motion may be combined with an increased temperature reading from a sensor proximate to an item of equipment. The combined sensor readings may assist in an analysis of a cause of the sensor readings.

In still another aspect, one or more sensor readings may be correlated to a life expectancy of an item of equipment, such as for example a heating Ventilation and Air Conditioning (HVAC) unit. By way of non-limiting example, an ammeter sensor reading measuring an electrical draw of an HVAC unit may be quantified upon deployment of the unit. The initial readings may act as a baseline of a unit in excellent operational condition. A similar baseline reading may be taken via an accelerometer measuring a vibration generated by the HVAC unit. Still other sensor readings may include airflow, temperature, humidity, or other condition. Over time, a change in one or more senor reading values may indicate some wear and move the HVAC equipment item into a "normal wear but operational" status.

Still further along a time continuum, one or more sensor readings may indicate a pending failure. For example, a current required to run the unit may be measured by the ammeter sensor and indicate an increased draw in electrical current. Likewise, airflow may decrease, and temperature may increase, and other sensors may provide additional evidence of a pending failure. Finally, a failed unit may generate a very high temperature reading and ammeter readings may increase to a level of sufficient electrical current draw to trip an electrical breaker, thereby indicating a failure.

According to the present invention, any of the sensor readings (or all, or some subset of all sensor readings) may be referenced to generate an alert. Following the alert, remedial action may be taken.

Figure 20:
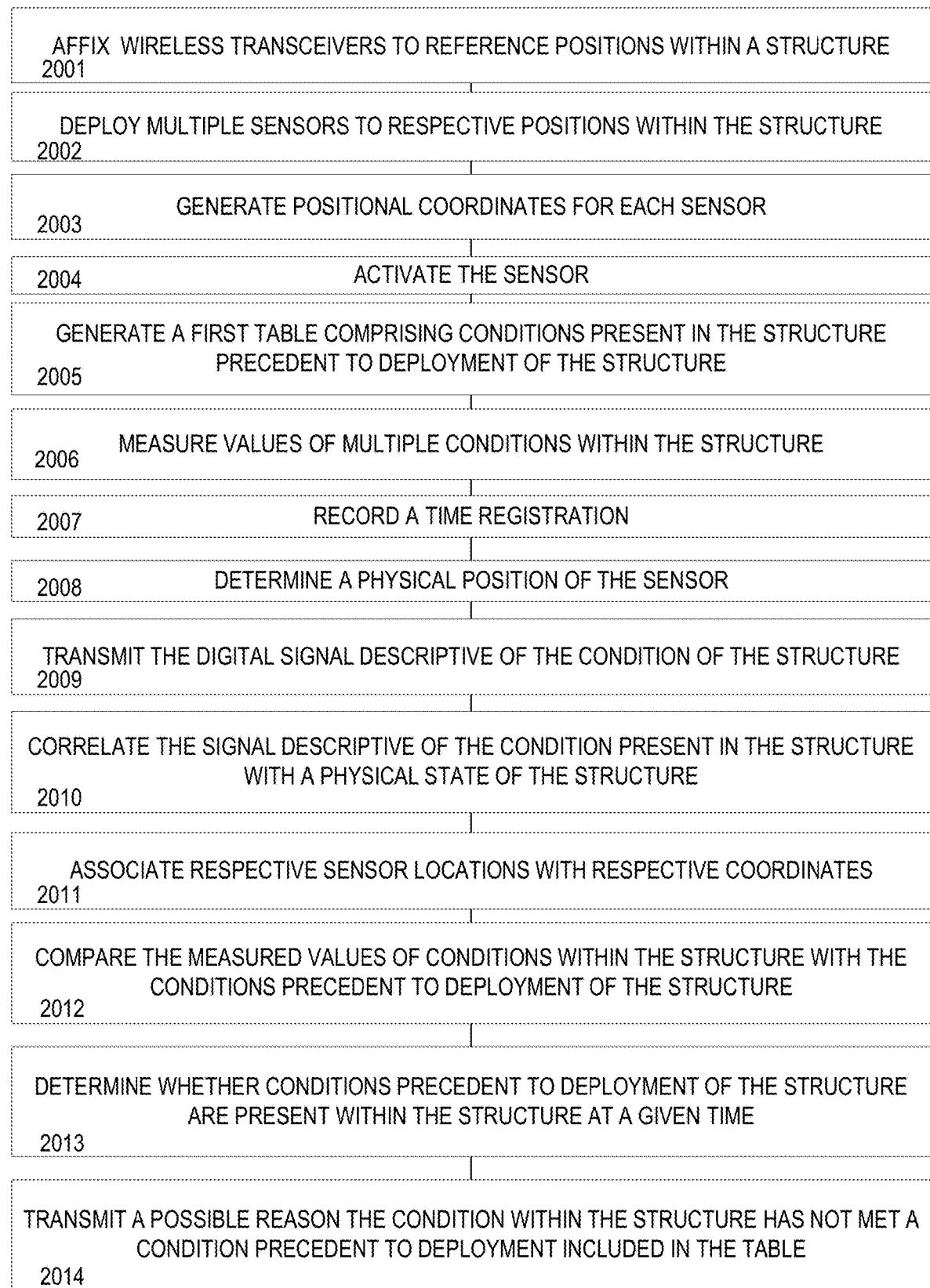

Referring now to FIG. 20, methods steps that may be executed in some embodiments of the present invention are presented. At step 2001, as discussed in detail herein, Transceivers may be affixed to reference positions within or proximate to a structure. In some preferred embodiment's Transceivers are positioned at the perimeter of the structure and are capable of wireless communication form any point within the structure.

At step 2002, multiple sensors are deployed at positions within, or proximate to, the structure in a manner conducive for the sensor to operate and generate data descriptive of a condition that is one or both of: within the structure or proximate to the structure. The sensor will also generate a digital signal descriptive of the condition monitored by the sensor. Deployed may include affixing the sensor in a fashion that enables to sensor in a manner intended. For example, an accelerometer may be fixedly attached to a beam or other structural component in order to accurately experience vibrations emanating from the structural component. A temperature probe may need to be properly positioned to be exposed to ambient temperature conditions. An ammeter may be installed in a position enabling the ammeter to accurately determine an electrical current being conducted by an electrical wire. Other sensors will likewise be installed within the structure in a place and manner conducive to generating accurate readings of conditions within the structure.

At step 2003, positional coordinates may be generated for some or all of the sensors deployed. As discussed herein, positional coordinates may be based upon triangulation between the sensor or a smart device proximate to the sensor in wireless communication with two, three or more transceivers generating wireless transmissions from reference points. A physical position of the sensor may also be determined based upon wireless communication of the sensor with two or more of the wireless transceivers at the reference positions. As discussed herein the physical position may include an X coordinate and a Y coordinate on an X, Y plane and an elevation based upon a Z coordinate relative to a ground plane or other designated plane of origin.

At step 2004, the sensor is activated to an operational state and generates the digital data and transmits the data. In some preferred embodiments, the sensor will transmit the data via a wireless transmission. In other embodiments, the sensor may transmit the data via an electrical or optical connector.

At step 2005, a first table is generated that includes conditions that would preferably precede deployment of the structure. For example, for a residential structure, such as a single family home, a multi-family home, a condominium, or a townhome; a first table may include building codes. For other structures, ANSI codes, engineering specifications and other desired attributes may be included. Engineering specifications may include, by way of non-limiting example, an amount of pressure (or weight) a load bearing wall or other structure may be exposed to. Other specifications may include an amount of vibration (such as vibration caused by wind or physical activity within the structure may be safely handled by the structure without causing damage and/or making the structure unsafe.

At step 2006, the deployed sensors are operational to measure multiple conditions within the structure. The measurements are made, for example, via physical operation of the sensors, which may include applying an operating electrical current to active components within the sensor. Operation may be based upon a schedule of periodic readings, via remote control, or resulting from manual manipulation of a control on the sensor.

At step 2007, a time registration indicating when values of one or more conditions were measured is recorded. In some embodiments, the time registrations may be utilized as an index to synchronize multiple sensor readings. An index may be activated based upon a time at which a sensor was activated. The index may be used to create a chronological sequence of sensor readings. The index may also be used to synchronize multiple sensor readings and thereby capture a holistic picture of a structure during a given time period.

At step 2008, a physical location of the sensor may be determined. A direction of the sensor from a home position may also be determined via the processes described herein. A distance of sensor to an item of equipment or an area of interest may be determined. The distance may be determined via methods, such as LIDAR, echo, User entry or other method.

At step 2009 a digital signal is transmitted descriptive of the condition of the structure. The condition of the structure may be based upon Vital Conditions of the structure assessed via the sensor readings. The transmission may include a logical communication with wireless communications via an industrial scientific and medical (ISM) band wavelength which may include wavelengths between 6.765 MHz and 246 GHz. WiFi is one protocol that may be implemented for wireless communication, as is Bluetooth, ANT, infrared or other protocol. At step 2010, a physical state of the building at the physical position of the sensor, or an area of the structure within range of the sensor, may be correlated with the digital signal descriptive of a condition of the structure. A condition present in the structure at an indexed time, may be correlated with a physical state of the structure or a condition present in the structure at the correlated time.

At step 2011, preferably the location is quantified via an X, Y, and Z coordinate. The sensor locations and/or areas of the structure within range of the sensor for which the sensor may take a reading, are associated with location coordinates, such as X, Y and Z coordinates.

At method step 2012, a controller may compare measured values of conditions present in the structure with the conditions precedent to deployment of the structure. For example, the conditions precedent to deployment may include metrics of safety factors. Metrics of safety factors may include building codes, stress indicators, load capacity (weight), electrical current drawn, water pressure minimum and maximums, humidity, particulate levels in air, presence of mold or spore forms, presences of insects or rodents, etc.

Referring now to step 2013, a determination may be made as whether conditions precedent to deployment of a structure are present within the structure at a given point in time. In some embodiments, this determination may be made based upon the measured values of sensors indicating conditions within the structure and the time registration.

At method step 2014, a transmission may be made that indicates that a structure has not met a condition precedent to deployment. The transmission may include an alert that the structure is somehow deficient and that a remedial action may be one or both of necessary and appropriate.

In some embodiments, a condition precedent may be indicative of a value of a property for use as collateral to an obligation. For example, a property that includes a structure that is not up to code may not be as valuable as a property that meets all codes and/or engineering specifications. In another non-limiting example, a value designated for a property that includes a structure may be monitored in real time, or at least in near real time (with no artificial delay introduced by any aspects of the system and the only delay resulting from timing considerations entailed in normal operation of the system (e.g. transmitting times, processing times; storage times, communication speed and the like).

Referring now to FIG. 20A, additional steps that may be implemented in some embodiments are illustrated. Method steps may include utilizing accelerometers and/or other sensors. At step 2015 a vibration is introduced into a component of the structure and at step 2016 the vibration pattern introduced is compared with a pattern of vibration detected by a MEMS. At step 2017 a series of transitions of MEMS accelerometer readings may be tracked and at step 2018 the pattern of vibrations measured by the MEMS accelerometers may be correlated with structural integrity.

At step 2019, alternatively, a condition of a structure may be generated and based upon a pattern of vibration measured (transmitted and received within the structure). At step 2020, a threshold range of values measured by a sensor may be set and one or more method steps may be executed based upon whether the threshold range is exceeded or not. Method steps may also be predicated upon an analysis that indicates a particular condition or set of conditions within the structure.

Figure 20B:
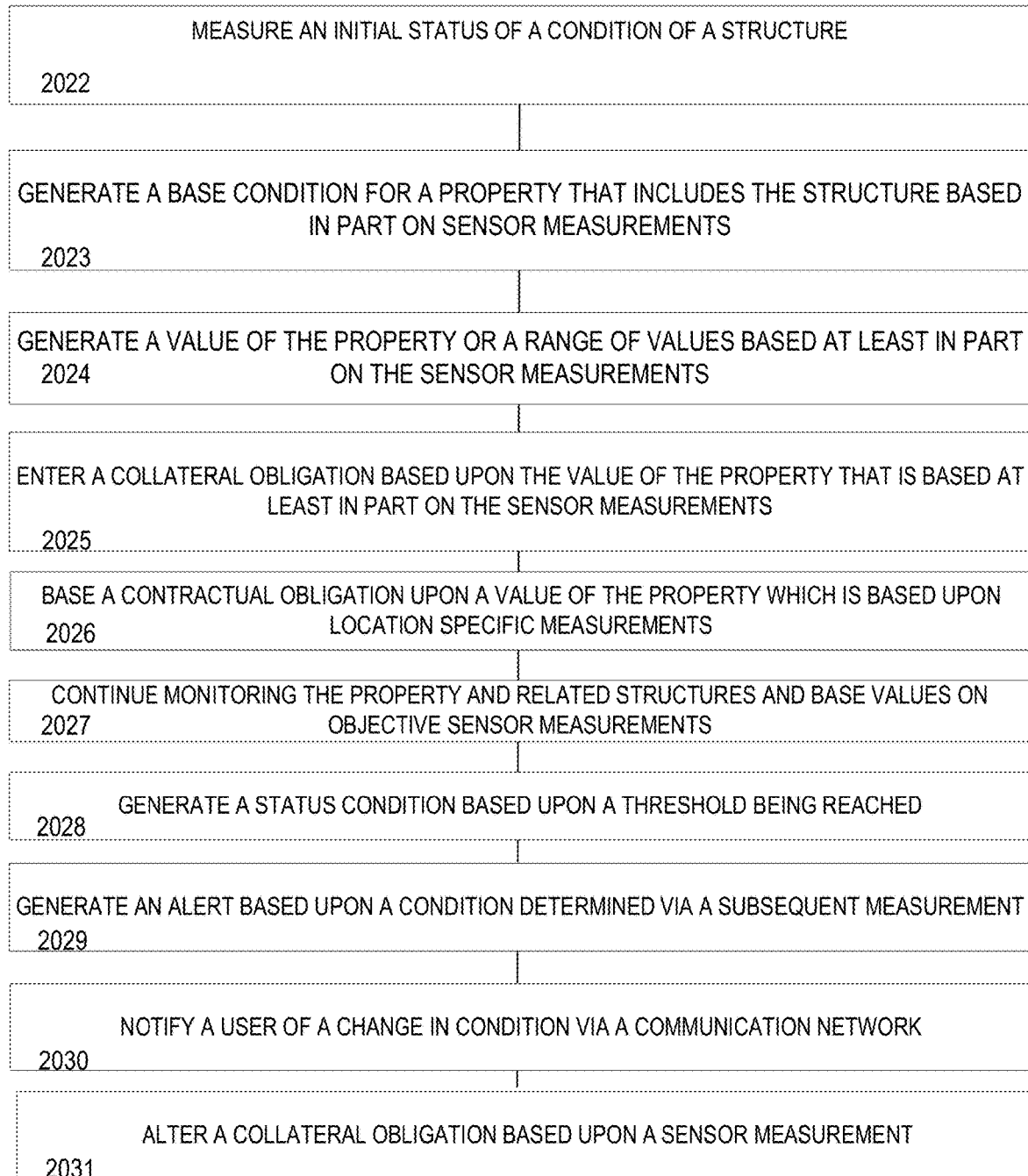

Referring now to FIGS. 20B and 20C, method steps are specified for measuring initial conditions within a structure and using the initial conditions measured and subsequent conditions. At step 2022 an initial status of a condition of a structure is measured with sensors at locations specified via X, Y, and Z coordinates.

At step 2023 a base condition for a property that includes the structure may be generated, based, at least in part, upon sensor measurements. For example, the sensor ratings may be used to value a property within a range of values applicable to the property.

At step 2024, a value of the property may generate, or a range of values, based at least in part upon the measurements made with the sensors in or proximate to the structure. The range of values may be based upon a size, type and location of a property; and a specific value chosen within a range may be attributed to a condition of the property as supported by measurements made by the sensors in the structure.

At 2025 a collateral obligation may be entered generated based upon a value of the property that is based upon the sensor measurements. Unlike previous property appraisal methodologies that may have been based upon a significant amount of subjective value, the present invention provides for automated generation of objective data that is used to generate a valuation of a property. Objective data generated by the present invention may include a size of a property as measured with laser based or other electronic instruments, a location of the property as determined via GPS or other location technology and a condition of a structure as determined via sensor measurements of conditions within the structure at a quantified time and date.

At step 2026, a contractual obligation may also be based upon a value of the property based upon location specific sensor measurements. A contractual obligation may include, by way of non-limiting example; a mortgage; a posting of collateral; a value of individual worth or other contract term.

At step 2027, continuing monitoring of a property and related structure may be ongoing and based upon objective sensor measurements.

At step 2028, in some embodiments, one or more threshold status conditions may be generated. For example, a structure may need to be occupied by humans, a structure may need to maintain structural integrity of major components; a structure may need to be maintained within specified humidity ranges to prevent mold; or other condition.

At step 2029 an alert may be generated based upon a condition determined via a measurement subsequent to a measurement used to determine a base condition. Typically, the measurement subsequent to a measurement used to determine a base condition will be performed on a predetermined schedule. The alert may indicate that one or more measurements are outside of a range correlating with a last determined condition of the structure. For example, damage to the structure may have caused a subsequent sensor measurement to change considerably. Similarly, a remedial action upon some aspect of the structure may cause a sensor reading to indicate that a structure is in better condition following the remedial action.

At step 2030, a transmission via a communications network, such as a cellular network, or internet protocol network, radio frequency communication or other broadband type communication may be used to notify a user of a change in condition that exceeds a predetermined threshold. In some embodiments, an alert may notify a User that conditions have remained the same and act as an affirmation that the structure is in a same condition as previously transmitted.

At step 2031, in some embodiments, a collateral obligation may change based upon the sensor measurement. For example, sensor measurements indicating damage to a structure, or other deleterious change to the structure may lower an amount of credit available based upon the property including the structure being used as collateral. Alternatively, sensor measurements indicating an improvement in condition of the structure may increase a value attributed to the collateral and result in an increased line of credit, cancellation of mortgage insurance or other change in obligation.

Referring now to FIG. 20C, method steps for a process that may be practiced using a same or different transceiving modality is illustrated. At method step 2032 a location of a first Position Transceiver supported by an Agent is calculated based upon wireless communication with a first Reference Position Transceiver. The wireless communication may include transmission and receipt of logical communications via one or more of the wireless modalities discussed herein, and therefore may include, but is not limited to modalities including: WiFi communications, UWB communications, Ultrasonic communications, Infrared communications, Bluetooth communication, and other wavelength communications.

Generally, triangulation based upon wireless communication determines three distances from a first point to a second point based upon wireless communications using a single modality of communication. According to the present invention, triangulation may include a single modality, or multiple modalities of wireless communication. Also, within a single modality, a same or multiple wavelengths may be used for communication. For example, a first distance may be determined based a wireless communication in a WiFi modality using a first bandwidth. A second distance may be determined based upon a wireless communication in the same WiFi modality and using the same first specific bandwidth, or another bandwidth within the same WiFi modality. Alternatively, or in combination with the determination of the second distance based upon the WiFi modality, the second distance may be determined based upon a wireless communication in a Bluetooth (or other communication modality, such as those discussed herein). A third distance may also be generated and may be based upon a wireless communication in any of a WiFi modality, a Bluetooth modality, or other communication modality (such as UWB, infrared or ultrasonic modalities).

According to the present invention, almost any combination of communication modalities may be used for wireless communications upon which a distance is generated. A controller may combine each respective distance to generate a location of a Transceiver involved. The multi-modality communication Transceivers taught in the present invention enable a wide range of combinations that may be leveraged to provide beneficial aspects of a particular modality with other beneficial aspects of another communication modality.

For example, an ultrasonic or infrared communication modality may provide a very accurate distance determination. In addition, the ultrasonic and infrared distance determinations may include a directional aspect that may be leveraged to provide a more accurate position determination when combine with an omni-direction communication modality based distance, such as a distance based upon WiFi and/or Bluetooth. In addition, ultrasonic and/or infrared communication modality may provide an accurate determination of a room in which the measurement is taking place since these communication modalities may not pass through solid objects (such as a wall) very well. Other modalities may each provide advantages and/or disadvantages based upon variables that may have an impact upon a wireless communication.

The present invention therefore includes using multiple communication modalities and multiple bandwidths within a single communication modality to determine a particular distance (e.g. a distance between Reference Point Transceiver 1 to a Transceiver supported by an Agent) and also using multiple communication modalities and multiple bandwidths within a single communication modality to determine different distances (e.g. a first distance between Reference Point Transceiver 1 to a Transceiver supported by an Agent and a second distance between Reference Point Transceiver 2 and the Transceiver supported by the Agent).

In some embodiments, a choice of communication modality may be based upon environmental conditions in which the wireless communication is taking place. For example, an environment with significant particulate in the air (such as smoke or dust) may not be ideal for an infrared wireless transmission, or an environment with significant electrical noise may be detrimental to a WiFi or Bluetooth wireless communication, but not detrimental at all to an ultrasonic (or infrared) wireless communication. Therefore, the present in invention includes the ability to receive data from sensors proximate to an area of wireless communication (as described in this disclosure) and to weight a consideration of a particular wireless communication based upon data generated by such sensors.

At method step 2033, a location of a second position transceiver also supported by the Agent is generated and based upon a wireless communication with a Reference Position Transceiver. The ability to utilize multiple modalities and multiple frequencies described above also applies to this position generation (and other position generation). The second position Transceiver may also be included in a same device as the first position transceiver, such as a smart phone (and in some embodiments may include the same position Transceiver at a different location) or the second position Transceiver may be incorporated into a separate device, such as a ring, a watch, a pointer a wand or other device.

At method step 2034, a vector is generated based upon the location of the first position Transceiver and the position of the Second position Transceiver. The vector will generally include a position of the Agent based upon the wireless communications and a direction of interest based upon a relative position of the location of the first position Transceiver and the location of the second position Transceiver.

At step 2035, a query of a database may be made based upon the vector generated. The database query may include, for example, a request for direction to a defined area of interest or a defined object or aspect of the structure; a request for a portion of an AVM, details of an aspect of a structure (such as electrical features, plumbing features or structural features) or almost any other database information that may be related to a position of the Agent and a direction of interest.

At step 2036, a user interface may be generated based upon a response to the query based upon the vector. The user interface may include one or both of aspects ascertainable to a human Agent (human readable and/or pictorial) and aspects ascertainable to an automation Agent (such as digital data).

At method step 2037, the user interface may be displayed upon a screen included in a smart device associated with the Agent.

Figure 21:
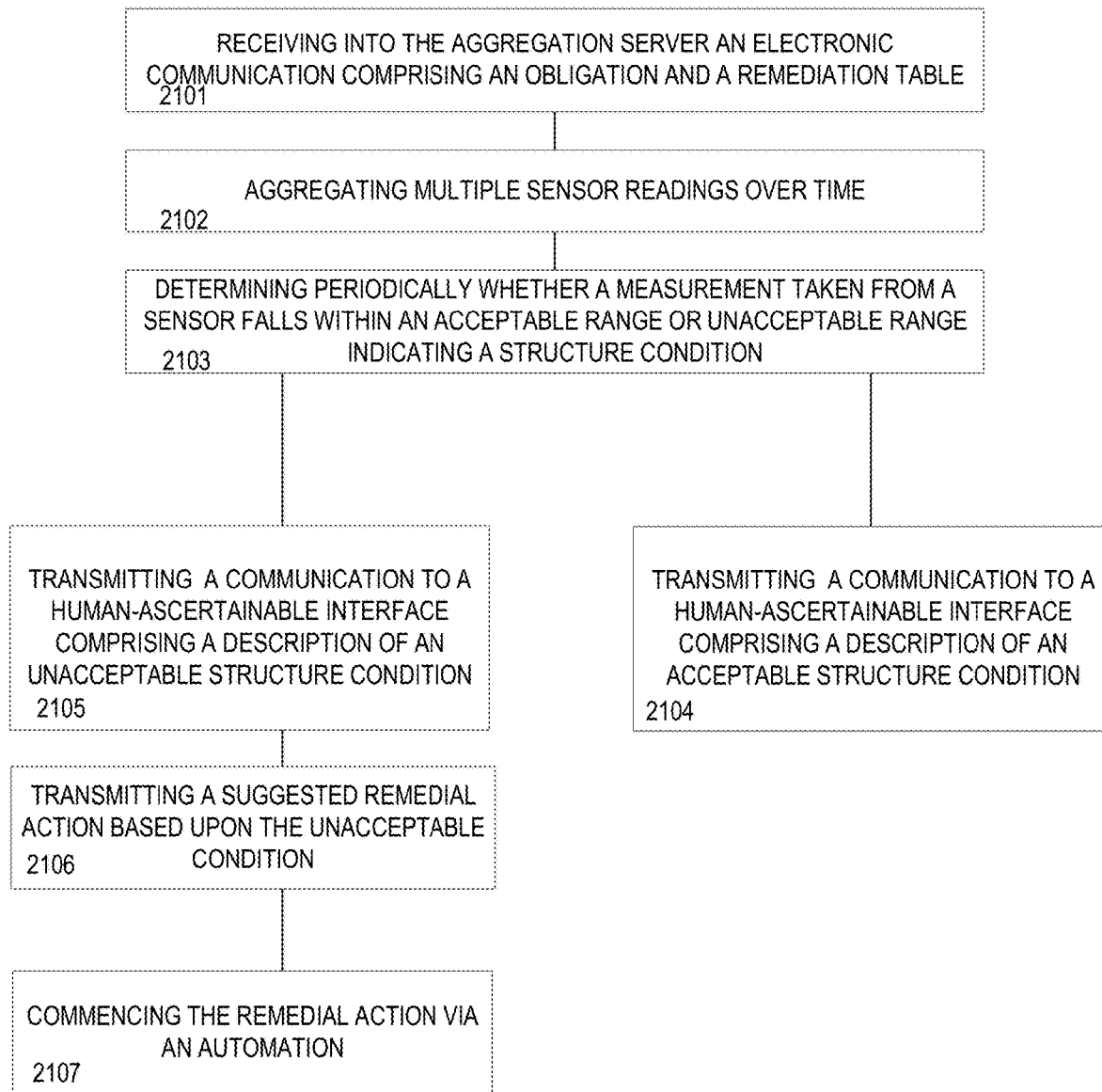
FIG. 21 illustrates an exemplary method steps for generation of a user interface.

Referring now to FIG. 21, an exemplary method for hierarchical actions based upon structural conditions is shown. At 2101, the aggregation server receives an electronic communication comprising an obligation and a remediation table. An obligation could be based off a contract (traditional contract or smart contract) and reflect any obligation surrounding the property, such as one or more of: maintain a certain loan-to-value ratio; maintain habitable living conditions by reference to pre-defined Vital Conditions; maintain a certain occupancy level; or achieve any Objective. One or more sensors are associated with each obligation. For example, if the obligation is to maintain habitable living conditions, associated sensors may include one or more of: thermometer, humidity meter, particulate concentration detector (e.g., smoke detector), or a vibration detector. Additionally, the remediation table may include one or more ranges for each sensor. For example, in some embodiments, if the obligation is to maintain habitable living conditions, then the acceptable range of temperatures as measured from the thermometer sensor might be 65-80° F. The remediation table also includes one or more prescribed remedial actions to take if the sensor reading falls outside an acceptable range. For example, if the temperature of the structure reaches 85° F., then the remedial action may be one or more of: increase the power of the air conditioning unit, shut a door, or shut a window. There may be one or more sets of acceptable ranges, each with its own respective remedial action. For example, if the acceptable temperature range is 65-80° F., a second temperature range may be 50-90° F. Within this temperature range, the structure may still be able to comply with the obligation if specific steps are taken. Here, closing a door might not restore the temperature to the acceptable range, but replacing the roof might be sufficient. An additional possible sensor range might reflect that the structure is incapable of ever complying with its obligations. Continuing with the thermometer example, a third temperature range may be 0-1100° F. (the latter being the average temperature of a house fire). In this case, the structure may be deemed permanently non-compliant with a criterion associated with the structure.

By way of a second non-limiting example, a criteria may include maintaining a designated loan-to-value ratio for a Structure that is subject to a loan, such as a mortgage or that is given a certain rating, or that is included with other properties in a grouping, such as a group of properties in a Real Estate Investment Fund (REIT). An AVM, using the SVCM, provides a unique means for knowing the value of the Structure at any given time. Additionally, an objective may comprise maintaining the Structure at a certain quality rating under a certain objective quality standard. For example, the Uniform Appraisal Dataset assigns a condition rating to a Structure from C1 to C6 (the UAD Condition Ratings), and a quality rating from Q1 to Q6. See, e.g., FANNIE MAE, SELLING GUIDE § B4-1.3-06 (Oct. 2, 2018), https://www.fanniemae.com/content/guide/selling/b4/1.3/06.html. The UAD Condition Ratings are as follows (listed without their accompanying Notes):

C1: The improvements have been very recently constructed and have not previously been occupied. The entire structure and all components are new and the swelling features no physical depreciation.

C2: The improvements feature virtually no deferred maintenance, little or no physical depreciation, and require no repairs. Virtually all building components are new or have been recently repaired, refinished, or rehabilitated. All outdated components and finishes have been updated and/or replaced with components that meet current standards. Dwellings in this category either are almost new or have been recently completely renovated and are similar in condition to new construction.

C3: The improvements are well-maintained and feature limited physical depreciation due to normal wear and tear. Some components, but not every major building component, may be updated or recently rehabilitated. The structure has been well-maintained.

C4: The improvements feature some minor deferred maintenance and physical deterioration due to normal wear and tear. The dwelling has been adequately maintained and requires only minimal repairs to building components/mechanical systems and cosmetic repairs. All major building components have been adequately maintained and are functionally adequate.

C5: The improvements feature obvious deferred maintenance and are in need of some significant repairs. Some building components need repairs, rehabilitation, or updating. The functional utility and overall livability are somewhat diminished due to condition, but the dwelling remains useable and functional as a residence.

C6: The improvements have substantial damage or deferred maintenance with deficiencies or defects that are severe enough to affect the safety, soundness, or structural integrity of the improvements. The improvements are in need of substantial repairs and rehabilitations, including many or most major components.

A contractually imposed obligation may include, for example, that a given Structure always be at a C3 level or higher. A Structure's UAD Condition Rating is, in part, a function of the frequency and necessity of repair of major components. A Structure reaches C4 when it has improvements that feature some "minor deferred maintenance" and requires "only minimal repairs to components/mechanical systems." Id. Accordingly, the AVM, supplemented with SVCM, is a desirable way to ensure a Structure does not reach C4, in at least two ways. First, in some embodiments, the AVM tracks maintenance history of various components. In some embodiments, the AVM may be pre-loaded with a desired repair schedule. For example, experts recommend that the HVAC system be serviced at least once per year. Each of these services may be documented in the AVM through the successful completion of a Service Call. Conversely, if the AVM does not have a record of maintenance of the HVAC system for three years (as an example), then this lack of maintenance may constitute deferred maintenance sufficient to change the rating of the Structure from C3 to C4.

Second, Sensors may be placed to monitor components, mechanical systems, and electrical systems in accordance with SVCM. For example, Sensors may include voltmeters positioned throughout the Structure's electrical systems. If a voltmeter detects an unexpected, prolonged voltage drop across the voltmeter, the Structure may also be downgraded to C4.

Other factors affecting the appraisal value of a Structure or its UAD Condition Rating that may be reflected in the AVM include, without limitation: heat and air throughout the Structure, Structural construction materials and updates, neighborhood value (where other Structures in a neighborhood are also covered by an AVM and SVCM), structural soundness and sealing, and appliance maintenance.

objective list to put property in rated condition (A rated property—specific contractual commitment—property will be kept in this rated condition—do sensor readings reflect that they meet—if you have 20 items, out of compliance with 7, it can do that—evaluate price of remedial action—hierarchically rate remedial actions—combining logic w/physical measurements, measuring states, flagging, giving indication of what to do today—can look at portfolio today At step 2102, multiple Sensor readings are aggregated at the aggregation server over time. These may be multiple readings from one Sensor, a single reading from multiple Sensors, or multiple readings from multiple Sensors. This may serve to establish a pattern of measurements pertaining to the objective. Additionally, in some embodiments, an entity may have access to aggregation data for a plurality of structures. Such data can be additionally combined to usefully evaluate parameters and desired ranges. For example, upon the purchase of a structure, an appraisal or a construction of an AVM may indicate that the optimal temperature for the structure is 74° F. However, if 99 other similar structures maintain an average temperature of 71° F., then the acceptable range may be modified accordingly.

At step 2103, periodically the aggregation server may determine whether a measurement taken from a Sensor falls within the acceptable range. Periodically may mean daily, weekly, monthly, yearly, or any other interval. As discussed at step 2101, multiple Sensor ranges may be considered. At steps 2104 and 2105, these determinations may be sent to a human-ascertainable interface. At step 2104, a determination may be requested from the human-ascertainable interface, and if the sensor readings fall within an acceptable range, the aggregation server may provide confirmation of same.

At step 2105, however, if the determination is that the measurements do not fall within an acceptable range, the remediation table is consulted to determine the appropriate remediation action. As discussed at step 2101, the remediation action may comprise changing the conditions of the structure. In some embodiments, the AVM may be consulted to determine the most effective remediation measure. In some embodiments, the effectiveness of a remediation measure is determined with reference to one or more of: the speed of the remediation, the cost of the remediation, or the long-term effect of the remediation.

At step 2106, in some embodiments, the aggregation server is in logical connection with the AVM, home automation tools, or other automated apparatuses that can implement the associated remedial action. For example, if the temperature measurement falls outside the acceptable range, in these embodiments the aggregation server can communicate with an automated thermostat to adjust the temperature accordingly (e.g., by increasing power to the air condition or heater). In some embodiments, the remediation table comprises a hierarchical listing of actions to take to fall into compliance with an obligation. For example, the contract or other communication specifying the obligation may enumerate 20 conditions to monitor, such as yearly HVAC maintenance, airflow throughout the Structure, and insulation quality in each room of the Structure. If the AVM indicates that a predetermined threshold number of these conditions are not met, then the aggregation server may take remedial actions in accordance with a set of predefined rules. These rules may be prioritized by, for example, price or efficacy in remediating the undesired condition. Based on the previous example, the aggregation server may determine that the HVAC has not been serviced within the last three years; a crack in the wall exists in the living room; and the kitchen is absorbing outside heat at a greater rate than anticipated upon appraisal or at the time of the obligation. If the remedial action rules are prioritized by price, then the aggregation server may determine that the least expensive remedial action is requesting service to the HVAC—and the aggregation server may automatically order such service. Accordingly, at step 2107 a remedial action may be commenced via an automation.

Figure 22A:
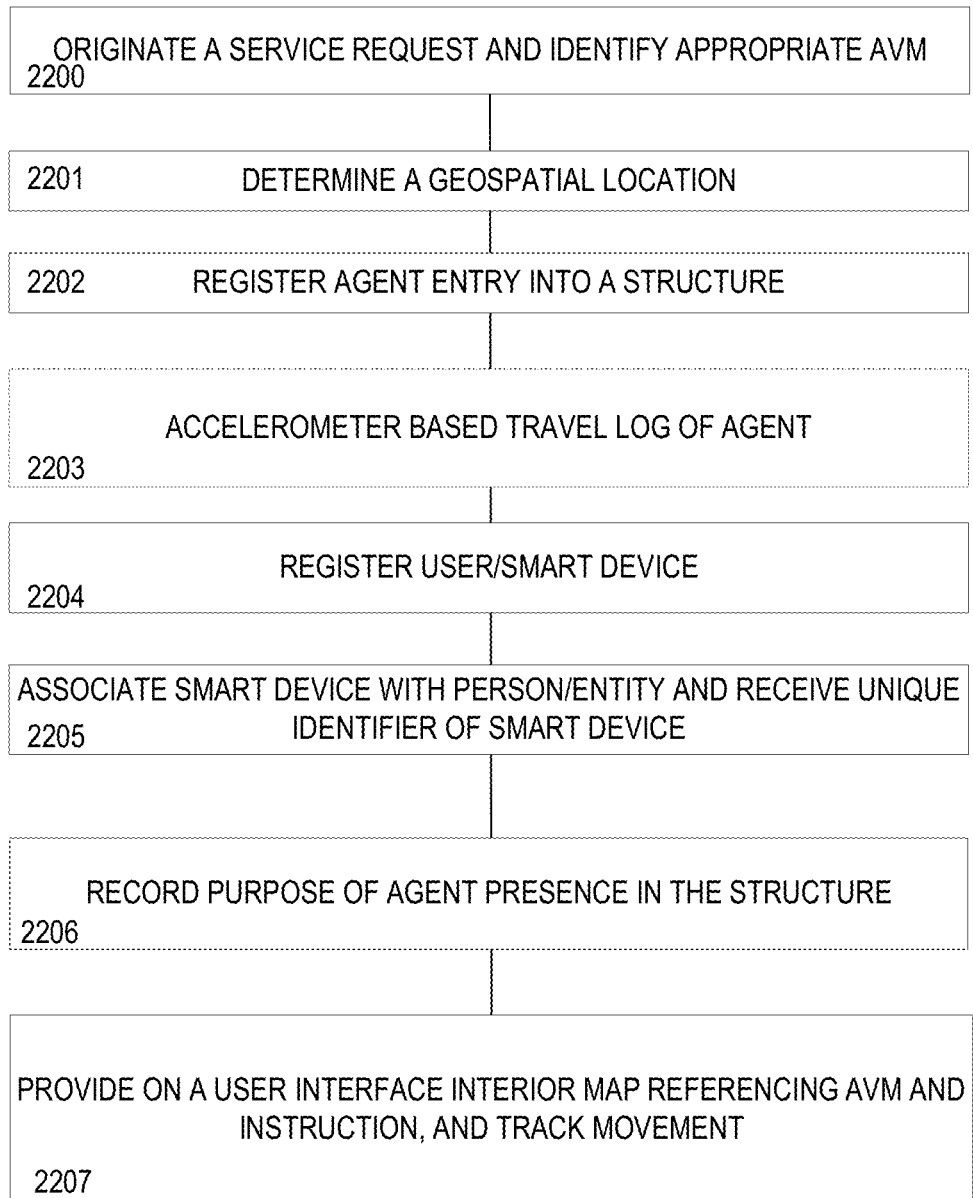
FIGS. 22A-B illustrates method steps that may be executed in practicing some embodiments of the present invention.

Referring now to FIG. 22A, method steps that may be implemented in some embodiments of the present invention are illustrated. At method step 2200, a service request is originated. The service request may be associated with geospatial location services are used to determine geospatial location such as a location of the structure with a position and direction of interest. At step 2201 the geospatial services may be used to determine an Agent's location relative to the structure and directions thereto. The methods used may include, by way of non-limiting example, one or more of: satellite-based GPS, cell tower triangulation, radio signal triangulation, Wi-Fi signal location services, infrared transmitters and the like.

In some embodiments, geospatial location services may be cross-referenced with a database registry of as built virtually modeled facilities and may be used in conjunction with a network of registered service technicians to route a nearest available service technician to a structure related to the service request.

At method step 2202, the Agent's entry into the structure will be registered. Registration of entry into the structure may be achieved through multiple methods, which may include, by way of non-limiting example, on or more of: WiFi gateway detection, infrared detection, magnetic door locking systems, Bluetooth services, and the like. Upon entry into the structure requesting the service call, system will register the service technician's entry into the structure.

At method step 2203, a series of accelerometer readings may generate travel log of Agent travel within the structure and may be based upon a change in triangulation values and/or an accelerometer reading or image based movement techniques. The methods used may be, by means of nonlimiting example, one or more of: use of data gleaned from accelerometers located on or in possession of Agent, WiFi services, radio frequency (RF) triangulation, Bluetooth technology, infrared transceiving, ultrasonic transceiving, RFID badges, and the like.

At method step 2204, a smart device associated with the Agent will be registered for communication with the Agent.

At method step 2205, a unique identifier may be associated with the smart device and/or the Agent.

At method step 2206, a purpose of the Agent presence within the structure is recorded. Exemplary purposes may include, one or more of: a service call placed from the structure to the system detailing an equipment malfunction; service calls from the structure detailing non-specific malfunctions and symptomatic data indicating an equipment malfunction; a service call placed by self-assessing equipment utilizing internet of things (IoT) and machine learning functionality to ascertain malfunctions and predictive analytics to anticipate malfunctions, and the like. The system may integrate data reports into the AVM and relay content of the reports to the smart device associated with the Agent in the field.

Alternatively, a smart device may arrive at a structure without prior knowledge of a purpose. Upon entry into the structure and registration of the smart device a controller may relay data gleaned from the AVM, operational data uploaded to the system through IoT processes, and other experiential data reported to the controller. Methods for relation of such data to an on-site smart device may include, by means of non-limiting example, referential data based on proprietary orienteering processes to determine smart device location within structure, which location will be cross-referenced with AVM data.

At method step 2206, a purpose for the presence of the Agent in the structure may be recorded, such as for example in a log linked to the AVM. At step 2207, the method steps may use one or more of: augmented reality overlays; heads-up displays or other wearable technologies; augmented reality overlays displayed on smart devices; direct instructional vectoring provided to the smart device by the system over WiFi internet connection or LTE signal; virtual reality walkthrough instructions provided to a user interface and/or the smart device on site associated with the Agent, updated map/schematic displays detailing the structure and directing the Agent to a source of a purpose for being within the structure based upon vectoring and orienteering processes. Orienteering apparatus may include, by means of non-limiting example, on or more of: WiFi triangulation, infrared position detection, radio frequency (RF) detection, RF ID tracking, onboard accelerometers located on the smart device or carried smart devices, and the like.

Figure 22B:
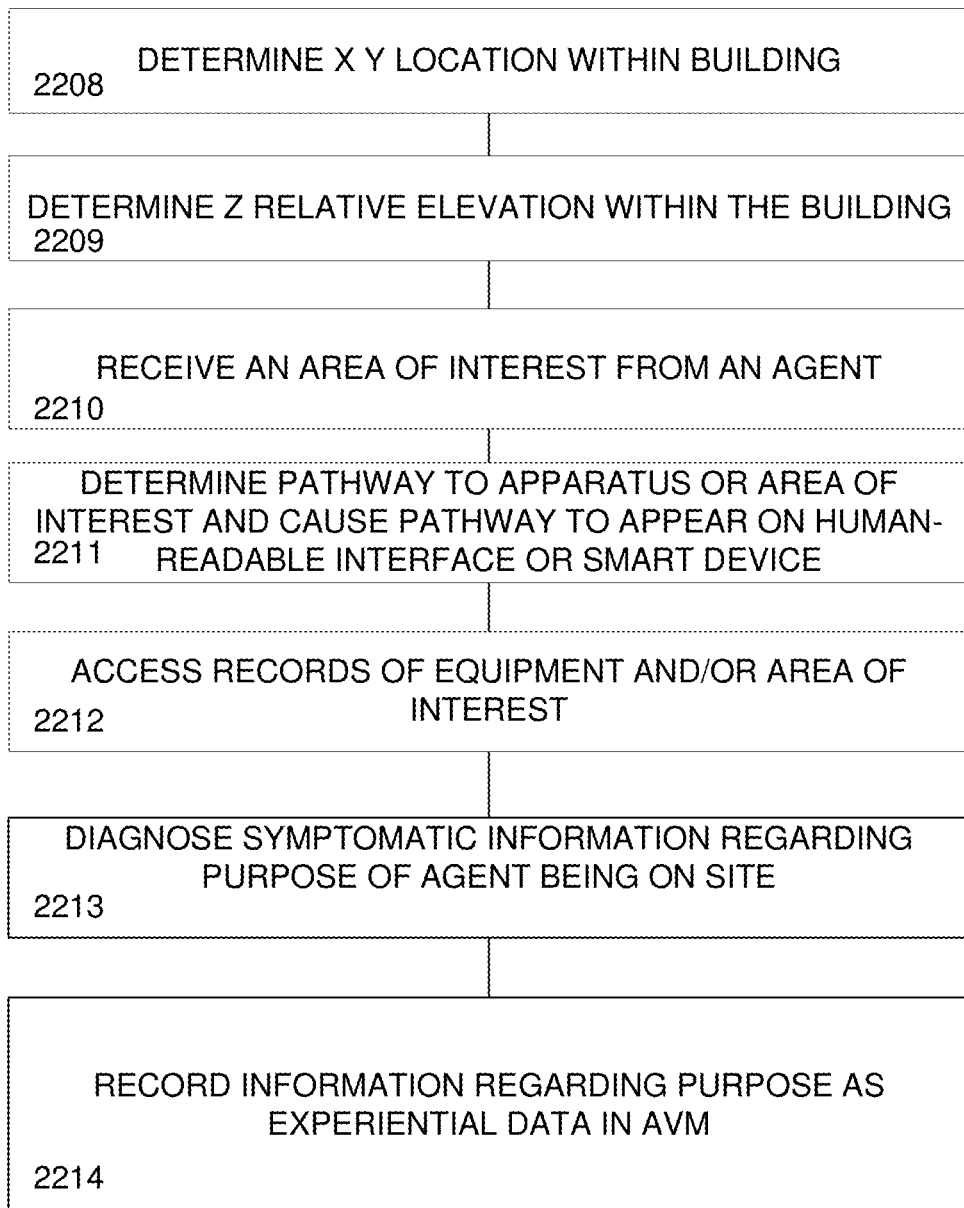

Referring now to FIG. 22B, at method step 2208, a position Transceiver location within the structure along X and Y coordinates may be determined. At method step 2209, the position Transceiver's location along the Z axis may be determined. In some examples, the method steps 2208 and 2209 may occur simultaneously or nearly simultaneously. The methods used may be, by means of non-limiting example, one or more of: onboard magnetometers, onboard barometers, onboard accelerometers, and the like, used in conjunction with in-structure XY axis position processes described in method step above, along with data detailed in the AVM of the structure.

At method step 2210, an Agent may designate and area of interest.

The system may determine an Agent's direction of interest using, by means of non-limiting example, on or more of the following methods: infrared pointers, laser direction finding devices, onboard camera(s), RF ID trackers, RFD finders, barcode scanners, hex/hash code scanners, WiFi triangulation, and the like.

At method step 2211, the Agent's distance and a pathway to an area of interest is generated and displayed upon a human readable interface. The methods used may be, by means of non-limiting example, one or more of the following: infrared pointers, laser pointing devices, WiFi triangulation, RF ID sensors, RFD, depth perception sensors contained within onboard cameras, onboard magnetometers, Bluetooth technology, ANT sensors, directionally enabled smart device cases, and the like.

At method step 2212, records of equipment and/or area of interest will be accessed and relayed to the smart device. The smart device's position, direction of interest, and distance to the equipment/area of interest may be cross-referenced with the AVM and experiential data may be accessed and displayed on the user interface. Data regarding the purpose may be added to the AVM and experiential data displayed to a user interface, such as a user interface on a smart device.

At method step 2213, symptomatic data will be diagnosed to determine cause of emergency as possible. The methods used may be, by means of non-limiting example, one or more of: IoT experiential data gathered and collated from multiple sources across multiple facilities similar to the presented symptomatic data, internet-gathered data analyzed by various machine learning technologies, algorithmic analytics of symptomatic data to determine causal indications, and smart device expertise.

At method step 2214, information related to the purpose and a subject location is recorded and added as experiential data to the AVM. The methods used may be, by means of non-limiting example, on or more of: equipment self-reporting through IoT and machine learning technologies, smart device entered data, experiential data gathered from emplaced sensors and other recording devices within the structure itself, and the like.

Figure 23A:
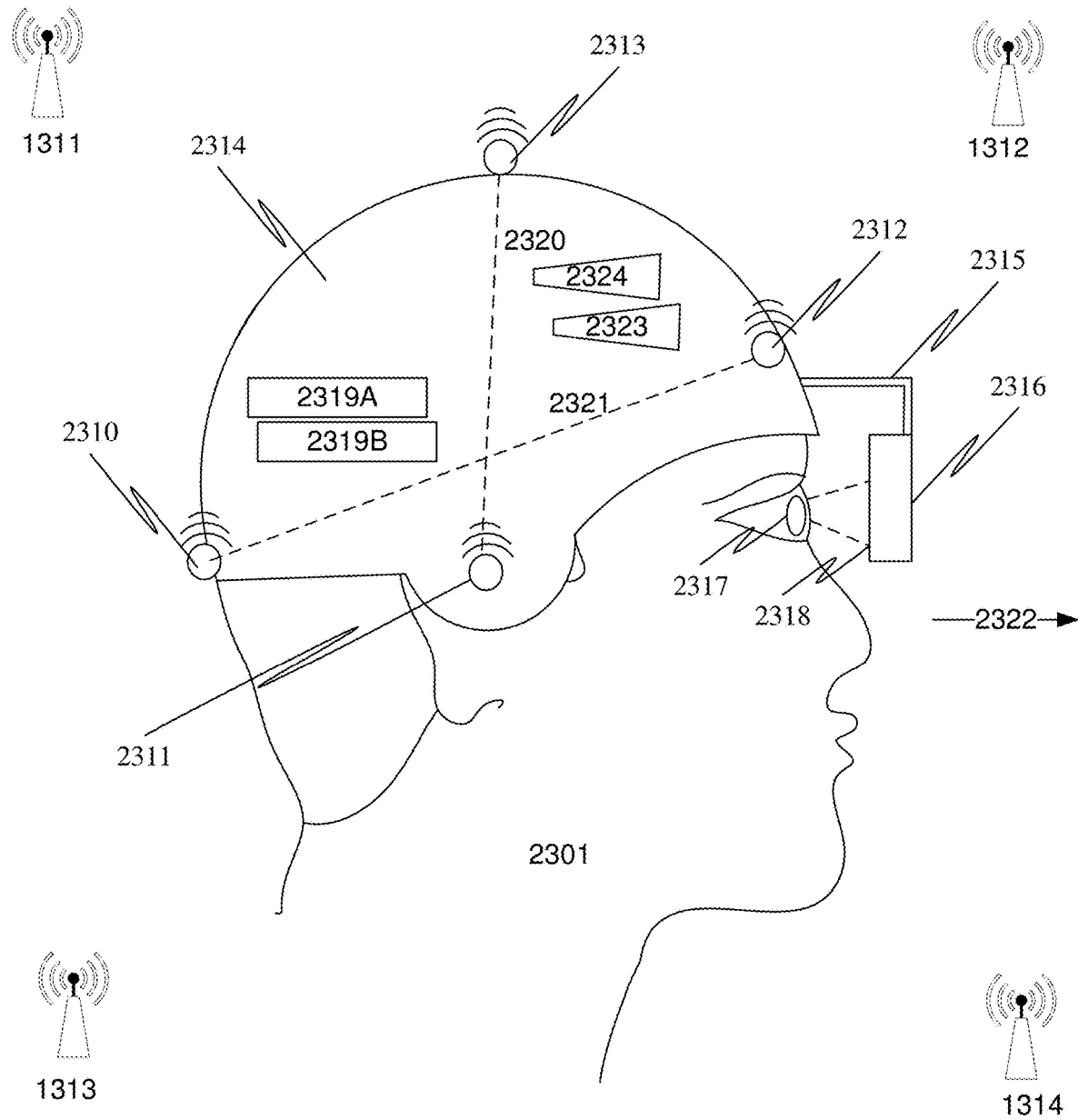
FIGS. 23A-C illustrate aspects of headset displays with location devices.
Figure 23B:
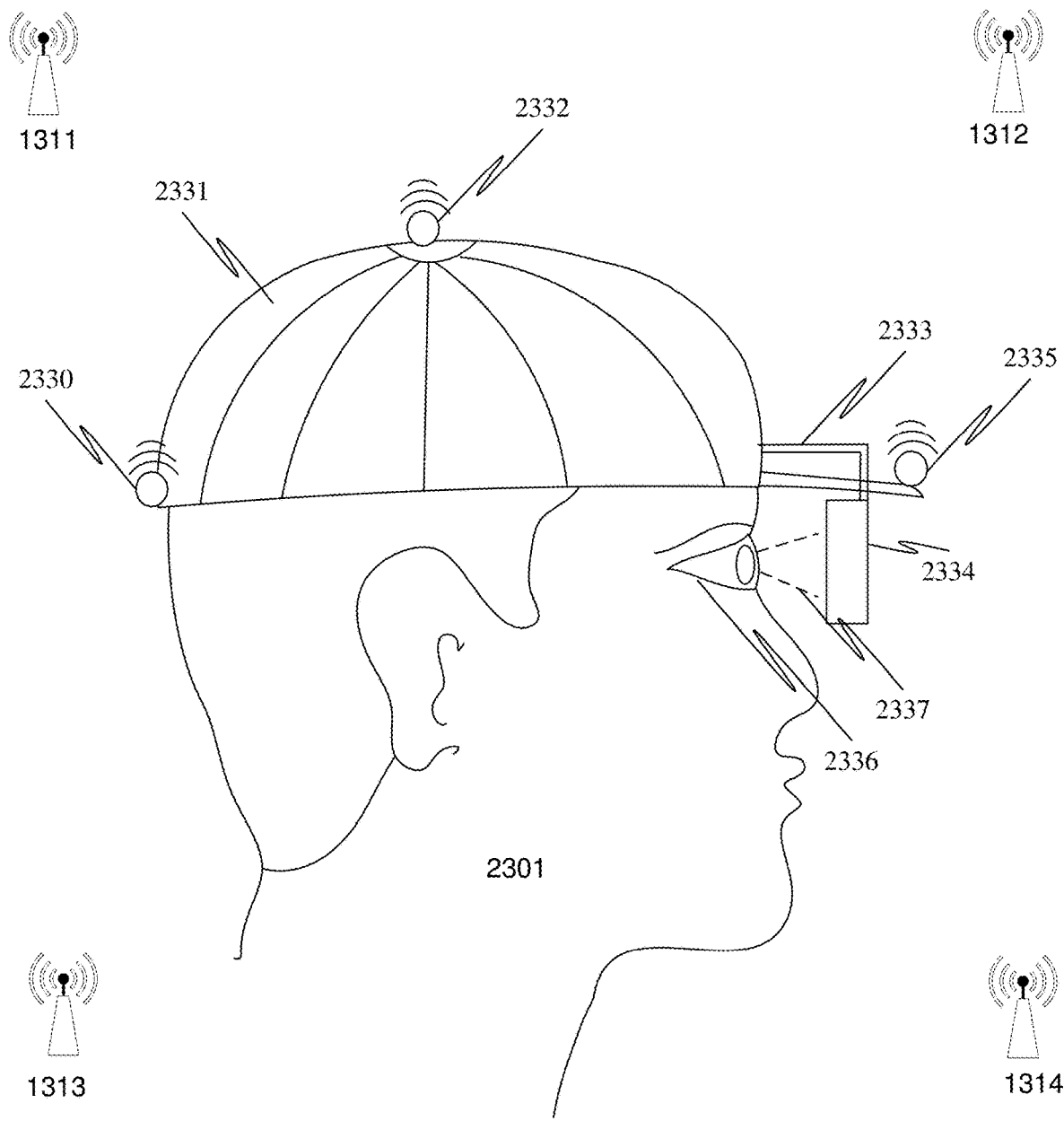
Figure 23C:
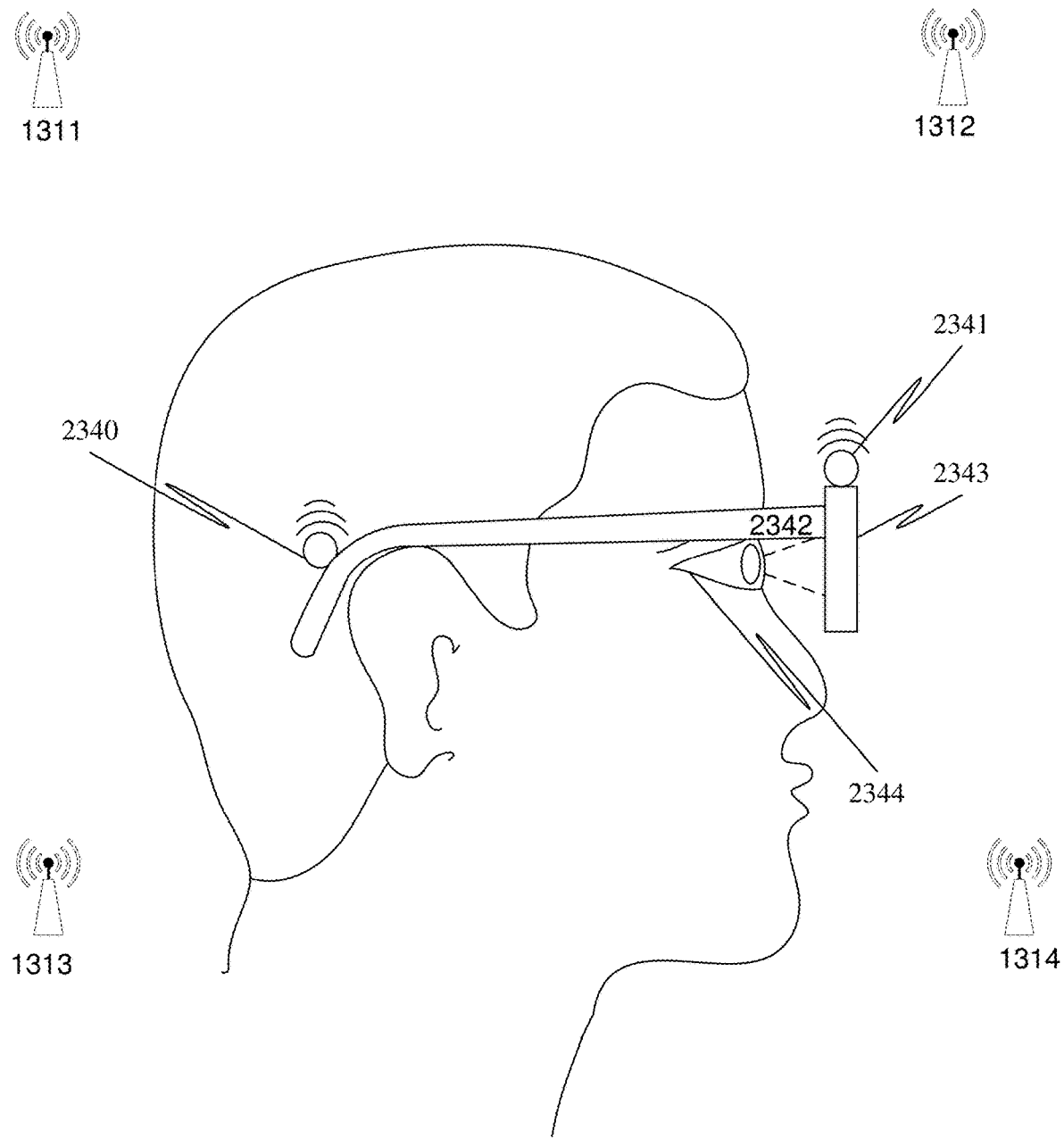

Referring now to FIGS. 23A-23C, aspects of AR Headgear 2314 according to some embodiments of the present invention are shown. In FIG. 23A, a helmet type mount 2314 may be secured or otherwise fitted onto a user 2301. The helmet 2314 includes one or more wireless position devices 2310-2313 fixedly attached to the helmet 2314 or incorporated into the helmet 2314. The wireless position devices 2310-2313 may be made functional in the same manner as wireless position devices 1303-1310 illustrated in FIG. 13 and also interact with Reference Transceivers 1311-1314 in a manner congruent with the discussion of Reference Transceivers 1311-1314. Although four wireless position devices 2310-2313 are illustrated, any suitable number may be included, such as by way of non-limiting example a wireless position device on each side of a helmet, a wireless position device 2310-2313 on a front portion of the helmet 2314 and a wireless position device 2310-2313 on a rear portion of the helmet, and a wireless position device 2310-2313 placed generally about 180 degrees across from each other. Embodiments may include configurations of wireless position devices 2310-2313 in almost any pattern conducive to transmission and reception, accordingly, a circlet of wireless position devices 2310-2313 may be formed into a crown of contiguous wireless position devices 2310-2313, or a mesh of wireless position devices 2310-2313 that covers all or some portion of the helmet are within the scope of the present invention.

In another aspect, each of the wireless position devices 2310-2313 may include an array of wireless transceiver devices. In this manner, the redundancy of multiple transceivers may allow for more reliable and more accurate communication. Transceivers that operate at less than optimum performance, or less than a median of performance may be ignored so that the logical communications remain clean through the transceivers operating at a higher level.

A distance 2320 or 2321 between two wireless position devices 2310-2313 will be sufficient for some modalities of wireless communication (e.g. Ultrawideband, IR, WiFi, GPS, etc.) to allow for respective position calculates to indicate w forward direction 2322 for the helmet, and accordingly, for the user wearing the headgear 2314. Other directions may be determined in a similar fashion.

A controller 2319A may be attached to, or resident within the head gear 2314 essentially enabling the headgear 2314 to function as a smart device or an auxiliary smart device as discussed throughout this specification. A power source 2319B, such as a battery or other storage of potential energy may also be included. The power source may be used to power one or more of the controller 2319A; wireless position devices 2310-2313; a display 2316 or other device included in the headgear 2314.

One or more visual display devices 2316 may be supported via a display support 2315 in a position in front of the user's eye 2317 or otherwise within a field of view 2318 of the user 2301.

One or more image capture devices 2323 may also be fixedly attached to the helmet 2314. In some embodiments, the image capture devices 2323 may be used to capture As Built image data and/or general conditions of a structure. In another aspect, multiple image capture devices 2323 may be used as stereoscopic cameras to determine a distance of the helmet from an object within the field of view of the cameras 2323. Similarly, a laser device 2324, such as a LIDAR device, an infrared device, or other device type may be fixed to or incorporated into the helmet 2314. The laser device 2324 may be functional to determine a distance of the device to a first reflective surface, and/or to scan a surface in front of the helmet 2314. Laser devices pointing in a direction other than forward may also be used with the same functionality in a different direction.

FIGS. 23B and 23C illustrate headgear 2331 and 2340 of types other than a helmet. In FIG. 23B a hat type headgear 2331 may include wireless position devices 2330-2333 at various position on a hat 2331, such as a crown of a hat 2332; a rear portion of a hat 2330 and a brim of a hat 2335. In addition, a display fixture 2333 may support a user viewable display 2334 that is within a field of view 2337 of an eye 2336 of a user 2301.

FIG. 23C illustrates a pair of eyeglasses with additional functionality and components to qualify it as AV Headgear. The eyeglass AV Headgear 2342 may include wireless positional devices 2340-2341 that are fixed to or incorporated into the eyeglass AV Headgear 2342. The wireless positional devices 2340-2341 may be placed in any position convenient, such as, for example, a WPD 2340 on the temple of the eyeglass AV Headgear 2342 or a WPD 2341 on the bridge of the eyeglass AV Headgear 2343 in proximity to an eye 2344.

Figure 24A:
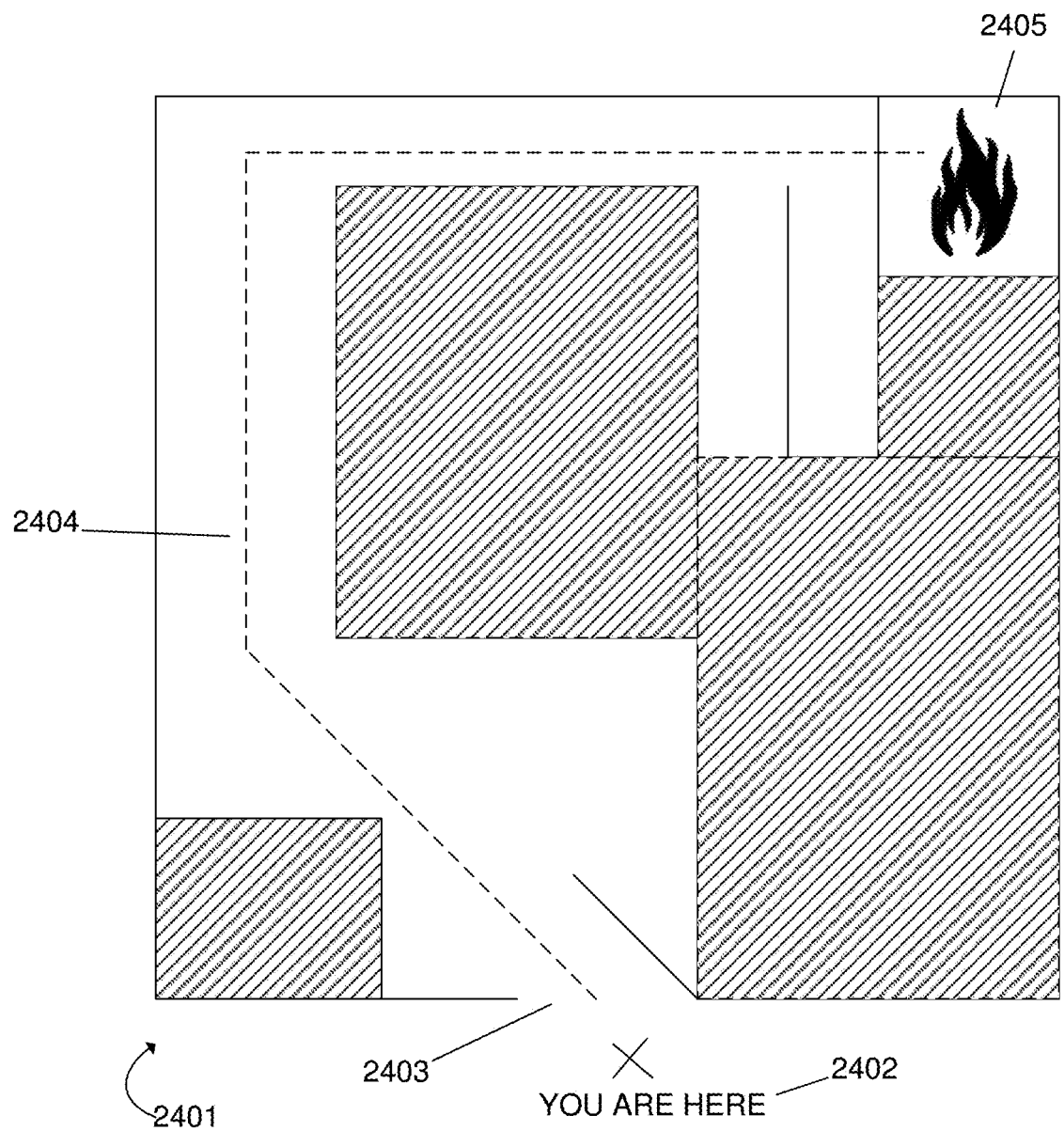
FIG. 24A illustrates an exemplary interior map with directions based upon the AVM.

Referring to FIG. 24A, a sample interior map 2401 is shown. The map 2401 comprises an indicator of a first position of the emergency responder 2402, an entrance 2403, a recommended path 2404, and a second position 2405. The second position 2405 may include an area requiring the emergency response, a problem area to investigate, the location of an object or person to be rescued, or stairs leading to same. The emergency responder's first position 2402 is related to the second position and one or more vectors through the physical Structure from the first position to the second position are established. In some iterations of the present invention, the vector may be established by relating characteristics of the emergency responder to the suitability of the emergency, and the conditions present in the Structure. Conditions within the Structure are monitored by a Structure-wide building vital statistics monitoring apparatus which may produce readings of, by way of non-limiting example, one or more of: carbon monoxide monitoring; IR sensor monitoring; air quality monitoring; and the like. Accordingly, an appropriate vector for an emergency responder may be established. The established vector between the first position and the second position is relayed to the emergency responder via a user interface and the emergency responder's progress along the vector is monitored according to monitoring protocols.

Figure 24B:
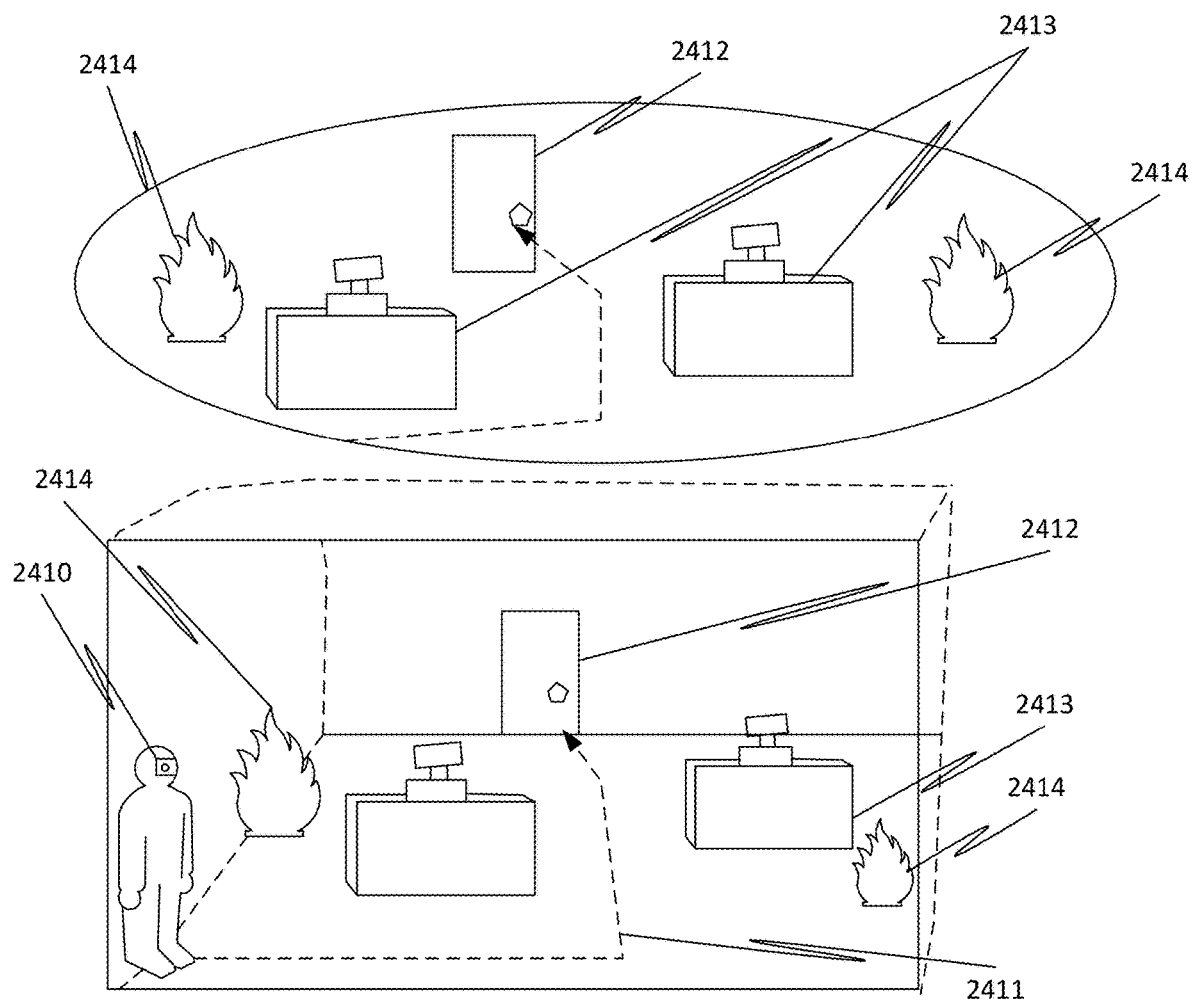
FIG. 24B illustrates an exemplary embodiment of heads-up display for an emergency responder.

Referring to FIG. 24B, a depiction of Augmented Reality HUD 2410 application of the present invention is displayed. An emergency responder may access the AVM data of the subject Structure and the orienteering function of the AVM is engaged. The orienteering function of the AVM relays a pathway 2411 via waypoint 2412 from the emergency responder's first position to a second position. The orienteering function directs the emergency responder on a pathway 2411 through a subject Structure around As Built emplaced elements 2413 or emergency-related obstacles 2414, which may impede a more direct route to a waypoint 2412 during an emergency.

In preferred embodiments of the present invention, wearable augmented reality HUD technologies 2410 are utilized. The pathway 2411 to an emergency responder's waypoint 2412 while responding to an emergency is displayed via augmented reality overlay through the subject Structure making use of As Built AVM data to direct an emergency responder around emplaced objects 2413 or emergency obstacles 2414 otherwise obstructing a given user's pathway 2411 to a waypoint 2412.

A user may be located within a structure and may wear an augmented reality headgear. The user may establish an orientation for his view plane in numerous manners and then view information, imagery stored data and the like related to that view plane.

Figure 25A:
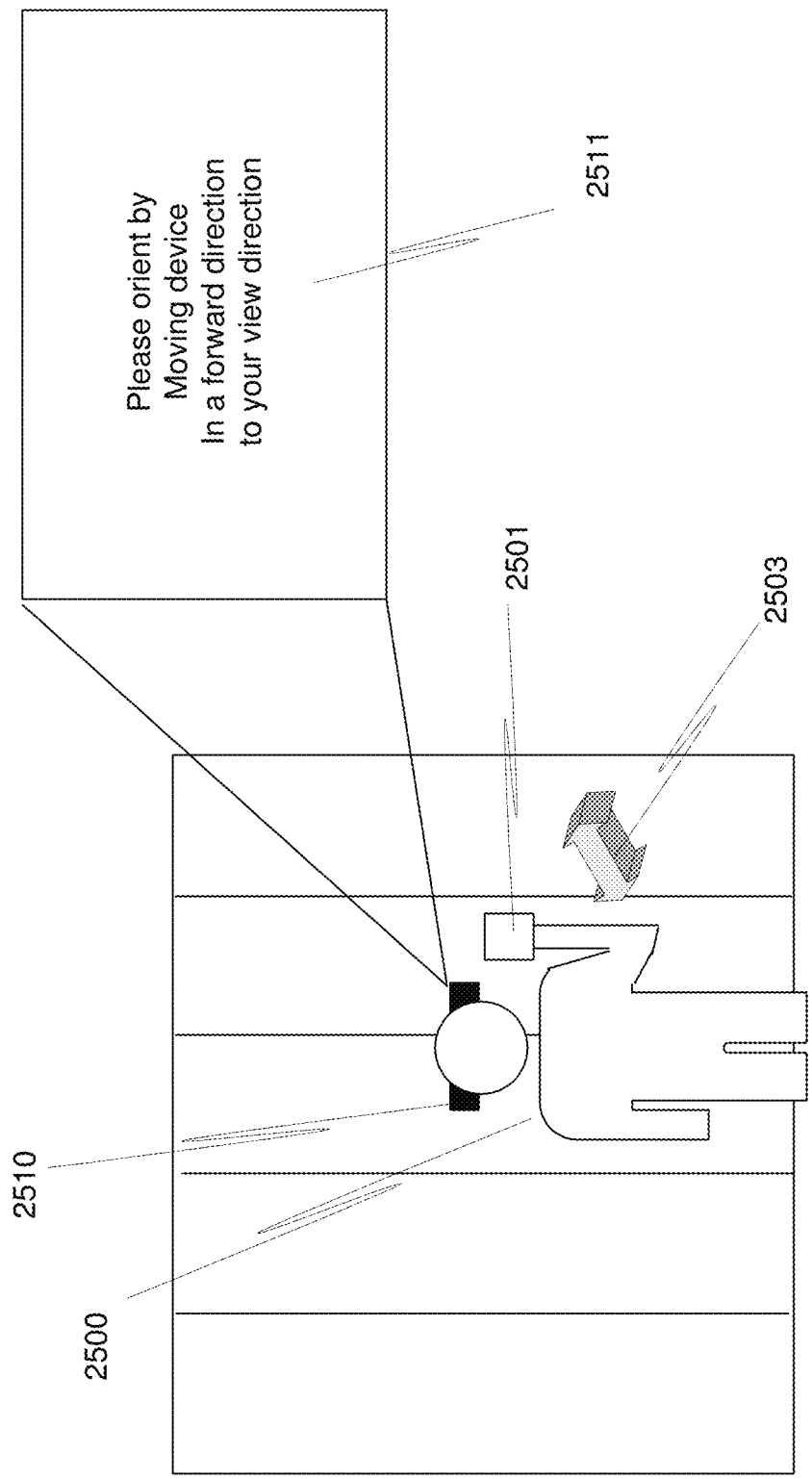
FIG. 25A illustrates use of an AV Headgear in concert with a designation of direction.

Referring now to FIG. 25A, an illustration of a user 2500 employing an augmented reality headgear 2510 in concert with a designation of direction 2503 is provided. The means of establishing a direction and orienting spatially may be used. For example, mobile device 2501 may be moved in the direction of the view plane which will correspond to the oriented direction 2503. The mobile device may include GPS and/or cellular-based location schemes to extrapolate the direction from location information. In some examples, the user 2500 may be requested to orient the system by displaying a message 2511 to the user via the augmented reality headgear 2510.

Once the user has oriented his system, he may interact with database servers to access and create database records of various types including imagery. Referring to FIG. 25B, an illustration of a user 2500 employing an oriented Headgear 2510 in a use mode is provided. In some examples, the orientation may be conducted with a smart device 2501. In the augmented reality headgear various types of data may be presented include a textual interface 2520 of command options and information. Additionally, a demonstration of imagery being collected by smart device 2501 of the environment may be displayed as image 2521.

Figure 25C:
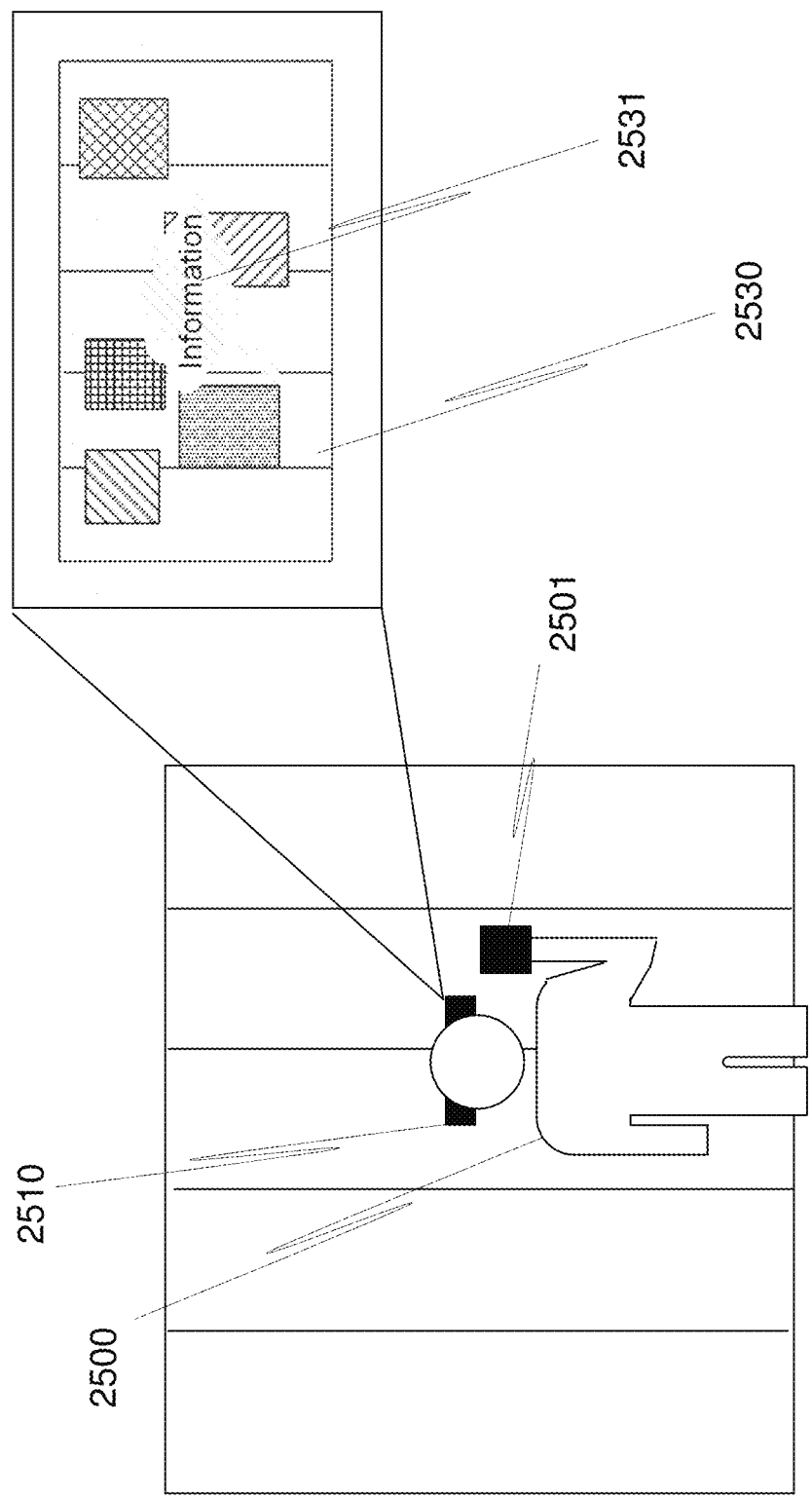
FIG. 25C illustrates an oriented Headgear in a use mode displaying stored information.

Referring to FIG. 25C, aspects of information display are illustrated. The figure illustrates a user 2500 wearing an oriented augmented reality headgear 2510 and holding a smart device 2501. In an example, the figure illustrates displaying stored information about the Structure/environment in which the user 2500 is oriented. In an example, an image 2530 displaying a wall structure and embedded facilities and other such structures is provided. The display may also include other types of data presented such as textual information 2531.

Figure 25D:
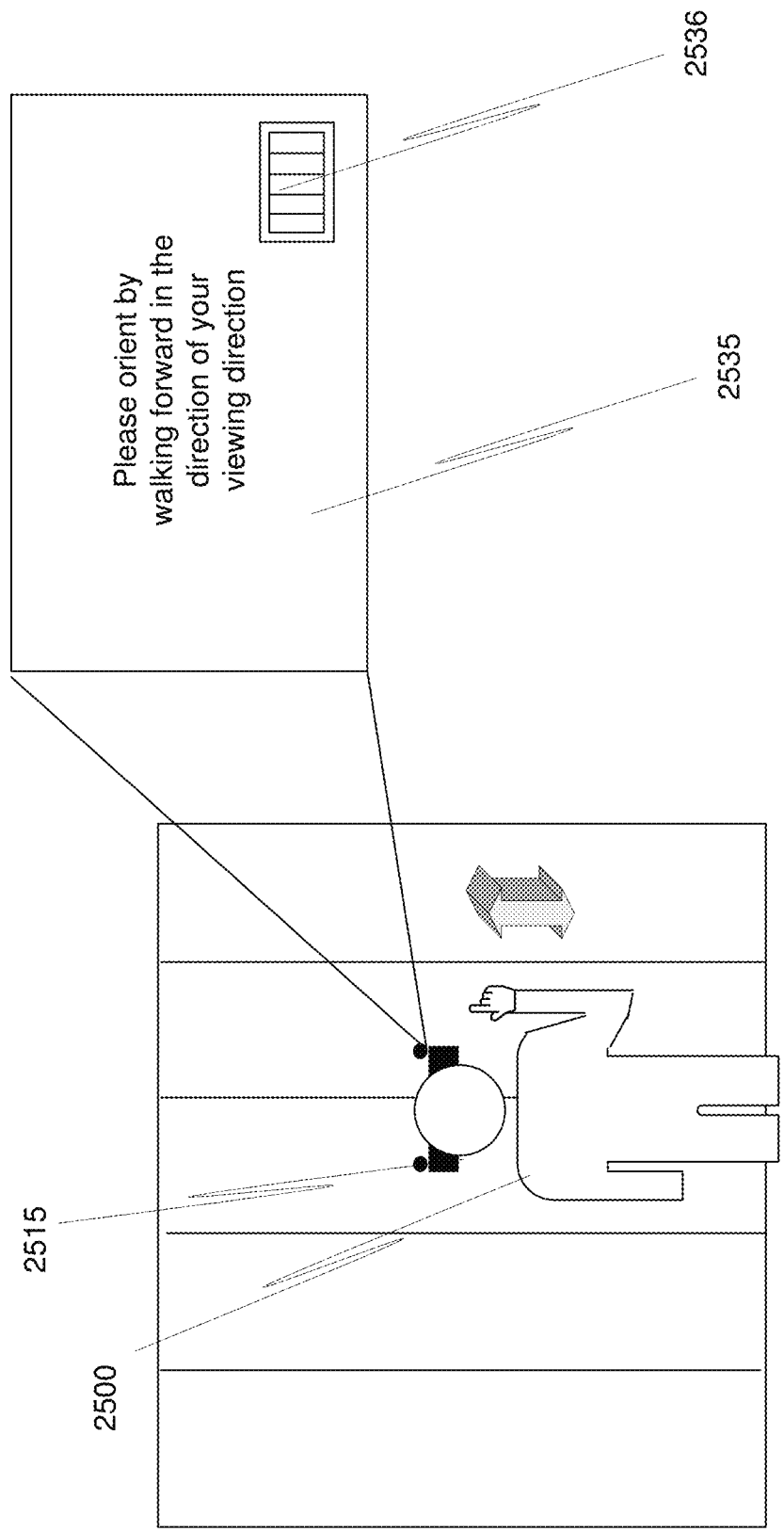
FIG. 25D illustrates a Headgear equipped with location viewing stereoscopic cameras in an interactive use mode to establish orientation by moving in an orienteering direction.

In some examples, an augmented reality headgear may also include camera systems of various kinds to record the view plane of the user. In some examples, a stereoscopic camera system may be incorporated into the augmented reality headgear. Referring to FIG. 25D, a Headgear equipped with location viewing stereoscopic cameras 2515 is utilized by a user 2500 in an interactive use mode. In the example, the user 2500 may establish orientation by moving in an orienteering direction. In some examples, the augmented reality headgear may include GPS or cellular communication devices which may be able to sense the direction of movement and orient the system. In the augmented reality headgear, textual instructions 2535 may be provided to the user 2500. An inset 2536 may provide a view of the current imagery observed by the stereoscopic cameras 2515.

Figure 25E:
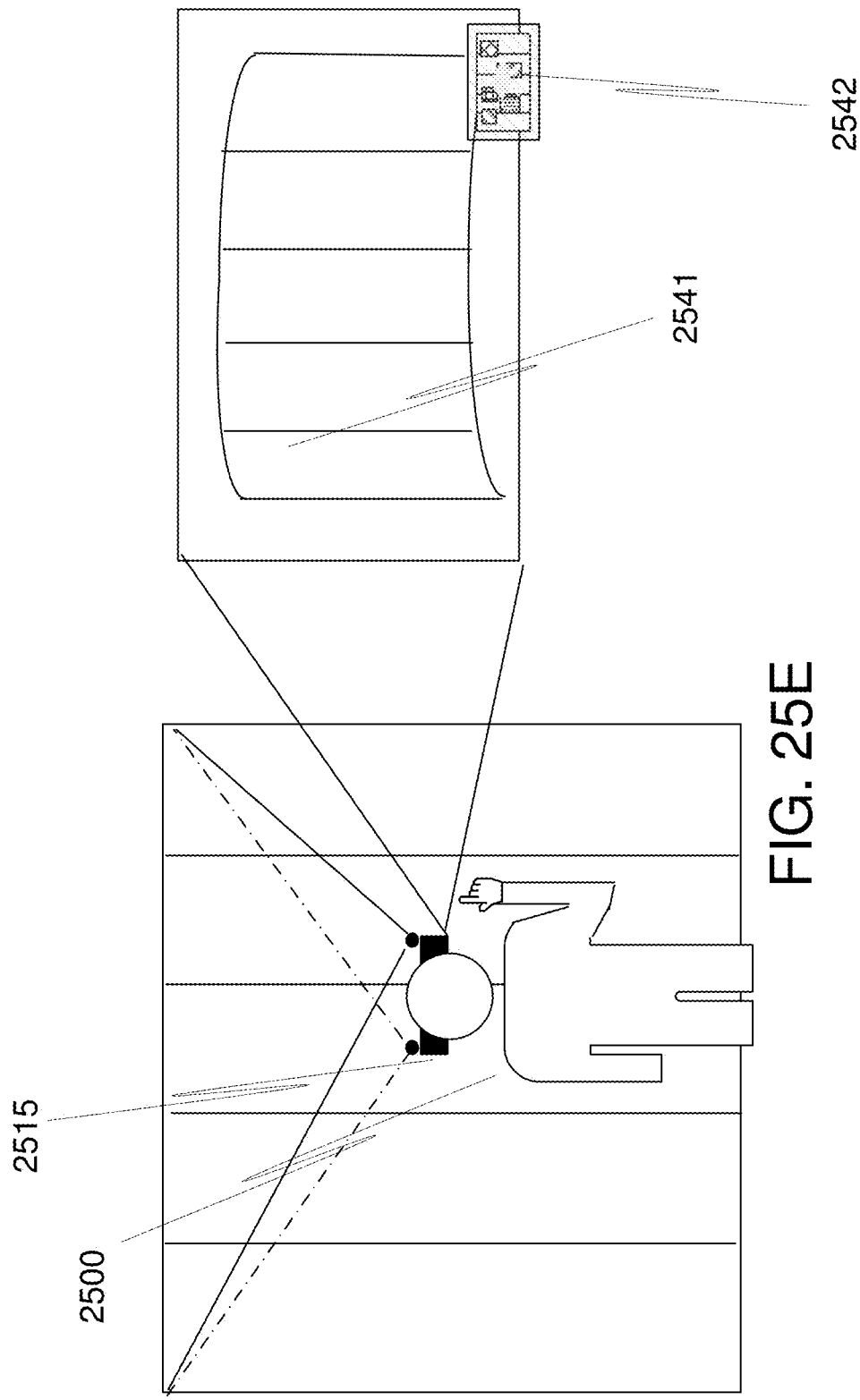
FIG. 25E illustrates a Headgear equipped with location viewing stereoscopic cameras in a stereographic imaging mode with a stereoscopic display.

Referring to FIG. 25E, an illustration of a user 2500 utilizing an oriented stereoscopic camera system 2515 to observe the oriented user view plane is shown. In an example, the augmented reality headgear may display a stereoscopic rendering of the imagery 2541 utilizing such function of the augmented reality headgear. In the illustration, an inset 2542 may include a display of historical data of the view plane such as embedded structure and the like.

Figure 25F:
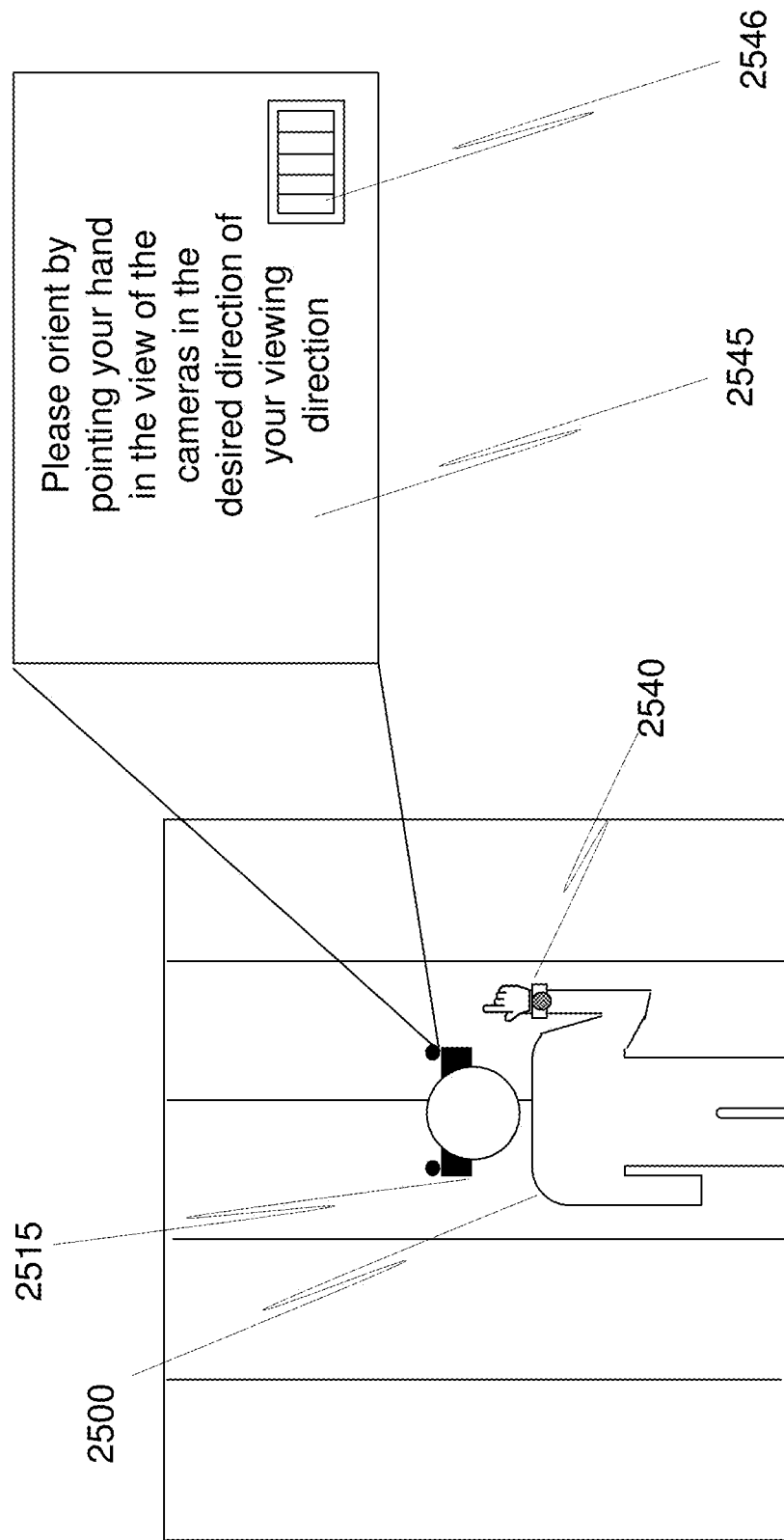
FIG. 25F illustrates a Headgear equipped with location viewing stereoscopic cameras in an interactive use mode to establish orientation by pointing in an orienteering direction while wearing a GPS-equipped device.

FIG. 25F illustrates a Headgear equipped with location viewing stereoscopic cameras 2515 in an interactive use mode to establish orientation by pointing in an orienteering direction while wearing a GPS-equipped device 2540. In some examples, a wearable GPS device 2540 may be a smart watch. In other examples, any device that can provide a location reference may be utilized. The device 2540 may use near field communication or other wireless protocols to communicate with reception elements that may be located in the stereoscopic camera system to triangulate a location relative to the Headgear to provide orientation information. As in previous examples, the augmented reality headgear may provide textual information 2545 to the user 2500 and may provide simultaneous display of other information such as the camera view in an inset 2546.

Figure 25G:
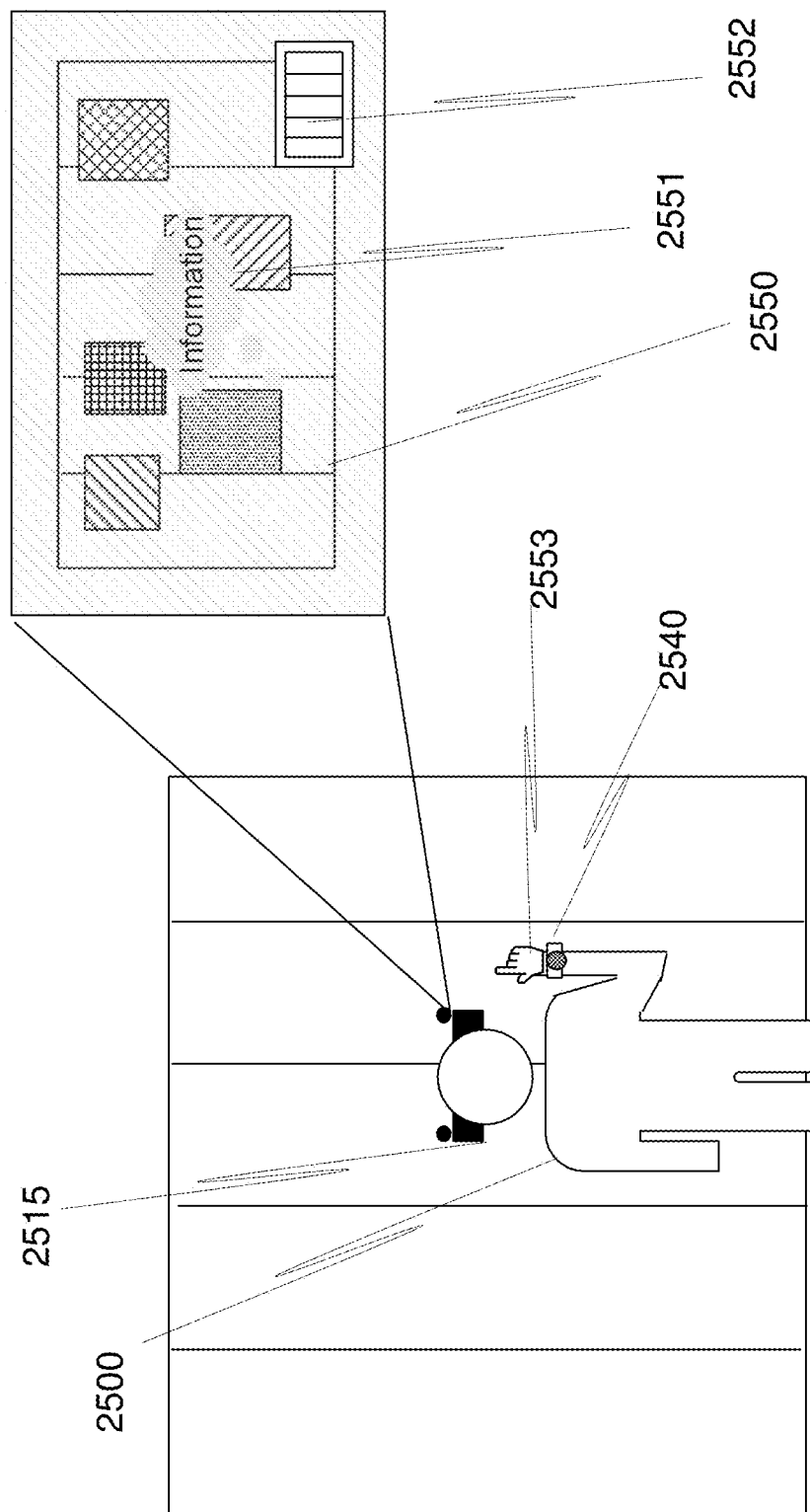
FIG. 25G illustrates a Headgear equipped with location viewing stereoscopic cameras in an operational mode displaying historic information with current view inset.

FIG. 25G illustrates a Headgear equipped with location viewing stereoscopic cameras 2515 in an operational mode displaying historic information with current view inset. In some examples, a device 2540 capable of providing location information may be worn by the user 2500. The virtual reality display may show a superposition of the view of the camera system 2550 with previous information 2551 and historic views of embedded structure, facilities and the like. Other information may be displayed in split screen or inset display 2552. In some examples, the user may utilize the location sensing aspects of device 2540 to allow the user to point to a virtual location displayed in his augmented reality headgear. In some examples, sensors, haptic feedback elements and the like may be additionally worn by a user such as in glove sensor 2553 which may provide feedback to and from the user. The glove may sense aspects such as flexing motion that may occur, such as in a grabbing motion as a non-limiting example, such as movements of fingers and the like. As well, the user 2500 may feel physical feedback from the haptic feedback elements to convey various aspects of the model in the virtual reality display.

Figure 25H:
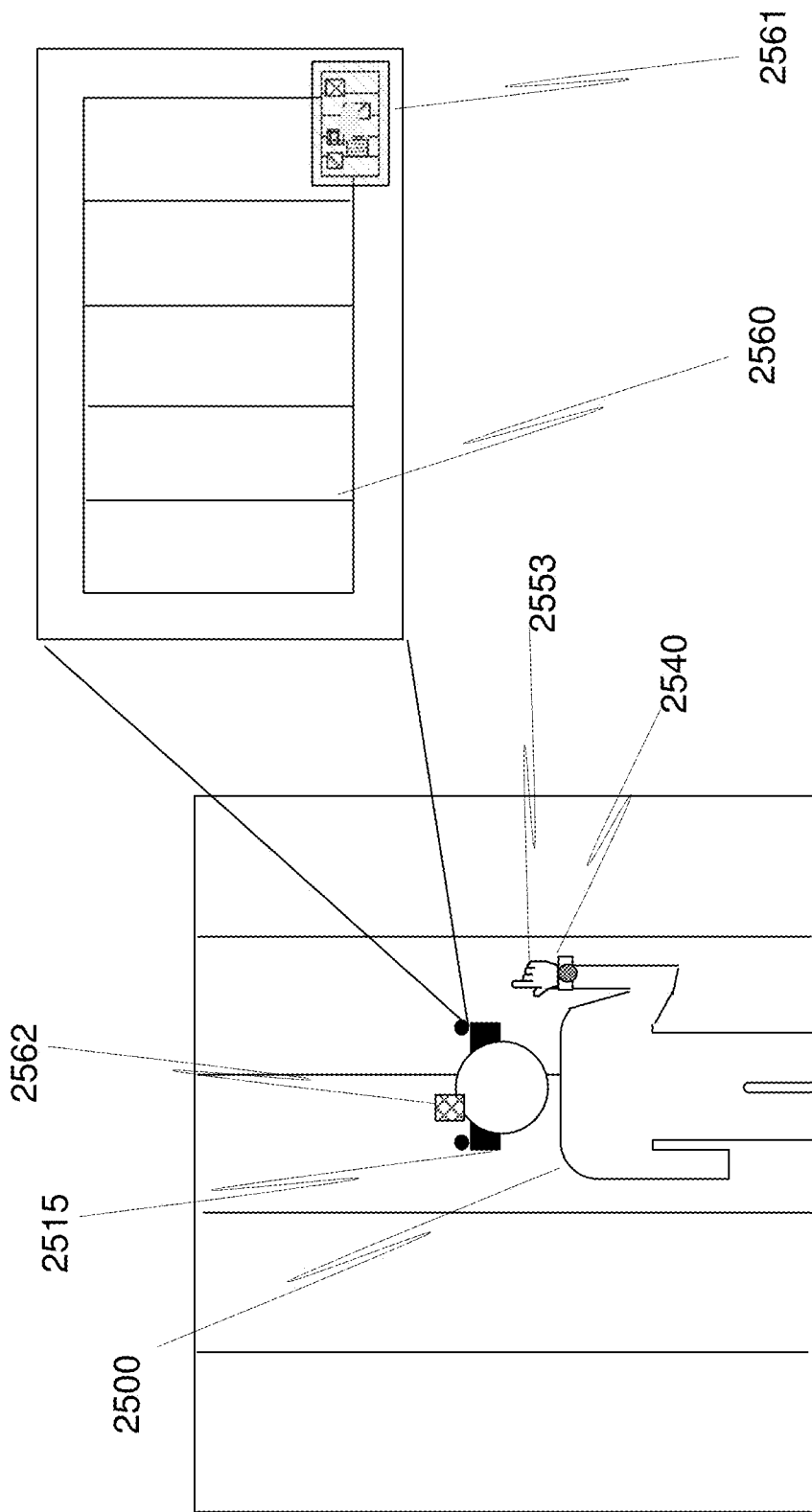
FIG. 25H illustrates an oriented Headgear equipped with location viewing stereoscopic cameras acquiring current picture data of a viewing direction with historic view inset.

An important aspect of maintaining models of Structures and environments, as has been disclosed herein, may be to provide routine updates to imagery and three-dimensional scanning of the location. In FIG. 25H, an example illustrates an oriented Headgear equipped with location viewing stereoscopic cameras 2515 used by a user 2500 in acquiring current picture data 2560 of a viewing direction. In some examples, the augmented reality headgear may also include a three-dimensional scanning system 2562 that may record a three-dimension model of the surfaces in the view plane. An inset 2561 may present additional data or views. In some examples, the user may utilize the location sensing aspects of device 2540 to allow the user to point to a virtual location displayed in his augmented reality headgear. In some examples, sensors, haptic feedback elements and the like may be additionally worn by a user such as in glove sensor 2553 which may provide feedback to and from the user. The glove may sense aspects such as flexing motion that may occur, such as in a grabbing motion as a non-limiting example, such as movements of fingers and the like. As well, the user 2500 may feel physical feedback from the haptic feedback elements to convey various aspects of the model in the virtual reality display.

Figure 25I:
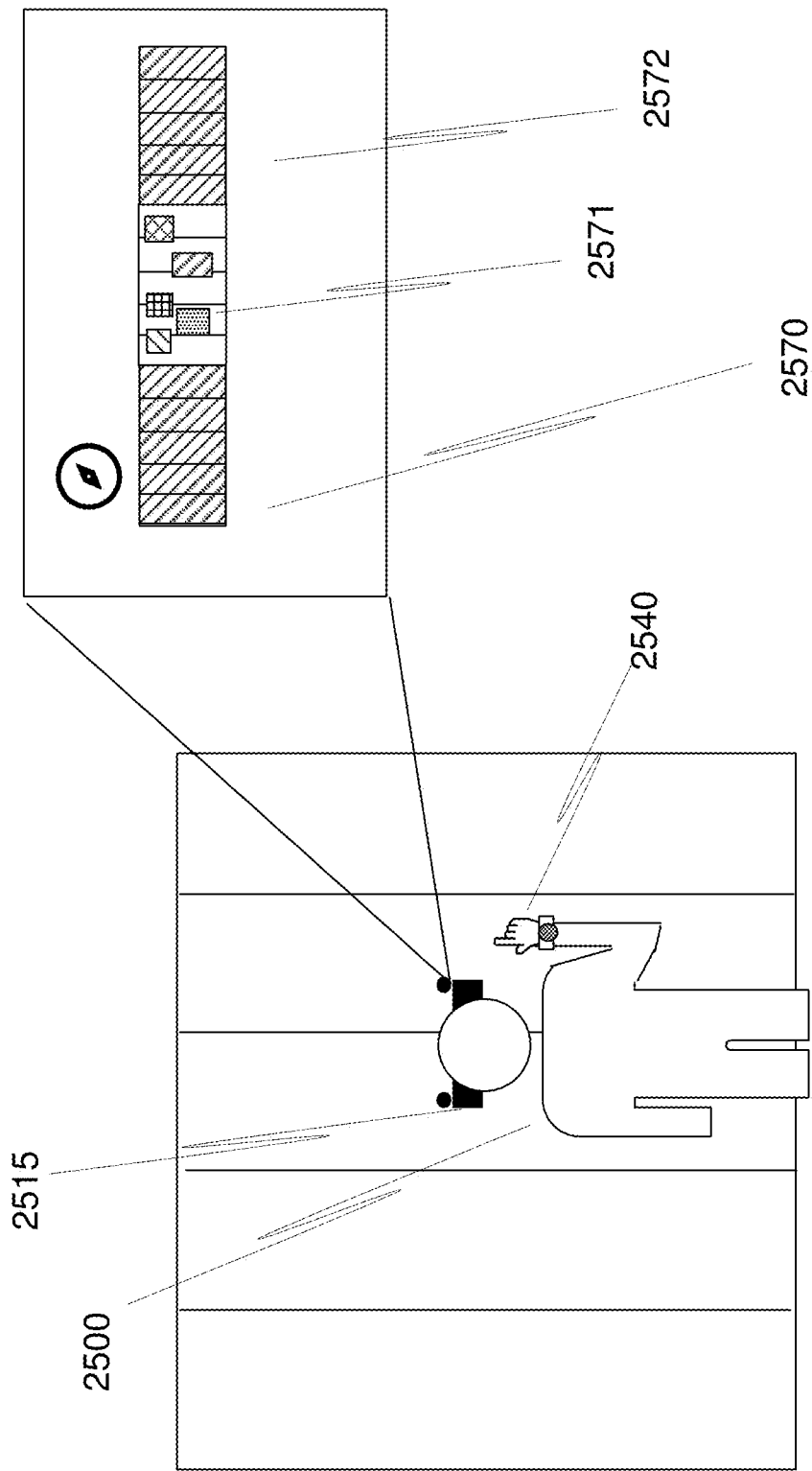
FIG. 25I illustrates a Headgear equipped with location viewing stereoscopic cameras in an interactive use mode to record panoramic picture data to update the status record.

In some examples, the updating of location imagery may be supported by displaying information in the augmented reality headgear with an indicator of the updated information in a panoramic depiction. In some examples, shading, coloring, or blinking may be used to depict imagery that still has to be updated. Referring to FIG. 25I, an illustration of a Headgear equipped with location viewing stereoscopic cameras 2515 is utilized by a user 2500 in an interactive use mode to record panoramic picture data 2570 to update the status record. As the user records current imagery, the display may show the new unshaded imagery 2571 as distinct from previously recorded regions of the environment 2572 that need to have new imagery recorded. In some examples, the user may utilize the location sensing aspects of device 2540 to allow the user to point to a virtual location displayed in his augmented reality headgear. As well, the user 2500 may feel physical feedback from the haptic feedback elements to convey various aspects of the model in the virtual reality display.

Figure 25J:
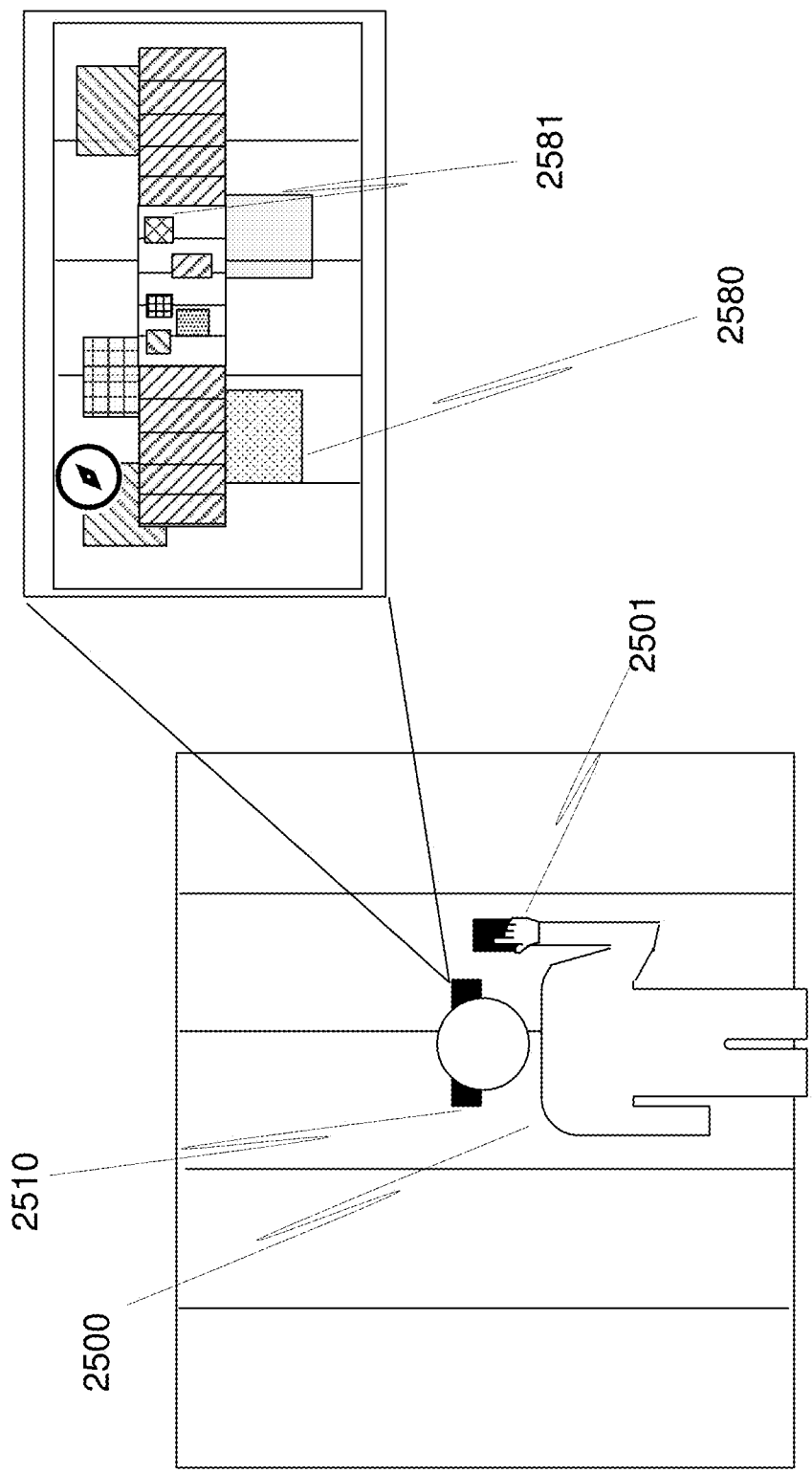
FIG. 25J illustrates a Headgear equipped with a handheld camera in an interactive use mode to record panoramic picture data.

There may be numerous manners to record new imagery and three-dimensional structural data such as cameras, image detectors in smart devices, three-dimensional scanning devices and the line. FIG. 25J shows an illustration of a user 2500 wearing a virtual reality display 2510, and is illustrated updating current status capture images 2581 in panoramic picture data 2580 with a smart device 2501 handheld camera in an interactive use mode to record panoramic picture data.

Figure 26A:
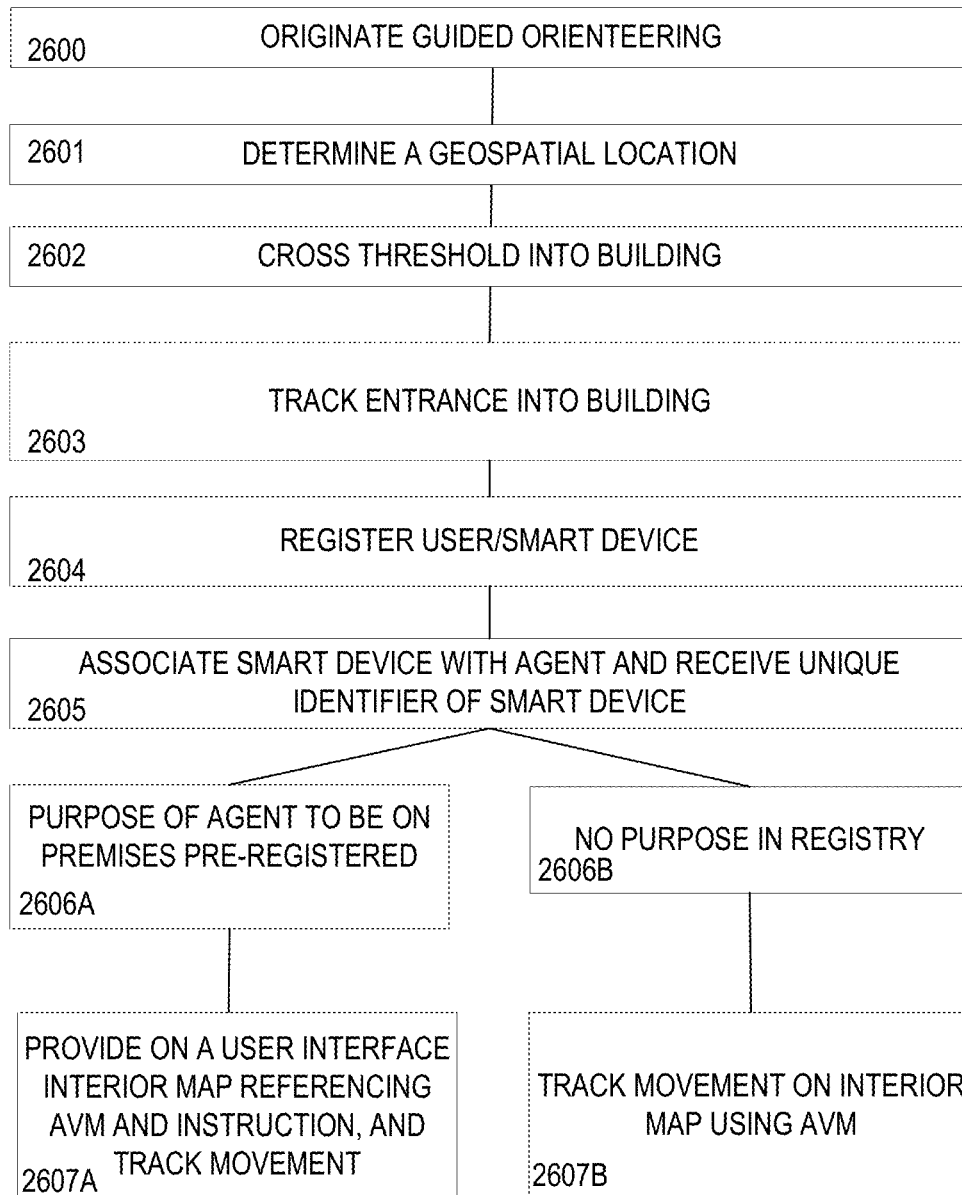
FIGS. 26A-B illustrate an exemplary embodiment of method steps.

Referring now to FIG. 26A, method steps for Guided Orienteering conducted by an Agent at a structure based on wireless communication wherein a purpose of a Guided Orienteering is known are illustrated.

At method step 2600, a Guided Orienteering within a given Structure with a corresponding AVM is originated. Origination of a Guided Orienteering may be achieved by a variety of means including, by way of non-limiting example, one or more of: automated notification of changes in the physical state of a structure as recorded by a Structure Vital Conditions Monitoring system, as disclosed in U.S. patent application Ser. No. 16/165,517; smart contract and blockchain features designed to initiate Guided Orienteerings upon the achievement of pre-registered logical make/break points; audio communication, text message; email communication; and the like.

At method step 2601, a geospatial location of an Agent is determined. This may be done by any of the well-known methods of coarse geo spatial location, such as triangulation involving GPS, Bluetooth, WiFi, UWB, ultrasonic and/or cellular communications.

At method step 2602, upon crossing a threshold into the Structure or property housing the Structure, an Agent's arrival at the subject structure or property housing the structure is registered with the AVM of the structure or property housing the structure. An Agent's arrival at a subject structure may be achieved by one or more of, by way of non-limiting example, one or more of: geopositioning systems; in-ground radio frequency monitors; magnetic locking doors triggering make/break signals; IR sensors; camera recognition; RFID/Barcode/UUID scanning; optical monitoring or physical interaction with the subject structure.

At method step 2603, a smart device supported by an Agent comprises an accelerometer, which assists in tracking movement of the Agent throughout the building. The accelerometer can assist in tracking movement by, for example, supplying acceleration data which can be converted into position data using known methods of numerical integration. In this way, the accelerometer can serve as a backup location finder to the WiFi triangulation discussed in considerable detail above.

At method step 2604, the smart device supported by an Agent is registered with the AVM of the Structure. Smart devices supported by Agents and Agents themselves may be selected for registration according to a number of factors including, by means of non-limiting example, one or more of: relative proximity to a given Guided Orienteering's point of origin; expertise or suitability relative to a purpose of a given Guided Orienteering session; availability to partake in the Guided Orienteering; cost of deployment; and the like. At step 2605, the smart device is associated with a specific Agent and a unique identifier associated with the smart device is received.

At step 2606A-B, the Agent's purpose during the Guided Orienteering may be registered with the AVM of the subject structure. Registration of the Agent's arrival at the subject structure may automatically cause the Agent's purpose on the Guided Orienteering to be registered by the structure's AVM.

In some embodiments, at step 2606A, a purpose of the Agent is pre-registered in a system. Upon verification that the Agent has a purpose, at step 2607A, an interior map and instruction may be provided with reference to the AVM. In some embodiments, a user interface is generated for the Agent on the Guided Orienteering.

By way of non-limiting example, a user interface may be one or more of: a smart device application, a virtual reality headset, an augmented reality apparatus, a remote control interface for an unmanned vehicle, etc. In some embodiments, a user interface will relay information from the AVM relative to the Agent's position within the structure on a given Guided Orienteering to the Agent in real or near real time. In some embodiments, a virtual representation of a physical apparatus or area of interest within the subject structure corresponding to the origin of the Guided Orienteering as stored in the AVM may be designated the second position and relayed to the Agent via the user interface.

Figure 27A:
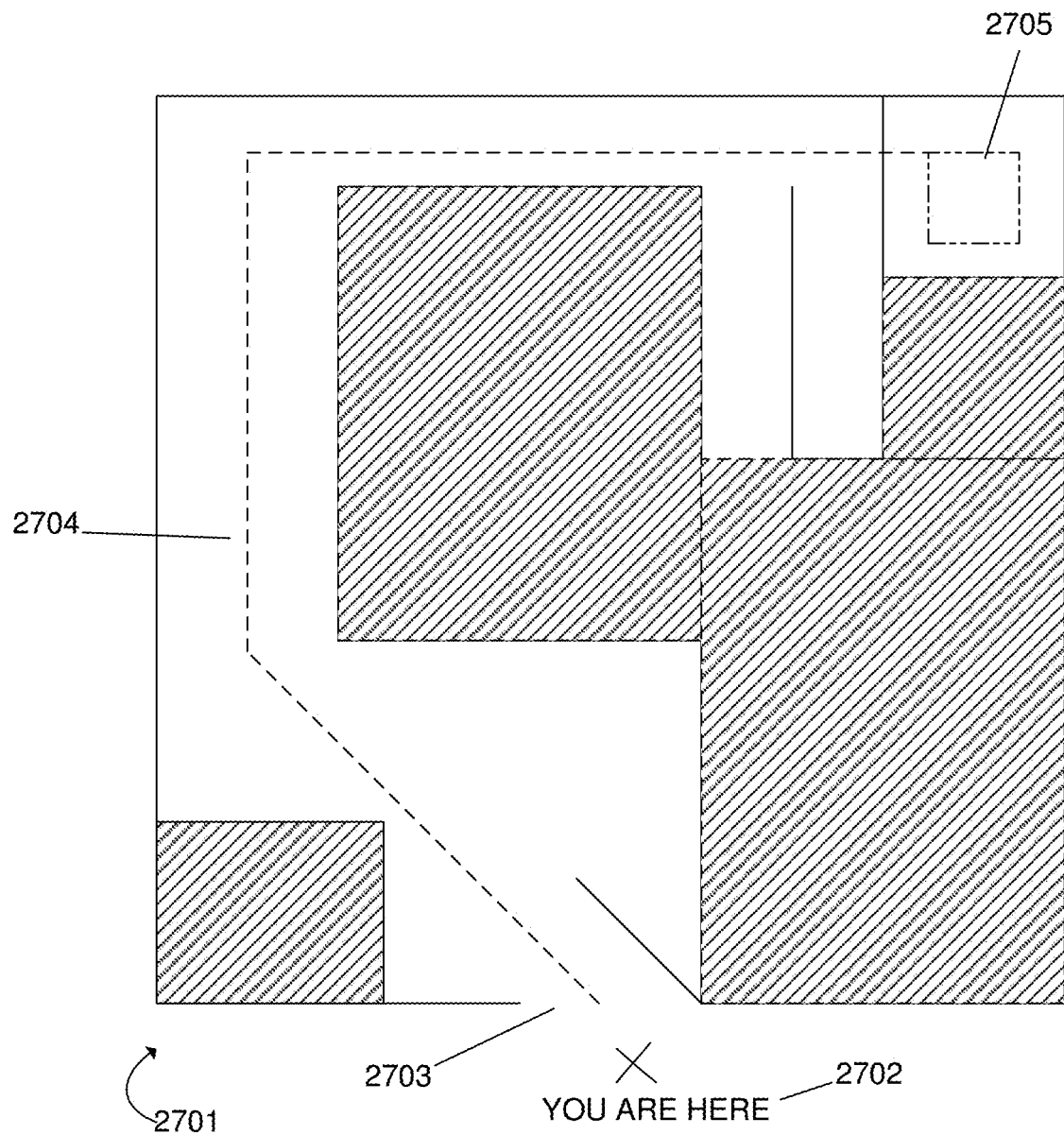
FIG. 27A illustrates an exemplary interior map with directions based upon the AVM.

Referring to FIG. 27A, a sample interior map 2701 is shown. The map 2701 comprises an indicator of a first position of the Agent 2702, an entrance 2703, a recommended path 2704, and a second position 2705. The second position 2705 may include a specific apparatus to be worked on, a problem area to investigate, or stairs leading to same. The Agent's first position 2702 is related to the second position and one or more vectors through the physical structure from the first position to the second position is established. In some iterations of the present invention, the vector may be established by relating characteristics of the Agent to the suitability of the Guided Orienteering, and the conditions present in the structure. Conditions within the structure are monitored by a structure-wide building vital statistics monitoring apparatus which may produce readings of, by way of non-limiting example, one or more of: Carbon Monoxide monitoring; IR sensor monitoring; air quality monitoring; and the like. Accordingly, an appropriate vector for a given Agent may be established. The established vector between the first position and the second position is relayed to the Agent via a user interface and the Agent's progress along the vector is monitored according to monitoring protocols.

Figure 27B:
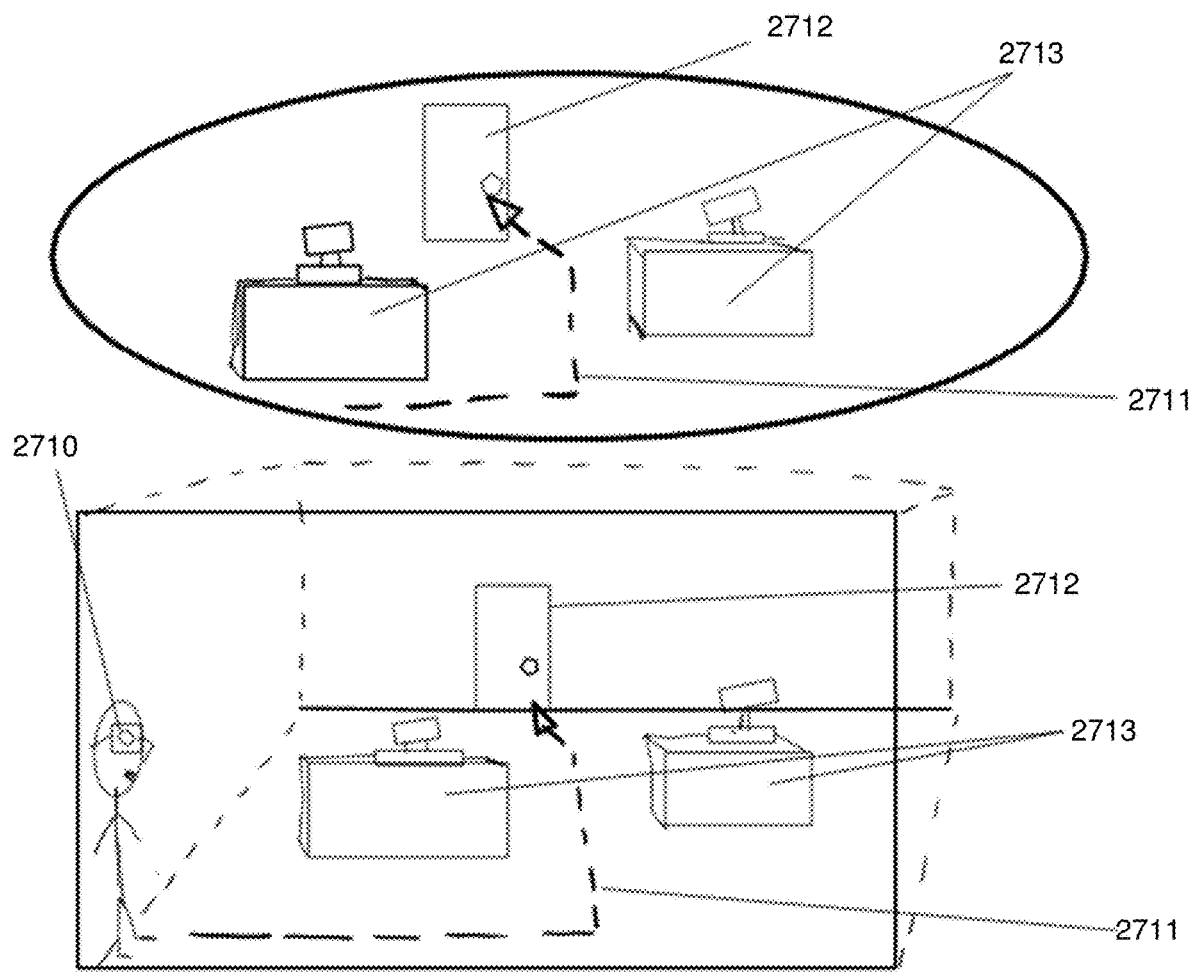
FIG. 27B illustrates an exemplary embodiment of heads-up display for a service technician.

Referring now to FIG. 27B, a depiction of Augmented Reality HUD 2710 application of the present invention is displayed. An Agent on a Guided Orienteering accesses the AVM data of the subject structure and the orienteering function of the AVM is engaged. The orienteering function of the AVM on the Guided Orienteering relays a pathway 2711 via waypoint 2712 from the Agent's first position to a second position. The orienteering function directs the Agent on a pathway 2711 through a subject structure around as built emplaced elements 2713 which may impede a more direct route to a waypoint 2712 along a Guided Orienteering.

In preferred embodiment of the present invention, wearable augmented reality HUD technologies 2710 are utilized. The pathway 2711 to an Agent's waypoint 2712 in progress of a Guided Orienteering is displayed via augmented reality overlay through the subject structure making use of as built AVM data to direct a given user around emplaced objects 2713 otherwise obstructing a given user's pathway 2711 to a waypoint 2712 on a Guided Orienteering.

Referring again to FIG. 26A, in other embodiments, at step 2606B, there may be no registered purpose for the Agent. In that case, at step 2607B, the Agent's position may be tracked on an interior map of the Structure with reference to the AVM. This may allow, for example, security officers associated with the Structure to track a potential unidentified person, or may allow a person associated with a Structure to convey appropriate instructions to the Agent.

By way of non-limiting example, a given Agent's position may be ascertained and recorded by one or more of: relating the Agent's position to that of three or more wireless Transceivers affixed within the structure at known reference positions corresponding to virtual positions within the AVM; IR sensor readings; GPS; cell signal triangulation; trilateration and multi-lateration using emplaced sensors, which may use one or more of WiFi protocol, Bluetooth, etc.; accelerometers and/or magnetometers onboard a smart device or the Agent; optical sensors and the like.

Figure 26B:
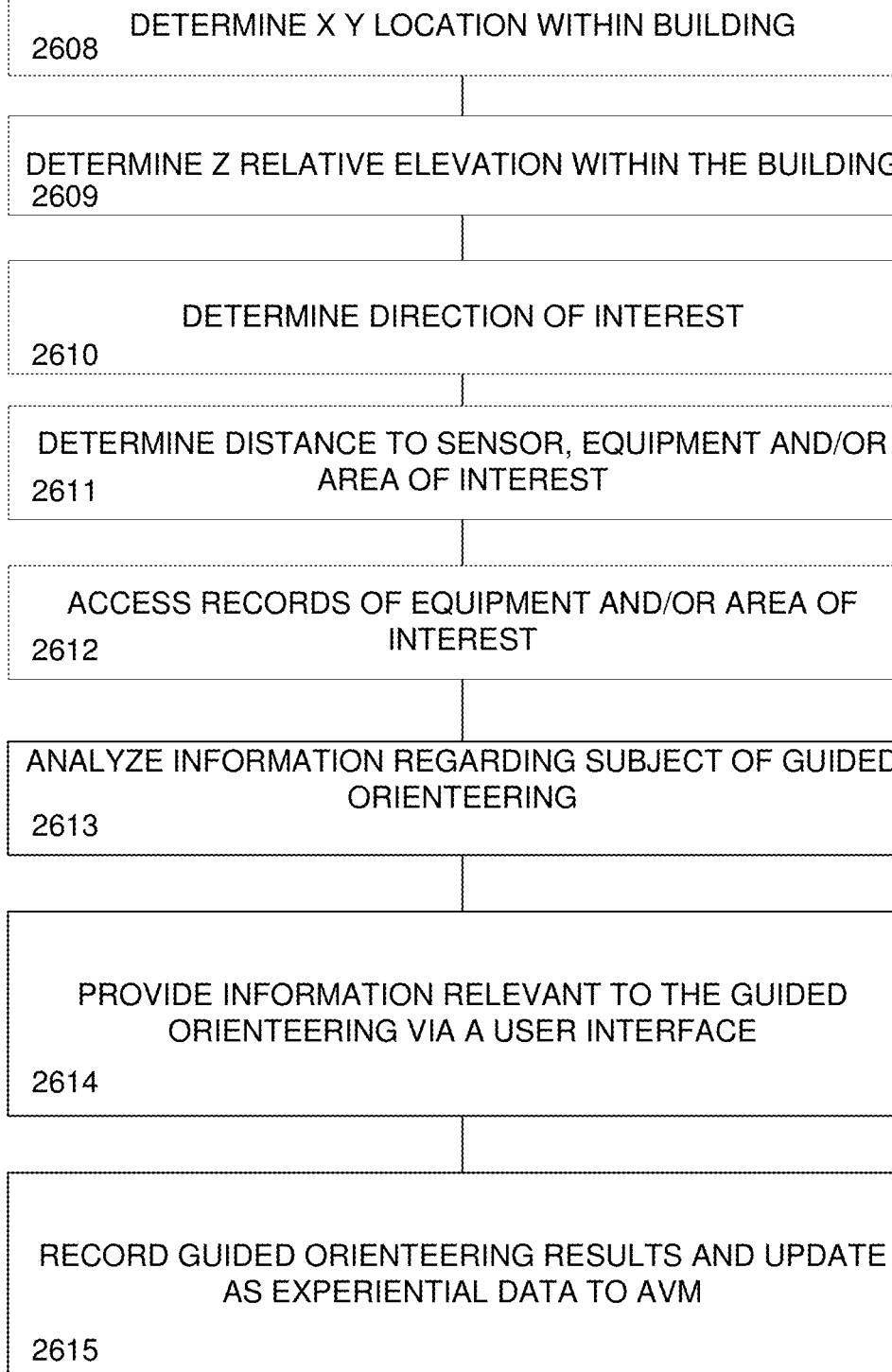

Referring now to FIG. 26B, additional method steps for a Guided Orienteering conducted by an Agent at a structure based on orienteering wherein the purpose of a Guided Orienteering is known are illustrated. At steps 2608 and 2609, a location of the Agent is determined. In the exemplary embodiments shown at steps 2608 and 2609, Cartesian coordinates are used; however, as discussed above, in some embodiments, it may be desirable to use other coordinate systems, such as spherical or cylindrical coordinates. At exemplary steps 2608 and 2609, the Agent's position is determined with reference to Cartesian coordinates, as discussed in considerable detail above. As discussed herein, positional coordinates may be based upon triangulation between the Agent's smart device and two, three, or more transceivers generating wireless transmissions from reference points with which the smart device is in wireless communication. A physical position of the smart device may also be determined based upon wireless communication of the smart device with two or more of the wireless transceivers at the reference positions. As discussed herein the physical position may include an X coordinate and a Y coordinate on an X, Y plane and an elevation based upon a Z coordinate relative to a ground plane or other designated plane of origin.

At step 2610, a direction of interest from the second position is designated and correlated to the AVM. By way of non-limiting example, a direction of interest may be designated by one or more of: change in position of a smart device as determined with relation to a plurality of affixed transceivers; designation of direction of interest via smart device application; laser target designation; and the like. Additional methods of determining a direction of interest are described in more detail above.

At step 2611, a distance to an area of interest is determined. In exemplary embodiments, the Agent's location is known by virtue of steps 2608-09. This location can be combined with the direction of interest determined at step 2610 to create a ray in the AVM with an origin at the Agent's smart device and extending infinitely in the direction of interest. Any sensor, structure aspect, device and/or equipment registered on the AVM as being along that ray (or within a tolerance; for example, this may include a feature within ten degrees of the ray) may be displayed on the Agent's smart device. In some embodiments, the Agent may then choose a desired feature, aspect, device, equipment or area of interest.

At step 2612, records of structure features, devices, equipment and/or area of interest may be displayed on the Agent's smart device. Records may include, without limitation, annotations from a previous visit, visitation log, product manuals, warranties, maintenance histories, date of installation, experiential data regarding the equipment and/or area of interest, instructional information regarding the repair/use of a given feature, or any other potentially useful information.

At step 2613, symptomatic information regarding the subject of the Guided Orienteering is analyzed. This may include data gathered from one or more previously deployed Sensors, such as stress indicators, load capacity (weight), electrical current drawn, water pressure minimum and maximums, humidity, particulate levels in air, presence of mold or spore forms, presences of insects or rodents, etc. The Sensor will also generate a digital signal descriptive of the condition monitored by the Sensor. Deployed may include affixing the Sensor in a fashion that enables to Sensor in a manner intended. For example, an accelerometer may be fixedly attached to a beam or other structural component in order to accurately experience vibrations emanating from the structural component. A temperature probe may need to be properly positioned to be exposed to ambient temperature conditions. An ammeter may be installed in a position enabling the ammeter to accurately determine an electrical current being conducted by an electrical wire. Other Sensors will likewise be installed within the structure in a place and manner conducive to generating accurate readings of conditions within the structure. In some embodiments, this information is combined to suggest a hierarchical repair approach to the Agent by determining the most likely problems associated with the symptomatic information.

At step 2614, information relevant to the Guided Orienteering is provided to the Agent. By way of non-limiting example, relevant information may include; building features, historical data, information on artwork or devices encountered by an Agent, technical walkthrough information, repair data, or maintenance instructions. Relevant information may also include, one or more of: an audio segment; an image; a video; and textual data; which may be caused to display on the Agent's smart device. In some embodiments, relevant information will describe a desirable action based upon a purpose of the Guided Orienteering.

At step 2615, Guided Orienteering results are recorded in the AVM as experiential data. Guided Orienteering results may include an indication of the success of the Guided Orienteering, a quantifiable value indicating an increase in efficiency or other desirable value, annotations, or other information useful to subsequent Agents, useful for valuing the Structure modeled by the AVM, or for any other desirable use of experiential data as described herein.

Wood Destroying Organism Tracking

According to some embodiments, a Guided Orienteering may relate to monitoring of a structure for Wood Destroying Organism (WDO) presence and activity. According to the present invention, conditions conducive to WDO infestation, such as a warm moist environment, are monitored and reported to an automated processor. In addition, sensors are deployed to monitor evidence of WDO presence.

In some embodiments, Sensors may provide Experiential Data quantifying one or more of: moisture levels; temperature; duration of a level of moisture and/or temperature; vibration patterns indicating a presence of WDOs; infrared imaging; mechanical detection mechanisms (such as a switch on a door to a baited area); image capture and recognition (similar to facial recognition); or other transducer or data capture device that generates experiential data that may be used to generate a likelihood of the presence of one or more WDOs. Orienteering apparatus and methods described herein may be used to direct an Agent to a sensor site within a Structure and/or area of interest based upon Sensor readings.

Depending on moisture levels, climate, and location of a colony (they are more active in warm, moist conditions), it could take three to eight years before a visual sign of an infestation serious damage to a structure—is visually apparent. The present invention detects the presence of WDOs almost as soon as they appear on a monitored venue.

In some embodiments, areas of entry are included in areas to be monitored via sensors. Areas of entry may include, for example, lower portions of a structure conducive to entry of subterranean termites, which may cause 95% of termite damage in North America. Subterranean termites are found in each state except Alaska. Such termites are most prevalent in the Southern states, which are sometimes referred to as the "termite belt," extending across the Southeast from Virginia to Texas.

Image data of a monitored site may be analyzed to determine if a captured image indicates the presence of termites or other WDOs; for example indications may include: a thin gritty gray-brown film on the surface of damaged material, tunnels, tracks, insects, narrow mud tubes on both the interior and exterior of walls and/or foundation; or other indicators.

In addition, vibrational data and/or image data may be indicative of a swarm, wherein a swarm includes movement of flying "reproductives" that leave a colony, typically in spring, to mate and start a new colony. Following a swarm, a WDO may shed their wings and head within a concealed space or underground within a few hours. Captured images may therefore also include discarded wings that resemble fish scales.

Figure 28A:
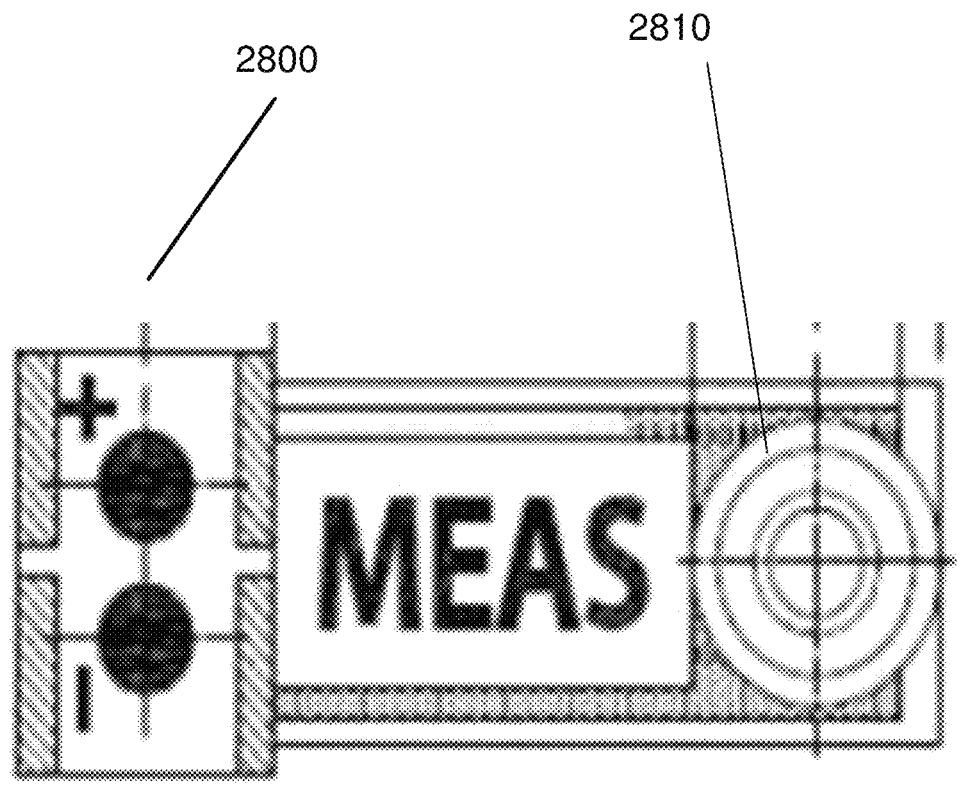
FIGS. 28A-B illustrates an exemplary sensor for detection of insects by vibration measurement and analysis.
Figure 28B:
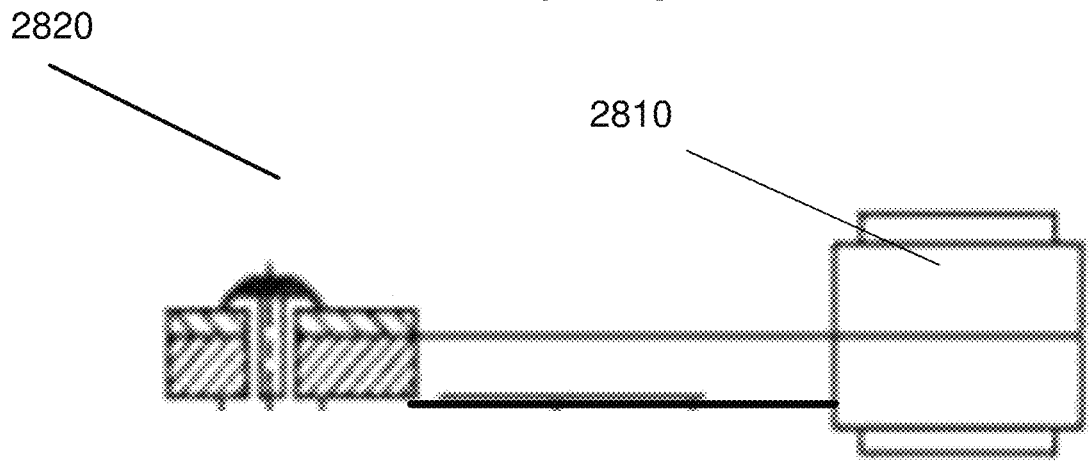

Motion detecting sensors, including vibration detection sensors may include piezoelectric sensors, piezo displacement sensors; accelerometer and the like. One example of a sensor includes a cantilever-type sensor such as the MiniSense 100 Vibration Sensor in top view FIG. 28A, from Measurement Specialties, which provides for high sensitivity to relatively low frequencies and is shielded to provide insulation from ambient RFI/EMI energy. FIG. 28A shows a circuit diagram of one model of MiniSense 100 Vibration Sensor 2800 with a sensor detecting sensing element 2810, but any model would suffice according to the present disclosure. A side view, 2820, is illustrated in FIG. 28B. In some examples, the sensor 2810 which may be located within another structure, may generate data comprising a vibration presence, other portions of the sensing structure may include moisture sensors. The output of these devices may be used in determining a presence of wood destroying organisms based upon the data comprising the vibration and moisture presence.

Figure 29:
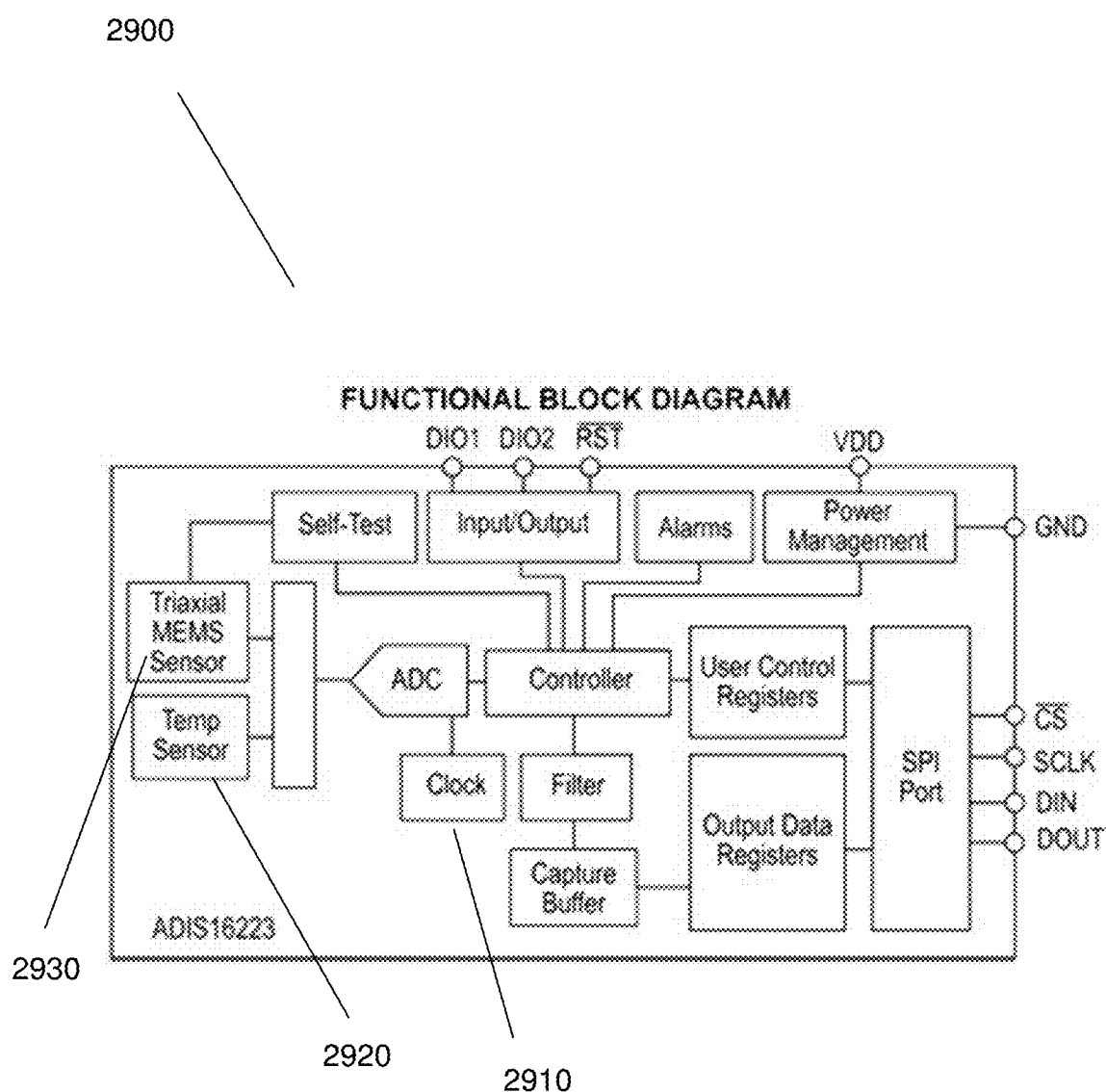
FIG. 29 illustrates a mems based vibration detection element.

In some embodiments, desirable features of the motion detecting sensor include:
High Voltage Sensitivity (1 V/g)
Over 5 V/g at Resonance
Horizontal or Vertical Mounting
Shielded Construction
Solderable Pins, PCB Mounting
Low Cost
<1% Linearity
Up to 40 Hz (2,400 rpm) Operation Below Resonance Another exemplary sensor is the ADIS16223 Digital Tri-Axial Vibration Sensor 2900 from Analog Devices, shown in FIG. 29, a vibration sensor system that combines the company's iMEMS sensing technology 2930 with signal processing, data capture, and a convenient serial peripheral interface (SPI). The SPI and data buffer structure yield convenient access to wide bandwidth sensor data. The 22 kHz sensor resonance and 72.9 kSPS sample rate provide a frequency response that is suitable for machine health applications.

In this case, an internal clock 2910 drives the data sampling system during a data capture event, which eliminates the need for an external clock source. The data capture function has four different modes that offer several capture trigger options to meet the needs of several applications. The ADIS 16223 also offers a digital temperature sensor 2920, digital power supply measurements and peak output capture. It is available in a 15 mm×15 mm×15 mm module with a threaded hold for stud mounting with a 10-32 UNF screw. Applications include vibration analysis, shock detection and event capture, condition monitoring, machine health, instrumentation diagnostics, safety shutoff sensing, security sensing including tamper detection.

Figure 30:
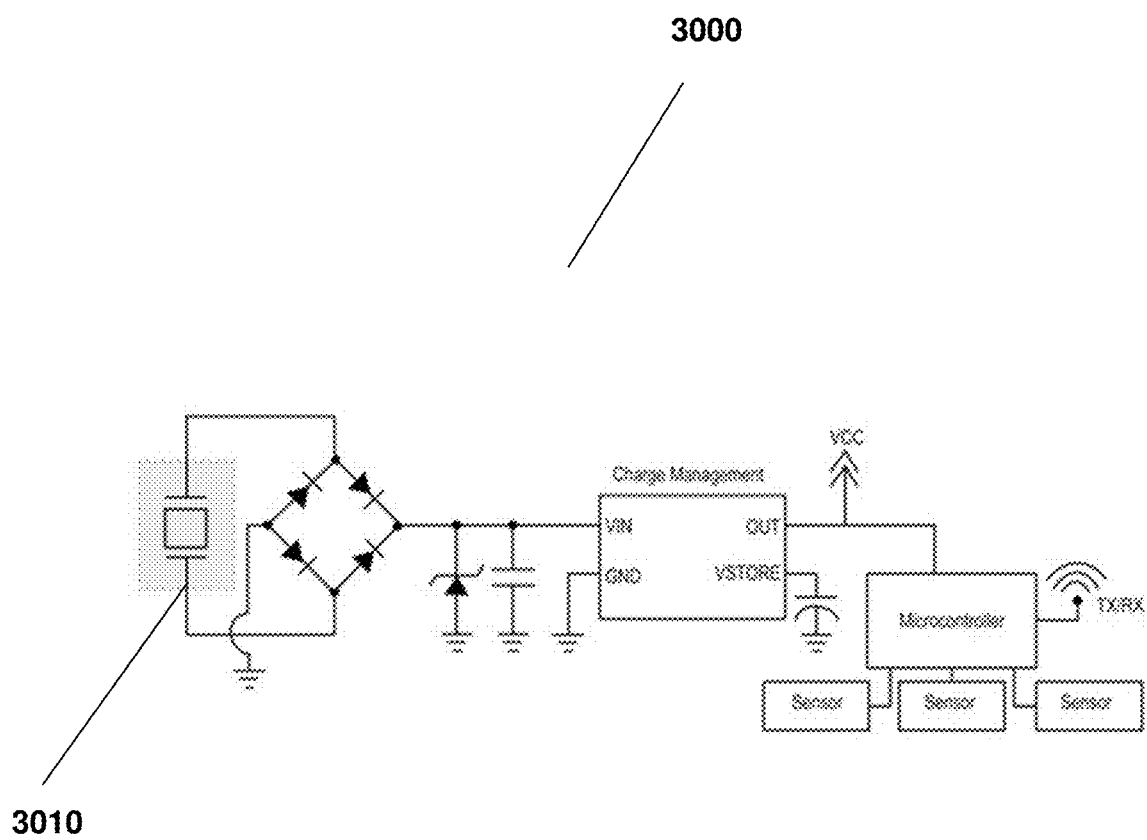
FIG. 30 illustrates an exemplary piezoelectric vibration sensor which may also function as a vibration energy harvesting device.

Also of note, particularly for energy harvesting applications, is the Midé Technology Volture Piezoelectric energy harvester 3000, illustrated in FIG. 30, which converts otherwise wasted energy from mechanical vibrations into usable electrical energy.

The Volture does this by using normally brittle piezoelectric materials 3010.

The piezoelectric materials are packaged in a protective skin with pre-attached electrical leads, producing a robust component with no soldered wires. The skin also provides electrical insulation and defense against humidity and harsh contaminants. The device could use vibrations as a power source, but also can detect vibrations as a sensor. As relevant, applications of the Volture include:
Industrial health monitoring network sensors
Condition Based Maintenance Sensors
Wireless HVAC Sensors
Mobile Asset Tracking
Tire Pressure Sensors
Oil and Gas sensors
All air, land and sea vehicle sensors
Battery and hard-wired power replacement Data may be collected in a structure during one or more of a build, renovation and deployment. Data analysis techniques, such as a Fast Fourier Transform; structured queries; and unstructured queries may yield relevant pattern information.

Sonic and Ultrasonic Location Tracking

In some embodiments of the present invention, sound waves may be used to perform one or more of: location determination; movement tracking in interior or exterior locations; and distance calculation from a position to an animate Agent which may be accomplished based upon transmission and receipt of sonic transmission. Sound wave transmissions include a number of significant attributes, which may translate into one or both of a benefit and a detriment for a given set of circumstances when used for RF based location determination. According to the present invention, sonic waves may be deployed independently, or in combination with transmissions and reception of logical communications utilizing other bandwidths, such as bandwidths associated with WiFi, Bluetooth, ANT, infrared or almost any wavelength in the Industrial, Scientific and Medical bands (sometimes referred to as "ISM Bands")

For example, sound waves travel through an ambient atmosphere at a significantly slower speed than electromagnetic radiation (6×10^2 m/sec versus 3×10^8 m/sec). Therefore, accuracy in a time scale that measurements are performed with can be orders of magnitude smaller for sonic based location tracking than for electromagnetic based measurements. Embodiments that include sonic transceivers operating at normal processing speeds may be able to perform location determination with increased accuracy in some environments.

Sonic wave emanations may be used to compliment electromagnetic emanations based upon a tendency that sonic waves generally do not efficiently penetrate walls other physical items or structures. Sonic transceivers may be particularly advantageous in a defined area where location can be unambiguously determined to be within a particular room (the use of multiple bandwidth transmitting and receiving for different purposes is further discussed below). Sound wave interaction with a solid surface, such as a wall, may require that for optimal performance, transceiver/transmitters/receivers to be located in each room where location detection is desired which may raise the cost of systems. In some embodiments, a reflected sonic transmission may be received and analyzed to determine an effect of the reflected nature of the transmission.

Figure 31A:
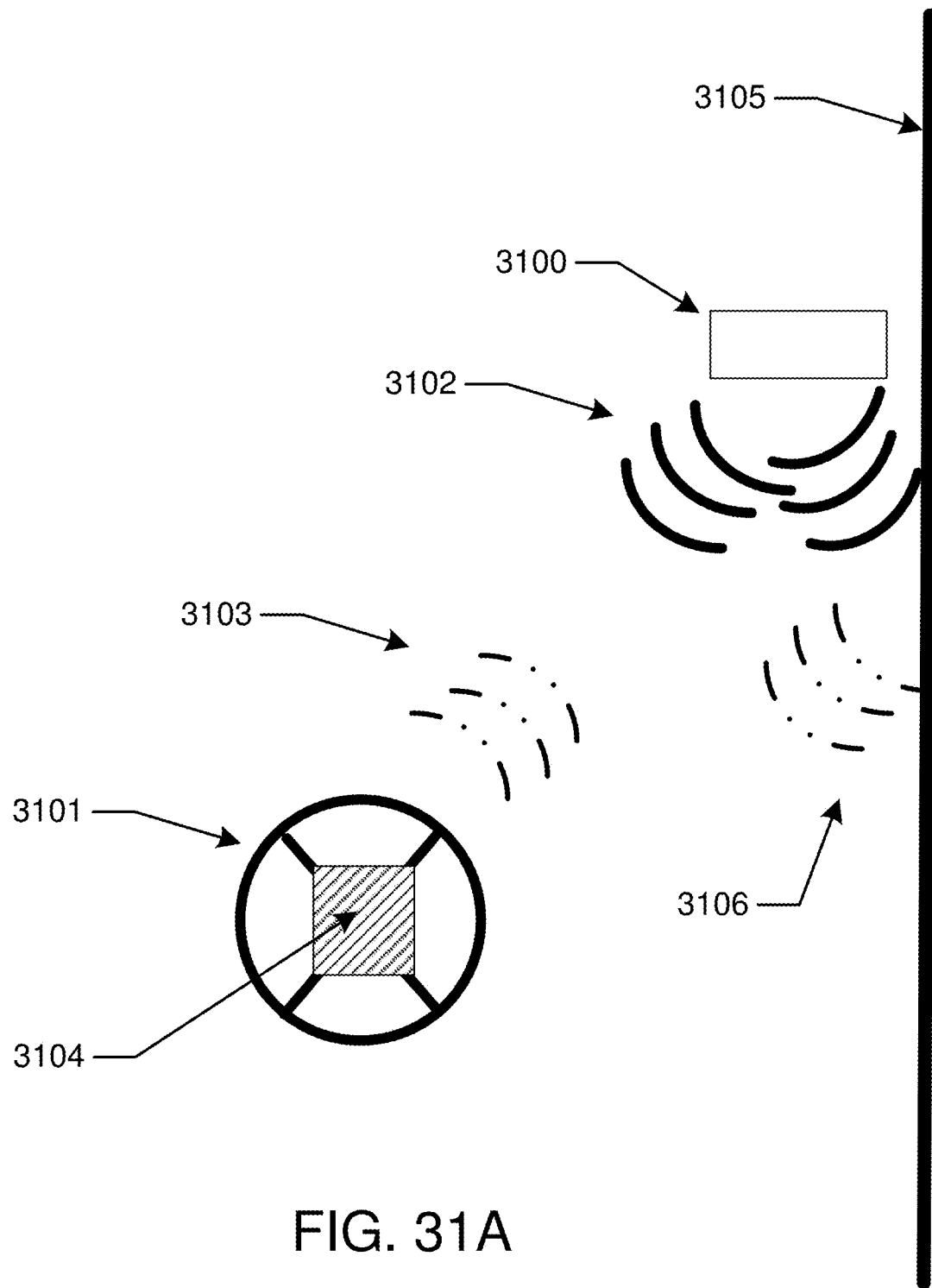
FIG. 31A-31E illustrate exemplary diagrams of transceivers and defined areas.

Accordingly, numerous methods may be employed using sonic emanations and reception for location determination. In general, frequencies of effective indoor sonic location detection may be at ultrasonic bandwidths (commonly used bandwidths include frequencies of between 1 MHz and 10 MHz, although frequencies of less than 50 KHz to greater than 200 MHz are possible), which are either below or above audible detection by people or other animals in the location;

such as at frequencies above 20 kHz. In some examples, illustrated in FIG. 31A, a sonic detection device 3100 may perform a location measurement 3101 by emitting sound signals 3102 and receiving their echo 3103 back from an Agent 3104. Signals may echo 3106 from a wall 3105 or structure.

In some examples, as may be used in orienteering herein, an Agent whose location is to be tracked may support receivers, transmitters or transceivers which may interact with a tracking infrastructure of ultrasonic transceivers that may be fixedly secured, such as via mechanical mounting within a room environment. An ultrasonic positioning system may have indoor positioning accuracy at centimeter, millimeter, and even sub millimeter accuracy.

Figure 31B:
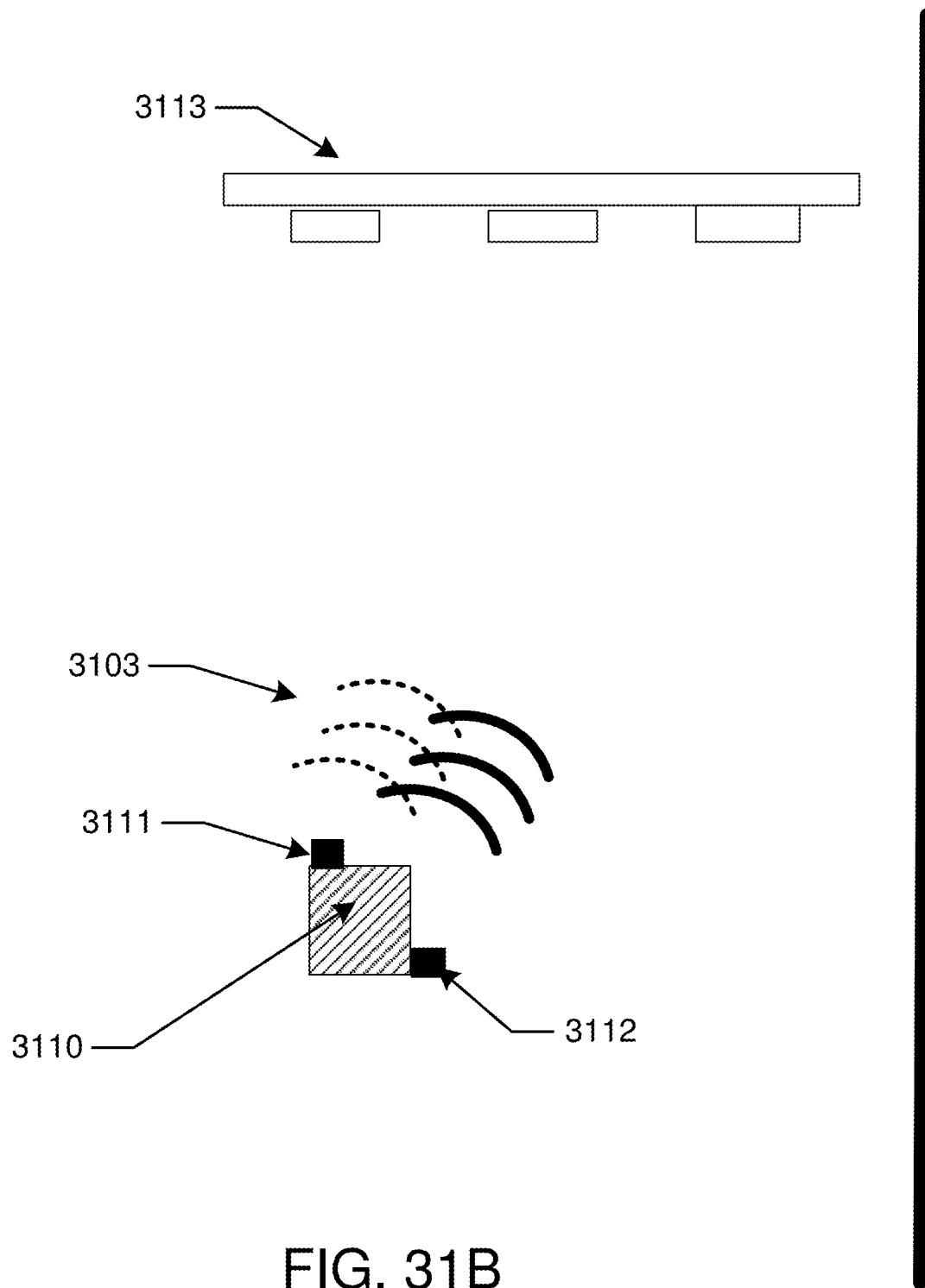

Referring to FIG. 31B, an example of an ultrasonic location determination system is illustrated. In the example, an Agent of interest 3110 may include at least a first transmission device 3111 and a second transmission device 3112 which may emit sonic waves towards an array of ceiling mounted detectors 3113. The array of ceiling mounted detectors 3113 may use the sonic waves to determine a location of the Agent of interest 3110. In an example, the array of ceiling mounted detectors 3113 may have a synced timing apparatus to track arrival times of one or both of radio frequency waves and sonic waves which may be used to determine multiple directions and arrival times of the signals which in turn may be used to generate a location determination.

In some examples, such synced timing apparatus is able to generate a location of a stationary Agent to within centimeter accuracy using sonic wave transmissions and reception and preferably within several millimeters of accuracy. In addition, in some embodiments sensors are able to detect frequency shifts within the sonic emanations which may add information about the relative rate of movement of the Agent, which may then in turn allow for correction to the timing signals.

Figure 31C:
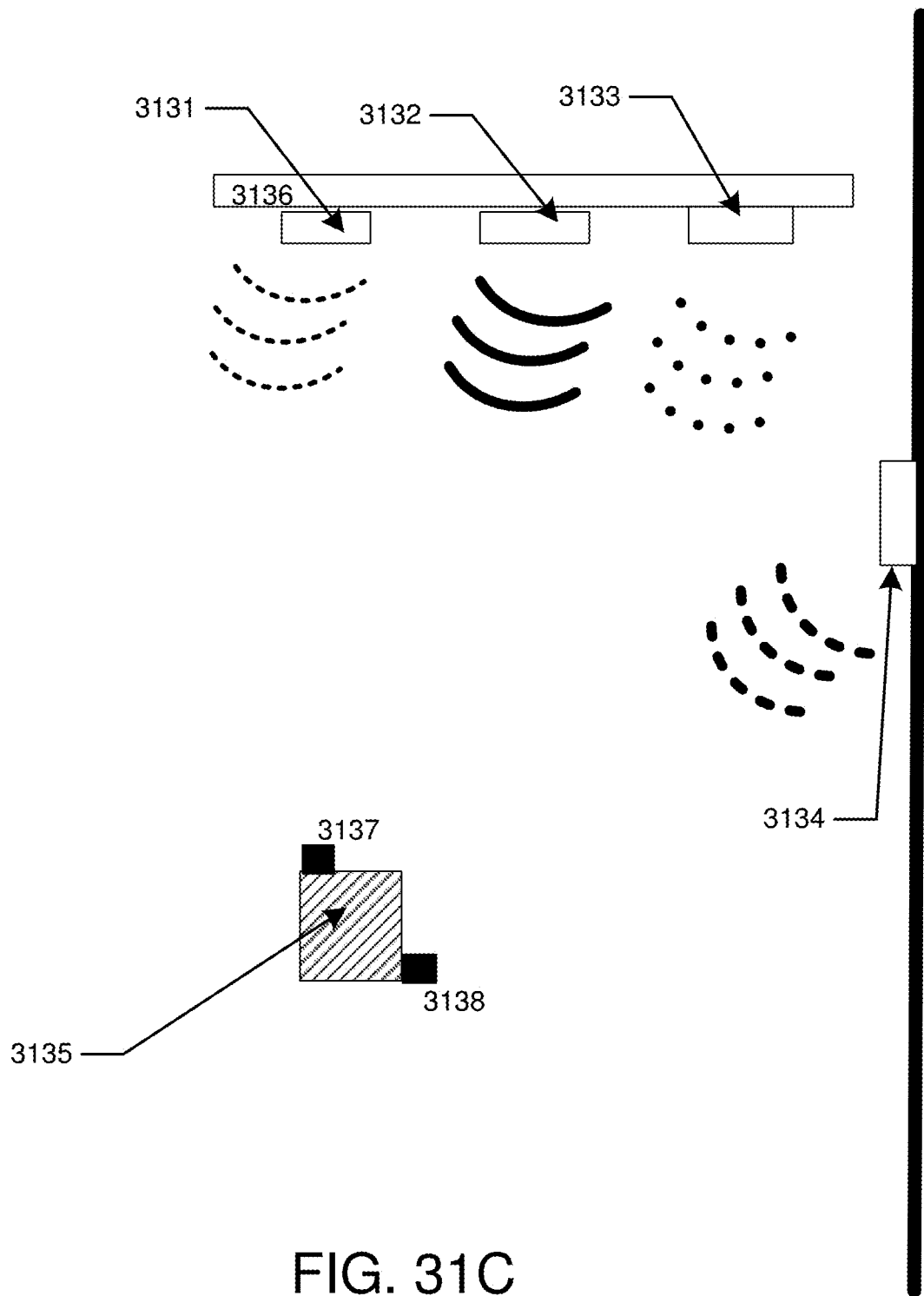

Referring to FIG. 31C, another example of an ultrasonic location detection system is illustrated. In an opposite sense to the system illustrated in FIG. 31B, Transceivers 3131-3134 are attached to a structure 3136 and emit one or more frequencies of ultrasonic sound emanations. Agent 3135 supported transceivers 3137-3138 3135 may receive the one or more frequencies of ultrasonic sound emanations and use the arrival times to determine a location of the Agent relative to the Transceivers 3131-3134.

In some examples, a combination of radio frequency emissions and ultrasonic emissions may be used. For example, a compliment of radio frequency emissions/receptions and ultrasonic of radio frequency emissions and ultrasonic emissions may be reconciled to generate more accurate location determination. In another aspect, a radio frequency signal may be used to transmit syncing signals that establish a time that ultrasonic signals are transmitted. Since, the electromagnetic signal may be orders of magnitude faster than the sound the relatively small time of travel from the transceivers 3131-3134 to the Agent 3135 may be negligible and therefore used as "zero-time" setpoints as received at the Agent of interest 3135. In this case, a controller determining a location may use not only relative arrival times, but also a delta time between a radiofrequency transmission and ultrasonic transmission to determine a distance from a transmitting Transceiver. An array of such ultrasonic and/or radiofrequency transceivers provide increased accuracy in triangulating a location of the Agent.

In still further examples, RF communications may not only transmit a syncing pulse, but also transmit digital data about various aspects of a defined area, such as the defined area's identification, its relative and/or absolute location in space and other refinements. In some example, data related to improved distance calculation may also be transmitted by RF communication such as temperature of the environment, humidity and the like which may influence the speed of sound in the environment as a non-limiting example. In some examples such a system may result in millimeter level accuracy of position determination.

Figure 31D:
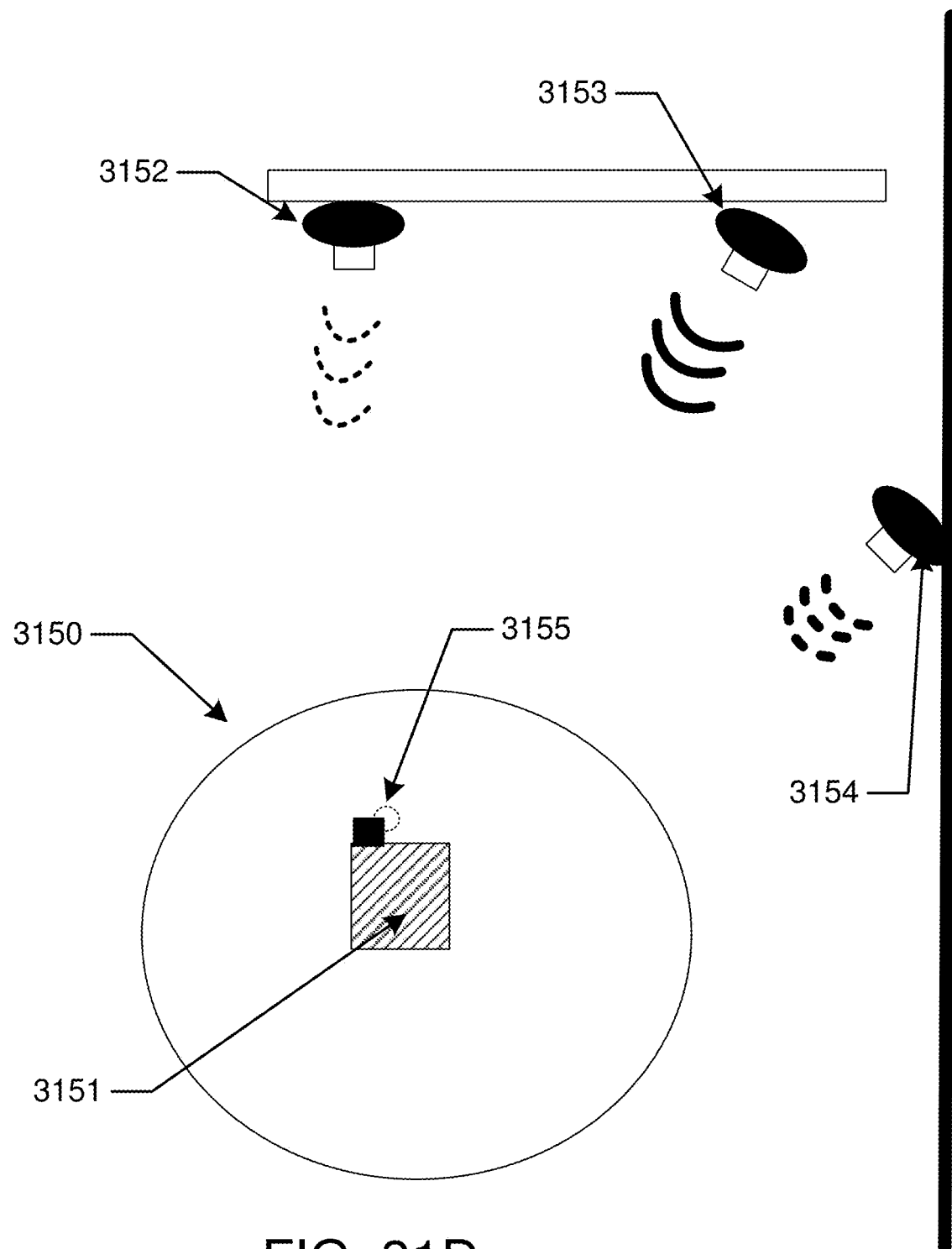

In reference to FIG. 31D, a sophisticated ultrasonic based tracking system is illustrated. In this example, a radio frequency-based system may be used to determine a relative location 3150 of an Agent 3151 in a room. A system including directionally 3152-3154 controlled ultrasonic transceivers may determine a region that the Agent is located in. Detectors on a smart device or a location determining device supported by the Agent may receive transmitted ultrasonic signals and further refine a distance estimate 3155. In some examples, the process may be iterated to refine the direction of each of the ultrasonic transmitters and maximize signal levels of the transmission which may provide additional information in the calculation of a position. RF and WiFi transmissions may be used for data communications and syncing as have been described. In other examples as the Agent is moving, the iterative process may be used to track the Agent as it moves through space. Stationary Agents may be tracked with submillimeter accuracy in some embodiments.

Figure 31E:
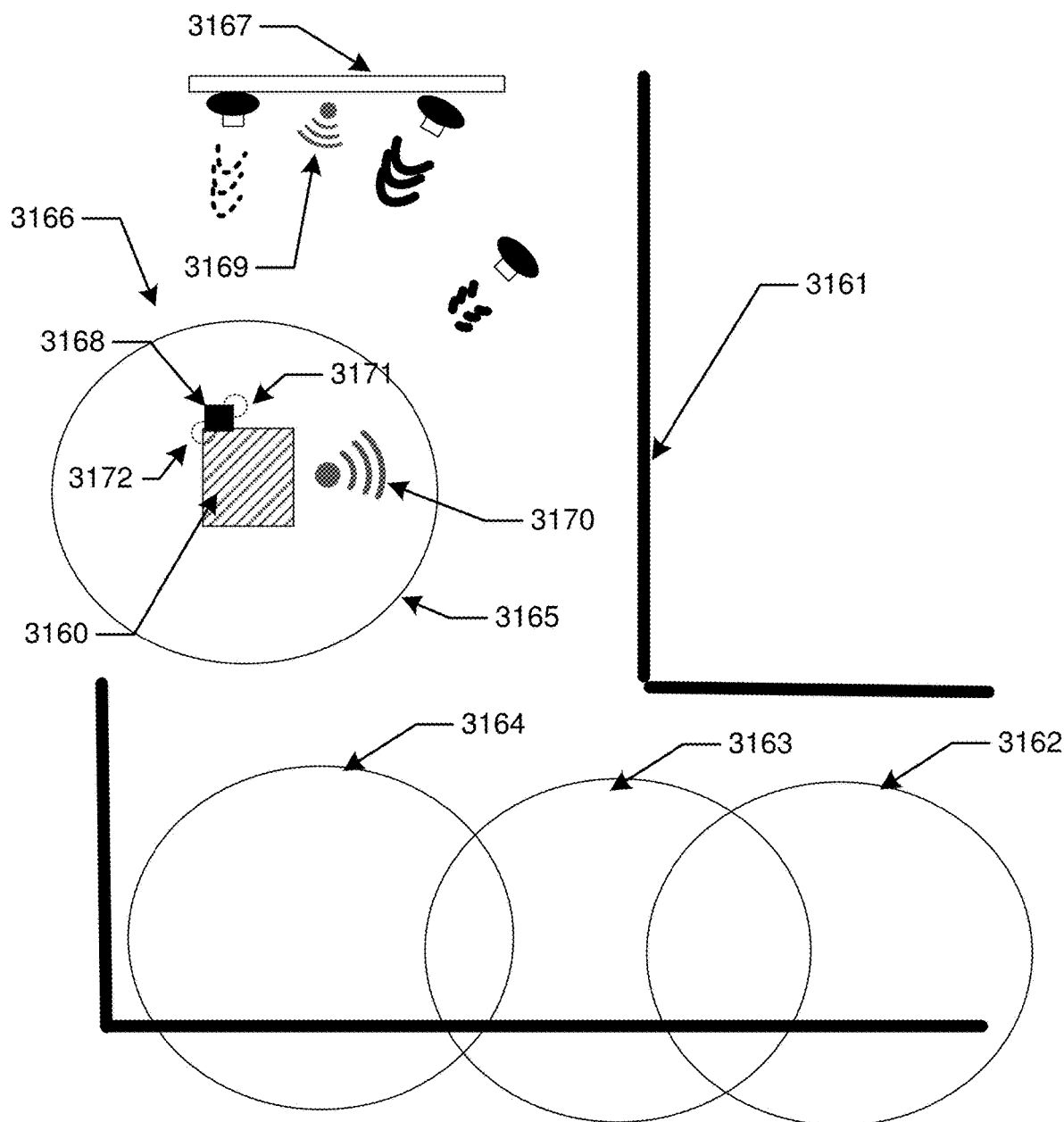

Referring now to FIG. 31E, an example of orienteering utilizing a location tracking system which employs sonic transceivers is illustrated. An Agent 160 is illustrated travelling through a building structure 3161 along a path from points 3162 to 3163, 3164 and 3165. The Agent's location may be determined by a first means, such as a WiFi location protocol employing RTT as a non-limiting example.

The relatively large circles around the tracked points 3162-3165 illustrate a location accuracy of a first technique. A first technique may localize an Agent in a first room 3166 and at position 3165. Therein, a set 3167 of directable ultrasonic beams are directed to the general location and begin to communicate with a tracking device 3168 supported by an Agent 3160. An ultrasonic location protocol may be initiated and a RF signal 3169 may be started to synch the location determination. In some examples, a WiFi 3170 protocol may also be activated to communicate digital data with a sensor of the tracking device 3168. Sensing elements 3171 and 3172, wherein additional sensor elements may be present and not illustrated, may be located with sub-millimeter to millimeter precision. A location of two or more transceivers may be used to create a direction vector as has been described herein, and a direction of interest may thereby be determined and quantified. In some examples, the tracking device may include a smart device with interface screens that may allow a user to interact with the smart device to indicate the desire to record transmit and receive and generate a direction vector indicative of a direction of interest while the user points in a certain direction.

Particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order show, or sequential order, to achieve desirable results. In certain implementations, multitasking and parallel processing may be advantageous. Nevertheless, it will be understood that various modifications may be made without departing from the spirit and scope of the claimed invention.

What is claimed is:

1. An apparatus comprising:
a headset supportable on a head of an agent;
a biosensor operative to provide empirical data descriptive of the agent;
a display comprising a human readable interface;
a first wireless position device fixedly attached to the headset at a first position of the headset;
a second wireless position device fixedly attached to the headset at a second position;
a controller in logical communication with the first wireless position device and the second wireless position device, the controller comprising a processor and a digital storage storing software executable on demand to cause the apparatus to:
wirelessly communicate first timing information between the first wireless position device and at least three reference point transceivers;
determine an X,Y, and Z coordinate set descriptive of a position the first wireless position device wherein the X, Y, and Z coordinates are determined using the first timing information comprising a time of travel of the wireless communication between the first wireless position device and at least one of the three positioning reference devices;
generate a position of the first wireless position device based upon the first timing information communicated between the first wireless position device and the at least three reference point transceivers;
wirelessly communicate second timing information between the second wireless position device and the at least three reference point transceivers;
generate a position of the second wireless position device based upon the second timing information communicated between the second wireless position device and the at least three reference point transceivers;
generate a vector intersecting the position of the first wireless position device and the second wireless position device;
generate a query of a database based upon the vector generated;
query the database with the query based upon the vector; and
generate a user interface based upon a received response to the query and the empirical data descriptive of the agent.

2. The apparatus of claim 1 further comprising a second controller in communication with the first controller, the second controller located remote from the headset.

3. The apparatus of claim 1 further comprising a set of stereoscopic cameras.

4. The apparatus of claim 3, wherein the stereoscopic cameras are fixed to the headset and focused upon a region including hands of the agent supporting the headset.

5. The apparatus of claim 3, wherein an image from the stereoscopic cameras is included in the user interface.

6. The apparatus of claim 1 further comprising a smart device, wherein the smart device is in wireless communication with the headset, and wherein the smart device is in logical communications with the first wireless position device and the second wireless position device.

7. The apparatus of claim 6 wherein the smart device determines X, Y, and Z coordinates of the first transceiver by a receipt of data from a transmission the timing information from one of the three positioning reference devices.

8. The apparatus of claim 1 further comprising a three dimensional scanner affixed upon the headset.

9. The apparatus of claim 8 wherein the three dimensional scanner comprises a laser.

10. The apparatus of claim 1 wherein at least one of the first wireless position device and the second wireless position device wirelessly communicate with at least one of the three reference point transceivers via an ultra wide band wireless communication.

11. The apparatus of claim 1 wherein at least one of the first wireless position device and the second wireless position device wirelessly communicate with at least one of the three reference point transceivers via a blue tooth wireless communication.

12. The apparatus of claim 1 wherein the first timing information is communicated between the first wireless position device and a first of the three reference point transceivers in a first modality and is communicated between the first wireless position device and a second of the three reference point transceivers in a second modality.

13. The apparatus of claim 1 wherein the headset comprises a hat.

14. The apparatus of claim 13 additionally comprising a display fixture supporting the display in a field of view of an eye of the agent while the agent is wearing the hat.

15. The apparatus of claim 1 wherein the headset comprises a pair of eyeglasses.

16. The apparatus of claim 15 wherein the eyeglasses comprise a temple and at least one of the first wireless position device and the second wireless position device is placed on the temple.

17. The apparatus of claim 15 wherein the eyeglasses comprise a bridge and at least one of the first wireless position device and the second wireless position device is placed on the bridge of the eyeglasses.

* * * * *